US009619170B2

(12) United States Patent
Hashimoto et al.

(10) Patent No.: US 9,619,170 B2
(45) Date of Patent: Apr. 11, 2017

(54) INFORMATION PROCESSING SYSTEM HAVING A DATA MIGRATION LOG

(71) Applicant: Kabushiki Kaisha Toshiba, Minato-ku (JP)

(72) Inventors: Daisuke Hashimoto, Kawasaki (JP); Koichi Nagai, Chigasaki (JP); Takanori Watanabe, Ome (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/850,833

(22) Filed: Sep. 10, 2015

(65) Prior Publication Data

US 2016/0011818 A1  Jan. 14, 2016

Related U.S. Application Data

(63) Continuation of application No. PCT/JP2013/073859, filed on Aug. 29, 2013.

(30) Foreign Application Priority Data

Mar. 18, 2013  (JP) .................................. 2013-055548

(51) Int. Cl.
*G06F 12/00* (2006.01)
*G06F 3/06* (2006.01)
(Continued)

(52) U.S. Cl.
CPC .......... *G06F 3/0647* (2013.01); *G06F 3/0617* (2013.01); *G06F 3/0653* (2013.01);
(Continued)

(58) Field of Classification Search
CPC .. G06F 3/0647; G06F 11/1004; G06F 3/0688; G06F 3/0617; G06F 3/0653;
(Continued)

(56) References Cited

U.S. PATENT DOCUMENTS 6,119,245 A  9/2000 Hiratsuka
6,529,992 B1  3/2003 Thomas et al.
(Continued)

FOREIGN PATENT DOCUMENTS

CN  102221981 A  10/2011
EP  2 378 410 A2  10/2011
(Continued)

OTHER PUBLICATIONS

Office Action issued Jan. 26, 2016 in Japanese Patent Application No. 2013-055548 (with English translation).
(Continued)

*Primary Examiner* — John A Lane
(74) *Attorney, Agent, or Firm* — Oblon, McClelland, Maier & Neustadt, L.L.P.

(57) ABSTRACT

According to an embodiment, when a storage status of a first storage unit is recognized as a protected state, a control unit writes data to a second storage unit. When a read target address is recorded in a data migration log area, the control unit reads data from the second storage unit. When the read target address is not recorded in the data migration log area, the control unit reads data from the first storage unit.

20 Claims, 76 Drawing Sheets

(51) Int. Cl.
- *G06F 12/02* (2006.01)
- *G06F 11/00* (2006.01)
- *G11C 16/34* (2006.01)
- *G11C 29/52* (2006.01)
- *G06F 11/10* (2006.01)
- *G11C 29/00* (2006.01)
- *G06F 11/16* (2006.01)

(52) U.S. Cl.
CPC .......... *G06F 3/0688* (2013.01); *G06F 11/008* (2013.01); *G06F 11/1004* (2013.01); *G06F 12/0246* (2013.01); *G11C 16/3495* (2013.01); *G11C 29/52* (2013.01); *G06F 11/1666* (2013.01); *G11C 29/82* (2013.01)

(58) Field of Classification Search
CPC .. G06F 11/08; G06F 12/0246; G06F 11/1666; G11C 29/52; G11C 16/3495; G11C 29/82
See application file for complete search history.

(56) References Cited

U.S. PATENT DOCUMENTS

| | | | |
|---|---|---|---|
| 7,222,259 B2 | 5/2007 | Tanaka et al. | |
| 7,343,465 B2 * | 3/2008 | Shibayama | G06F 3/0608 709/216 |
| 7,424,639 B2 | 9/2008 | Tanaka et al. | |
| 7,525,749 B2 | 4/2009 | Maejima et al. | |
| 7,606,946 B2 | 10/2009 | Kobayashi et al. | |
| 7,739,544 B2 | 6/2010 | Yamato et al. | |
| 7,840,836 B2 | 11/2010 | Chang | |
| 7,861,122 B2 | 12/2010 | Cornwell et al. | |
| 7,934,068 B2 | 4/2011 | Abe et al. | |
| 8,037,380 B2 | 10/2011 | Cagno et al. | |
| 8,176,367 B2 | 5/2012 | Dreifus et al. | |
| 8,230,164 B2 | 7/2012 | Danilak | |
| 8,489,924 B2 | 7/2013 | Nakatsugawa et al. | |
| 8,577,646 B2 | 11/2013 | Nishikawa et al. | |
| 8,631,191 B2 | 1/2014 | Hashimoto | |
| 8,667,216 B2 | 3/2014 | Hashimoto | |
| 8,677,093 B2 | 3/2014 | Hayashi | |
| 8,683,117 B2 | 3/2014 | Hashimoto | |
| 8,756,367 B2 | 6/2014 | Hashimoto | |
| 8,904,119 B2 * | 12/2014 | Yadav | G06F 3/061 711/152 |
| 9,026,734 B2 | 5/2015 | Hashimoto | |
| 9,026,764 B2 | 5/2015 | Hashimoto | |
| 2007/0214187 A1 | 9/2007 | Thomas et al. | |
| 2009/0063895 A1 | 3/2009 | Smith | |
| 2009/0222617 A1 | 9/2009 | Yano et al. | |
| 2010/0125751 A1 | 5/2010 | McKean | |
| 2010/0306577 A1 | 12/2010 | Dreifus et al. | |
| 2010/0325199 A1 | 12/2010 | Park et al. | |
| 2011/0197045 A1 | 8/2011 | Okamoto | |
| 2011/0239083 A1 | 9/2011 | Kanno | |
| 2011/0258379 A1 | 10/2011 | Hayashi | |
| 2012/0246388 A1 | 9/2012 | Hashimoto | |
| 2014/0075097 A1 | 3/2014 | Nagai | |
| 2014/0149707 A1 | 5/2014 | Hayashi | |

FOREIGN PATENT DOCUMENTS

| | | |
|---|---|---|
| JP | 3565687 B2 | 6/2004 |
| JP | 2010-225021 A | 10/2010 |
| JP | 4643456 B2 | 12/2010 |
| JP | 4764490 B2 | 6/2011 |
| JP | 2011-209879 A | 10/2011 |
| JP | 2011-227898 A | 11/2011 |
| JP | 5052376 B2 | 8/2012 |
| WO | WO 2013/027642 A1 | 2/2013 |

OTHER PUBLICATIONS

Combined Taiwanese Office Action and Search Report issued Sep. 8, 2015 in Taiwanese Patent Application No. 102143915 (with English Translation).
International Search Report mailed Feb. 6, 2014 for PCT/JP2013/073859 filed Aug. 29, 2013 in English.
International Written Opinion mailed Feb. 6, 2014 for PCT/JP2013/073859 filed Aug. 29, 2013 in English.
Information Technology ATA/ATAPI Command Set-3 (ACS-3), d2161r4-ATAATAPI_Command_Set_-_3.pdf, http://www.t13.org/, Sep. 4, 2012.
NVM Express Revision 1.1 NVM_Express_1_1.pdf, http://www.nvmexpress.org/, Oct. 11, 2012.
Serial ATA International Organization: Serial ATA Revision 3.1 Gold Revision, http://www.serialata.org/, Jul. 18, 2011.
PCI Express Base Specification Revision 3.0, http://www.pcisig.com/ Nov. 10, 2010.
Serial ATA Technical Proposal: SATA31_TPR_C108 Title: Device Sleep, http://www.serialata.org/, Oct. 24, 2011.
SCSI Primary Commands-4 (SPC-4) INCITS T10/1731-D, Revision 36e, http://www.t10.org/ Aug. 24, 2012.
Masaru Kitsuregawa, "Yokuwakaru Storage Networking" First Edition, Ohm, Ltd., p. 6-9 and p. 67-93, May 20, 2011.
Office Action issued Aug. 16, 2016 in Korean Patent Application No. 10-2015-7023650 (with English language translation).

* cited by examiner

FIG.14

MANAGEMENT INFORMATION

FREE BLOCK TABLE (FBT): 60

| PHYSICAL BLOCK ID | ERASE COUNT |
|---|---|
| ... | ... |
| ... | ... |
| ... | ... |
| ... | ... |

BAD BLOCK TABLE (BBT): 61

| PHYSICAL BLOCK ID |
|---|
| ... |
| ... |
| ... |
| ... |

ACTIVE BLOCK TABLE (ABT): 62

| PHYSICAL BLOCK ID | ERASE COUNT |
|---|---|
| ... | ... |
| ... | ... |
| ... | ... |
| ... | ... |

TRACK TABLE: 63

| TRACK ADDRESS | PHYSICAL BLOCK ID |
|---|---|
| ... | ... |
| ... | ... |
| ... | ... |
| ... | ... |

CLUSTER TABLE: 64

| CLUSTER ADDRESS | PHYSICAL BLOCK ID | INTRA-PHYSICAL BLOCK PAGE ADDRESS |
|---|---|---|
| ... | ... | ... |
| ... | ... | ... |
| ... | ... | ... |
| ... | ... | ... |

STATISTICAL INFORMATION ~65

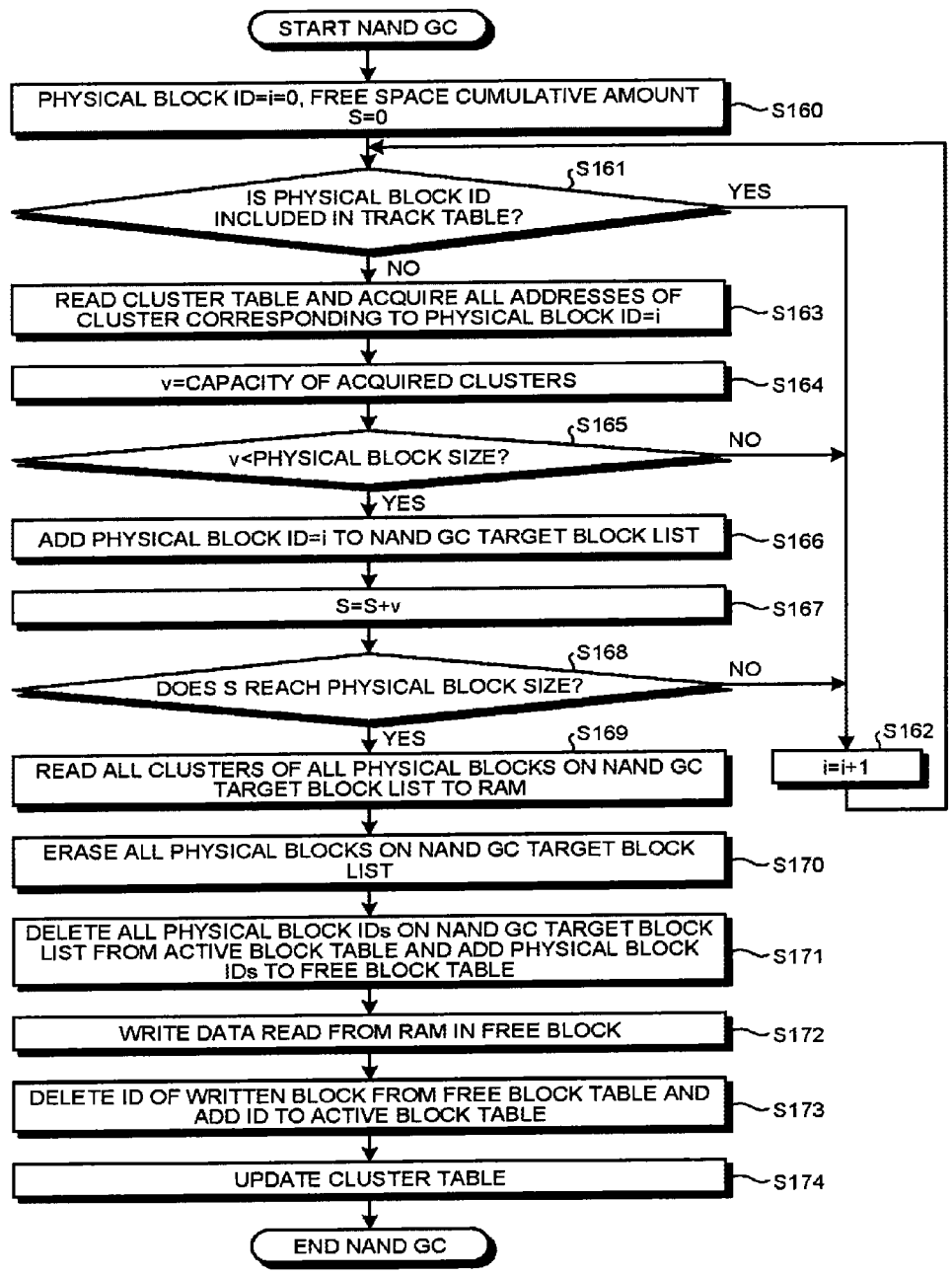

FIG.27A

| attribute ID | attribute NAME | Value | Threshold | Worst | Raw Data |
|---|---|---|---|---|---|
| ... | TOTAL NUMBER OF BAD BLOCKS (STATISTICAL INFORMATION X01) | ... | ... | ... | ... |
| ... | TOTAL NUMBER OF BAD LOGICAL SECTORS (STATISTICAL INFORMATION X02) | ... | ... | ... | ... |
| ... | TOTAL ERASE COUNT (STATISTICAL INFORMATION X03) | ... | ... | ... | ... |
| ... | AVERAGE OF ERASE COUNT (STATISTICAL INFORMATION X04) | ... | ... | ... | ... |
| ... | CUMULATIVE VALUE OF NUMBER OF TIMES OF WRITE ERROR OCCURRENCE OF NAND MEMORY (STATISTICAL INFORMATION X05) | ... | ... | ... | ... |
| ... | CUMULATIVE VALUE OF ERASE ERROR COUNT OCCURRENCE OF NAND MEMORY (STATISTICAL INFORMATION X06) | ... | ... | ... | ... |
| ... | TOTAL NUMBER OF READ LOGICAL SECTORS (STATISTICAL INFORMATION X07) | ... | ... | ... | ... |
| ... | TOTAL NUMBER OF WRITE LOGICAL SECTORS (STATISTICAL INFORMATION X08) | ... | ... | ... | ... |
| ... | TOTAL NUMBER OF TIMES OF ECC CORRECTION INABILITY (STATISTICAL INFORMATION X09) | ... | ... | ... | ... |
| ... | NUMBER OF TIMES OF RETRY READ OCCURRENCE (STATISTICAL INFORMATION X10) | ... | ... | ... | ... |
| ... | TOTAL NUMBER OF n BITS TO m BITS ECC CORRECTION UNITS (STATISTICAL INFORMATION X11) | ... | ... | ... | ... |
| ... | NUMBER OF TIMES OF DATA CORRUPTION ERROR OF INTERFACE 19 (STATISTICAL INFORMATION X12) | ... | ... | ... | ... |
| ... | NUMBER OF TIMES OF COMMUNICATION SPEED DOWN SHIFT OF INTERFACE 19 (STATISTICAL INFORMATION X13) | ... | ... | ... | ... |
| ... | NUMBER OF TIMES OF LANE NUMBER DOWN SHIFT OF INTERFACE 19 (STATISTICAL INFORMATION X14) | ... | ... | ... | ... |
| ... | NUMBER OF TIMES OF ERROR OCCURRENCE OF INTERFACE 19 (STATISTICAL INFORMATION X15) | ... | ... | ... | ... |
| ... | NUMBER OF TIMES OF ERROR OCCURRENCE OF RAM 40 (STATISTICAL INFORMATION X16) | ... | ... | ... | ... |
| ... | TOTAL USE TIME OF STORAGE UNIT 2 (STATISTICAL INFORMATION X17) | ... | ... | ... | ... |
| ... | NUMBER OF TIMES OF START (STATISTICAL INFORMATION X18) | ... | ... | ... | ... |

FIG.27B

| | | | | | | | | | | | | | | |
|---|---|---|---|---|---|---|---|---|---|---|---|---|---|---|
| ... | NUMBER OF TIMES OF OCCURRENCE OF UNAUTHORIZED POWER INTERRUPTION (STATISTICAL INFORMATION X19) | ... | ... | ... | ... | ... | ... | ... | ... | ... | ... | ... | ... | ... |
| ... | CUMULATIVE TIME WHEN TEMPERATURE EXCEEDS MAXIMUM VALUE OF RECOMMENDED OPERATION TEMPERATURE (STATISTICAL INFORMATION X20) | | | | | | | | | | | | | |
| ... | CUMULATIVE TIME WHEN TEMPERATURE FALLS BELOW MINIMUM VALUE OF RECOMMENDED OPERATION TEMPERATURE (STATISTICAL INFORMATION X21) | | | | | | | | | | | | | |
| ... | RESPONSE TIME MAXIMUM VALUE OF COMMAND (STATISTICAL INFORMATION X22) | ... | ... | ... | ... | ... | ... | ... | ... | ... | ... | ... | ... | ... |
| ... | RESPONSE TIME AVERAGE VALUE OF COMMAND (STATISTICAL INFORMATION X23) | ... | ... | ... | ... | ... | ... | ... | ... | ... | ... | ... | ... | ... |
| ... | RESPONSE TIME MAXIMUM VALUE OF NAND MEMORY (STATISTICAL INFORMATION X24) | | | | | | | | | | | | | |
| ... | RESPONSE TIME AVERAGE OF NAND MEMORY (STATISTICAL INFORMATION X25) | ... | ... | ... | ... | ... | ... | ... | ... | ... | ... | ... | ... | ... |
| ... | PRESENT TEMPERATURE (STATISTICAL INFORMATION X26) | ... | ... | ... | ... | ... | ... | ... | ... | ... | ... | ... | ... | ... |
| ... | HIGHEST TEMPERATURE (STATISTICAL INFORMATION X27) | ... | ... | ... | ... | ... | ... | ... | ... | ... | ... | ... | ... | ... |
| ... | LOWEST TEMPERATURE (STATISTICAL INFORMATION X28) | ... | ... | ... | ... | ... | ... | ... | ... | ... | ... | ... | ... | ... |
| ... | MANAGEMENT INFORMATION REDUNDANCY (STATISTICAL INFORMATION X29) | ... | ... | ... | ... | ... | ... | ... | ... | ... | ... | ... | ... | ... |
| ... | TOTAL WRITE DATA AMOUNT IN RAM 40 (STATISTICAL INFORMATION X30) | | | | | | | | | | | | | |
| ... | STATISTICAL INFORMATION INCREASE RATIO (STATISTICAL INFORMATION X31) | ... | ... | ... | ... | ... | ... | ... | ... | ... | ... | ... | ... | ... |
| ... | NAND GC FAILURE FLAG (STATISTICAL INFORMATION X32) | ... | ... | ... | ... | ... | ... | ... | ... | ... | ... | ... | ... | ... |

METADATA $_{6C}$ $_{300}$

| FILE ID | LOGICAL DRIVE ADDRESS | DISK ID | LBA | SECTOR COUNT |
|---|---|---|---|---|
| ... | LOGICAL DRIVE 4 | STORAGE UNIT 2 | ... | ... |
| ... | LOGICAL DRIVE 4 | STORAGE UNIT 2 | ... | ... |
| ... | LOGICAL DRIVE 4 | STORAGE UNIT 2 | ... | ... |
| ... | LOGICAL DRIVE 4 | STORAGE UNIT 2 | ... | ... |
| ... | LOGICAL DRIVE 4 | STORAGE UNIT 2 | ... | ... |

FIG.41

| | 6D   450 |
|---|---|
| LOGICAL DRIVE STATUS TABLE ||
| LOGICAL DRIVE ADDRESS | STATUS |
| ... | NORMAL STATE |
| ... | DATA MIGRATION STATE |
| ... | NORMAL STATE |

FIG.50

| MIGRATION LOG | 550 |
| --- | --- |
| LBA | SECTOR COUNT |
| ... | ... |
| ... | ... |
| ... | ... |
| ... | ... |

FIG.57

| STEP | LOGICAL DRIVE 4 | | STATE |
|---|---|---|---|
| | STORAGE UNIT 2 | STORAGE UNIT 3 | |
| 1 | 1 | UN-CONNECTED | BEFORE RELIABILITY DETERIORATION |
| 2 | 2 | UN-CONNECTED | REQUEST TO CONNECT STORAGE UNIT 3 |
| 3 | 2 | 0 | RIGHT AFTER STORAGE UNIT 3 IS CONNECTED |
| 4 | 3 | 4 | IN DATA MIGRATION |
| 5 | 5 | 1 | DATA MIGRATION IS COMPLETED |

FIG.59

| STORAGE UNIT LBA | LOGICAL SLOT 0 STORAGE UNIT 2A | LOGICAL SLOT 1 STORAGE UNIT 2B | LOGICAL SLOT 2 STORAGE UNIT 2C | LOGICAL SLOT 3 STORAGE UNIT 2D |
|---|---|---|---|---|
| 0 | D(0) | D(1) | D(2) | P(0, 2) |
| 1 | D(3) | D(4) | P(3, 5) | D(5) |
| 2 | D(6) | P(6, 8) | D(7) | D(8) |
| 3 | P(9, 11) | D(9) | D(10) | D(11) |
| 4 | D(12) | D(13) | D(14) | P(12, 14) |
| 5 | D(15) | D(16) | P(15, 17) | D(17) |
| ... | ... | ... | ... | ... |

FIG.60

| STORAGE UNIT LBA | LOGICAL SLOT 0 STORAGE UNIT 2A | LOGICAL SLOT 1 STORAGE UNIT 2B | LOGICAL SLOT 2 STORAGE UNIT 2C | LOGICAL SLOT 3 STORAGE UNIT 2D | LOGICAL SLOT 1 STORAGE UNIT 3 |
|---|---|---|---|---|---|
| 0 | D(0) | D(1) | D(2) | P(0, 2) | - |
| 1 | D(3) | D(4) | P(3, 5) | D(5) | - |
| 2 | D(6) | P(6, 8) | D(7) | D(8) | - |
| 3 | P(9, 11) | D(9) | D(10) | D(11) | - |
| 4 | D(12) | D(13) | D(14) | P(12, 14) | - |
| ... | ... | ... | ... | ... | ... |

FIG.61

| MIGRATION LOG | |
|---|---|
| STORAGE UNIT LBA | SECTOR COUNT |
| ... | ... |
| ... | ... |
| ... | ... |
| ... | ... |

| STEP | LOGICAL SLOT 0 STORAGE UNIT 2A | LOGICAL SLOT 1 STORAGE UNIT 2B | LOGICAL SLOT 2 STORAGE UNIT 2C | LOGICAL SLOT 3 STORAGE UNIT 2D | LOGICAL SLOT 1 STORAGE UNIT 3 | STATE |
|---|---|---|---|---|---|---|
| 1 | 1 | 1 | 1 | 1 | UN-CONNECTED | BEFORE RELIABILITY DETERIORATION |
| 2 | 1 | 2 | 1 | 1 | UN-CONNECTED | REQUEST TO CONNECT STORAGE UNIT 3 |
| 3 | 1 | 2 | 1 | 1 | 0 | RIGHT AFTER STORAGE UNIT 3 IS CONNECTED |
| 4 | 1 | 3 | 1 | 1 | 4 | IN DATA MIGRATION READ IS PERFORMED PREFERENTIALLY FROM STORAGE UNIT 2A/2C/2D, AND LBA DATA OF STORAGE UNIT 2B IS RESTORED FROM PARITY AS APPROPRIATE |
| 5 | 1 | 5 | 1 | 1 | 1 | DATA MIGRATION IS COMPLETED |

FIG.70

| STORAGE UNIT LBA | RELIABILITY DETERIORATED DATA MIGRATION SOURCE LOGICAL SLOT 1 | | | | NEW DISK DATA MIGRATION DESTINATION LOGICAL SLOT1 | BEHAVIOR DURING READ |
|---|---|---|---|---|---|---|
| | LOGICAL SLOT 0 STORAGE UNIT 2A | LOGICAL SLOT 1 STORAGE UNIT 2B | LOGICAL SLOT 2 STORAGE UNIT 2C | LOGICAL SLOT 3 STORAGE UNIT 2D (FAILURE) | STORAGE UNIT 3 | |
| 0 | D(0) | D(1)old | D(2) | P(0, 2)new (FAILURE) | D(1)new | D(0), D(2) DO NOT NEED TO BE RESTORED READ D(1) FROM DATA MIGRATION DESTINATION STORAGE UNIT 3 |
| 1 | D(3) | D(4) | P(3, 5) | D(5) (FAILURE) | - | D(3), D(4) DO NOT NEED TO BE RESTORED D(5) IS RESTORED BY XORING D(3), D(4), AND P(3,5) |
| 2 | D(6) | P(6, 8)old | D(7)new | D(8) (FAILURE) | P(6, 8)new | D(6), D(7) DO NOT NEED TO BE RESTORED D(8) IS RESTORED BY XORING D(6), D(7)new, AND P(6,8)new |
| 3 | P(9, 11) | D(9) | D(10) | D(11) (FAILURE) | - | D(9), D(10) DO NOT NEED TO BE RESTORED D(11) IS RESTORED BY XORING D(9), D(10), AND P(9,11) |
| 4 | D(12) | D(13) | D(14) | P(12, 14) (FAILURE) | - | NOT NEED TO BE RESTORED |
| 5 | D(15) | D(16)old | P(15, 17)new | D(17) (FAILURE) | D(16)new | D(15) DOES NOT NEED TO BE RESTORED D(16) IS READ FROM DATA MIGRATION DESTINATION STORAGE UNIT 3B D(17) IS RESTORED BY XORING D(15), D(16)new, AND P(15,17)new |
| ... | ... | ... | ... | ... | ... | |

FIG.71

| STORAGE UNIT LBA | LOGICAL SLOT 0 | RELIABILITY DETERIO- RATED BACKUP SOURCE LOGICAL SLOT 1 | RELIABILITY DETERIO- RATED BACKUP SOURCE LOGICAL SLOT 2 | LOGICAL SLOT 3 | NEW DISK DATA MIGRATION DESTINATION LOGICAL SLOT 1 | NEW DISK DATA MIGRATION DESTINATION LOGICAL SLOT 2 | BEHAVIOR DURING READ |
|---|---|---|---|---|---|---|---|
| | STORAGE UNIT 2A | STORAGE UNIT 2B | STORAGE UNIT 2C | STORAGE UNIT 2D (FAILURE) | STORAGE UNIT 3B | STORAGE UNIT 3C | |
| 0 | D(0) | D(1)old | D(2) | P(0, 2)new (FAILURE) | D(1)new | - | D(0), D(2) DO NOT NEED TO BE RESTORED READ D(1) FROM DATA MIGRATION DESTINATION 3B |
| 1 | D(3) | D(4) | P(3, 5) | D(5) (FAILURE) | - | - | D(3), D(4) DO NOT NEED TO BE RESTORED D(5) IS RESTORED BY XORING D(3), D(4), AND P(3,5) |
| 2 | D(6) | P(6, 8)old | D(7)old | D(8) (FAILURE) | P(6, 8)new | D(7)new | D(6) DOES NOT NEED TO BE RESTORED D(7) IS READ FROM DATA MIGRATION DESTINATION 3C D(8) IS RESTORED BY XORING D(6), D(7)new, AND P(6,8)new |
| 3 | P(9, 11) | D(9) | D(10) | D(11) (FAILURE) | - | - | D(9), D(10) DO NOT NEED TO BE RESTORED D(11) IS RESTORED BY XORING D(9), D(10), AND P(9,11) |
| 4 | D(12) | D(13) | D(14) | P(12, 14) (FAILURE) | - | - | NOT NEED TO BE RESTORED |
| 5 | D(15) | D(16)old | P(15, 17)old | D(17) (FAILURE) | D(16)new | P(15, 17) new | D(15) DOES NOT NEED TO BE RESTORED D(16) IS READ FROM DATA MIGRATION DESTINATION STORAGE UNIT 3B D(17) IS RESTORED BY XORING D(15), D(16)new, AND P(15,17)new |
| ⋮ | ⋮ | ⋮ | ⋮ | ⋮ | ⋮ | ⋮ | |

FIG.72

| STORAGE UNIT LBA | DATA MIGRATION SOURCE LOGICAL SLOT 1 | | | | DATA MIGRATION DESTINATION LOGICAL SLOT 1 | BEHAVIOR DURING READ |
|---|---|---|---|---|---|---|
| | LOGICAL SLOT 0 STORAGE UNIT 2A | STORAGE UNIT 2B | LOGICAL SLOT 2 STORAGE UNIT 2C | LOGICAL SLOT 3 STORAGE UNIT 2D | STORAGE UNIT 3 | |
| 0 | D(0) | D(1)old | D(2)UECC | P(0, 2)new | D(1)new | ECC CORRECTION INABILITY ERROR IN READ OF ALBA=2 →RESTORED BY XORING D(0), D(1)new, AND P(0, 2)new |
| 1 | D(3) | D(4) | P(3, 5) | D(5) | - | |
| 2 | D(6) | P(6, 8)old | D(7)new | D(8)UECC | P(6, 8)new | ECC CORRECTION INABILITY ERROR IN READ OF ALBA=7 →RESTORED BY XORING D(6), D(7)new, AND P(6,8)new |
| 3 | P(9, 11) | D(9)UECC | D(10) | D(11) | - | ECC CORRECTION INABILITY ERROR IN READ OF ALBA=9 →RESTORED BY XORING D(10), D(11), AND P(9,11) |
| 4 | D(12) | D(13) | D(14) | P(12, 14) | - | |
| 5 | D(15) | D(16)old | P(15, 17)new | D(17) | D(16)new | |
| ... | ... | ... | ... | ... | ... | |

FIG.75

STATUS TABLE 650

| LOGICAL DRIVE ADDRESS | DISK ID | LOGICAL DRIVE STATUS | DISK STATUS |
|---|---|---|---|
| A | a | NORMAL STATE | 1 (NORMAL STATE) |
| B | b1 | IN DATA MIGRATION | 3 (DATA MIGRATION SOURCE) |
| B | b2 | IN DATA MIGRATION | 4 (DATA MIGRATION DESTINATION) |
| C | c | NORMAL STATE | 1 (NORMAL STATE) |

INFORMATION PROCESSING SYSTEM HAVING A DATA MIGRATION LOG

CROSS-REFERENCE TO RELATED APPLICATION

This application is a continuation of PCT international application Ser. No. PCT/JP2013/073859 filed on Aug. 29, 2013 which designates the United States and claims the benefit of priority from Japanese Patent Application No. 2013-055548 filed on Mar. 18, 2013; the entire contents of which are incorporated herein by reference.

FIELD

Embodiments described herein relate to an information processing system for migrating data of a first storage unit to a second storage unit.

BACKGROUND

When a secondary storage device for a personal computer or a server is configured using a flash memory, in some case, there are a defective block that cannot be used as a storage area or a defective area that cannot be read because, for example, errors often occur. When the number of defective blocks or the number of defective areas exceeds an upper limit value, because a new defective block or defective area cannot be registered, write of write-requested data in a flash memory cannot be guaranteed. Therefore, when the number of defective blocks or the number of defective areas exceeds the upper limit value, even if there is a free area in the flash memory, write of data is suddenly disabled.

Therefore, there is a method of monitoring deterioration of a storage device and limiting write of data from an information processing device to the storage device before the life end of the storage device. With this method, it is possible to back up user data in another storage device and migrate the user data before the life end of the storage device and prevent a data loss due to the life end of the storage device.

However, this method is complicated because work for backing up the user data in the other storage device has to be performed. Further, because data write in the original storage device for backup is limited by the information processing device, it is likely that the operation of various application programs loaded in the information processing device is limited and processing speed of the application programs falls.

BRIEF DESCRIPTION OF THE DRAWINGS

FIG. 14 is a diagram of management information of the SSD;

FIG. 21 is a flowchart for explaining an operation procedure in performing NAND GC;

FIG. 27A and FIG. 27B are diagram of SMART information serving as an example of statistical information;

FIG. 41 is a diagram of a logical drive status table;

FIG. 50 is a diagram of a data migration log;

FIG. 57 is a diagram of transition of states of the logical drive that takes places when a storage unit has reached the life end;

FIG. 59 is a diagram for explaining a transformation method for an array LBA (ALBA) and a storage unit LBA (SLBA) in a normal state;

FIG. 60 is a diagram for explaining a transformation method for the array LBA (ALBA) and the storage unit LBA (SLBA) immediately after migration state transition;

FIG. 61 is a diagram of a data migration log;

FIG. 69 is a diagram of transition of statuses of storage units;

FIG. 70 is a diagram of an example in which a data migrating state of one storage unit and a failure of another storage unit simultaneously occur;

FIG. 71 is a diagram of an example in which a data migrating state of two storage units and a failure of another storage unit simultaneously occur;

FIG. 72 is a diagram of an example in which, in a data migrating state of one storage unit, an uncorrectable ECC error occurs in another storage unit;

FIG. 75 is a diagram of a status table;

DETAILED DESCRIPTION

According to an embodiment, an information processing system includes a first storage unit including a readable and writable first memory, a second storage unit including a readable and writable second memory, an information processing device connectable to the first storage unit and the second storage unit, and a data migration log area. The information processing device includes a control unit. The control unit executes first processing for determining a storage status of the first storage unit based on reliability information acquired from the first storage unit. The control unit executes second processing for, when the storage status of the first storage unit is recognized as a protected state by the first processing, executing write on only the second storage unit of the first and second storage units, when a read target address is recorded in the data migration log area, executing read data from the second storage unit and, when the read target address is not recorded in the data migration log area, executing read data from the first storage unit. The control unit executes third processing for recording an address of data written in the second storage unit in the data migration log area according to the write by the second processing. The control unit executes fourth processing for, when the storage status of the first storage unit is not recognized as the protected state by the first processing, executing read data from the first storage unit without reading from the data migration log area.

Information processing system according to embodiments are explained in detail below with reference to the accompanying drawings. The invention is not limited by the embodiments.

First Embodiment

Configuration of a System

Figure 1:
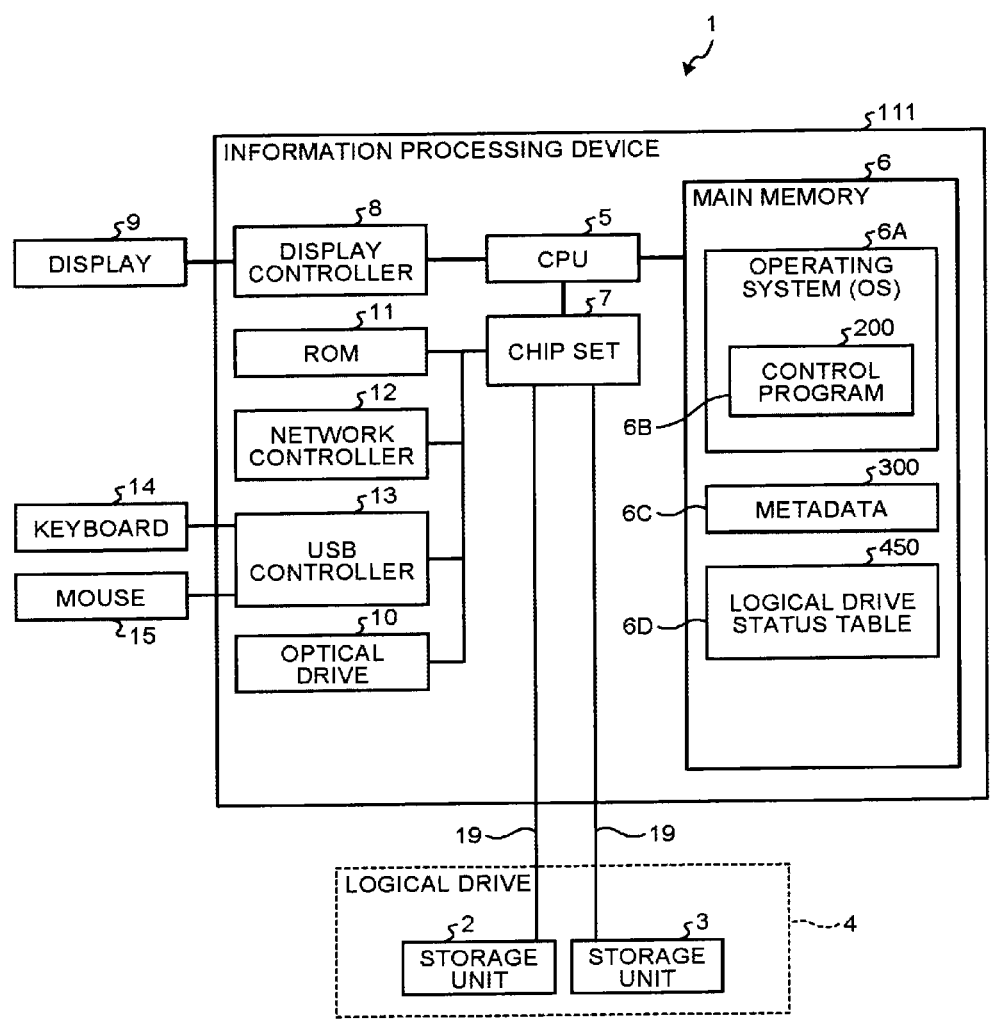
FIG. 1 is a block diagram of a functional configuration example of an information processing system in a first embodiment.

The configuration of a computer system, which is an example of an information processing system, in a first embodiment is shown in FIG. 1. An information processing system 1 includes an information processing device 111, one or a plurality of storage units, and an interface 19 configured to connect the information processing device 111 and the storage units. In this embodiment, a SSD (Solid State Drive), which is a nonvolatile storage device, is used as the storage unit. However, the storage unit can be other storage devices such as a hard disk drive (HDD), a hybrid drive, a SD card, a USB memory, a NAND flash memory chip, a magnetic tape, an embedded Multi Media Card (eMMC), and a storage device and a memory node described in United States Patent Application Publication No. 2012/0117354. A plurality of storage areas included in one storage device can be respectively used as separate storage units. In the following explanation in this embodiment, a SATA (Serial Advanced Technology Attachment) interface is used as the interface 19. However, a PCI Express (Peripheral Component Interconnect Express, PCIe), a USB (Universal Serial Bus), a SAS (Serial Attached SCSI), a Thunderbolt (registered trademark), an Ethernet (registered trademark), a Fibre channel, and the like can be used. A CPU (a control circuit) 5 is a central processing unit in the information processing device 111. Various calculations and controls in the information processing device 111 are performed by the CPU 5. The CPU 5 and a chip set 7 are connected by an interface such as a DMI (Direct Media Interface). The CPU 5 performs control of a storage unit 2 and an optical drive 10 such as a DVD drive via the chip set 7. The CPU 5 performs control of a main memory 6. As the main memory 6, for example, a DRAM (Dynamic Random Access Memory), a MRAM (Magnetoresistive Random Access Memory), a ReRAM (Resistance Random Access Memory), and a FeRAM (Ferroelectric Random Access Memory) can be adopted.

A user performs control of the information processing device 111 through an input device such as a keyboard 14 or a mouse 15. A signal from the keyboard 14 or the mouse 15 is processed by the CPU 5 via, for example, a USB (Universal Serial Bus) controller 13 and the chip set 7. The CPU 5 sends image data and text data to a display (a display device) 9 via a display controller 8. The user can visually recognize, via the display 9, the image data and the text data sent from the information processing device 111.

The CPU 5 is a processor provided to control the operation of the information processing device 111. The CPU 5 executes, for example, an operating system (OS) 100 loaded from the storage unit 2 to the main memory 6. Further, when the optical drive 10 enables execution of at least one of read processing and write processing on an inserted optical disk, the CPU 5 executes the processing. The CPU 5 executes UEFI (Unified Extensible Firmware Interface) firmware, a system BIOS (Basic Input/Output System), and the like stored in a ROM 11. The UEFI firmware and the system BIOS are programs for hardware control in the information processing device 111. Besides, the CPU 5 controls a network controller 12 via the chip set 7. As the network controller 12, there are, for example, a LAN (Local Area Network) controller and a wireless LAN controller.

The main memory 6 temporarily stores a program and data and functions as a work memory of the CPU 5. The main memory 6 includes a storage area 6A for storing the OS 100 and a storage area 62 for storing a control program 200. As generally known as, for example, Windows (registered trademark), the OS 100 is a program for managing the entire information processing device 111, for example, managing an input and output device of the information processing device 111, managing a storage unit and a memory, and performing control for enabling software to use hardware and a storage device of the information processing device 111. In an example explained in this embodiment, the control program 200 is a part of the OS 100. However, the control program 200 and the OS 100 can be independent programs. In this embodiment, the control program 200 is explained as a program read to the main memory 6 via the interface 19 and executed. However, the control program 200 can be stored in the ROM 11 and operate as a part of the UEFI firmware or the system BIOS. The control program 200 can be implemented in the information processing device 111 as hardware. In the main memory 6, metadata 300 and a logical drive status table 450 are stored.

The display controller 8 is a video reproduction controller configured to control the display 9 of the information processing device 111. The chip set 7 is a bridge device connected to a local bus of the CPU 5. The chip set 7 controls the storage unit 2 and a storage unit 3, which are storage devices configured to store various kinds of software and data, via the interface 19. The storage unit 2 and the storage unit 3 can be connected to the CPU 5 through the chip set 7 or can be directly connected to the CPU 5.

The information processing device 111 accesses the storage unit 2 and the storage unit 3 in a unit of a logical sector. A write command (a write request), a read command (a read request), a flash command, and the like are input to the storage unit 2 and the storage unit 3 via the interface 19.

Figure 2:
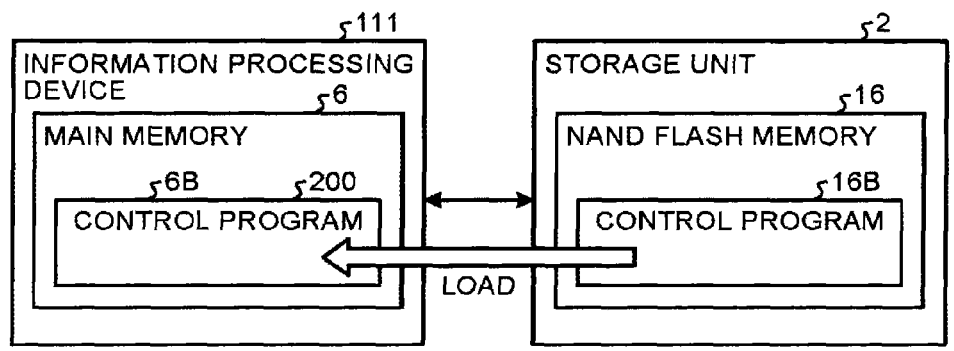
FIG. 2 is a block diagram of a functional configuration example of the information processing system in storing a control program in a SSD.
Figure 3:
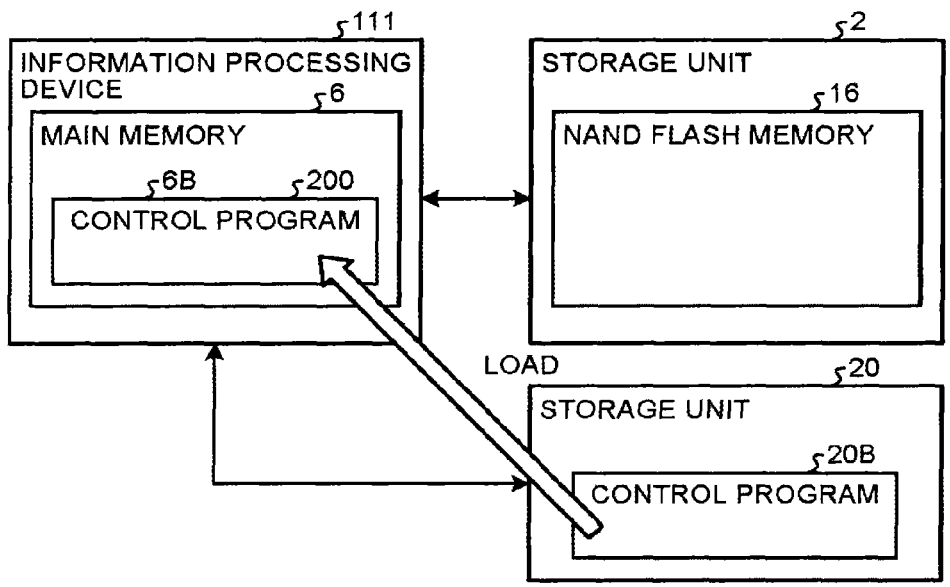
FIG. 3 is a block diagram of a functional configuration example of the information processing system in storing the control program in another external storage device.

The chip set 7 also has a function for subjecting the ROM 11, the optical drive 10, the network controller 12, and the USB controller 13 to access control. The keyboard 14 and the mouse 15 are connected to the USE controller 13. Form of a control program In this embodiment, for example, as shown in FIG. 2, when the information processing device 111 is off, the control program 200 is stored in an area 16B of a NAND flash memory (a NAND memory) 16 of the storage unit 2. As shown in FIG. 2, when the information processing device 111 starts or a program starts, the control program 200 is loaded from the area 16B of the NAND memory 16 to an area 6B on the main memory 6. On the other hand, when a plurality of storage units are connected to the information processing device 111, for example, when a storage unit 20 separate from the storage unit 2 and the storage unit 3 is connected to the information processing device 111, as shown in FIG. 3, the control program 200 can be stored in an area 20B of the storage unit 20. Then, when the information processing device 111 starts or the program starts, the control program 200 is loaded from the area 20B to the area 6B on the main memory 6. In particular, when the storage unit 20 is used as a system drive configured to store an OS and the storage unit 2 is used as a data drive configured to store user data such as a document, still image data, and moving image data, it is desirable to store the control program 200 in the storage unit 20, which functions as a system drive, in terms of clearly distinguishing roles of the storage unit 2 and the storage unit 20. For example, the storage unit 20 functioning as the system drive is used as a storage drive configured to mainly store an OS and an application program and the storage unit 2 functioning as the data drive is used as a storage drive configured to store user data.

In terms of saving labor for setup of the control program 200 by the user, for example, as shown in FIGS. 2 and 3, it is desirable that the information processing system 1 is shipped from a manufacturer, displayed in a shop, and delivered to the user in a state in which the control program 200 is stored in the storage unit 2 or the storage unit 20. On the other hand, in terms of enabling the user to select propriety of installation of the control program 200 and in terms of enabling a latest control program to be provided to the user, it is desirable that the control program 200 can be stored in the storage unit 2 or the storage unit 20 by download from a WEB or installation from an external storage medium, such as a DVD-ROM or a USB memory.

Figure 4:
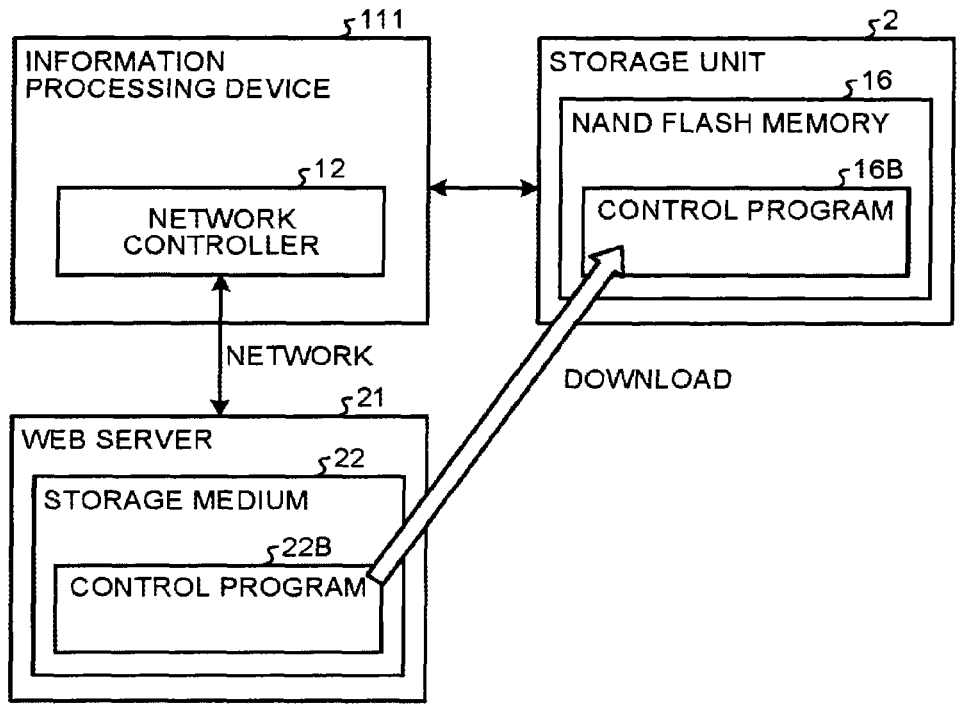
FIG. 4 is a block diagram of a functional configuration example of the information processing system in installing the control program from a WEB.

FIG. 4 is an example of the download from the WEB. The control program 200 is stored in an area 22B of a storage medium 22 in a WEB server 21. The control program 200 is downloaded (or installed) in the area 16B on the NAND memory 16 of the storage unit through, for example, the network controller 12 via a network such as the Internet, a local network, or a wireless LAN. As the storage medium 22, for example, a SSD, a HDD, a hybrid drive, or a magnetic tape is used. In the case of FIG. 3, the control program 200 is downloaded to or installed in the area 20B on the storage unit 20.

Figure 5:
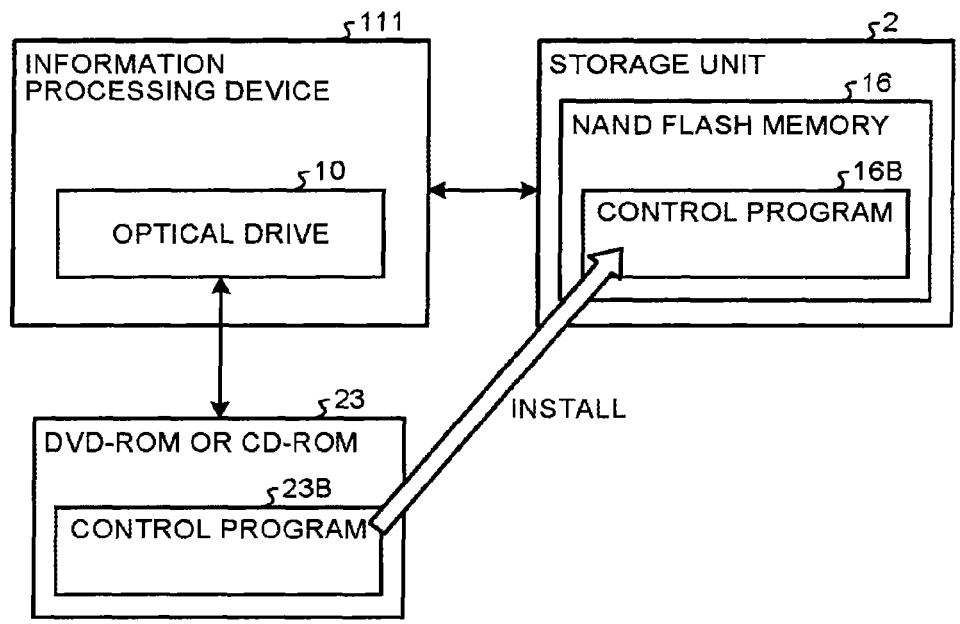
FIG. 5 is block diagram of a functional configuration example of the information processing system in installing the control program from an optical drive.

FIG. 5 is an example of the installation from the optical medium. The control program 200 is stored in an optical medium 23 such as a DVD-ROM, a CD-ROM, a DVD-RW, or a Blu-ray (registered trademark) disc. When the optical medium 23 is set on the optical drive 10, the control program 200 is installed in the area 16B on the NAND memory 16 (or the area 20B) of the storage unit 2 via the optical drive 10.

Figure 6:
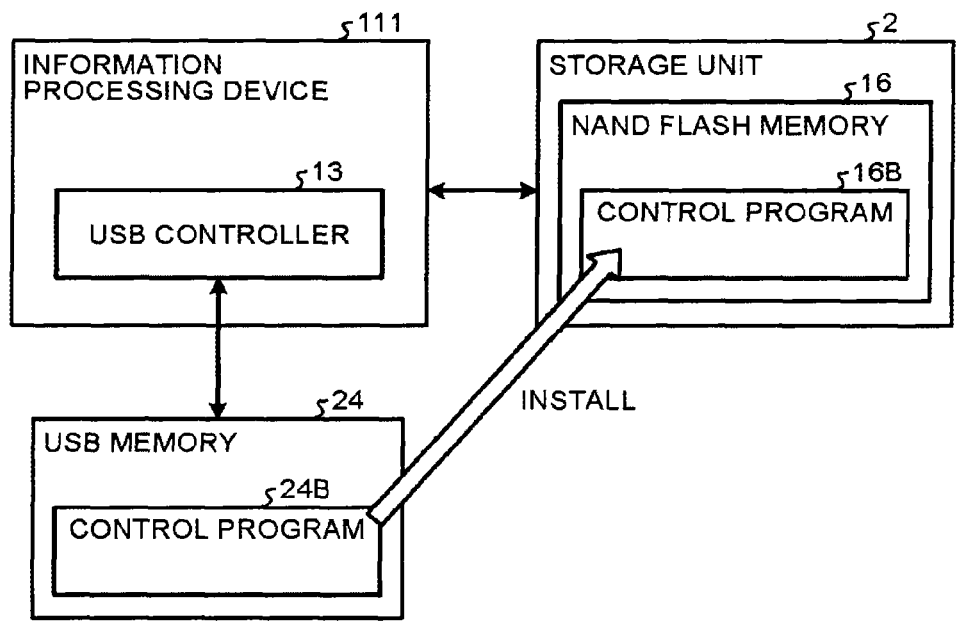
FIG. 6 is a block diagram of a functional configuration example of the information processing system in installing the control program from a USE memory.

FIG. 6 is an example of the installation from the USE memory. The control program 200 is stored in an area 24B of a USB memory 24. When the USB memory 24 is connected to the USB controller 13, the control program 200 is installed in the area 16B on the NAND memory 16 (or the area 20B) of the storage unit 2 via the USE controller 13. Naturally, other external memories such as a SD card can be used instead of the USB memory 24. In terms of easiness of acquisition by the user, it is desirable that the optical medium 23 and the USB memory 24 are packaged together with the information processing system 1 or the storage unit 2 as accessories when the information processing system 1 or the storage unit 2 is shipped. On the other hand, the optical medium 23 and the USB memory 24 can be independently sold as software commodities or can be attached as supplements of a magazine or a book.

Hierarchical Structure of Software

Figure 7:
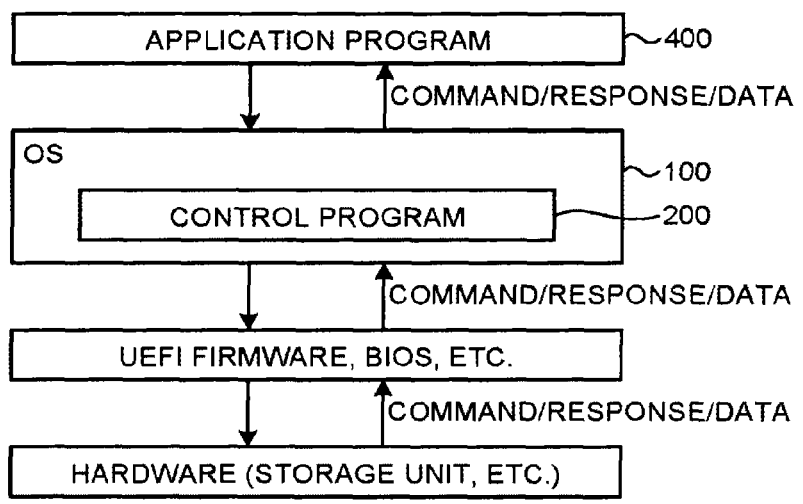
FIG. 7 is a block diagram of a hierarchical functional configuration example of the information processing device.

A Hierarchical structure in a software level of the information processing device 111 is shown in FIG. 7. Usually, an application program 400 loaded on the main memory 6 does not directly communicate with storage units such as the storage unit 2 and the storage unit 3 and communicates with the storage units through the OS 100 loaded to the main memory 6. The OS 100 communicates with the storage units through the UEFI firmware or the system BIOS. Before life end processing (processing at the end of the storage unit's life or Lifespan-reached processing) explained below, the OS 100 recognizes the storage unit 2 as a logical drive 4 (see FIG. 38) functioning as a logical unit and notifies the application program 400 of the logical drive 4 as an accessible storage drive. When the application program 400 needs to transmit a command such as a read request or a write request to the logical drive 4, the application program 400 transmits a request for access to the logical drive in a file unit to the OS 100. The OS 100 refers to the metadata 300 stored in the main memory 6, specifies a logical address (LBA: Logical block Address) of the storage unit 2 corresponding to the access-requested file, and transmits the command, the LBA, and data to the storage unit 2 via the interface 19. Upon receiving a response from the storage unit 2, the OS 100 transmits a response to the application program 400. When the logical drive 4 changes to a migration state explained below, the OS 100 recognizes the storage unit 2 and the storage unit 3 as the logical drive 4.

Configuration of the Information Processing Device

Figure 8:
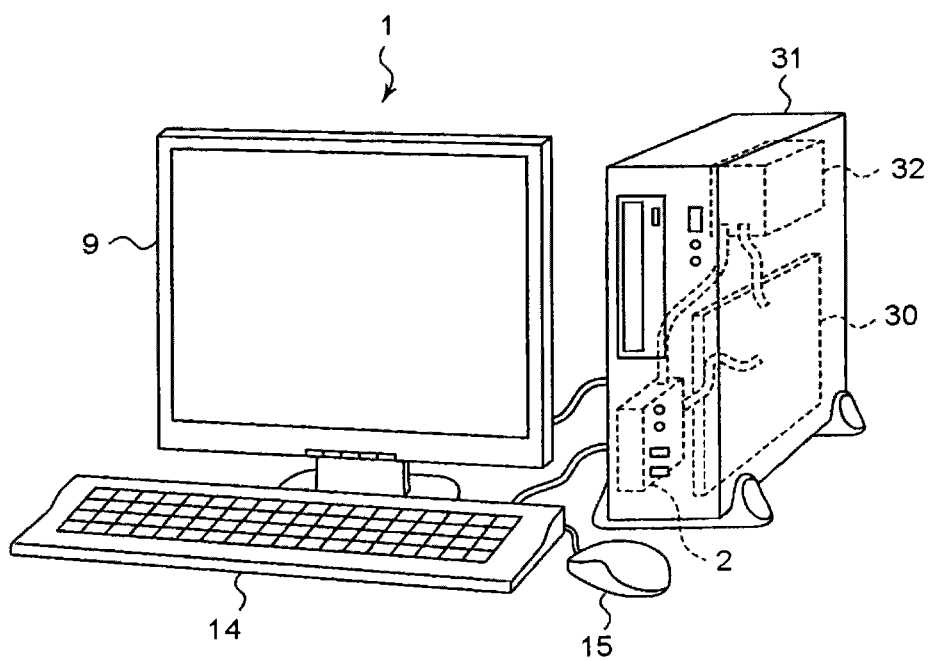
FIG. 8 is a diagram of an external configuration of the information processing system.

A configuration example of the information processing system 1 is explained. FIG. 8 is a schematic diagram of a desktop computer functioning as the information processing system 1. The desktop computer includes a computer main body 31, the display 9, the keyboard 14, and the mouse 15. The computer main body 31 includes a motherboard 30 mounted with main hardware, the storage unit 2, and a power supply device 32. The storage unit 2 is physically connected to the motherboard 30 via a SATA cable and electrically connected to, via the chip set 7 mounted on the motherboard 30, the CPU 5 also mounted on the motherboard. The power supply device 32 generates various kinds of electric power used in the desktop computer and supplies the electric power to the motherboard 30, the storage unit 2, and the like via a power supply cable. The storage unit 3 can be physically connected to the motherboard 30 via the SATA cable. Consequently, the storage unit 3 is electrically connected to, via the chip set 7 mounted on the motherboard 30, the CPU 5 also mounted on the motherboard.

Figure 9:
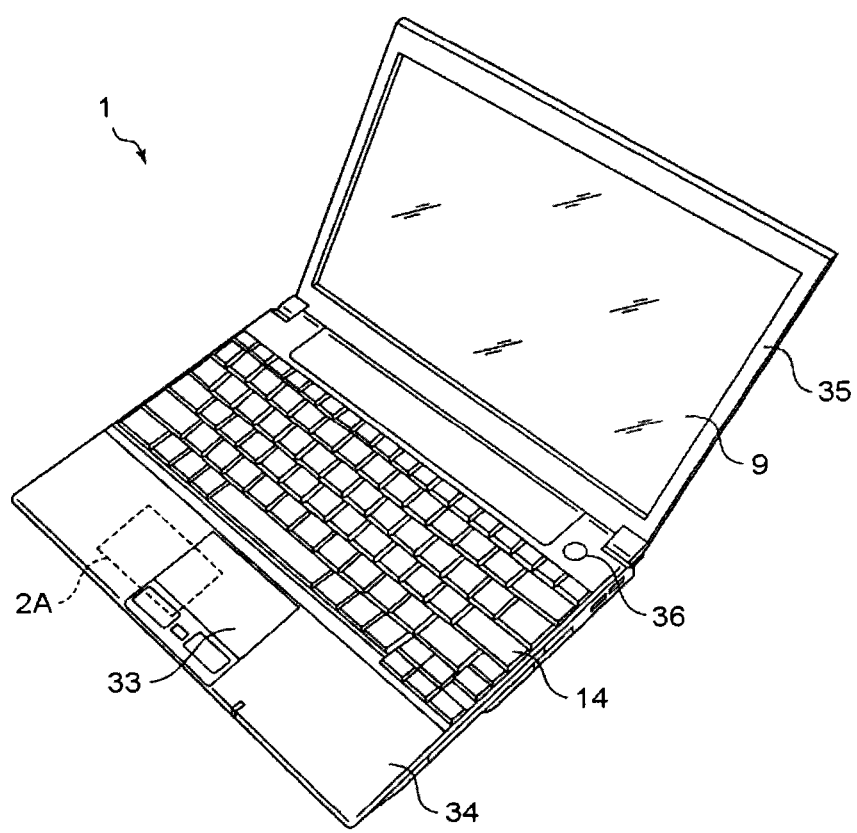
FIG. 9 is a diagram of another external configuration of the information processing system.

FIG. 9 is a schematic diagram of a portable computer functioning as the information processing system 1. The portable computer includes a computer main body 34 and a display unit 35. In the display unit 35, a display device 9 configured by, for example, an LCD (Liquid Crystal Display) is incorporated. The display unit 35 is attached to the computer main body 34 to be capable of pivoting between an open position where the upper surface of the computer main body 34 is exposed and a closed position where the upper surface of the computer main body 34 is covered. The computer main body 34 includes a thin box-like housing. A power switch 36, the keyboard 14, a touch pad 33, and the like are arranged on the upper surface of the computer main body 34. As in the desktop computer, the computer main body 34 includes the storage unit 2, a motherboard, and a power supply device.

The information processing system 1 applied with the present invention can be, besides the above, an image pickup apparatus such as a still camera or a video camera or can be a tablet computer, a smart phone, a game apparatus, a car navigation system, a printer apparatus, a scanner apparatus, a server system, or the like.

Configuration of the Storage Device (1)

The configuration of the storage unit 2 is explained. In the explanation in this embodiment, a main component of the storage unit 2 is the NAND memory 16. In the explanation in this embodiment, the storage unit 2 and the storage unit 3 have the same configuration. On the other hand, the present invention can also be applied when the storage unit 3 has a configuration different from the configuration of the storage unit 2. For example, the storage unit 2 is a SSD including the NAND memory 16 as a main component and the storage unit 3 is a hard disk drive including a magnetic disk as a main component. It is desirable that the storage unit 2 and the storage unit 3 have stored statistical information 65 therein. However, the present invention can also be applied when the storage unit 2 has stored the statistical information 65 therein and the storage unit 3 does not have stored the statistical information 65 therein. It is desirable that the storage capacity of the storage unit 3, which is a data migration destination, is equal to or larger than the storage capacity of the storage unit 2, which is a data migration source. However, the present invention can also be applied when the storage capacity of the storage unit 3 is smaller than the storage capacity of the storage unit 2.

Configuration of the NAND Memory

Figure 10:
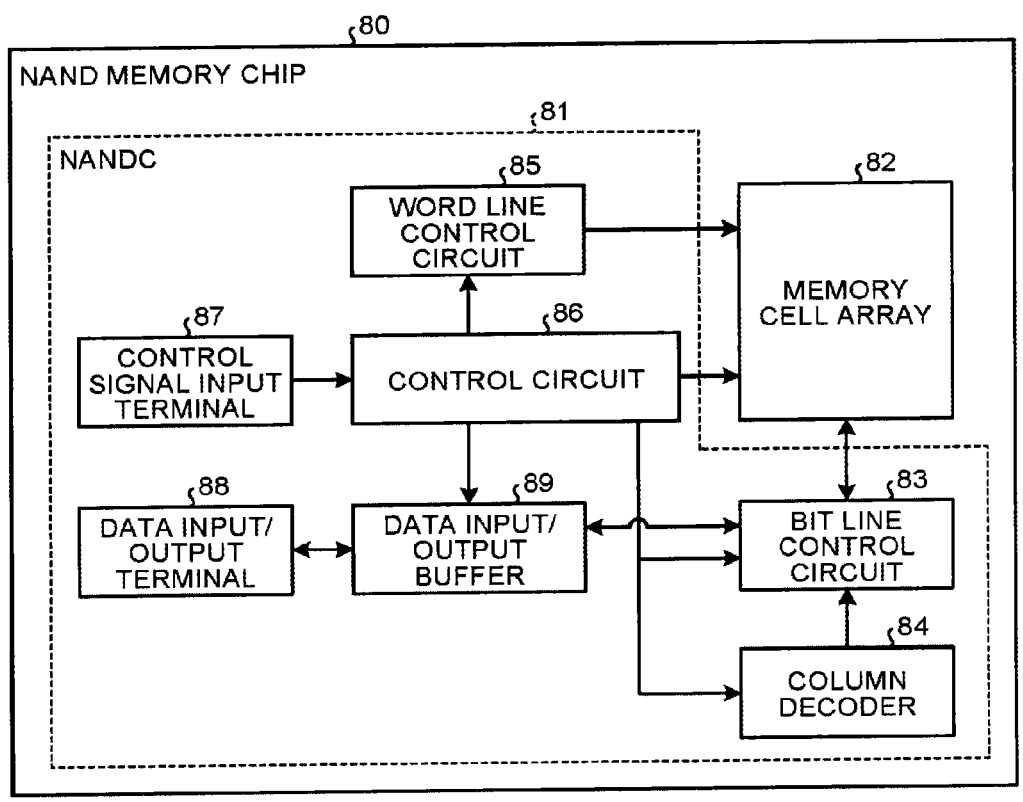
FIG. 10 is a block diagram of a functional configuration example of a NAND memory chip.

In FIG. 10, an internal configuration example of a NAND memory chip 80 included in the NAND memory 16 used as components of the storage unit 2 and the storage unit 3 in this embodiment is shown. The NAND memory 16 includes one or a plurality of NAND memory chips 80.

The NAND memory chip 80 includes a memory cell array in which a plurality of memory cells are arrayed in a matrix shape. A memory cell transistor included in the memory cell array is configured by a MOSFET (Metal Oxide Semiconductor Field Effect Transistor) having a stacked gate structure formed on a semiconductor substrate. The stacked gate structure includes a charge storage layer (a floating gate electrode) formed on the semiconductor substrate via a gate insulating film and a control gate electrode formed on the floating gate electrode via an inter-gate insulating film. A threshold voltage of the memory cell transistor changes according to the number of electrons accumulated in the floating gate electrode. The memory cell transistor stores data according to a difference in the threshold voltage.

In the explanation in this embodiment, the respective memory cells adopt a write system of a four-level store method for 2 bit/cell for writing data using an upper page and a lower page. However, the essence of the present invention is the same when the memory cells adopts a write system of a two-level store method of 1 bit/cell for writing data using a single page, a write system of an eight-level store method for 3 bit/cell for writing data using an upper page, a middle page, and a lower page, or a write system of a write system of a multi-level store method for 4 bit/cell or more. The memory cell transistor is not limited to the structure including the floating gate electrode and can be a structure such as a MONOS (Metal-Oxide-Nitride-Oxide-Silicon) type that can adjust a threshold voltage by trapping electrons on a nitride interface functioning as a charge storage layer. Similarly, the memory cell transistor of the MONOS type can be configured to store one bit or can be configured to store a multi-level. The memory cell transistor can be, as a nonvolatile storage medium, a semiconductor storage medium in which memory cells are three-dimensionally arranged as described in U.S. Pat. No. 8,189,391, United States Patent Application Publication No. 2010/0207195, and United States Patent Application Publication No. 2010/0254191.

As shown in FIG. 10, the NAND memory chip 80 includes a memory cell array 82 configured by arranging memory cells for storing data in a matrix shape. The memory cell array 82 includes a plurality of bit lines, a plurality of word lines, and a common source line. Electrically data-rewritable memory cells are arranged in a matrix shape at intersections of the bit lines and the word lines. A bit line control circuit 83 for controlling the bit lines and a word line control circuit 85 for controlling the word lines are connected to the memory cell array 82. That is, the bit line control circuit 83 reads data of the memory cells in the memory cell array 82 via the bit lines and applies a write control voltage to the memory cells in the memory cell array 82 via the bit lines and writes data in the memory cells.

A column decoder 84, a data input/output buffer 89, and a data input/output terminal 88 are connected to the bit line control circuit 83. The data of the memory cells read from the memory cell array 82 is output to the outside from the data input/output terminal 88 via the bit line control circuit 83 and the data input/output buffer 89. Write data input to the data input/output terminal 88 from the outside is input to the bit line control circuit 83 by the column decoder 84 via the data input/output buffer 89 and written in designated memory cells.

The memory cell array 82, the bit line control circuit 83, the column decoder 84, the data input/output buffer 89, and the word line control circuit 85 are connected to a control circuit 86. The control circuit 86 generates, according to a control signal input to the control signal input terminal 87, control signals and control voltages for controlling the memory cell array 82, the bit line control circuit 83, the column decoder 84, the data input/output buffer 89, and the word line control circuit 85. A circuit section other than the memory cell array 82 in the NAND memory chip 80 is referred to as NAND controller (NANDC) 81.

Figure 11:
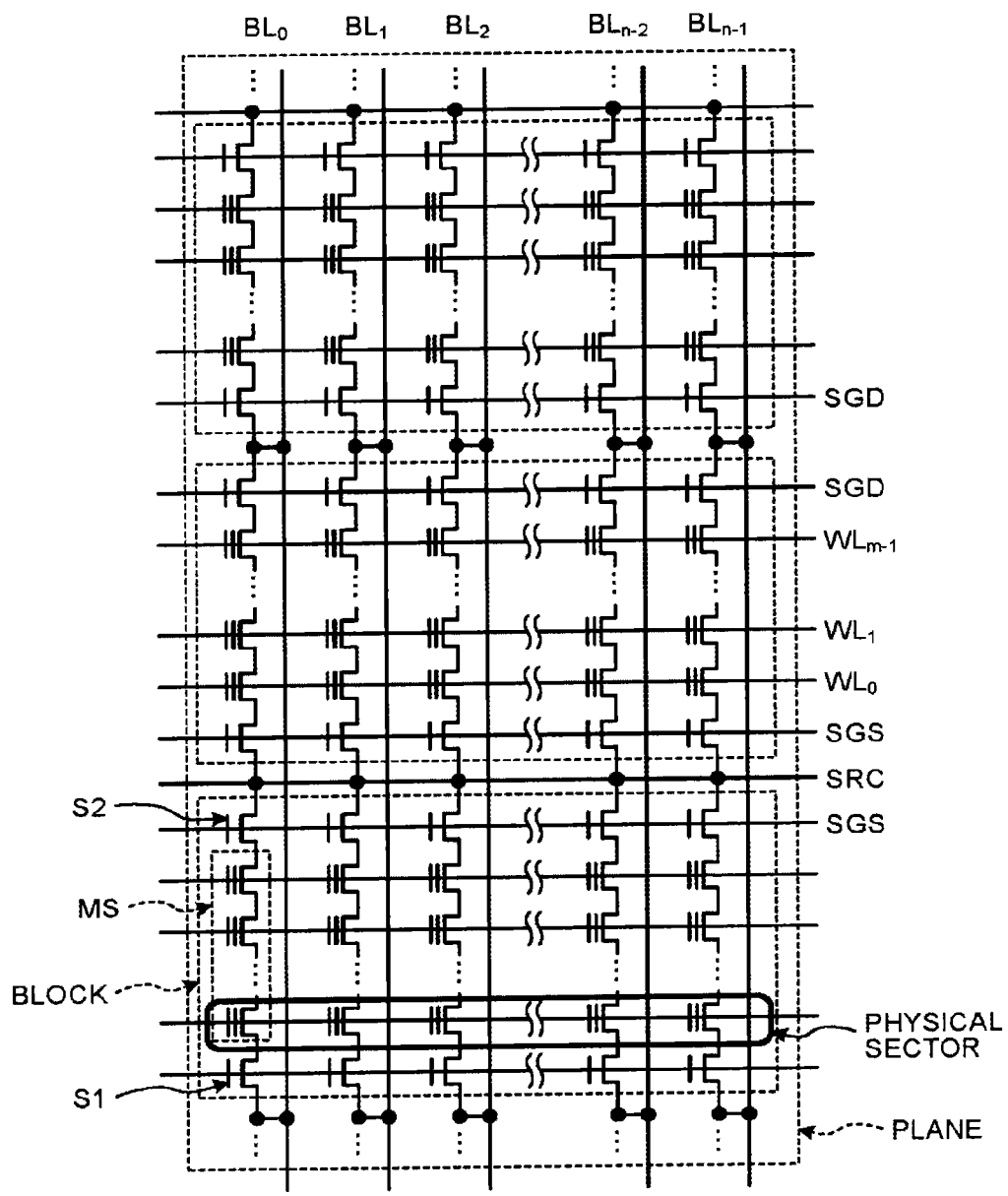
FIG. 11 is a circuit diagram of a configuration example of one plane included in the NAND memory chip.

FIG. 11 shows the configuration of the memory cell array 82 shown in FIG. 10. The memory cell array 82 is a NAND cell type memory cell array and is configured to include a plurality of NAND cells. One NAND cell includes a memory string MS formed by memory cells connected in series and selection gates S1 and S2 connected to both ends of the memory string MS. The selection gate S1 is connected to a bit line BL and the selection gate S2 is connected to a source line SRC. Control gates of memory cells MC arranged in the same row are connected in common to word lines WL0 to WLm-1. First selection gates S1 are connected in common to a select line SGD and second selection gates S2 are connected in common to a select line SGS.

The memory cell array 82 includes one or a plurality of planes. The plane includes a plurality of blocks. Each of the blocks includes a plurality of NAND cells. Data is erased in a unit of the block.

A plurality of memory cells connected to one word line configure one physical sector. Data is written and read for each physical sector. The physical sector is unrelated to a logical sector of the LBA explained below. In the one physical sector, for example, data equivalent to two physical pages (two pages) is stored in the case of the 2 bit/cell write system (four-level). On the other hand, in the case of the 1 bit/cell write system (two-level), for example, data equivalent to one physical page (one page) is stored in the one physical sector. In the case of the 3 bit/cell write system (eight-level), for example, data equivalent to three physical pages (three pages) is stored in the one physical sector.

During a read operation, a program verify operation, and a program operation, one word line is selected and one physical sector is selected according to a physical address such as a Row Address received from a SSDC 41 explained below. Switching of a page in the physical sector is performed according to a physical address. In this embodiment, the NAND memory 16 adopts the 2 bit/cell write system, the SSDC 41 handles the physical sector assuming that two pages, i.e., an upper page and a lower page, are allocated to the physical sector as physical pages. Physical addresses are allocated to all the pages.

Figure 12:
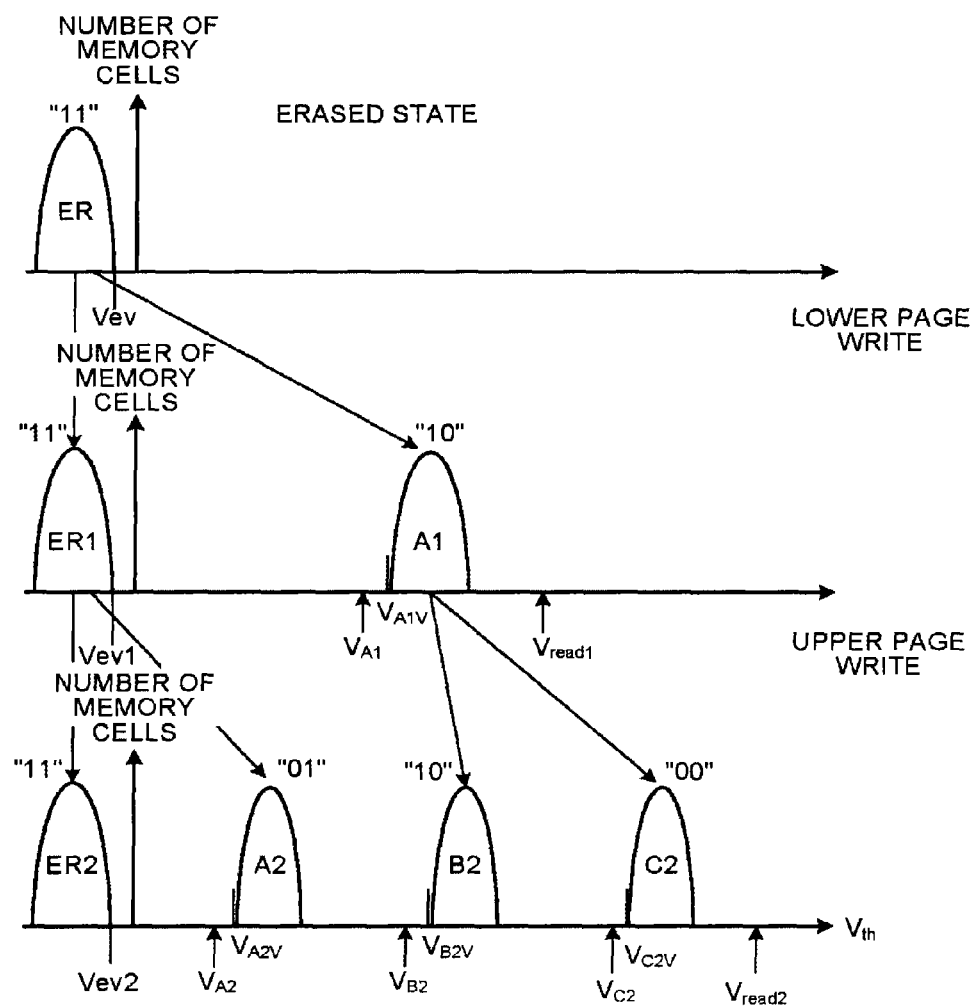
FIG. 12 is a diagram of a threshold voltage distribution in a four-level data storage method.

The four-level NAND memory of 2 bit/cell is configured such that a threshold voltage in one memory cell could have four kinds of distributions. FIG. 12 shows a relation between 2-bit four-level data (data "11", "01", "10", and "00") stored in memory cells of a four-level NAND cell type flash memory and a threshold voltage distribution of the memory cells. In FIG. 12, VA1 represents a voltage applied to a selected word line when two data are read concerning a physical sector, a lower page of which is already written and an upper page of which is not written yet. VA1V represents a verify voltage applied to check whether write is completed when write in A1 is performed.

VA2, VB2, and VC2 represent voltages applied to a selected word line when four data are read concerning a physical sector, a lower page and an upper page of which are already written. VA2V, VB2V, and VC2V represent, when write in threshold voltage distributions is performed, verify voltages applied to check whether the write is completed. Vread1 and Vread2 represent, when read of data is performed, read voltages applied to an unselected memory call in the NAND cells and conducting the unselected memory cell irrespective of retained data of the unselected memory cell. Further, Vev1 and Vev2 represent, when data of the memory cells are erased, erasing verify voltages applied to the memory cells to check whether the erasing is completed. Vev1 and Vev2 have negative values. The magnitude of Vev1 and Vev2 are determined taking into account the influence of interference of adjacent memory cells. Magnitude relations of the voltages are as follows:

$Vev1 < VA1 < VA1V < Vread1$ $Vev2 < VA2 < VA2V < VB2 < VB2V < VC2 < VC2V < Vread2$ The erasing verify voltages Vev1, Vev2, and Vev3 are negative values as explained above. However, a voltage actually applied to the control gate of the memory cell MC in the erasing verify operation is not a negative value and is zero or a positive value. That is, in the actual erasing verify operation, a positive voltage is given to a back gate of the memory cell MC and a voltage of zero or a positive value smaller than the back gate voltage is applied to the control gate of the memory cell MC. In other words, the erasing verify voltages Vev1, Vev2, and Vev3 are voltage equivalently having negative values.

An upper limit value of a threshold voltage distribution ER of the memory cell after block erasing is also a negative value. Data "11" is allocated to the memory cell. The memory cells of data "11", "01", "10", and "00" in a lower page and upper page written state respectively have positive threshold voltage distributions ER2, A2, B2, and C2 (lower limit values of A2, B2, and C2 are also positive values). The threshold voltage distribution A2 of the data "01" has a lowest voltage value, the threshold voltage distribution C2 of the data "00" has a highest voltage value, and the voltage values of the various threshold voltage distributions have a relation of A2<B2<C2. The memory cell of the data "10" in a lower page written and upper page unwritten state has a positive threshold voltage distribution A (a lower limit value of A1 is also a positive value). The threshold voltage distribution shown in FIG. 12 is only an example. The present invention is not limited to this. For example, in the explanation referring to FIG. 12, all the threshold voltage distributions A2, B2, and C2 are positive threshold voltage distributions. However, when the threshold voltage distribution A2 is a negative voltage distribution and the threshold voltage distributions B2 and C2 are positive voltage distributions, the distributions are also included in the scope of the present invention. Even if threshold voltage distributions ER1 and ER2 are positive values, the present invention is not limited to this. In this embodiment, the correspondence relation among the data of ER2, A2, B2, and C2 is "11", "01", "10", and "00". However, the correspondence relation can be another correspondence relation such as "11", "01", "00", and "10".

2-bit data of one memory cell includes lower page data and upper page data. The lower page data and the upper page data are written in the memory cell according to separate write operations, i.e., two write operations. When data is represented as "*@", * represents the upper page data and @ represents the lower page data.

First, write of the lower page data is explained with reference to first and second sections of FIG. 12. It is assumed that all the memory cells have the threshold voltage distribution ER in the erased state and store the data "11". As shown in FIG. 12, when write of the lower page data is performed, the threshold voltage distribution ER of the memory cells is divided into two threshold voltage distributions (ER1 and A1) according to a value ("1" or "0") of the lower page data. When the value of the lower page data is "1", ER1=ER because the threshold voltage distribution ER in the erased state is maintained. However, a relation between the threshold voltage distributions ER and ER1 can be ER1>ER.

On the other hand, when the value of the lower page data is "0", a high electric field is applied to tunnel oxide films of the memory cells, electrons are injected into the floating gate electrode, and the threshold voltage Vth of the memory cells is increased by a predetermined value. Specifically, the verify voltage VA1V is set and the write operation is repeated until the threshold voltage is increased to be equal to or higher than the verify voltage VA1V. As a result, the memory cells change to the written state (the data "10"). When the memory cells do not reach the threshold voltage even if the write operation is repeated a predetermined number of times (or the number of memory cells not reaching the threshold voltage is equal to or larger than a threshold value), write in the physical page is "Program Error" (Program Fail or Write Error).

Write of the upper page data is explained with reference to the second and third sections of FIG. 12. The write of the upper page data is performed based on write data (upper page data) input from the outside of the chip and lower page data already written in the memory cells.

That is, as shown in the second and third sections of FIG. 12, when a value of the update data is "1", a high electric field is not applied to the tunnel oxide films of the memory cells to prevent a rise of the threshold voltage Vth of the memory cells. As a result, the memory cells having the data "11" (the threshold voltage distribution ER1 of the erased state) maintain the data "11" (ER2) and the memory cells having the data "10" (the threshold voltage distribution A1) maintain the data "10" (B2). However, in terms of securing a voltage margin between the distributions, it is desirable to adjust a lower limit value of the threshold voltage distribution using the positive verify voltage VB2V larger than the verify voltage VA1V to thereby form a threshold voltage distribution B2 obtained by narrowing the width of the threshold voltage distribution. When the memory cells do not reach the threshold voltage even if the lower limit value adjustment is repeated a predetermined number of times (or the number of memory cells not reaching the threshold voltage is equal to or larger than the predetermined value), write in the physical page is "Program Error".

On the other hand, when the value of the upper page data is "0", a high electric field is applied to the tunnel oxide films of the memory cells, electrons are injected into the floating gate electrode, and the threshold voltage Vth of the memory cells is increased by a predetermined value. Specifically, the verify voltages VA2V and VC2V are set and the write operation is repeated until the threshold voltage is increased to be equal to or higher than the verify voltages VA2V and VC2V. As a result, the memory cells having the data "11" (the threshold voltage distribution ER1 in the erased state) change to the data "01" of the threshold voltage distribution A2 and the memory cells having the data "10" (A1) changes to the data "00" of the threshold voltage distribution C2. At this point, the verify voltages VA2V and VC2V are used and lower limit values of the threshold voltage distributions A2 and C2 are adjusted. When the memory cells do not reach the threshold voltage even if the write operation is repeated the predetermined number of times (or the number of memory cells not reaching the threshold voltage is equal to or larger than the threshold value), write in the physical page is "Program Error".

On the other hand, in an erase operation, an erasing verify voltage Vev is set and the erase operation is repeated until the threshold voltage is reduced to be equal to or lower than the verify voltage Vev. As a result, the memory cells change to the written state (the data "00"). When the memory cells do not reach the threshold voltage even if the erase operation is repeated a predetermined number of times (or the number of memory cells not reaching the threshold voltage is equal to or larger than the predetermined value), erasing for the physical page is "Erase Error" (erase fail).

An example of the data write system in the general four-level store method is explained above. In a multi-bit storage system of 3 bit/cell or more, according to higher order page data, an operation for dividing the threshold voltage distribution into eight or more kinds is only added to the operation explained above. Therefore, a basic operation is the same.

Configuration of the Storage Device (2)

Figure 13:
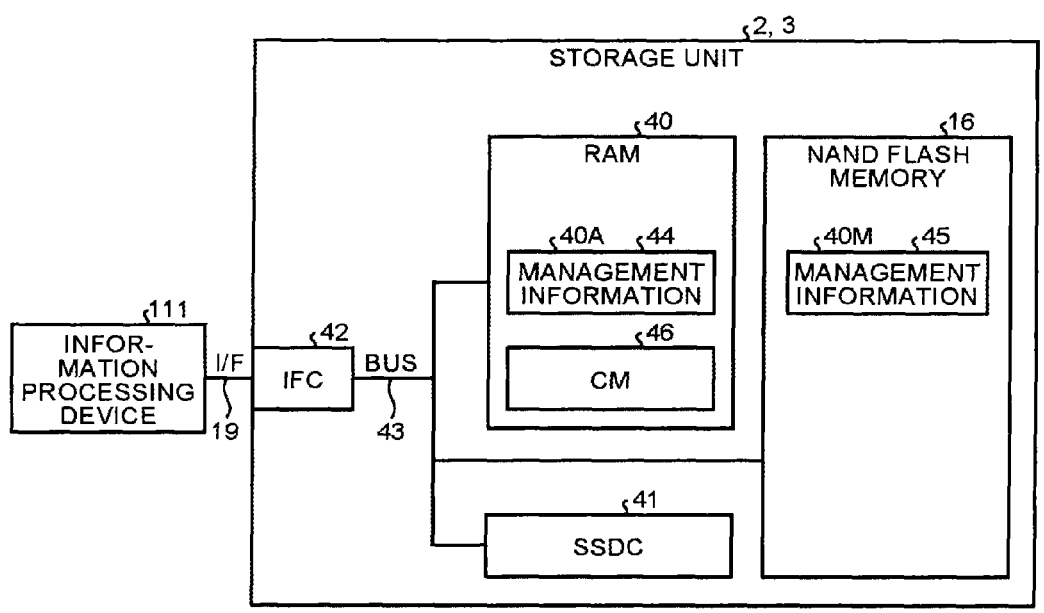
FIG. 13 is a block diagram of a functional configuration example of the SSD.

A configuration example of the storage unit 2 and the storage unit 3 is explained. In this embodiment, as shown in FIG. 13, the storage unit 2 and the storage unit 3 functioning as SSD include a NAND flash memory (hereinafter abbreviated as NAND memory) 16 functioning as a nonvolatile semiconductor memory, an interface controller (IFC) 42 configured to perform transmission and reception of signals to and from the information processing device 111 via the interface 19, a RAM (Random Access Memory) 40 functioning as a semiconductor memory including a cache memory (CM) 46 functioning as an intermediate buffer between the IFC 42 and the NAND memory 16, a SSD controller (SSDC) 41 configured to administer management and control of the NAND memory 16 and the RAM 40 and control of the interface controller 42, and a bus 43 configured to connect these components.

As the RAM 40, for example, a volatile RAM such as a DRAM (Dynamic Random Access Memory) or a SRAM (Static Random Access Memory) or a nonvolatile RAM such as a FeRAM (Ferroelectric Random Access Memory), a MRAM (Magnetoresistive Random Access Memory), a PRAM (Phase Change Random Access Memory), or a ReRAM (Resistance Random Access Memory) can be adopted. The RAM 40 can be included in the SSDC 41.

The NAND memory 16 includes a plurality of NAND memory chips 80. The NAND memory 16 stores user data designated by the information processing device 111, stores a management table for managing the user data, and stores, for backup, management information managed by the RAM 40. The NAND memory 16 includes the memory cell array 82 in which a plurality of memory cells are arrayed in a matrix shape. The respective memory cells can perform multi-level storage using an upper page and a lower page. The NAND memory 16 includes a plurality of memory chips. Each of the memory chips is configured by arraying a plurality of blocks, which are units of data erasing. In the NAND memory 16, write of data and read of data are performed for each page. The block includes a plurality of pages.

The RAM 40 includes the cache memory (CM) 46 functioning as a cache for data transfer between the information processing device 111 and the NAND memory 16. The RAM 40 functions as a memory for management information storage and a memory for work area. Management tables managed in an area 40A of the RAM 40 are various management tables stored in an area 40M of the NAND memory 16 and loaded when the storage unit 2 and the storage unit 3 are started. The management data are backed up in the area 40M of the NAND memory 16 periodically, when a standby command is received, when a flash command is received, or when a power supply is interrupted.

A function of the SSDC 41 is realized by a processor configured to execute a system program (firmware) stored in the NAND memory 16, various hardware circuits, and the like. The SSDC 41 executes, in response to various commands such as a write request, a cache flash request, and a read request from the information processing device 111, data transfer control between the information processing device 111 and the NAND memory 16, update and management of the various management table stored in the RAM 40 and the NAND memory 16, ECC decryption of data read from the NAND memory 16, and the like.

When the information processing device 111 transmits a read request or a write request to the storage unit 2, the information processing device 111 inputs an LBA serving as a logical address via the interface 19. The LBA is a logical address in which serial numbers are given to logical sectors (size: e.g., 512 Bytes) starting from 0. When the information processing device 111 issues a read request or a write request to the storage unit 2, the information processing device 111 inputs, together with the LBA, the size of a logical sector for which the read request or the write request is issued.

The IFC 42 has a function for receiving a read request, a write request, other requests, and data from the information processing device 111, transmitting the received requests and the data to the SSDC 41, and transmitting the data to the RAM 40 according to the control by the SSDC 41.

A configuration example of management information 44 used in the storage unit 2 and the storage unit 3 is shown in FIG. 14. As explained above, the management information 44 is stored in the area 40M of the NAND memory 16 in a nonvolatile manner. The management information stored in the area 40M is loaded to the area 40A of the RAM 40 and used when the storage unit 2 is started. The management information 44 in the area 40A is backed up in the area 40M periodically or when the power supply is interrupted. When the RAM 40 is a nonvolatile RAM such as a MRAM or a FeRAM, the management information 44 can be stored in only the RAM 40. Then, the management information 44 is not stored in the NAND memory 16. To reduce a write amount in the NAND memory 16, it is desirable that data stored in the management information 44 is data obtained by compressing data stored in the area 40A of the RAM 40. To reduce a write frequency in the NAND memory 16, it is desirable that update information (difference information) of the management information 44 stored in the area 40A of the RAM 40 is additionally written.

As shown in FIG. 14, the management information includes a free block table (FBT) 60, a bad block table (BT) 61, an active block table (ABT) 62, a track table (a logical-to-physical transformation table in a track unit) 63, a cluster table (a logical-to-physical transformation table in a cluster unit) 64, and statistical information 65.

Figure 15:
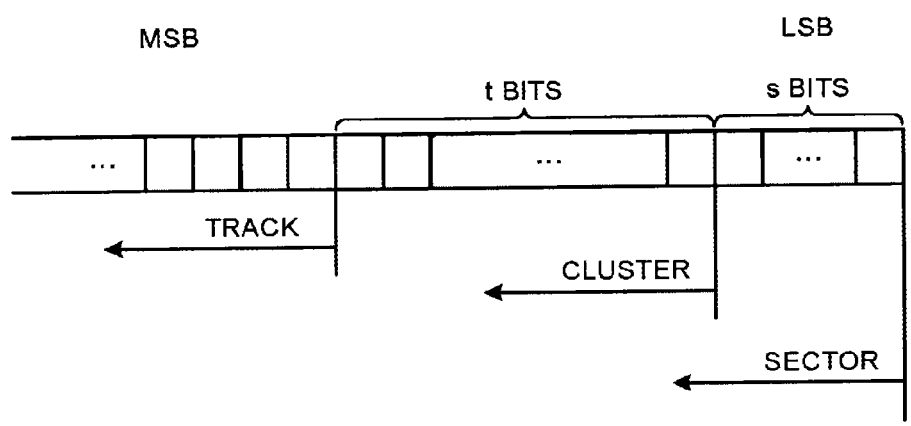
FIG. 15 is a diagram of a relation between an LBA and a management unit of the SSD.

As shown in FIG. 15, the LEA is a logical address in which serial numbers are given to logical sectors (size: e.g., 512 Bytes) starting from 0. In this embodiment, as management units for the logical address (LOA) of the storage unit 2, a cluster address configured by higher order bit rows from a lower order (s+1)th bit of the LBA and a track address configured by higher order bit rows from a lower order (s+t+1)th bit of the LBA are defined. That is, the logical sector is a minimum access unit from the information processing device 111. A cluster is a management unit for managing "small data" in the SSD. The cluster size is defined to be a natural number times as large as the logical sector size. A track is a management unit for managing "large data" in the SSD. The track size is defined to be two or a larger natural number times as large as the cluster size. Therefore, the track address is obtained by dividing the LBA by the track size. An address in the track is a remainder obtained by dividing the LBA by the track size. The cluster address is obtained by dividing the LBA by the cluster size. An address in the cluster is a remainder obtained by dividing the LBA by the cluster size. In the following explanation, for convenience, the size of the track is equal to the size of data recordable in one physical block (when a redundant bit of ECC processing performed by the SSDC 41 is included in the physical block, a size obtained by removing the redundant bit). The size of the cluster is equal to the size of data recordable in one physical page (when a redundant bit of the ECC processing performed by the SSDC 41 is included in the physical page, a size obtained by removing the redundant bit).

The free block table (FBT) 60 manages a block address (a physical block ID) of a use-unallocated physical block (a free block: FB) that can be allocated anew for write when write in the NAND memory 16 is performed. The free block table (FBT) 60 manages erase count for each physical block ID. When a physical block is erased, the free block tabled (FBT) 60 increments the erase count of the block.

The bad block table (BBT) 61 manages a block ID of a bad block (BB) serving as a physical block that cannot be used as a storage are because, for example, errors often occur. As in the FBT 60, the erase count can be managed for each physical block ID.

The active block table (ABT) 62 manages an active block (AB), which is a physical block to which a use is allocated. The active block table (ABT) 62 manages the erase count for each physical block ID. When a physical block is erased, the active block table (ABT) 62 increments the number of times of easing of the block.

The track table 63 manages a correspondence relation between a track address and a physical block ID of a physical block in which track data corresponding to the track address is stored.

The cluster table 64 manages a correspondence relation among a cluster address, a physical block ID of a physical block in which cluster data corresponding to the cluster address is stored, and a page address in the physical block in which the cluster data corresponding to the cluster address is stored.

The SSDC 41 stores, in the statistical information 65, various parameters (X01 to X32) related to the reliability of the storage unit 2 as reliability information (see FIG. 27).

Values (Raw Values) of the statistical information 65 used as an example of the reliability information include a total bad block count (statistical information X01), a total bad logical sector count (statistical information X02), a total erase count (statistical information X03), an average erase count (statistical information X04), a total program error count of the NAND memory (statistical information X05), a total erase error count of the NAND memory (statistical information X06), a total read logical sector count (statistical information X07), a total written logical sector count (statistical information X08), a total uncorrectable ECC error count (statistical information X09), a total retry read count (statistical information X10), a corrected n bit-m bit ECC event count (statistical information X11), data corruption error count of the interface 19 (statistical information X12), a link speed down shift count of the interface 19 (statistical information X13), a lane count down shift count of the interface 19 (statistical information X14), an error count of the interface 19 (statistical information X15), an error count of the RAM 40 (statistical information X16), a power on time of the storage unit 2 (statistical information X17), a power cycle count (statistical information X18), an unintentional power down count (statistical information X19), a cumulative time when temperature exceeds a maximum value of a recommended operation temperature (statistical information X20), a cumulative time when temperature falls below a minimum value of a recommended operation temperature (statistical information X21), a maximum value of a response time of a command (statistical information X22), an average value of a response time of a command (statistical information X23), a maximum value of a response time of the NAND memory (statistical information X24), an average value of a response time of the NAND memory (statistical information X25), a present temperature (statistical information X26), a highest temperature (statistical information X27), a lowest temperature (statistical information X28), system data redundancy (statistical information X29), a total of written data amount in the RAM 40 (statistical information X30), a statistical information increase ratio (statistical information X31), and a NAND GC Error Flag (statistical information X32).

The total bad block count (statistical information X01) is explained. The SSDC 41 increments the statistical information X01 by one every time one physical block of the NAND memory 16 in the storage unit 2 is added to a bad block. It is desirable that the SSDC 41 resets the statistical information X01 to zero during manufacturing (e.g., before a test process) of the storage unit 2. It is desirable that, when an error occurs in a block during the test process or when a block with a small inter-distribution margin of a threshold voltage distribution is detected, the SSDC 41 adds the block to the bad block in advance. The SSDC 41 can directly calculate the statistical information X01 from the BBT 61 without storing the statistical information X01 in the statistical information 65. A larger value of the statistical information X01 indicates that reliability is further deteriorated.

Figure 25:
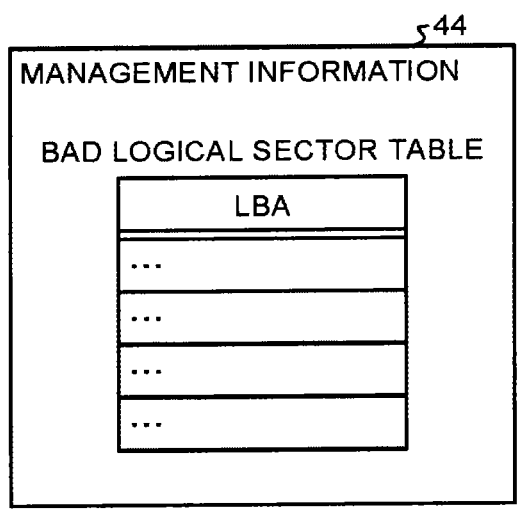
FIG. 25 is a diagram of a bad logical sector table.
Figure 26:
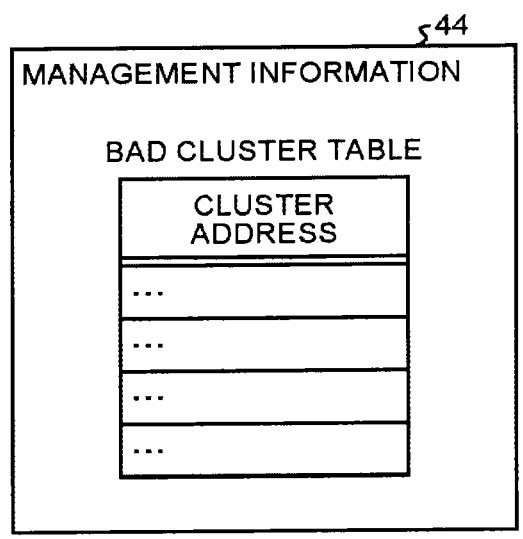
FIG. 26 is a diagram of a bad cluster table.

The total bad logical sector count (the statistical information X02) is explained. When a read command and an LBA are received from the information processing device 111 and read data cannot be subjected to ECC correction during read from the NAND flash memory 16, the SSDC 41 can register the LBA in the bad logical sector table in the management information 44 as a bad logical sector (see FIG. 25). The SSDC 41 stores the number of LBAs registered in the bad logical sector table in the statistical information 65 as the total bad logical sector count (the statistical information X02). When a read command is received from the information processing device 111, the SSDC 41 reads the bad logical sector table on the RAM 40 and searches for the received LBA in the bad logical sector table. When the LBA is found in the bad logical sector table, the SSDC 41 notifies the information processing device 111 of a read error without reading data from the NAND flash memory 16. When a write command is received from the information processing device 111 concerning the LBA of the bad logical sector and write processing is performed, the SSDC 41 deletes the written LBA from the bad logical sector table. When a delete notification is received from the information processing device 111 concerning the LBA of the bad logical sector and delete notification processing is performed, the SSDC 41 deletes the LBA subjected to the delete notification processing from the bad logical sector table. When an erase command (a Secure Erase command) for the storage unit 2 is received from the information processing device 111, the SSDC 41 erases the bad logical sector table. As the erase command for the storage unit 2, for example, an F4h Security Erase Unit command of ACS-3 or an 80h Format NVM command of NVM Express Revision 1.1 can be used. Instead of managing the bad logical sector table in an LBA unit (a logical sector unit), as shown in FIG. 26, the SSDC 41 can manage the bad logical sector table in a cluster unit as a bad cluster table. The SSDC 41 manages, as the statistical information X02, the number of LBAs registered in the bad logical sector table or the number of cluster addresses registered in the bad cluster table. The SSDC 41 can directly calculate the statistical information X02 from the bad logical sector table and the bad cluster table without storing the statistical information X02 in the statistical information 65. A larger value of the statistical information X02 indicates that reliability is further deteriorated.

The total erase count (statistical information X03) is explained. The statistical information X03 indicates a cumulative value of the erase count of all blocks of the NAND memory 16 in the storage unit 2. The SSDC 41 increments the statistical information X03 by one every time one physical block of the NAND memory 16 in the storage unit 2 is erased. It is desirable that the statistical information X03 is reset to zero during manufacturing (e.g., before a test process) of the storage unit 2. The SSDC 41 can directly calculate the statistical information X03 from the FBT 60, BBT 61, and the ABT 62 without storing the statistical information X03 in the statistical information 65. A larger value of the statistical information X03 indicates that reliability is further deteriorated.

The average erase count (the statistical information X04) is explained. The SSDC 41 calculates an average erase count per one block concerning all the blocks of the NAND memory 16 and stores the average erase count in the statistical information 65 as the statistical information X04. The SSDC 41 can exclude, from a totalization target of the statistical information X04, a part of the blocks such as a block in which the management information 44 is stored. It is desirable that the statistical information X04 is reset to zero during manufacturing (e.g., before a test process) of the storage unit 2. The SSDC 41 can directly calculate the statistical information X04 from the FBT 60, the BBT 61, and the ABT 62 without storing the statistical information X04 in the statistical information 65. The SSDC 41 can use a maximum value of the erase count or a minimum value of the erase count instead of the average erase count. A larger value of the statistical information X04 indicates that reliability is further deteriorated.

The total program error count (the statistical information X05) of the NAND memory is explained. The SSDC 41 increments (or can increment in a block unit) the statistical information X05 by one every time a program error occurs in one write unit in the NAND memory 16 in the storage unit 2. It is desirable that the statistical information X05 is reset to zero during manufacturing (e.g., before a test process) of the storage unit 2. A larger value of the statistical information X05 indicates that reliability is further deteriorated.

The total erase error count of the NAND memory (the statistical information X06) is explained. It is desirable that the statistical information X06 is reset to zero during manufacturing (e.g., before a test process) of the storage unit 2. The SSDC 41 increments the statistical information X06 by one every time an erase error occurs in one block in the NAND memory 16 in the storage unit 2. The SSDC 41 can collectively set a plurality of blocks as an erasing unit and increment the statistical information X06 by one every time an erase error occurs in one erasing unit. A larger value of the statistical information X06 indicates that reliability is further deteriorated.

The total read logical sector count (the statistical information X07) is explained. The SSDC 41 stores a cumulative number of the numbers of logical sectors of data transmitted to the information processing device 111 as read data by the IFC 42 in the statistical information 65 as the statistical information X07. It is desirable that the statistical information X07 is reset to zero during manufacturing (e.g., before a test process) of the storage unit 2. A larger value of the statistical information X07 indicates that reliability is further deteriorated.

The total written logical sector count (the statistical information X08) is explained. The SSDC 41 stores a total number of logical sectors of data received from the information processing device 111 as write data by the IFC 42 in the statistical information 65 as the statistical information X08. It is desirable that the statistical information X08 is reset to zero during manufacturing (e.g., before a test process) of the storage unit 2. A larger value of the statistical information X08 indicates that reliability is further deteriorated.

The total uncorrectable ECC error count (the statistical information X09) is explained. When an error bit cannot be corrected by ECC correction, the SSDC 41 increments the statistical information X09 by 1 in every one read unit. The SSDC 41 can add an estimated value of the number of error bits that cannot be corrected or can add the number of error blocks that cannot be corrected. It is desirable that the statistical information X09 is reset to zero during manufacturing (e.g., before a test process) of the storage unit 2. A larger value of the statistical information X09 indicates that reliability is further deteriorated.

The total retry read count (the statistical information X10) is explained. When the number of error bits is larger and error correction impossible (ECC error) during data read, it is desirable that the SSDC 41 executes error correction using the ECC again. In particular, when the SSDC 41 shifts the read levels VA1, VA2, VB2, and VC2 shown in FIG. 12 from default values and performs read, data that cannot be error-corrected can be sometimes error-corrected. The SSDC 41 can store the total retry read count in the statistical information X09 as the statistical information X10 and use the total retry read count for life end prediction and life end determination. It is desirable that the statistical information X10 is reset to zero during manufacturing (e.g., before a test process) of the storage unit 2. A larger value of the statistical information X10 indicates that reliability is further deteriorated.

The corrected n bit-m bit ECC event count (the statistical information X11) is explained. In the corrected n bit-m bit ECC event count, n and m are natural numbers and $0 \leq n \leq m \leq$ maximum number of correctable bits. When the ECC correction is performed for an ECC correction unit (e.g., a physical page), if all error bits are normally corrected and the number of corrected error bits is equal to or larger than n and equal to or smaller than m, the SSDC 41 increments the corrected n bit-m bit ECC event count by one for one ECC correction unit. If maximum 64 bits can be corrected per one correction unit by the ECC correction, for example, the SSDC 41 reserves eight parameters "corrected 1 bit-8 bit ECC event count", "corrected 9 bit-16 bit ECC event count", "corrected 17 bit-24 bit ECC event count", "corrected 25 bit-32 bit ECC event count", "corrected 33 bit-40 bit ECC event count", "corrected 41 bit-48 bit ECC event count", "corrected 49-bit-56 bit ECC event count", and "corrected 57 bit-64 bit ECC event count". If the ECC correction is normally performed, the SSDC 41 increments any one of the eight parameters by 1 every time the EEC correction in one ECC correction unit is performed. It is desirable that the statistical information X11 is reset to zero during manufacturing (e.g., before a test process) of the storage unit 2. A larger value of the statistical information X11 indicates that reliability is further deteriorated.

The data corruption error count of the interface 19 (the statistical information X12) is explained. The SSDC 41 increments the statistical information X12 by one every time data corruption of a signal is detected on the interface 19. Data transmitted and received on the interface 19 is subjected to error detection and error correction by the SSDC 41, the IFC 42, and the chip set 7 using, for example, a Cyclic Redundancy Check (CRC) code, a Bose-Chaudhuri-Hocquenghem (BCH) code, a Reed-Solomon (RS) code, a Low-Density Parity-Check (LDPC) code, and the like. When an error is detected or when the error correction cannot be performed, the SSDC 41 increments the statistical information X12 by one. For example, when the interface 19 is based on a SATA standard, the SSDC 41 increments the statistical information X12 by one every time an R error (Reception Error, R_ERR) in the SATA standard occurs once. As the statistical information X12, any one of Phy Event Counters of the SATA standard can be adopted. It is desirable that the statistical information X12 is reset to zero during manufacturing (e.g., before a test process) of the storage unit 2. A larger value of the statistical information X12 indicates that reliability is further deteriorated.

The link speed down shift count of the interface 19 (the statistical information X13) is explained. When the SSDC 41, the IFC 42, and the chip set 7 detect that communication speed of the interface 19 decreases to be smaller than a design value, the SSDC 41 increments the statistical information X13 by one. For example, although the interface 19, the IFC 42, and the SSDC 41 are designed at SATA communication speed of the maximum 6 Gbps, when it is detected that communication speed actually established between the interface 19, the IFC 42, and the SSDC 41 and the storage unit 2 and the information processing device 111 is lower communication speed such as 3 Gbps, the SSDC 41 regards this as an error in SATA communication and increments the statistical information X13 by one. For example, although the interface 19, the IFC 42, and the SSDC 41 are designed at Express communication speed of the maximum 8 Gbps, when it is detected that communication speed actually established between the interface 19, the IFC 42, and the SSDC 41 and the storage unit 2 and the information processing device 111 is lower communication speed such as 5 Gbps, the SSDC 41 regards this as an error in PCI Express communication and increments the statistical information X13 by one. It is desirable that the statistical information X13 is reset to zero during manufacturing (e.g., before a test process) of the storage unit 2. A larger value of the statistical information X13 indicates that reliability is further deteriorated.

The lane count down shift count of the interface 19 (the statistical information X14) is explained. When the SSDC 41, the IFC 42, and the chip set 7 detect that the number of active transmission lines of the interface 19 decreases to be smaller than a design value, the SSDC 41 increments the statistical information X14 by one. For example, although the interface 19, the IFC 42, and the SSDC 41 are designed at the number of PCI express transmission line (number of Lanes) of the maximum 8 Lanes, when it is detected that the number of transmission lines actually established between the interface 19, the IFC 42, and the SSDC 41 and the storage unit 2 and the information processing device 111 is a smaller number of transmission lines such as 4 Lanes, the SSDC 41 regards this as an error in PCI Express communication and increments the statistical information X14 by one. It is desirable that the statistical information X14 is reset to zero during manufacturing (e.g., before a test process) of the storage unit 2. A larger value of the statistical information X14 indicates that reliability is further deteriorated.

The error count of the interface 19 (the statistical information X15) is explained. Every time the SSDC 41, the IFC 42, and the chip set 7 detect an other abnormality in the interface 19 (other than X12) once, the SSDC 41 increments the statistical information X15 by one. It is desirable that the statistical information X15 is reset to zero during manufacturing (e.g., before a test process) of the storage unit 2. A larger value of the statistical information X15 indicates that reliability is further deteriorated.

The error count of the RAM 40 (the statistical information X16) is explained. When the SSDC 41 writes data in the RAM 40, an ECC encoding unit or an error-detection-code creating unit of the SSDC 41 or the RAM 40 encodes the data and writes the data in the RAM 40. When the SSDC 41 reads data from the RAM 40, an ECC decoding unit or an error detecting unit of the SSDC 41 or the RAM 40 subjects the data to error correction or error detection and reads the data from the RAM 40. If the error correction cannot be performed or if an error is detected when the SSDC 41 reads data from the RAM 40, the SSDC 41 increments the statistical information X16 by one. It is desirable that the statistical information X16 is reset to zero during manufacturing (e.g., before a test process) of the storage unit 2. A larger value of the statistical information X16 indicates that reliability is further deteriorated.

The power on time of the storage unit 2 (the statistical information X17) is explained. While a power supply for the storage unit 2 is ON, when the SSDC 41 counts a clock or receives time information from an internal timing circuit, the SSDC 41 increments the statistical information X17 as an elapsed time. Alternatively, the SSDC 41 can periodically receive time information of the information processing device 111 from the information processing device 111 and increment a difference in the time information. As examples of the power on time, for example, there are power on hours and power on seconds. It is desirable that the statistical information X17 is reset to zero during manufacturing (e.g., before a test process) of the storage unit 2. A larger value of the statistical information X17 indicates that reliability is further deteriorated.

The power cycle count (the statistical information X18) is explained. The SSDC 41 increments the statistical information X18 by one every time the power is supplied to the storage unit 2 and the storage unit 2 is started. During the power supply and the start, in some case, a read operation takes place and a write operation takes place for the NAND flash memory 16. Therefore, a larger value of the statistical information 18 indicates that reliability is further deteriorated. It is desirable that the statistical information X18 is reset to zero during manufacturing (e.g., before a test process) of the storage unit 2.

The unintentional power down count (the statistical information X19) is explained. Usually, when the power supply for the storage unit 2 is turned off, for example, the information processing device 111 issues, for example, an E0h Standby Immediate command described in Information technology ATA/ATAPI Command Set-3 (ACS-3) to the storage unit 2 or sets Shutdown Notification (CC.SHN) described in NVM Express Revision 1.1 to 01b. In this way, the information processing device 111 transitions the storage unit 2 to a state in which the power supply can be interrupted and then interrupts the power supply for the storage unit 2. On the other hand, in some case, power supply interruption unintentionally occurs when the storage unit 2 is not in the state in which the power supply can be interrupted. This is called Unintentional Power Down (Ungraceful Power Down, Unsafe Shutdown, and Unintended Power Down). When the storage unit 2 starts for the first time after the inappropriate power supply interruption, the SSDC 41 increments the statistical information X19 by one. The inappropriate power supply interruption also causes reliability deterioration of the storage unit 2 because user data is broken or a large amount of read and write operation from and to the NAND memory 16 takes place in the inappropriate power supply interruption. Therefore, a larger value of the statistical information X19 indicates that reliability is further deteriorated. It is desirable that the statistical information X19 is reset to zero during manufacturing (e.g., before a test process) of the storage unit 2.

The cumulative time when temperature exceeds a maximum value of a recommended operation temperature (statistical information X20) is explained. When a thermometer is mounted in the storage unit 2, for example, on the substrate of the storage unit 2, in the SSDC 41, or in the NAND memory 16, the SSDC 41 periodically receives temperature information from the thermometer. When the received temperature exceeds the recommended operation temperature (e.g., 100° C.), the SSDC 41 increments, based on time information acquired from the clock, an internal clock, or the information processing device 111, the number of hours of operation at temperature equal to or higher than the recommended operation temperature. It is desirable that the statistical information X20 is reset to zero during manufacturing (e.g., before a test process) of the storage unit 2. A larger value of the statistical information X20 indicates that reliability is further deteriorated.

The cumulative time when temperature falls below a minimum value of a recommended operation temperature (the statistical information X21) is explained. When a thermometer is mounted in the storage unit 2, the SSDC 41 periodically receives temperature information from the thermometer. When the received temperature falls below the recommended operation temperature (e.g., −40° C.), the SSDC 41 increments, based on time information acquired from the clock, the internal clock, or the information processing device 111, the number of hours of operation at temperature equal to or higher than the recommended operation temperature. It is desirable that the statistical information X21 is reset to zero during manufacturing (e.g., before a test process) of the storage unit 2. A larger value of the statistical information X21 indicates that reliability is further deteriorated.

The response time maximum value of a command (the statistical information X22) is explained. The SSDC 41 measures time (or the number of clocks) required from reception of a command from the information processing device 111 until transmission of a response to the information processing device 111 (or completion of execution of the command) and stores a maximum value of the time in the statistical information 65 as the statistical information X22. When a response time exceeding the statistical information X22 occurs, the SSDC 41 overwrites the statistical information X22 with the response time. The SSDC 41 can store the statistical information X22 for each of commands. It is desirable that the statistical information X22 is reset to zero during manufacturing (e.g., before a test process) of the storage unit 2 or during shipment of the storage unit 2.

The response time average value of a command (the statistical information X23) is explained. The SSDC 41 measures time (or the number of clocks) required from reception of a command from the information processing device 111 until transmission of a response to the information processing device 111 (or completion of execution of the command) and stores an average value of the time in the statistical information 65 as the statistical information X23. For example, the SSDC 41 stores a fixed number of response time lists in the RAM 40 and calculates an average value of the response time lists to thereby calculate the statistical information X23. The SSDC 41 can store the statistical information X23 for each of commands. It is desirable that the statistical information X23 is reset to zero during manufacturing (e.g., before a test process) of the storage unit 2 or during shipment of the storage unit 2.

The response time maximum value of the NAND memory (the statistical information X24) is explained. The SSDC 41 measures time (or the number of clocks) required from issuance of a command to the NAND memory 16 by the SSDC 41 until reception of a response (or reception of a command execution completion notification) and stores a maximum value of the time in the statistical information 65 as the statistical information X24. When a response time exceeding the statistical information X24 occurs, the SSDC 41 overwrites the statistical information X24 with the response time. The SSDC 41 can store the statistical information X24 for each of commands. It is desirable that the statistical information X24 is reset to zero during manufacturing (e.g., before a test process) of the storage unit 2 or during shipment of the storage unit 2.

The response time average value of the NAND memory (the statistical information X25) is explained. The SSDC 41 measures time (or the number of clocks) required from issuance of a command to the NAND memory 16 until reception of a response (or reception of a command execution completion notification) and stores an average value of the time in the statistical information 65 as the statistical information X25. For example, the SSDC 41 stores a fixed number of response time lists in the RAM 40 and calculates an average value of the response time lists to thereby obtain the statistical information X25. The SSDC 41 can store the statistical information X25 for each of commands. It is desirable that the statistical information X25 is reset to zero during manufacturing (e.g., before a test process) of the storage unit 2 or during shipment of the storage unit 2.

The present temperature (the statistical information X26) is explained. When a thermometer is mounted in the storage unit 2, the SSDC 41 periodically receives temperature information from the thermometer. The SSDC 41 stores temperature received from the thermometer last in the statistical information X26 as a present temperature. When the present temperature is extremely high (e.g., equal to or higher than 85° C.), the SSDC 41 determines that the reliability of the storage unit 2 is adversely affected. When the temperature is extremely low (e.g., equal to or lower than −10° C.), the SSDC 41 determines that the reliability of the storage unit 2 is adversely affected.

The highest temperature (the statistical information X27) is explained. The SSDC 41 stores a maximum value of the present temperature X26 in the statistical information X27 as a highest temperature. When the highest temperature is extremely high (e.g., equal to or higher than 85° C.), the reliability of the storage unit 2 is adversely affected. When the SSDC 41 receives the present temperature higher than the statistical information X27 from the thermometer, the SSDC 41 rewrites the statistical information X27 with the present temperature. It is desirable that the statistical information X27 is reset to temperature (e.g., −40° C.) sufficiently low compared with an operating temperature of the storage unit 2 during manufacturing (e.g., before a test process) of the storage unit 2 or during shipment of the storage unit 2.

The lowest temperature (the statistical information X28) is explained. The SSDC 41 stores a minimum value of the present temperature X26 in the statistical information X28 as a lowest temperature. When the lowest temperature is extremely low (e.g., equal to or lower than −40° C.), the SSDC 41 determines that the reliability of the storage unit 2 is adversely affected. When the SSDC 41 receives the present temperature lower than the statistical information X28 from the thermometer, the SSDC 41 rewrites the statistical information X28 with the present temperature. It is desirable that the statistical information X28 is reset to temperature (e.g., 120° C.) sufficiently high compared with an operating temperature of the storage unit 2 during manufacturing (e.g., before a test process) of the storage unit 2 or during shipment of the storage unit 2.

The system data redundancy (the statistical information X29) is explained. When system data such as data in the management information area 40M of the NAND memory 16 or a system program (firmware) stored in the NAND memory 16 is broken and unable to be read, it is likely that the storage unit 2 cannot perform a normal operation. For improvement of the reliability of the storage unit 2, it is desirable that the SSDC 41 makes the system data redundant across a plurality of physical blocks or a plurality of channels using RAID1, RAID5, or RAID6 and stores the system data in the area 40M. The SSDC 41 transforms redundancy of the system data into a numerical value and stores the numerical value in the statistical information 65 as the system data redundancy (the statistical information X29). When redundancy X29=R, a data loss up to maximum (R−1) blocks can be restored. For example, when the SSDC 41 manages management information 45 over four blocks using the RAID1, the management information 45 is stored as clones respectively in a block A, a block B, a block C, and a block D. Then, because the management information 45 retains four clones in total, the redundancy X29 of the management information 45 is four. For example, when data of the block A is broken and unable to be read, the SSDC 41 can read the management information 45 by performing data read from the block B, the block C, or the block D. Then, because the management information 45 retains three clones in total, the redundancy X29 of the management information 45 is three. For example, when the SSDC 41 manages the management information 45 over four blocks using the RAID5, the management information 45 is stored in, for example, the block A, the block B, the block C, and the block D respectively by four RAID5s. Then, even if data of maximum one block is lost, because the data can be restored, the redundancy X29 of the management information is two. In a state in which data for one block is lost, the redundancy X29 is one. When the redundancy X29 decreases, system data is more likely to be unable to be restored and a failure rate of the storage unit 2 increases. A smaller value of the redundancy X29 indicates that reliability is further deteriorated. When the redundancy X29 decreases, it is desirable that the SSDC 41 recovers the redundancy by rewriting restored data in a block in which data is lost.

The total of written data amount in the RAM 40 (the statistical information X30) is explained. The SSDC 41 stores a cumulative value of data write amounts written in the RAM 40 of the storage unit 2 in the statistical information 65 as the statistical information X30. The SSDC 41 increments the statistical information X30 by one every time data of one page is written in the RAM 40. It is desirable that the statistical information X30 is reset to zero during manufacturing (e.g., before a test process) of the storage unit 2. A larger value of the statistical information X30 indicates that reliability if further deteriorated.

The statistical information increase ratio (the statistical information X31) is explained. The SSDC 41 stores not-latest information of the statistical information X01 to X25 (e.g., values before a fixed time, values at the time when the storage unit 2 is powered on, and values at the time when the storage unit 2 is powered down last time) separately in the management information 44. The SSDC 41 calculates the statistical information X31 according to, for example, any one of the following formulas:

statistical information increase ratio=(latest statistical information)−(old information)

statistical information increase ratio=((latest statistical information)−(old information))/(elapsed time after old information is acquired)

statistical information increase ratio=((latest statistical information)−(old information))/(number of times of NAND access after old information is acquired)

It is desirable that the statistical information X31 is reset to zero during manufacturing (e.g., before a test process) of the storage unit 2. A larger value of the statistical information X31 indicates that reliability is further deteriorated.

The NAND GC Error Flag (the statistical information X32) is explained. When the statistical information X32 is 1, the number of free blocks sufficient for an operation cannot be acquired even with a garbage collection (GC) of data stored in NAND memory 16 (hereinafter referred to as NAND GC). It is desirable that the statistical information X32 is reset to zero during manufacturing (e.g., before a test process) of the storage unit 2. A larger value of the statistical information X32 indicates that reliability is further deteriorated.

The SSDC 41 can store all the parameters explained above or can store a part of any one of the parameters in the statistical information 65. It is desirable that the SSDC 41 stores the latest information of the statistical information 65 in the area 40A on the RAM 40 and periodically backs up the latest information as backup data in the area 40A on the NAND memory 16. On the other hand, the SSDC 41 can store the latest information in one of the RAM 40 and the NAND memory 16 and can transmit the statistical information to the information processing device 111 and store the statistical information in the information processing device 111 or a storage device connected to the information processing device 111.

Forward LBA Lookup Transformation

A procedure in which the SSDC 41 specifies a physical address from an LBA (forward LBA lookup transformation) is explained with reference to FIG. 16. When an LBA is designated, the SSDC 41 calculates a track address, a cluster address, and an intra-cluster address from the LBA.

First, the SSDC 41 searches through the track table 63 and specifies a physical block ID corresponding to the calculated track address (steps S100 and S101). The SSDC 41 determines whether the specified physical block ID is valid (step S102). When the physical block ID is not null and is a valid value (Yes at step S102), the SSDC 41 searches through the ABT 62 and determines whether the physical block ID is entered in the ABT 62 (step S103). When the physical block ID is entered in the ABT 62 (Yes at step S104), a position shifted by the intra-track address from a head position of a physical block designated by the physical block ID is a physical position on the NAND memory 16 corresponding to the designated LBA (step S105). In such a case, the cluster table 64 is unnecessary for specifying a physical position on the NAND memory 16 corresponding to the LEA. Such an LBA is referred to as "LBA managed in track unit". When the physical block ID is not entered in the ABT 62 at step S104 (No at step S104), the designated LBA does not have a physical address corresponding thereto. Such a state is referred to "unwritten state" (step S106).

When the physical address corresponding to the designated track address is null and is an invalid value at step S102 (No at step S102), the SSDC 41 calculates a cluster address from the LBA, searches through the cluster table 64, and acquires a physical block ID corresponding to the calculated cluster address and an intra-physical block address corresponding thereto from the cluster table 64 (step S107). A position shifted by the intra-cluster address from a head position of a physical page designated by the physical block ID and the intra-physical block page address is a physical position on the NAND memory 16 corresponding to the designated LEA. In such a case, the physical position on the NAND memory 16 corresponding to the LBA cannot be specified from only the track table 63 and the cluster table 64 needs to be referred to. Such an LEA is referred to as "LEA managed in cluster unit" (step S108).

Read Operation

Figure 17:
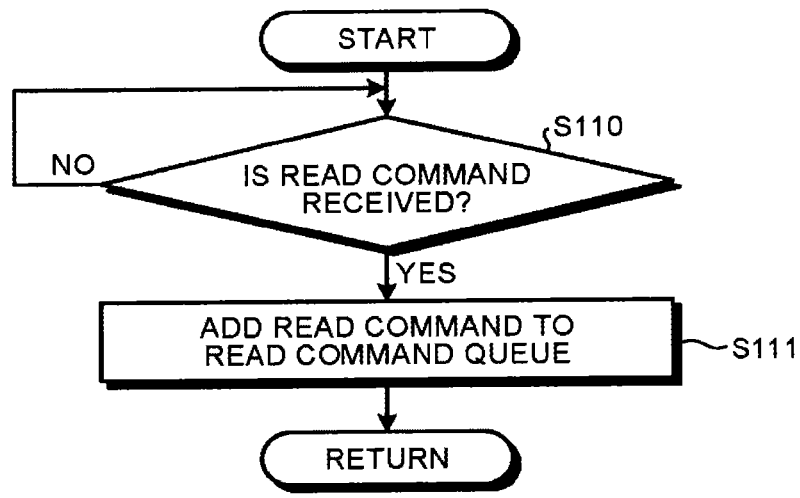
FIG. 17 is a flowchart for explaining an example of a read operation from the SSD.
Figure 18:
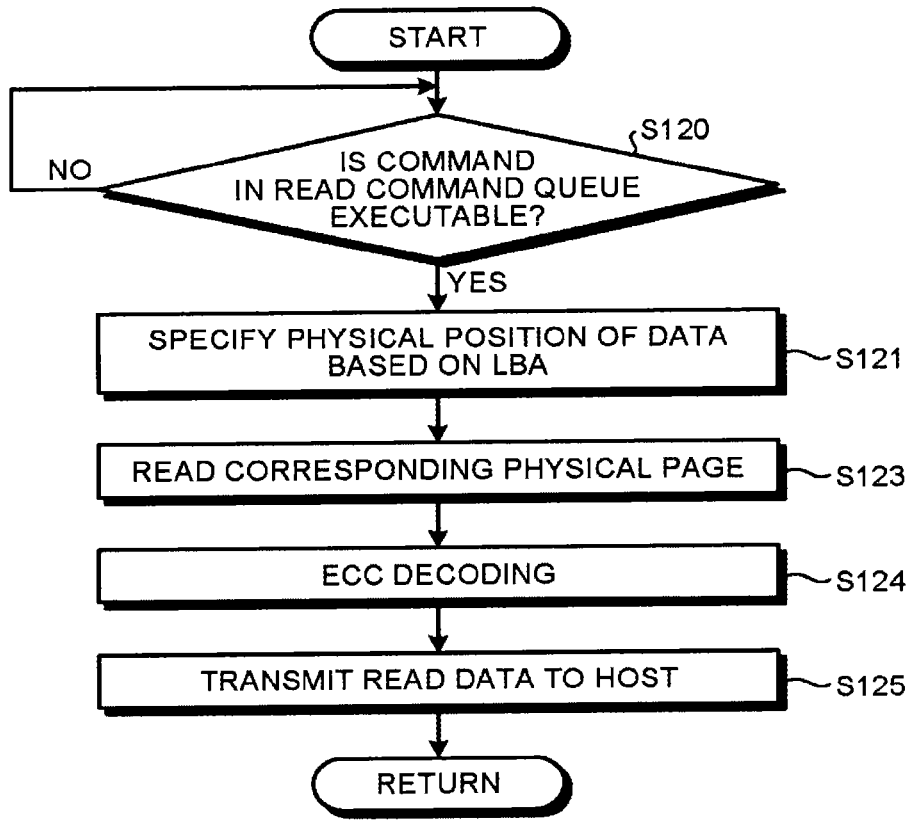
FIG. 18 is a flowchart for explaining an example of a read operation from the SSD.

A read operation from the storage unit 2 and the storage unit 3 by the information processing device 111 is explained with reference to FIGS. 17 and 18. In the read operation explained in this embodiment, 60h READ FPDMA QUEUED described in Information technology ATA/ATAPI Command Set-3 (ACS-3) is used as a read command. However, other read commands such as 25h READ DMA EXT can be adopted. A difference in a type of the read command does not affect the essence of the present invention. For example, 02h Read described in NVM Express Revision 1.1 can be used as the read command. When the storage unit 2 receives a read command from the information processing device 111 (step S110), the SSDC 41 adds the read command to a read command queue on the RAM 40 (step S111) and returns a reception notification of the read command to the information processing device 111.

On the other hand, when a read command is present in the read command queue on the RAM 40, the SSDC 41 determines whether read processing can be executed (step S120). Upon determining that the read processing can be executed, the SSDC 41 specifies a physical position of data from the LBA received from the information processing device 111 according to the forward LBA lookup transformation procedure shown in FIG. 16 (step S121). The SSDC 41 reads the data from a physical page in the specified position (step S123), subjects the read data to ECC decryption using an ECC redundancy bit in the read data (step S124), transmits the decrypted data to the information processing device 111 via the IFC 42 (step S125), and updates the statistical information 65. The SSDC 41 can once write the data read from the NAND memory 16 in the RAM 40, decrypt the data written in the RAM 40, and transmit the decrypted data to the information processing device 111 or can once write the decrypted data in the RAM 40 and transmit the data written in the RAM 40 to the information processing device 111.

At step S124, the SSDC 41 attempts decryption by the ECC. However, when the decryption cannot be performed, the SSDC 41 deletes, from the ABT 62, a physical block including a page that cannot be decrypted, registers the physical block in the BBT 61, and increments the total uncorrectable ECC error count (the statistical information X09) of the statistical information 65. Then, it is desirable that the SSDC 41 copies data of the block from the FBT 60 to an allocated free block, registers a physical block ID of the free block in the ABT 62, and rewrites physical blocks of the track table 63 and the cluster table 64 from a copy source physical block ID to a copy destination physical block ID.

Write Operation

Figure 19:
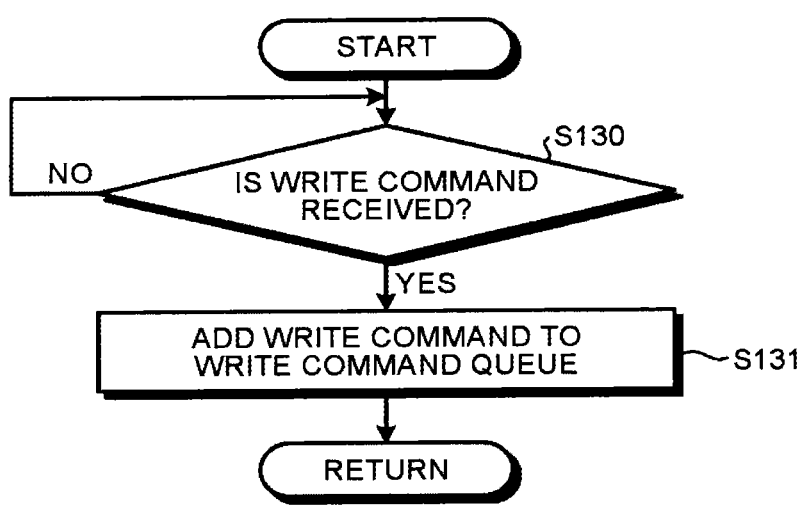
FIG. 19 is a flowchart for explaining an example of a read operation from the SSD.
Figure 20A:
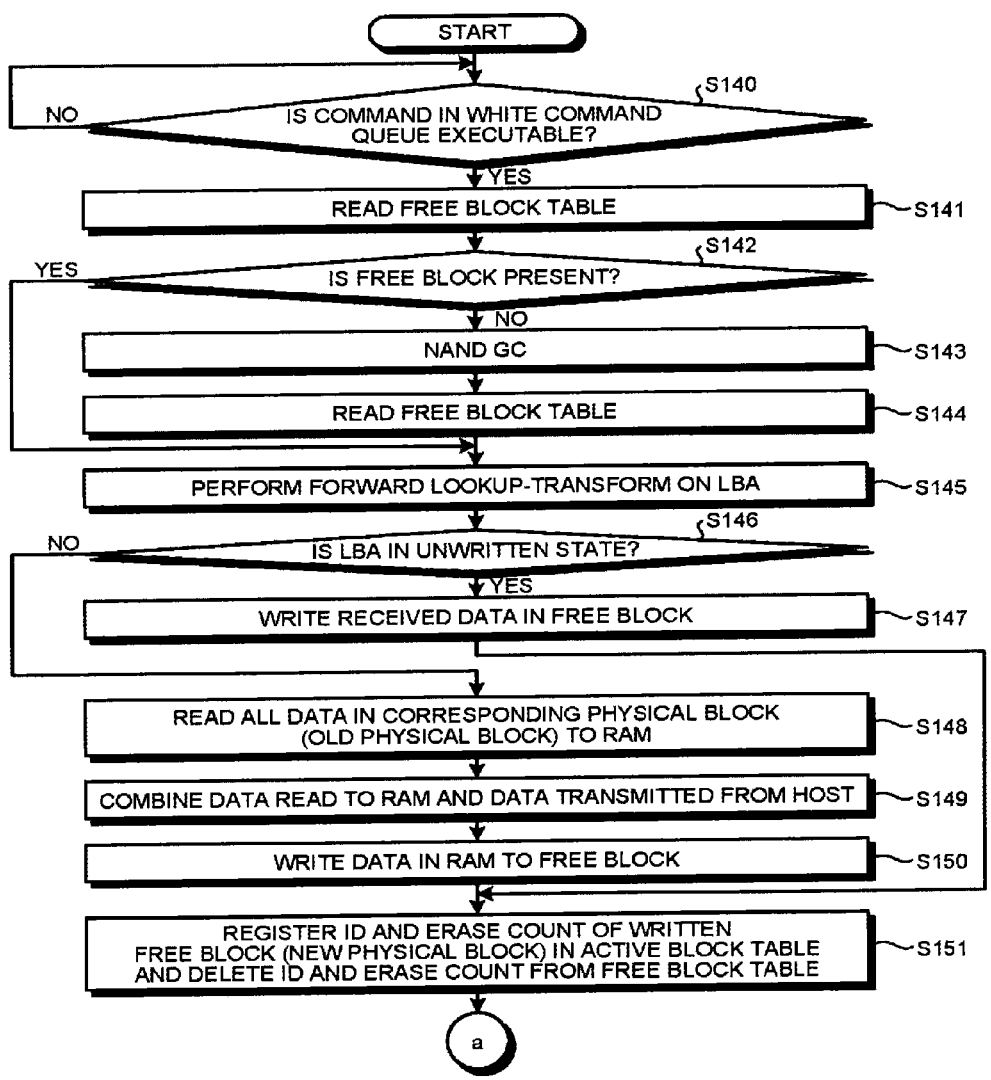
FIG. 20A and FIG. 20B are flowchart for explaining an example of a read operation from the SSD.
Figure 20B:
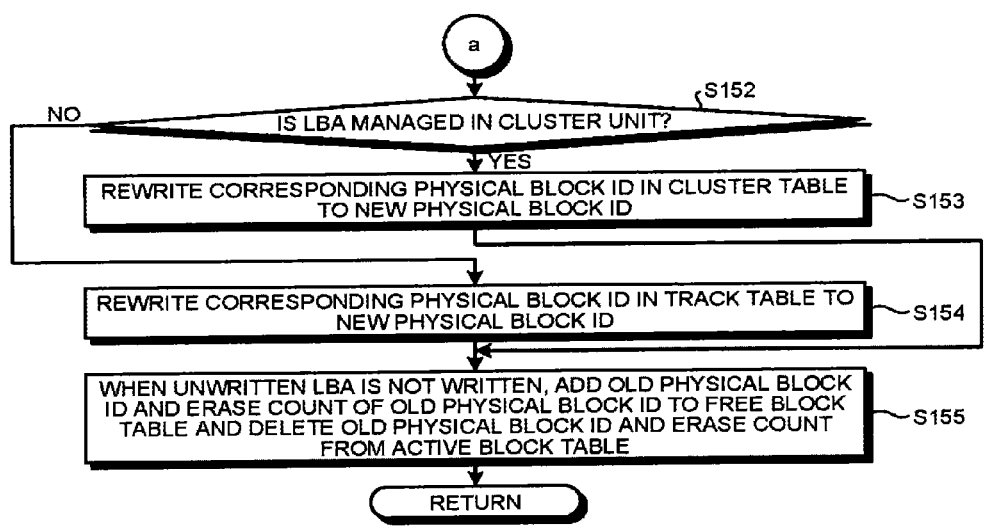

A write operation in the storage unit 2 and the storage unit 3 by the information processing device 111 is explained with reference to FIG. 19, FIGS. 20A and 20B. In the write operation explained in this embodiment, 61h WRITE FPDMA QUEUED described in Information technology ATA/ATAPI Command Set-3 (ACS-3) is used as a write command. However, other write commands such as 35h WRITE DMA EXT can be adopted. A difference in a type of the write command does not affect the essence of the present invention. For example, 01h Write described in NVM Express Revision 1.1 can be used as the write command. For example, when the storage unit 2 receives a write command from the information processing device 111 (step S130), the SSDC 41 adds the write command to a write command queue on the RAM 40 (step S131) and returns a reception notification of the write command to the information processing device 111.

On the other hand, when a write command is present in the write command queue on the RAM 40, the SSDC 41 determines whether write processing can be executed (step S140). Upon determining that the write processing can be executed, the SSDC 41 notifies the information processing device 111 that write is possible, receives write data from the information processing device 111, subjects the received data to ECC encoding, and stores the encoded data in the cache memory 46 of the RAM 40. The SSDC 41 can store unencoded data in the cache memory 46 and encode the data when writing the data in the NAND memory 16.

Subsequently, the SSDC 41 reads the FBT 60 (step S141) and acquires a physical block ID of a free block from the FBT 60. When a free block is absent (No at step S142), the SSDC 41 performs NAND GC of the NAND memory 16 explained below (step S143). After the NAND GC, the SSDC 41 reads the FBT 60 (step S144) and acquires a physical block ID of a free block from the FBT 60. The SSDC 41 applies an erase operation to the free block, the physical block ID of which is acquired. When an erase error occurs, the SSDC 41 adds the physical block ID to the BBT 61, deletes the physical block ID from the FBT 60, and executes the processing again from S141 to acquire a free block again. Even in a physical block in which an erase error occurs once, if the erase operation is performed again, the physical block sometimes can be normally erased without causing an erase error. Therefore, in terms of preventing an unnecessary increase in the number of bad blocks, it is desirable that the SSDC 41 reserves, for each of blocks, an item of an erase error count for each block serving as the statistical information X06 in the FBT 60 and the ABT 62, increments the item when an erase error of the block occurs, and registers the block in the BBT 61 when the erase error count for each block increases to be equal to or larger than a predetermined value. More desirably, to set only a physical block in which erase errors continuously occur as a bad block, the SSDC 41 provides an item of "erase count continuous errors for each block" instead of the "erase error count for each block", increments the item when an erase error of a block occurs, resets the item to zero when erasing can be performed without an error, and registers the block in the BBT 61 when the "erase count continuous errors for each block" increases to be equal to or larger than a predetermined value.

Subsequently, to find whether an LBA designated in the write command is in an unwritten state, the SSDC 41 determines whether valid data corresponding to the LBA is already stored in the NAND memory 16 according to the forward lookup transformation procedure shown in FIG. 16 (steps S145 and S146).

When the LBA is in the unwritten state (Yes at step S146), the SSDC 41 writes reception data stored in the cache memory 46 in a free block (step S147), registers an ID of the written free block (a new physical block) and the erase count of the free block in the ABT 62, and deletes the ID of the written physical block and the erase count of the free block from the FBT 60 (step S151). Then, the SSDC 41 divides an LEA of the reception data with a section in a track unit (a track section) and determines whether the track section is filled with data to determine whether the LBA is managed in track unit or managed in cluster unit (step S152). That is, when the track section is filled with data, the LBA is managed in track unit and, when the track section is not filled with data, the LEA is managed in cluster unit. When the LBA is managed in cluster unit, the SSDC 41 rewrites the cluster table 64, associates a new physical block ID with the LBA (step S153), rewrites the track table 63, and associates an invalid physical block ID (e.g., null) with the LBA. When the LEA is managed in track unit, the SSDC 41 rewrites the track table and associates a new physical block ID with the LBA (step S154).

On the other hand, when the LBA is not in the unwritten state at step S146, the SSDC 41 reads, based on a physical block ID obtained by the forward lookup transformation, all data in a physical block corresponding to the physical block ID from the NAND memory 16 and writes the data in the RAM 40 (step S148). Then, The SSDC 41 overwrites the data the data stored in the cache memory 46 and the data, which is read from the NAND memory 16 and is written in the RAM 40, in the RAM 40 (Step S149) and writes the combined data in a free block (Step S150).

When a Program Error occurs at step S150, the SSDC 41 adds the physical block ID to the BBT 61, deletes the physical block ID from the FBT 60, and executes the processing from step S141 again to acquire a free block again. Even in a physical block in which a Program Error occurs once, if the write operation is performed again, the physical block sometimes can be normally written without causing a Program Error. Therefore, in terms of preventing an unnecessary increase in the number of bad blocks, it is desirable that the SSDC 41 reserves, for each of blocks, an item of a number of times of occurrence of Program Error for each block serving as the statistical information X05 in the FBT 60 and the ABT 62, increments the item when a Program Error of the block occurs, and registers the block in the BBT 61 when a Program Error Count for each block increases to be equal to or larger than a predetermined value. More desirably, to set only a physical block in which Program Errors continuously occur as a bad block, the SSDC 41 provides an item of "number of times of write continuous errors for each block" instead of the "Program Error Count for each block", increments the item when a Program Error of a block occurs, resets the item to zero when write can be performed without an error, and registers the block in the BBT 61 when the "number of times of write continuous errors for each block" increases to be equal to or larger than a predetermined value.

The SSDC 41 registers an ID and the erase count of the written free block (a new physical block) in the ABT 62 and deletes the ID of the written physical block from the FBT 60 (step S151). When the LBA is managed in cluster unit, the SSDC 41 rewrites the old physical block ID of the cluster table 64 to the new physical block ID (steps S152 and S153). When the LBA is managed in track unit, the SSDC 41 rewrites the old physical block ID of the track table to the new physical block ID (steps S152 and S154). Further, the SSDC 41 adds the old physical block ID and the erase count of the old physical block ID to the FBT 60 and deletes the old physical block ID and the number of times or erasing of the old physical block ID from the ABT 62 (step S155). The SSDC 41 updates the statistical information 65 based on the write processing explained above.

NAND GC

Usually, a total LBA capacity (a total logical sector count) of the storage unit 2 is designed smaller than a total capacity of the NAND memory 16 of the storage unit 2 (over provisioning). Therefore, free blocks are not exhausted as long as the write operation continues to be performed in a track unit. On the other hand, when a large number of times of write in a cluster unit take place for an unwritten LBA, a physical block having a capacity larger than a cluster is allocated to one write in a cluster unit. Therefore, physical blocks of the NAND memory 16 more than a data capacity to be written are necessary. Consequently, free blocks are likely to be exhausted. When free blocks are exhausted, a free block can be acquired anew trough arrangement of the NAND memory 16 explained below.

The NAND GC by the SSDC 41 is explained with reference to FIG. 21. All clusters stored in a physical block are not always valid clusters. An invalid cluster not equivalent to a valid cluster is not mapped to the LBA. The valid cluster is a cluster in which latest data is stored. The invalid cluster is a cluster in which data of the same LBA is written in another place and is not referred to. In the physical block, there is a free space for data by a space of the invalid cluster. A free block can be acquired by executing the NAND GC for collecting data of the valid cluster and rewriting the data in a different block.

First, the SSDC 41 sets a selected physical block ID=i to zero and sets a free space cumulative amount S to zero (step S160). The SSDC 41 determines whether the physical block with the ID i=0 is entered in the track table 63 (step S161). When the physical block is entered in the track table, the SSDC 41 increments i by one (step S162) and performs the same determination concerning a physical block having the next ID number (step S161). That is, when the physical block ID is included in the track table 63, because data of the physical block is managed in track unit, the data is not a NAND GC target.

When the physical block with ID=i is not managed in track unit (No at step S161), the SSDC 41 refers to the cluster table 64 and acquires all addresses of a valid cluster included in the physical block with ID=i (step S163). The SSDC 41 calculates a size v for a total capacity of the acquired valid cluster (step S164). When the size v is smaller than a physical block size (Yes at step S165), the SSDC 41 adds an ID of the present physical block to a NAND GC target block list (step S166). Further, the SSDC 41 adds the acquired cluster capacity v of the present physical block to an acquired cluster cumulative amount S and updates the acquired cluster cumulative amount S (step S167).

When the size v is not smaller than the physical block size or the acquired cluster cumulative amount S does not reach the physical block size at step S168, the SSDC 41 increments i by one (step S162) and executes the procedure at steps S161 to S167 in the same manner concerning a physical block having the next ID number. The SSDC 41 repeats the procedure at steps S161 to S167 until the acquired cluster cumulative amount S reaches the physical block size at step S168.

When the acquired cluster cumulative amount S reaches the physical block size at step S168, the SSDC 41 reads data of all valid clusters concerning all physical blocks on the NAND GC target block list and writes the data in the RAM 40 (step S169), erases all physical blocks on the NAND GC target block list (step S170), and deletes the erased all physical blocks from the ABT 62 and adds the physical blocks to the FBT 60 (step S171). Then, the SSDC 41 increments the erase count. A target of the erasing processing performed at step S170 can be limited to a block in which data is written at step S172. This is desirable in terms of suppressing the erase count of blocks.

When an erase error occurs, the SSDC 41 adds the physical block ID to the BBT 61 and deletes the physical block ID from the FBT 60. Even in a physical block in which an erase error occurs once, if the erasing is performed again, the physical block sometimes can be normally erased without causing an erase error. Therefore, to prevent an unnecessary increase in the number of bad blocks, it is desirable that the SSDC 41 reserves, for each of blocks, an item of "Erase Error Count for each block" in the FET 60 and the ABT 62, increments the item when an erase error of the block occurs, and registers the block in the BBT 61 when the Erase Error Count for each block increases to be equal to or larger than a predetermined value. More desirably, to set only a physical block in which erase errors continuously occur as a bad block, the SSDC 41 reserves an item of "erase count continuous errors for each block" instead of the "Erase Error Count for each block", increments the item when an erase error of a block occurs, resets the item to zero when erasing can be performed without an error, and registers the block in the BBT 61 when the "erase count continuous errors for each block" increases to be equal to or larger than a predetermined value.

The SSDC 41 acquires a new free block from the FBT 60, writes, in the acquired free block, data written in the RAM 40 (step S172), adds a physical block ID of the free block, in which the data is written, and the erase count of the block to the ABT 62, and deletes the block ID of the block, in which the data is written, from the FBT 60 (step S173). Further, the SSDC 41 updates a cluster address, a physical block ID, and an intra-physical block page address in the cluster table 64 to correspond to the NAND GC of this time (step S174). The SSDC 41 updates the statistical information 65 based on processing contents of the NAND GC.

When a Program Error occurs at step S172, the SSDC 41 adds the physical block ID to the BBT 61, deletes the physical block ID from the FBT 60, and acquires a free block again. Even in a physical block in which a Program Error occurs once, if the write operation is performed again, the physical block sometimes can be normally written without causing a Program Error. Therefore, to prevent an unnecessary increase in the number of bad blocks, it is desirable that the SSDC 41 reserves, for each of blocks, an item of "Program Error Count for each block" in the FBT 60 and the ABT 62, increments the item when a Program Error of the block occurs, and registers the block in the BBT 61 when the "Program Error Count for each block" increases to be equal to or larger than a predetermined value. More desirably, to set only a physical block in which Program Errors continuously occur as a bad block, the SSDC 41 reserves an item of "number of times of write continuous errors for each block" instead of the "Program Error Count for each block", increments the item when a Program Error of a block occurs, resets the item to zero when write can be performed without an error, and registers the block in the BBT 61 when the "number of times of write continuous errors for each block" increases to be equal to or larger than a predetermined value.

In the procedure shown in FIG. 21, the NAND GC for preferentially filling data in a free block is performed. However, the NAND GC for preferentially acquiring a free block can be performed by calculating v by subtracting the capacity of a cluster acquired from a physical block size at step S164, determining whether v is smaller than 0 at step S165, shifting to step S168 when v is smaller than 0, and shifting to step S163 when v is not smaller than 0.

Delete Notification

Figure 22:
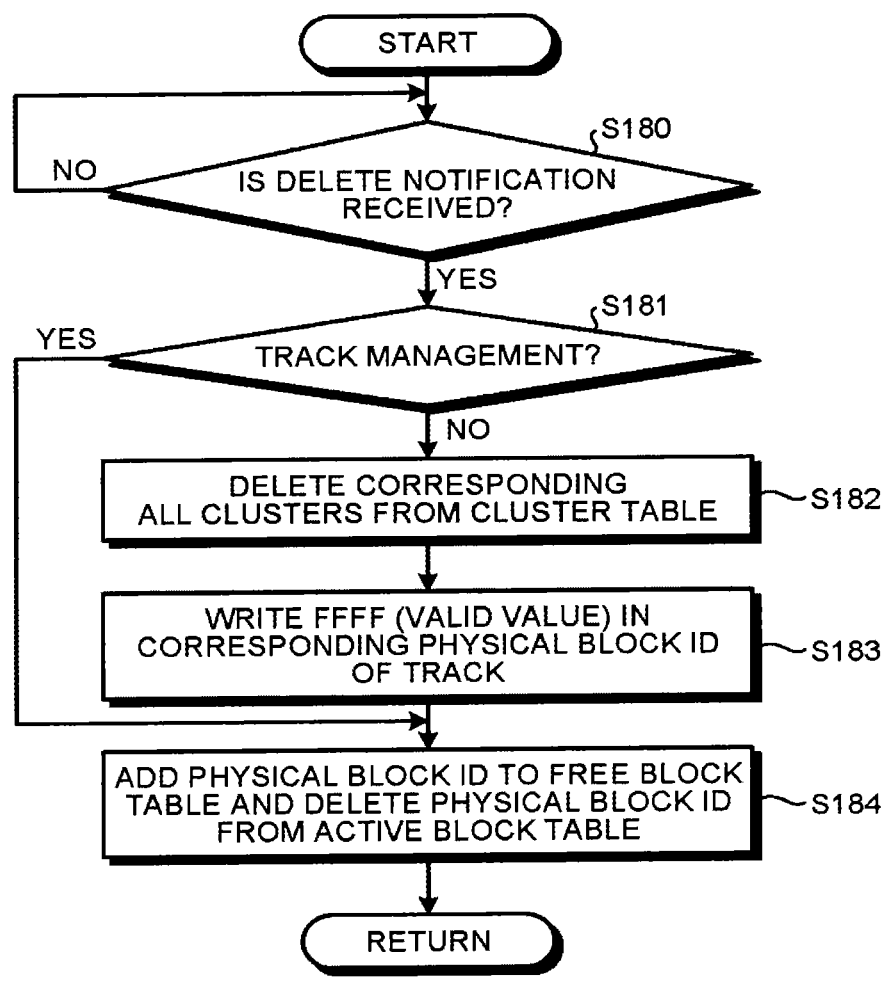
FIG. 22 is a flowchart for explaining an operation example of the SSD performed when a delete notification is received.

The delete notification processing by the SSDC 41 is explained with reference to FIG. 22. The delete notification is a command transmitted from the information processing device 111 to the storage unit 2 and the storage unit 3 when deletion of data is performed by the OS 100 on the information processing device 111. A command used for the delete notification processing is generally called trim command. Examples of the trim command include Deallocate of a 06h Data Set Management command described in Information technology ATA/ATAPI Command Set-3 (ACS-3) and a 09h Data Set Management command described in NVM Express Revision 1.1. The delete notification processing is a system in which, when data is deleted on the OS 100 or on a file system, a logical address area (an LBA area) where the deleted data is present is notified to a storage device as an LBA Range Entry including a set of an LBA and the number of sectors, whereby the area can be treated as a free area on the storage unit 2 and the storage unit 3 as well. The SSDC 41 can acquire a free block anew according to the delete notification. A function of the trim command can be realized by not only the command but also, for example, SCT Command Transport described in Information technology ATA/ATAPI Command Set-3 (ACS-3), a 08h Write Zeroes command described in NVM Express Revision 1.1, and other commands such as a vendor unique command.

Figure 16:
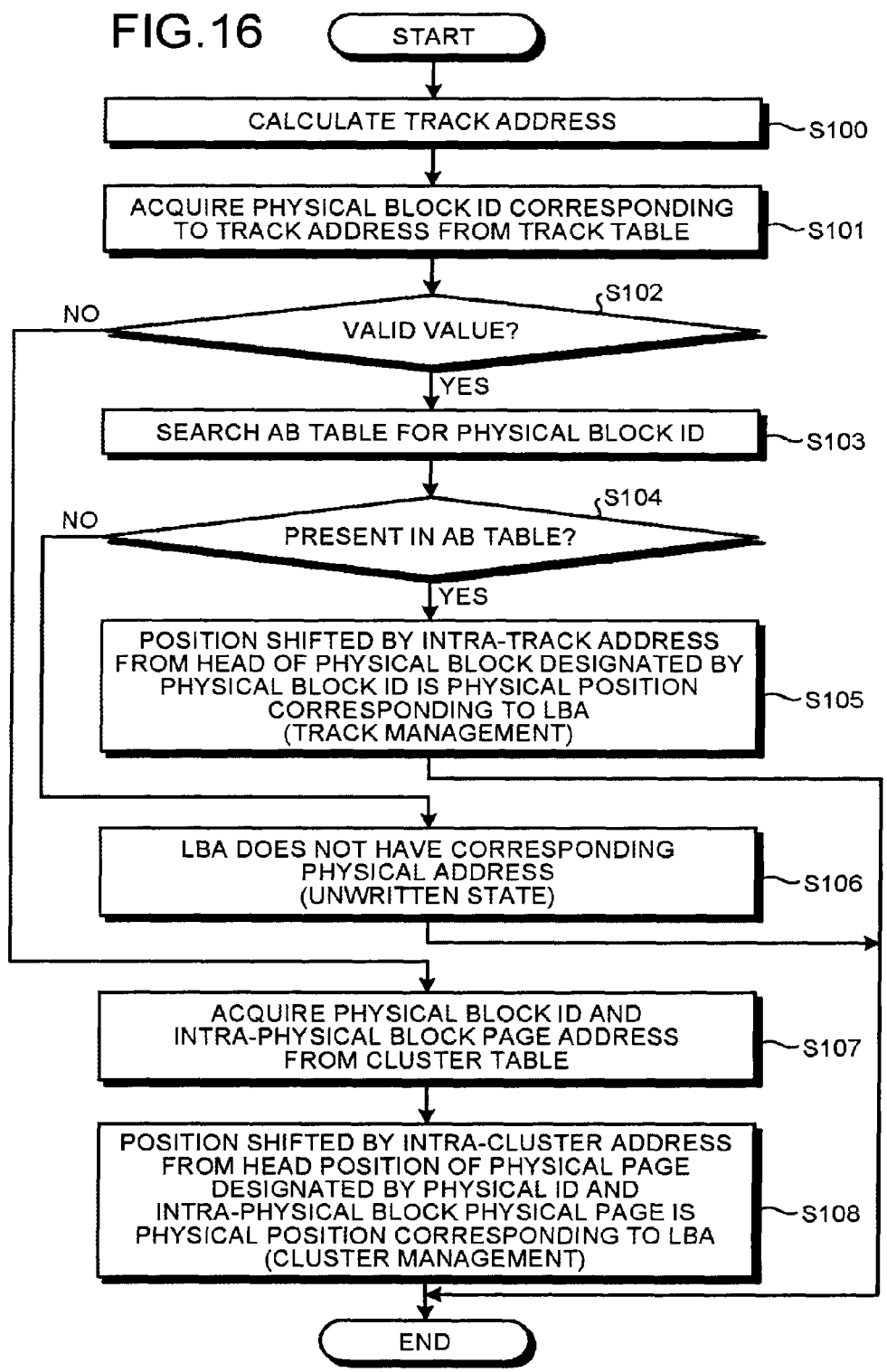
FIG. 16 is a flowchart for explaining a procedure for specifying a physical address from the LBA.

When the storage unit 2 and the storage unit 3 receive a delete notification from the information processing device 111 (step S180), the SSDC 41 subjects an LBA designated in the delete notification to forward LBA lookup transformation according to the procedure shown in FIG. 16. When the LBA included in the delete notification is managed in track unit (Yes at step S161), the SSDC 41 adds a physical block ID to the FBT 60 and deletes the physical block ID from the ABT 62 (step S184). On the other hand, when the LBA included in the delete notification is managed in cluster unit (No at step S181), the SSDC 41 deletes all clusters corresponding to the physical block from the cluster table 64 (step S182), writes an appropriate valid value (e.g., FFFF) in a physical block ID corresponding to a track corresponding to the LBA in the track table 63 (step S183), and adds the physical block ID to the FET 60 and deletes the physical block ID from the ABT 62 (step S184). The SSDC 41 can acquire a free block trough the delete notification processing other than the NAND GC.

Usually, the number of free blocks sufficient for write can be acquired by the NANG GC. When the number of free blocks sufficient for write cannot be acquired even by the NAND GC, it is desirable that the SSDC 41 sets the NAND GC Error Flag of the statistical information 65 to 1 and notifies the information processing device ill that a free block cannot be acquired through the acquisition of the statistical information 65 by the information processing device 111. For example, to give a margin to time from the time when the NAND GC Error Flag changes to 1 until the storage unit 2 actually stops operating, it is desirable to set a NAND GC failure flag to 1 when a condition (number of free blocks after the NAND GC is performed)<(number of free blocks necessary for write)+(margin) is satisfied and notify the information processing device 111 of the failure in acquisition of a free block as reliability information.

The NAND GC can be executed not only when a write request is received from the information processing device 111 but also, for example, when a predetermined time elapses after a command is received last from the information processing device or when a command for shift to a standby, idling, or sleep state is received from the information processing device 111 or can be executed, for example, when the SSDC 41 receives a command for staring the NAND GC from the information processing device 111 through SCT Command Transport described in ACS-3, other vendor commands, or the like.

Error Processing

Figure 23:
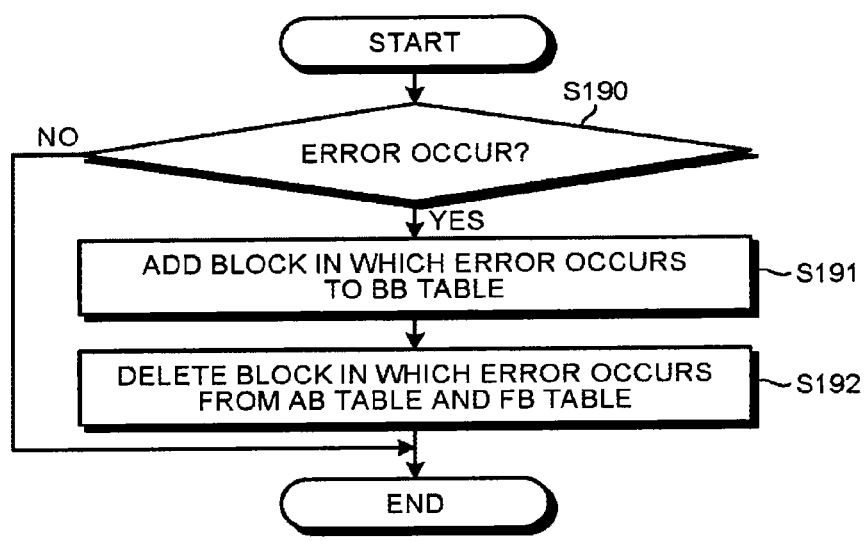
FIG. 23 is a flowchart for explaining an operation example of the SSD performed when an error occurs.

The error processing concerning the NAND memory 16 by the SSDC 41 is explained with reference to FIG. 23. Various kinds of processing such as the processing for a write request from the information processing device 111 and the NANG GC processing are usually performed as explained above. However, in some case, for example, a Program Error occurs in a write operation (a program operation) for the NAND memory 16, an erase error occurs in an erase operation for the NAND memory 16, or an ECC error (a failure in the error correction processing) occurs in a read operation for the NAND memory 16. In this case, exception handling for the error is necessary.

When any one of the errors occurs (step S190), the SSDC 41 adds a physical block in which the error occurs to the BBT 61 (step S191) and deletes the physical block in which the error occurs from the ABT 62 and the FBT 60 (step S192) to make is impossible to thereafter access the physical block in which the error occurs. Then, the SSDC 41 can copy data of the physical block in which the error occurs to another physical block. The SSDC 41 updates the statistical information 65 based on the error processing.

The examples of the error processing are explained above concerning the read processing, the write processing, and the NAND GC processing. However, the error processing is not limited to the examples and can be applied to all kinds of read processing, write processing, and erasing processing for the NAND memory 16.

Processing for Determining Life End

While the information processing device 111 is using the storage unit 2, values stored in the statistical information 65 are deteriorated and the storage unit 2 has reached the life end. For example, while the information processing device 111 is using the storage unit 2, the blocks of the NAND memory 16 are deteriorated in reliability, the number of bad blocks increases, and a sum of the number of free blocks and the number of active blocks decreases. Further, when the information processing device 111 is using the storage unit 2, even if the SSDC 41 executes the NAND GC, the number of free blocks sufficient for performing the write processing cannot be acquired. This is an example of a life end of the storage unit 2. In the following explanation, processing by the control program 200 performed when the life end of the storage unit 2 ends is explained.

When started, the control program 200 resides in the main memory 6 and monitors reliability information such as the statistical information 65 of the storage unit 2. To always monitor the statistical information 65 of the storage unit 2, it is desirable that the control program 200 is read from the area 16B (or the area 20B) to the area 6B when or immediately after the OS 100 is read from the area 16B (or 20B) to the area 6A (see FIGS. 2 and 3).

Figure 24:
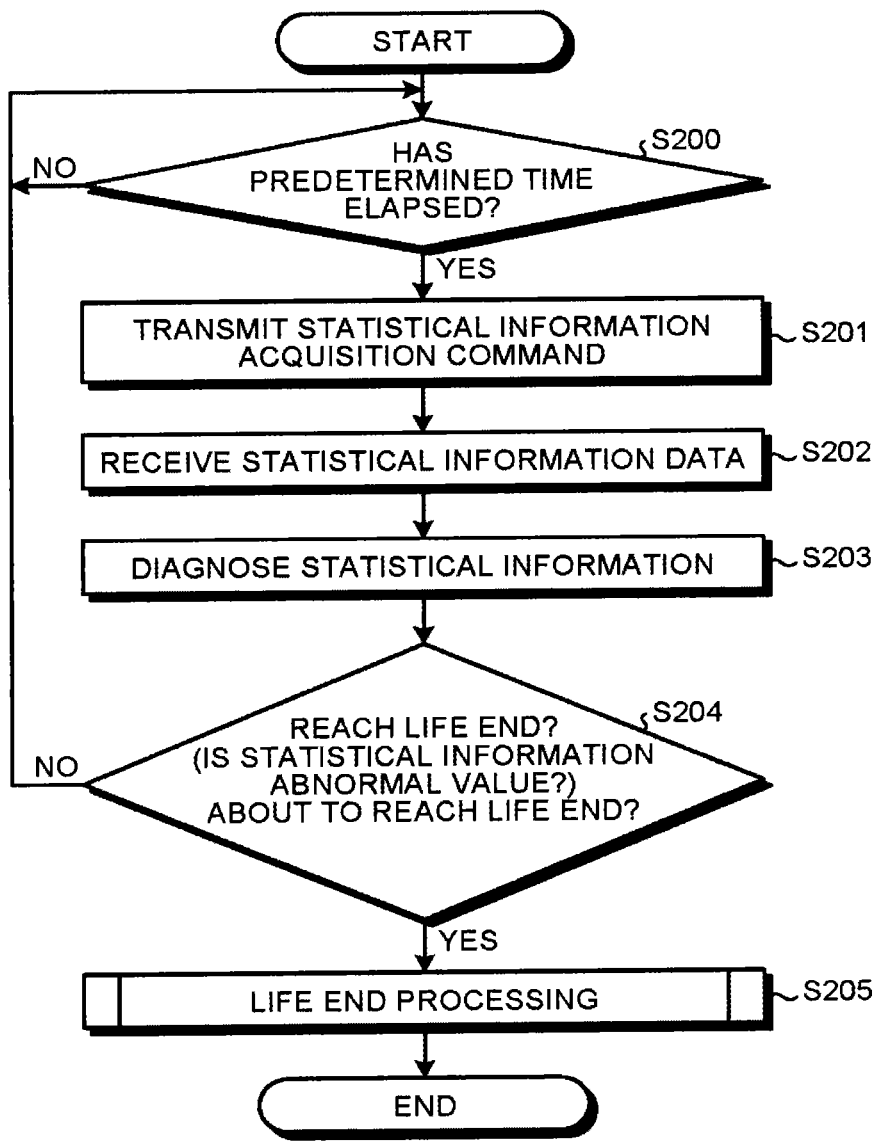
FIG. 24 is a flowchart for explaining statistical information acquisition processing.

For example, as shown in FIG. 24, the control program 200 acquires reliability information such as the statistical information 65 from the storage unit 2 at every fixed time (e.g., at every one minute) or in each fixed number of times of processing (e.g., at every 100 accesses to the storage unit 2 or at each 10 GB of data received by the storage unit 2). It is possible to perform more robust protection of user data by increasing a frequency of acquisition of the reliability information as the storage unit 2 is closer to the life end. As a method of acquiring statistical information, for example, a B0h/D0h SMART READ DATA command or a B0h/D5h SMART READ LOG command, which is a command of S.M.A.R.T (Self-Monitoring Analysis and Reporting Technology) used as a self diagnosis function for a memory, described in INCITS ACS-3 can be used. A 02h Get Log Page command described in NVM Express Revision 1.1 can be used. A SCT Command Transport described in ACS-3 or other vendor unique commands can be used. A 4Dh LOG SENSE command described in SCSI Primary Commands-4 (SPC-4), INCITS T10/1731-D, and Revision 36e (http://www.t10.org/) can be used.

In an example shown in FIG. 27, the SSDC 41 generates table data based on the statistical information 65 or directly stores table data in the statistical information 65 and transmits the table data to the information processing device 111 as reliability information. When using the S.M.A.R.T as the statistical information 65, as shown in FIG. 27, the SSDC 41 allocates an attribute ID to each of components of the statistical information 65. The SSDC 41 can allocate the attribute ID to only a part of the components of the statistical information 65. Concerning a component, a value of which increases as reliability is further deteriorated, among the components of the statistical information 65, the SSDC 41 calculates, for example, an attribute value, which is a value standardized as explained below.

$$\text{attribute value} = \text{SMAL} + \text{SMAB} \times (1-\text{AMALR}) \times (\text{RMAX}-\text{Raw Value})/\text{RMAX}$$

Raw Value is a value itself stored in the statistical information 65. RMAX is an upper limit value of the Raw Value for enabling guarantee of reliability. SMAB is a parameter set in advance as an initial value of the attribute value. For example, 100 is set as SMAB. SMAL (=attribute Threshold) is a value that the attribute value should reach when the Raw Value is equal to the upper limit value RMAX and is a parameter set in advance. For example, 30 is set as the SMAL. AMALR is a parameter derived from a relation AMALR=SMAL/SMAB and is equal to or larger than 0 and smaller than 1. In this way, the SSDC 41 calculates the attribute value of SMART information ("Value" in FIG. 27) and transmits the attribute value to the control program 200. The attribute Threshold is "Threshold" in FIG. 27. The Raw Value is "Raw Data" in FIG. 27.

For example, when the SSDC 41 uses the average erase count (the statistical information X04) as the Raw Value, if the present average erase count is 1000, Raw Data=1000. If the maximum erase count for enabling guarantee of the reliability of the NAND memory 16 is assumed to be 10000, RMAX=10000. If the SSDC 41 is designed to set an initial value of the attribute value to 100 in an initial state of the erase count=0, SMAB=100. When the erase count reaches RMAX=10000, the attribute value reaches SMAL.

Concerning a component, a value of which decreases as reliability is further deteriorated, among the components of the statistical information 65, the SSDC 41 calculates, for example, an attribute value, which is a value standardized as explained below.

$$\text{attribute value} = \text{SMAL} + \text{SMAB} \times (1-\text{AMALR}) \times (\text{Raw Value}-\text{RMIN})/(\text{RINIT}-\text{RMIN})$$

RMIN is a lower limit value of the Raw Value for enabling guarantee of reliability. RINIT is an initial value of the Raw Value.

Different values can be respectively adopted as the RMAX, the AMALR, and the SMAB for X01 to X32. When AMALR=0.3 is adopted at SMAB=100, a best value of the attribute value is 100 (e.g., 100 immediately after shipment) concerning statistical information to be adopted. When the attribute value gradually decreases as reliability is further deteriorated and the storage unit 2 cannot be guaranteed in reliability (the Raw Value of the statistical information is equal to or larger than RMAX) or the storage unit 2 is about to reach the life end, the attribute value reaches 30 or a smaller value. The control program 200 can use B0h/DAh SMART RETURN STATUS, which is a command described in ACS-3, as means for detecting whether the Attribute Value exceeds the Threshold and determine, from an output of the command, the life end according to whether the Attribute Value exceeds the Threshold.

Figure 28:
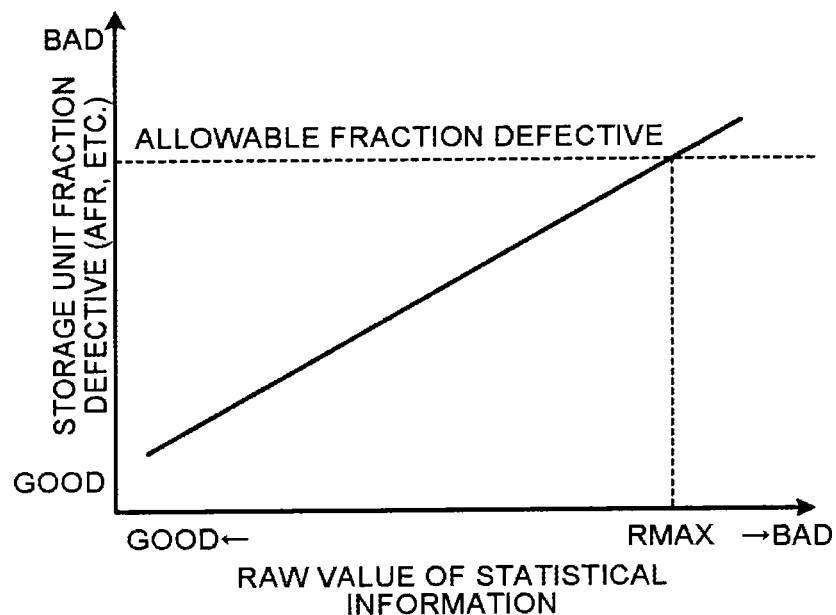
FIG. 28 is a graph of a relation between a Raw Value of the statistical information and a reject ratio of the SSD.

It is desirable that a manufacturer of the storage unit 2 derives a relation between the Raw Value of the statistical information and a fraction defective of the storage unit 2 in a development stage as shown in FIG. 28 and adopts, as the RMAX, the Raw Value at the time when the fraction defective exceeds an allowable value. For example, the manufacturer only has to perform, in the development stage of the storage unit 2, an abrasion test for verifying whether written data continues to be correctly stored for a fixed time or more while repeating a write operation at high temperature for a group of a large number of (e.g., one hundred) storage units 2 for test and, at the same time, continue to monitor the statistical information, and adopt, as the RMAX, the Raw Value of the statistical information at a point when the fraction defective reaches a fixed ratio. The manufacturer only has to leave the worn storage unit 2 untouched in a high-temperature state for a certain time or more, thereafter lower the temperature of the storage unit 2, perform a read operation for the storage unit 2, and, when read data cannot be subjected to ECC correction (or there are a fixed number or more of data that cannot be subjected to ECC correction), define this as a failure of the storage unit 2, and adopt, as a fraction defective, a value obtained by dividing the number of failures by the number of storage units 2 for which equivalent tests are performed. The manufacturer only has to adopt, the Raw Value, the fraction defective of which is significantly lower than the allowable fraction defective statistically, as the RMAX. The manufacturer can give a certain degree of margin to the RMAX and adopt, as the RMAX, RMAX'=RMAX−margin The manufacturer can adopt "Worst" in FIG. 27 as an index for a diagnosis of the life end of the storage unit 2 by the control program 200. "Worst" is calculated by the SSDC 41 as a worst value of the attribute value. For example, the Worst is a minimum value of the attribute value, for example, after shipment (or after manufacturing) of the storage unit 2. Alternatively, the manufacturer can adopt, as the Worst, a minimum value of the attribute value in a fixed time range in the past or can adopt, as the worst value, a minimum value in a period from the past when communication or processing was performed a certain fixed number of times (by a fixed data amount) to the present.

The manufacturer can adopt "Raw Data" (Raw Value) in FIG. 27 as a specification for a diagnosis of the life end of the storage unit 2 by the control program 200. The Raw Value of the statistical information is transmitted from the storage unit 2 to the control program 200 as the Raw Data. Then, the control program 200 already retains the RMAX in the control program 200, separately reads the RMAX from the storage unit 2, or reads the RMAX from another storage device to acquire the RMAX, compares the RMAX and the Raw Data, and, when Raw Data>RMAX or Raw Data RMAX, determines that the storage unit 2 has reached the life end. For example, in the case of the NAND GC failure flag, when the NAND GC failure flag is 1, the control program 200 determines that the storage unit 2 has reached the life end. For example, in the case of the total bad block count, when the total bad block count exceeds a predetermined value, the control program 200 determines that the storage unit 2 has reached the life end. As the Raw Data transmitted from the storage unit 2 to the information processing device 111, the Raw Value of the statistical information does not always need to be output. For example, the SSDC 41 can transmit, as the Raw Data, a value obtained by subjecting the Raw Value of the statistical information to the four arithmetic operations to the control program 200. The control program 200 can compare the Row Data with a value obtained by subjecting the RMAX to the four arithmetic operations to determine whether the storage unit 2 has reached the life end. The SSDC 41 can transmit, as the Raw Data, hashed data obtained by, for example, encrypting the Raw Value of the statistical information to the control program 200. The control program 200 can decrypt the Raw Data and compare the Raw Data with the RMAX of the data after the decryption to determine whether the storage unit 2 has reached the life end.

As explained above, the control program 200 determines whether the storage unit 2 has reached the life end (whether the storage unit 2 is in an abnormal state). When the control program 200 determines that the storage unit 2 has reached the life end (when the control program 200 determines that the storage unit 2 is in the abnormal state), the control program 200 shifts to life end processing (step S205) explained below. The statistical information 65 can adopt various forms other than the statistical information X01 to X32. The present invention can be applied to these forms as well. The present invention can be applied not only when a positive correlation is present in a relation between the statistical information and the fraction defective but also when a negative correlation is present in the relation between the statistical information and the fraction defective. The statistical information is, for example, a lowest temperature experienced by the storage unit 2 after shipment. Then, the control program 200 only has to adopt a lower limit value RMIN for enabling guarantee of reliability instead of the RMAX and, when the statistical information falls below the RMIN, determine that the storage unit 2 has reached the life end.

In this embodiment, the control program 200 acquires the statistical information at every fixed time (e.g., at every one minute) using S.M.A.R.T as shown in FIG. 24 (Yes at step S200). The control program 200 transmits B0h/D0h SMART READ DATA described in ACS-3, which is a statistical information acquisition command, to the storage unit 2 (step S201), receives data including the statistical information from the storage unit 2 (step S202), and diagnoses the received data (step S203). A diagnosis method is as explained above. When the control program 200 determines at step S204 that the storage unit 2 has reached the life end or when the control program 200 determines that the storage unit 2 is about to reach the life end (Yes at step S204), the control program 200 shifts to the life end processing (step S205). Even if the storage unit 2 has not reached the life end, for example, when the statistical information exceeds the RMAX set in advance or indicates an abnormal value, which is impossible in a normal operation, it is also desirable that the control program 200 shifts to the processing at step S205.

The control program 200 can perform the life end determination using, besides the SMART, Solid State Device Statistics (Log Address 04h, log page 07h) described in ACS-3 that can be acquired from the storage unit 2. For example, when the control program 200 determines that a value of Percentage Used Endurance Indicator of Offset 8-15 exceeds 100%, the control program 200 can shift to the life end processing.

The control program 200 can perform the life end determination using, besides the SMART, Identify Device Data that can be acquired according to an ECh IDENTIFY DEVICE command described in ACS-3. For example, when the control program 200 determines that a flag is set in a specific bit in the Identify Device Data, the control program 200 can shift to the life end processing. In particular, if the storage unit 2 is a SSD that adopts the invention of the Patent Literature 3, when the SSDC 41 shifts to a read only mode, the SSDC 41 can set a flag in a specific bit in the Identify Device Data. Consequently, the control program 200 can acquire the Identify Device Data to recognize that the storage unit 2 transitions to the read only mode and can shift to the life end processing.

The control program 200 can perform a life prediction for the storage unit 2 using life prediction technologies disclosed in Patent Literature 22 and the Patent Literature 23 and, when determining that the life end of the storage unit 2 is about to end in a fixed period, shift to the life end processing.

Figure 29:
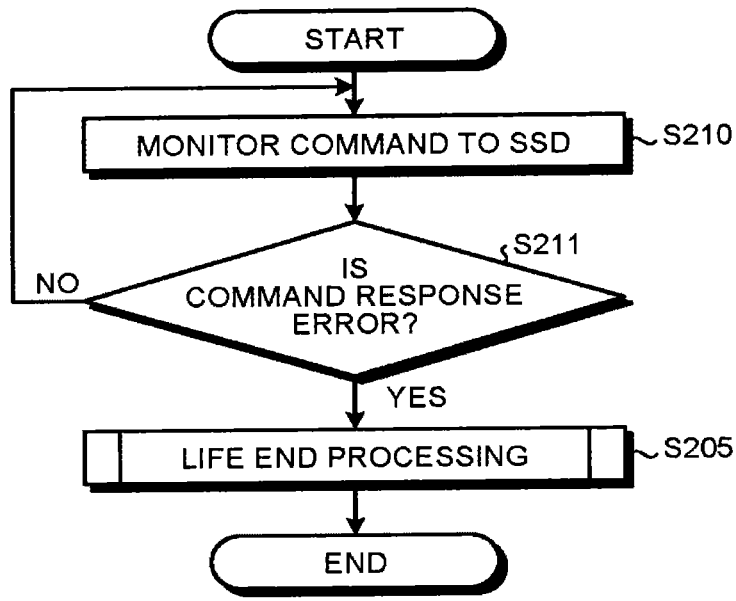
FIG. 29 is a flowchart for explaining an error command response handling process.

The control program 200 can shift to the life end processing using reliability information other than the statistical information 65. For example, as shown in FIG. 29, the control program 200 acquires (monitors), from the OS 100, the response information (see FIG. 7) received by the OS 100 from the storage unit 2 and uses the response information as the reliability information (step S210). When the response information is an error response (step S211), the control program 200 determines that the storage unit 2 reaches an abnormal state. The control program 200 shifts to the life end processing (step S205). A response to be monitored can be a response to any command. However, it is desirable in terms of a reduction in a load on the CPU 5 to monitor only responses to write commands to the storage unit 2 such as 61h WRITE FPDMA QUEUED and 35h WRITE DMA EXT described in ACS-3 and 01h Write command described in NVM Express Revision 1.1. In particular, if the storage unit 2 is a SSD that adopts the invention of Patent Literature 3, when the storage unit 2 has reached the life end, a response to the write command to the storage unit 2 is returned as an error. Therefore, it is possible to determine the life end without acquiring the statistical information. Naturally, the present invention can be applied when the storage unit 2 is not the SSD that adopts the invention of Patent Literature 3.

If the storage unit 2 is the storage unit 2 that adopts the invention of Patent Literature 3, in a state in which the storage unit 2 returns an error in response to the write command, in rewriting of a Boot Loader area of the storage unit 2 explained below, it is desirable that the SSDC 41 is configured not to return an error in response to a special write command (e.g., SCT command Transport described in ACS-3 and other vendor unique commands) in a Read Only mode state of Patent Literature 3 and write is performed in the storage unit 2 using the special write command. The special write command does not have to be used for write in a storage device other than the storage unit 2. Alternatively, if the OS 100 is an OS that uses only a certain write command (e.g., 61h WRITE FPDMA QUEUED) as the write command, the SSDC 41 can be configured to, when the SSDC 41 reaches Read Only of Patent Literature 3, return an error in response to the write command (e.g., 61h WRITE FPDMA QUEUED) 3, not return an error in response to another write command (e.g., 30h WRITE SECTOR(S)) and perform write of a Boot Loader area in the storage unit 2 using another write command (e.g., 30h WRITE SECTOR(S)).

Naturally, the command to be monitored can be a command other than the write command. For example, as a command response, a response (output) or a report to a B0H/D4H SMART EXECUTE OFF-LINE IMMEDIATE command described in ACS-3 can be monitored or a response to 90h EXECUTE DEVICE DIAGNOSTIC can be monitored. For example, the control program 200 can shift to the life end processing using a result of a self-test of the SMART acquired from the storage unit 2. The control program 200 transmits a B0h/D4h SMART EXECUTE OFF-LINE IMMEDIATE command described in ACS-3 to the storage unit 2, whereby the SSDC 41 executes the self-test. The control program 200 transmits B0h/D0h SMART READ DATA and a B0h/D5h SMART Read Log command described in ACS-3 to the storage unit 2 to acquire a result of the self-test as the reliability information. For example, when an error is included in the acquired result of the self-test, the control program 200 determines that the storage unit 2 has reached the life end.

Figure 30:
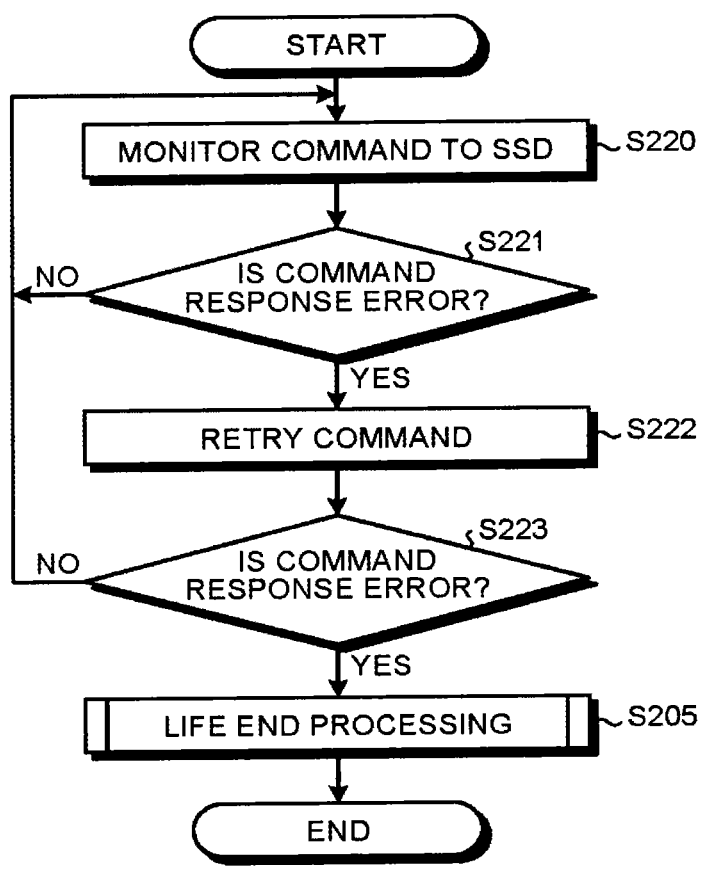
FIG. 30 is a flowchart for explaining another error command response handling process.

Even if a certain command response is an error response, if the command is transmitted again, it is likely that a command response is not an error. Then, because it is likely that the storage unit 2 has not reached the life end, in terms of performing the life end processing only when a command error having reproducibility occurs, it is desirable to perform the life end processing when the command error occurs a plurality of times. Further, in terms of strictly determining error reproducibility, it is desirable to perform the life end processing when the command error continuously occurs a plurality of times. Alternatively, as shown in FIG. 30, when an error response is received as a response to a command during monitoring of a command to the storage unit 2 (step S220 and Yes at step S221), the control program 200 or the OS 100 can transmit the command to the storage unit 2 again (command retry) (step S222) and, when an error response is received as a response to the retried command (Yes at step S223), perform the life end processing (step S205).

The control program 200 can shift to the life end processing using reliability information acquired from the information processing device 111. For example, when a thermometer is set in the information processing device 111, the control program 200 can monitor temperature output from the thermometer and, when the temperature exceeds an upper limit value or falls below a lower limit value, perform the life end processing as reliability deterioration time processing.

Data Configuration of in a Normal State

Figure 31:
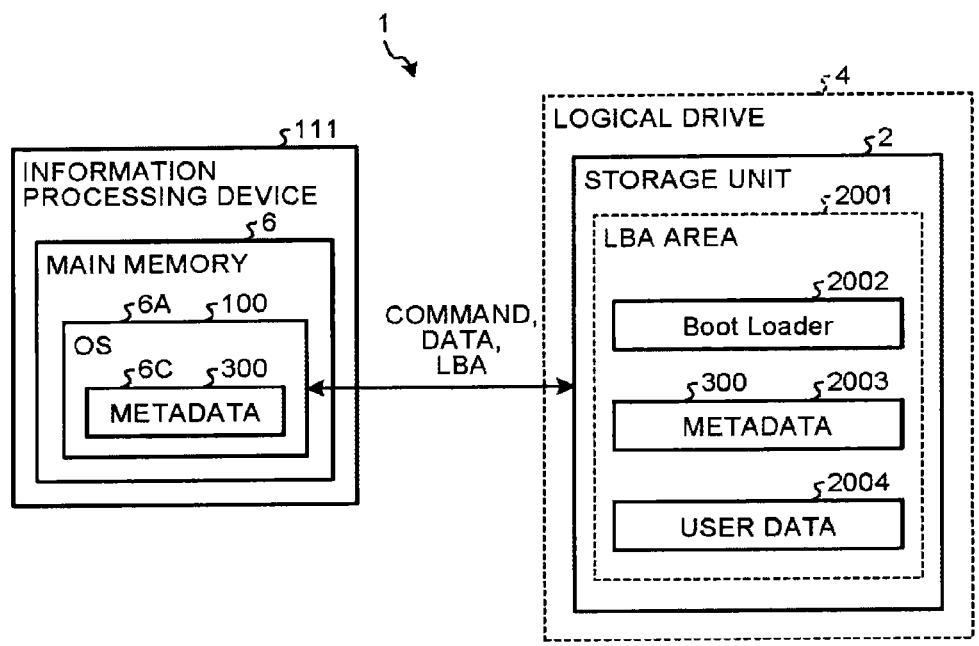
FIG. 31 is a diagram of a configuration example of data managed by an information processing device before life end processing is performed.

FIG. 31 is a configuration example of data managed by the information processing device 111 before the life end processing S205 is performed. As explained above, the information processing device 111 transmits a data read or a write command to the storage unit 2 designating an LBA, which is a logical address, rather than requesting the storage unit 2 to read or write data directly designating a physical address of the NAND memory 16. The SSDC 41 in the storage unit 2 dynamically maps the LBA and a physical address of the NAND memory 16 based on mapping information stored in the management information 44. In this way, data that can be directly managed by the information processing device 111 is managed according to the LBA. As an address space that can be managed by the information processing device 111, an LBA area 2001 is mapped to the storage unit 2. The LBA area 2001 includes a Boot Loader area 2002, a metadata area 2003, and a user data area 2004. A part of the areas can be allocated to an area other than the LBA area such as a log page address accessible by a SMART Read Log command or a Read Log command of ACS-3. The storage unit 2 is allocated to the logical drive 4.

Figure 32:
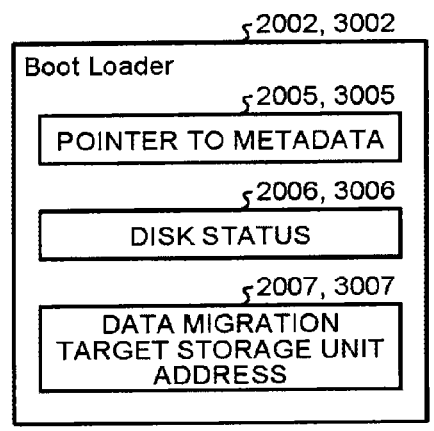
FIG. 32 is a diagram of internal data of a Boot Loader.

The Boot Loader area 2002 is an area read during the start of the information processing device 111. In this embodiment, the Boot Loader area 2002 is allocated to a fixed area of the LBA. However, the information processing device 111 can dynamically allocate the Boot Loader area 2002. As an example of the Boot Loader area, for example, there is a Master Boot Record (MBR). In the MBR, for example, an area of one logical sector in total (512 Bytes in total) of LBA=0x000 is allocated as the fixed Boot Loader area. As an example of the Boot Loader area, for example, there is a GUID partition table (GPT). In this embodiment, the Boot Loader area 2002 includes, as shown in FIG. 32, a metadata pointer area 2005 in which a head LBA of the metadata area 2003 is stored, a status storage area 2006 in which a storage status is stored, and an address area 2007 (a data migration target management area 2007) in which a data migration target storage device address is stored. For example, when the storage unit 2 is a data migration source and the storage unit 3 is a data migration destination, a storage unit identification name of the storage unit 3 is stored in the data migration target management area 2007 of the storage unit 2 and a storage unit identification name of the storage unit 2 is stored in a data migration target management area 3007 of the storage unit 3. In this embodiment, data stored in the status storage area 2006 can take values 0 to 5. The respective values indicate states of a storage unit at a storage destination as follows:

0: initial storage state
  1: normal state
  2: low reliability state
  3: data migration source state (protected state)
  4: data migration destination state
  5: discard target state The information processing device 111 reads the pointer 2005 when started, specifies an LBA of the metadata area 2003, and reads the metadata 300 from the metadata area 2003 of the LBA area 2001 to a metadata area 6C of the main memory 6. When rewriting of a file takes place, the OS 100 rewrites the metadata 300 of the metadata area 6C of the main memory 6, periodically backs up the metadata 300 of the metadata area 60 in the metadata area 2003 of the storage unit 2, and sequentially records a journal of the metadata 300 in the metadata area 2003 of the storage unit 2.

Figures 33, 34:
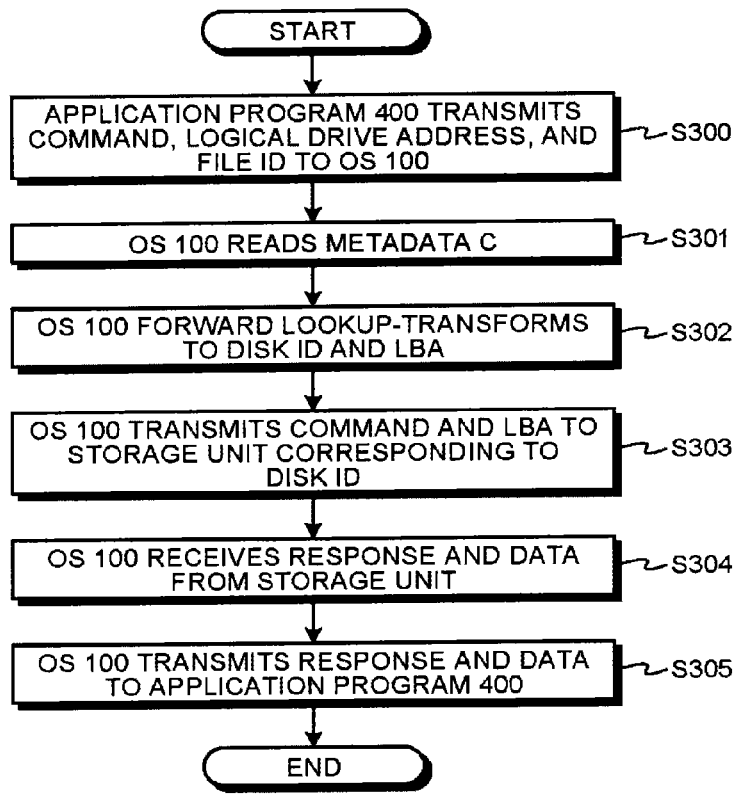
FIG. 33 is a diagram of a configuration example of metadata.
FIG. 34 is a flowchart of a procedure performed when an application program transmits an access request to a logical drive to an OS.

FIG. 33 is a configuration example of the metadata 300. A file ID is an address or a file name of data used by the application program 400 to identify the data. A logical drive address is an address allocated to each of logical drives used for specifying the logical drive 4 (see FIGS. 31 and 38). A storage unit identification name is an address allocated to a physical storage device used for specifying a physical storage device such as the storage unit 2 or the storage unit 3. In this embodiment, a WWN (World Wide Name) is used as the storage unit identification name. Because different values are respectively allocated to storage devices as the WWN, the WWN can be used to distinguish the physical storage device. The WWN is stored in, for example, Word108-111 of data read by an ECh Identify Device command described in ACS-3. Alternatively, as the storage unit identification name, for example, a serial number allocated to Word10-19 of data read by the ECh Identify Device command described in ACS-3 can be used, a Serial Number (SN) allocated to Byte23:04 of data read by a 06h Identify command described in NVM Express Revision 1.1 can be used, or a MAC (Media Access Control) address or an IP (Internet Protocol) address in a network protocol can be used. The storage unit identification name can be written in a storage device in advance during manufacturing of the storage device or can be allocated anew by the information processing device 111 when the storage device is connected to the information processing device 111. An LBA address of the user data area 2004 mapped by the metadata 300 is stored in the LBA of the metadata 300. An LBA of an area other than the user data area 2004 such as an LBA of the metadata area 2003 or the Boot Loader area 2002 can be stored in the LBA of the metadata 300. A sector count indicates a data length.

The metadata 300 is used by the OS 100 to forward-look up the storage unit identification name, the LBA, and the sector count from the file ID and the logical drive address or used by the OS 100 to reverse-look up the logical drive address and the file ID from the storage unit identification name, the LEA, and the sector count. Usually, the application program 400 directly designates the storage unit 2 and the LBA and does not perform read from and write in the storage unit and the storage device. The OS 100 recognizes (mounts) the storage unit 2 as the logical drive 4. When the application program 400 transmits the logical drive address and the file ID to the OS 100, the OS 100 reads the metadata 300, specifies a storage unit and an LBA corresponding to the logical drive and the file ID, and transmits a command and the LBA to the storage unit.

The logical drive is allocated to one or a plurality of physical drives, which is lower order layers, or an LBA area in a part of the physical drives by the OS 100 and the control program 200 shown in FIG. 7. Consequently, the application program 400, which is a higher order layer, virtually recognizes the logical drive as one drive. In this embodiment, in a state before the life end processing S205, the logical drive 4 is allocated to the storage unit 2, which is as a physical storage device. Even in the state before the life end processing S205, a storage array of Redundant Arrays of Inexpensive Disks (RAID), for example, a storage array of RAID0 or RAID5 can be configured using a plurality of physical storage devices. The storage array can be recognized as one logical drive 4. The present invention can also be applied in that case.

FIG. 34 is a flowchart of a procedure performed when the application program 400 transmits an access request to the logical drive 4 to the OS 100. When the application program 400 transmits an access request (e.g., a file read request or a file write request), a logical drive address, and a file ID to the OS 100 (step S300), the OS 100 reads the metadata 300 from the metadata area 6C (step S301). The OS 100 forward lookup-transforms the logical drive address and the file ID into a storage unit identification name and an LBA (step S302) and transmits a command and the LBA to a storage unit corresponding to the storage unit identification name (step S303). The storage unit performs a write operation in the user data area 2004 and a read operation from the user data area 2004 according to the command and transmits a response or data to the OS 100 (step S304). The OS 100 receives the response and the data from the storage unit and transmits a response and the data to the application program 400 and the processing ends (step S305).

In this embodiment, in a state before the life end processing S205 concerning the storage unit 2 is performed, because the logical drive 4 is configured from only the storage unit 2, all storage unit identification names corresponding to the logical drive 4 in the metadata 300 are WWNs of the storage unit 2. On the other hand, as in building of a RAID array in a logical drive, a plurality of storage unit identification names can be allocated to one logical drive address in the metadata 300 before the life end processing S205 is performed.

Figure 35:
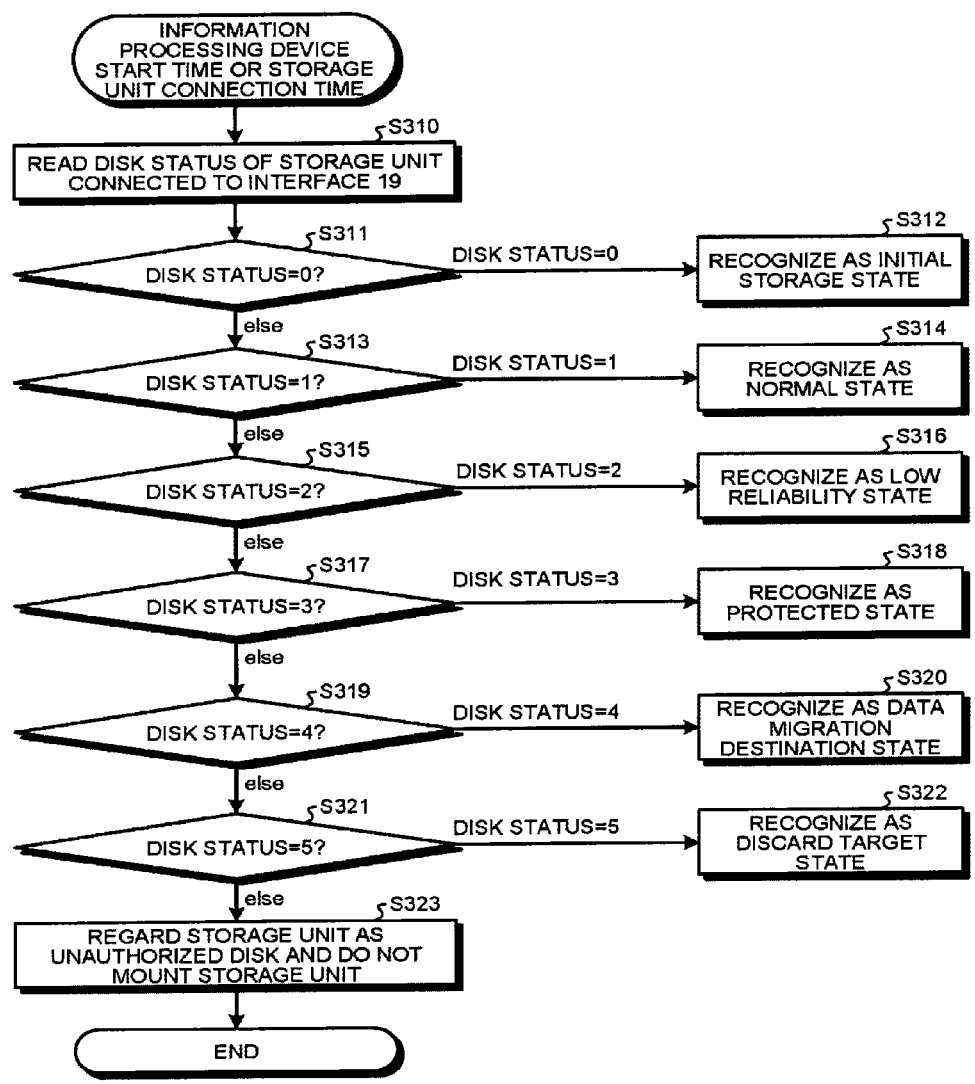
FIG. 35 is a flowchart for explaining a processing procedure of a control program performed when, for example, the information processing device starts.

In the storage status area 2006, information concerning a storage unit for the OS 100 is stored. FIG. 35 shows a processing procedure of the control program 200 performed when the information processing device 111 starts and when the storage unit is connected to the interface 19. The control program 200 reads the storage status area 2006 of the Boot Loader area 2002 of the storage unit through the interface 19 and changes, according to a read value, a state of the storage unit notified to the OS 100. When a storage status is 0 (step S311), the control program 200 notifies the OS 100 that the storage unit is an initial storage unit. The OS 100 recognizes the storage unit as the initial storage unit (step S312). During factory shipment of the storage unit or when the information processing device 111 erases the storage unit by using a F4h Security Erase Unit command of ACS-3, a 80h Format NVM command of NVM Express Revision 1.1, or the like, a value of the storage status area 2006 of the storage unit is changed to the storage status=0. When the information processing device 111 formats the storage unit, a value of the storage status area 2006 of the storage unit is changed to the storage status=0.

When the storage status is 1 (step S313), the control program 200 notifies the OS 100 that the storage unit is in the normal state. The OS 100 recognizes the storage unit as being in the normal state (step S314). The storage status of the storage unit 2 before the life end processing S205 is the storage status=1.

When the storage status is 2 (step S315), the control program 200 notifies the OS 100 that the storage unit is in the low reliability state. The control program 200 recognizes the storage unit as being in the low reliability state (step S316) and performs the life end processing S205.

When the storage status is 3 (step S317), the control program 200 notifies the OS 100 that the storage unit is performing data migration work functioning as a data migration source. The OS 100 recognizes the storage unit as being in a protected state (step S318).

When the storage status is 4 (step S319), the control program 200 notifies the OS 100 that the storage unit is performing data migration work functioning as a data migration destination. The OS 100 recognizes the storage unit as being in the data migration destination state (step S320).

When the storage status is 5 (step S321), the control program 200 notifies the OS 100 that the storage unit is in the discard target state. The OS 100 recognizes the storage unit as being in the discard target state (step S322). When the storage status is other than 0 to 5, it is desirable that the OS 100 regards the storage unit as an unauthorized storage unit and does not mount the storage unit (step S323).

Figure 36:
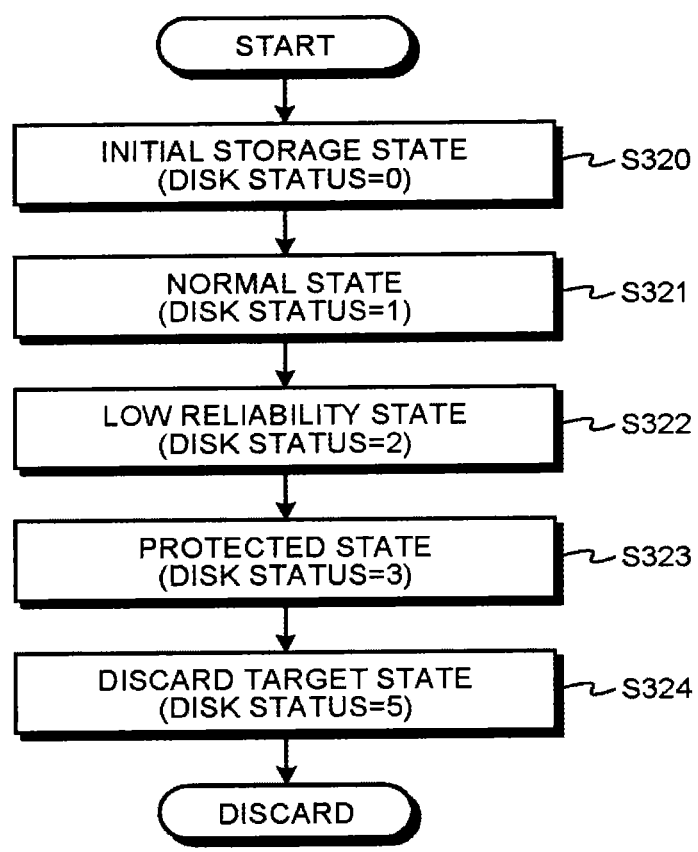
FIG. 36 is a state transition chart for explaining a life cycle of a storage unit.
Figure 37:
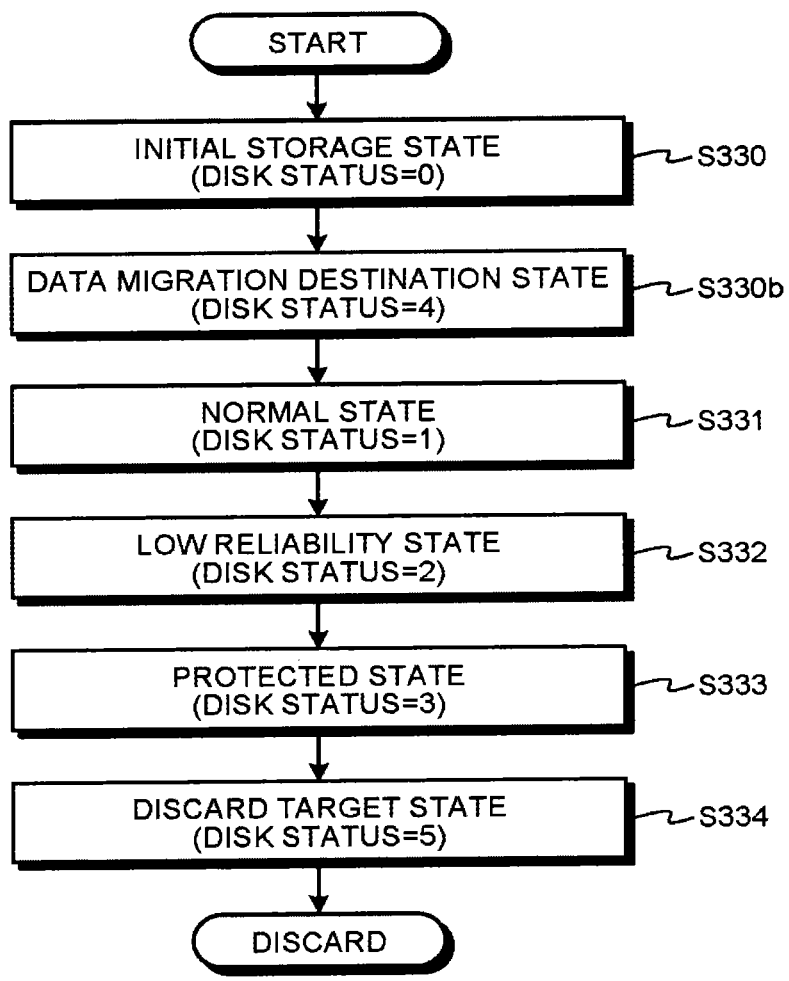
FIG. 37 is a state transition chart for explaining a life cycle of the storage unit.

FIGS. 36 and 37 are state transition charts for explaining a life cycle of the storage unit. A value of the storage status area 2006 of the storage unit immediately after manufacturing of the storage unit, immediately after shipping of the storage unit, immediately after erasing of the storage unit, and immediately after formatting of the storage unit is the storage status=0 indicating the initial storage state (step S330). Thereafter, the storage status changes to the storage status=1 indicating the normal state, whereby the storage unit is used as a normal storage unit by the OS 100 (step S331). As the storage unit is further deteriorated in reliability, the storage unit transitions to the storage status=2 indicating the low reliability state (step S332). After transitioning to the storage status=3 indicating the protected state (step S333), the storage unit changes to the storage status=5 indicating the discard target state (step S334). Then, finally, the storage unit is discarded by an operator or an administrator of the information processing system 1.

FIG. 37 shows a life cycle of the storage unit recognized as being in the data migration destination state on the information processing device 111. Then, after the initial storage state of the storage state=0 at step S330, after transitioning to the data migration destination state (the storage status=4) (step S330b), the storage unit in the data migration source state is detached, whereby the storage unit is used in the normal state of the storage status=1 (step S331).

Figure 38:
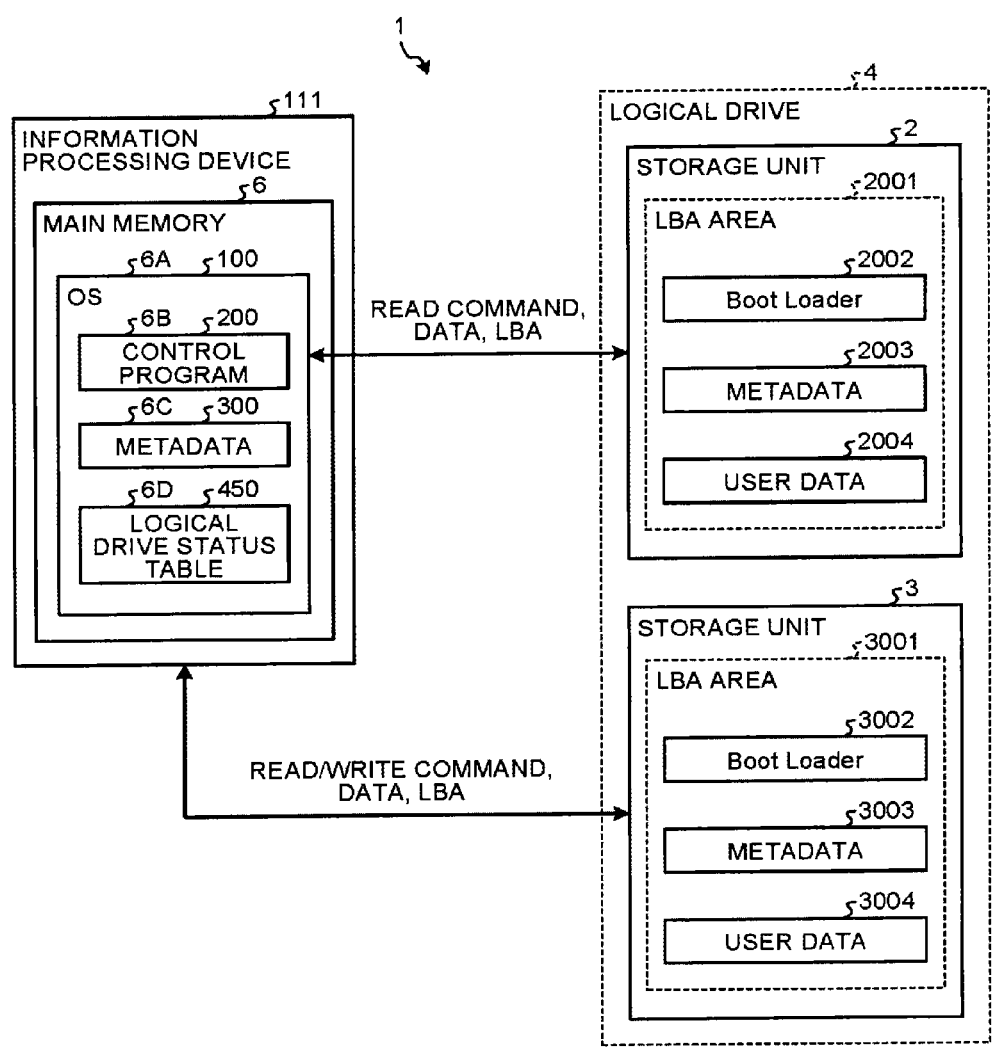
FIG. 38 is a diagram of a configuration example of data managed by the information processing device in a state in which a data migration source storage unit and a data migration destination storage unit are connected.

FIG. 38 shows a state in which, when the storage unit 2 is recognized as being in the low reliability state, the storage unit 3 different from the storage unit 2 is connected. An LBA area 3001 is allocated to the connected source unit 3 as an address space that can be managed by the information processing device 111. The LEA area 3001 includes a Boot Loader area 3002, a metadata area 3003, and a user data area 3004.

Figure 39:
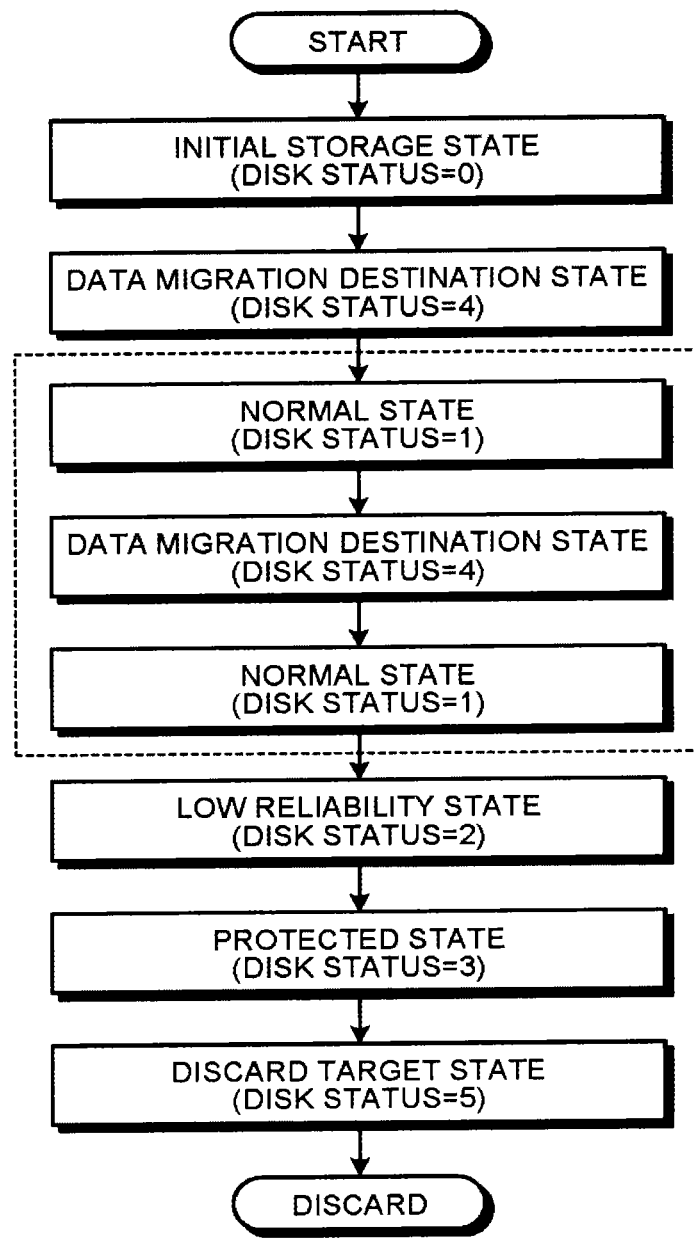
FIG. 39 is a state transition chart of a life cycle of the storage unit.

When the storage unit 2 is recognized as being in the low reliability state, as indicated by a broken line part of FIG. 39, the storage unit 3 in the normal state already connected to the information processing device 111 can be recognized as being in the data migration destination state instead of a storage unit in the initial storage state being recognized as being in the data migration destination state when the storage unit is connected to the information processing device 111.

Life End Processing (Processing at the End of the Storage Unit's Life)

Figure 40:
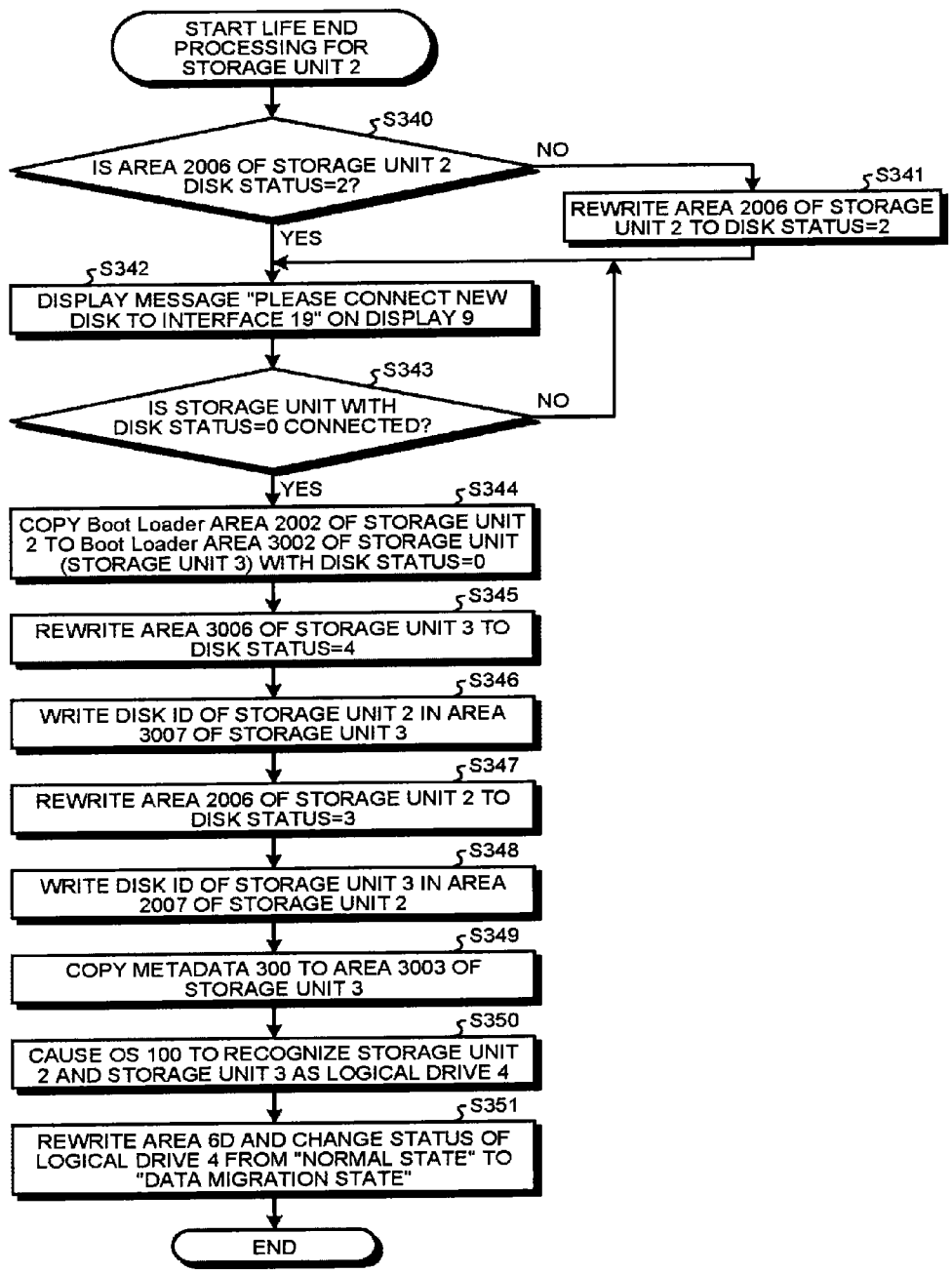
FIG. 40 is a flowchart for explaining processing performed by the control program in the life end processing.

A flowchart of processing performed by the control program 200 in the life end processing S205 is shown in FIG. 40. When the connected storage unit 2 has reached the life end or is about to reach the life end and the life end processing is started, the control program 200 determines whether the storage status area 2006 of the Boot Loader area 2002 is in the storage status=2 (the low reliability state) (step S340). When a result of the determination is negative, the control program 200 rewrites the storage status area 2006 to the storage status=2 (step S341) and shifts the procedure to step S342. When the determination result at step S340 is affirmative, the control program 200 shifts the procedure to step S342.

As at step S342, it is desirable that the control program 200 displays, on the display 9, a message for urging connection of a new storage unit such as "please connect a new storage unit to the interface 19". The control program 200 determines whether a storage unit in the storage status=0 (the initial storage state) is connected (step S343).

When a new storage unit is connected (when the storage unit 3 is connected), the control program 200 copies the Boot Loader area 2002 of the storage unit 2 to the Boot Loader area 3002 of the connected storage unit 3 in the storage status=0 (the initial storage state) (step S344, see FIG. 32). The control program 200 rewrites the storage status area 3006 of the Boot Loader 3002 of the storage unit 3 to the storage status=4 (the data migration destination status) (step S345).

When a storage unit in the storage status=0 (the initial storage state) is already connected or when a storage unit in the storage status=1 (the normal state) that can be allocated as the data migration destination is already connected at the point of Yes at step S340 or at the point of step S341, the control program 200 can set the storage unit as the storage unit 3, copy the Boot Loader area 2002 of the storage unit 2 to the Boot Loader area 3002 of the storage unit 3, and rewrite the storage status area 3006 of the Boot Loader area 3002 of the storage unit 3 to the storage status=4.

The control program 200 writes the storage unit identification name of the storage unit 2 in the data migration target management area 3007 of the Boot Loader area 3002 of the storage unit 3 (step S346). The control program 200 rewrites the storage status area 2006 of the Boot Loader area 2002 of the storage unit 2 to the storage status=3 (the protected state) (step S347). The control program 200 writes the storage unit identification name of the storage unit 3 in the data migration target management area 2007 of the Boot Loader area 2002 of the storage unit 2 (step S346). Looking at the data migration target management area 2007 of the storage unit 2 and the data migration target management area 3007 of the storage unit 3, the user can recognize that the storage unit 2 and the storage unit 3 are a pair for the data migration processing.

The control program 200 reads the latest metadata 300 from the main memory 6 or the metadata storage area 2003 of the storage unit 2, writes the read latest metadata 300 in the metadata storage area 3003 of the storage unit 3, and copies the latest metadata 300 (step S349). The control program 200 causes the OS 100 to recognize the storage unit 2 and the storage unit 3 as one logical drive 4 (step S350). The control program 200 updates the logical drive status table 450 in an area 6D on the main memory 6 such that the status changes from the "normal state" to the "data migrating state" (step S351).

FIG. 41 shows the logical drive status table 450 stored in the area 6D of the main memory 6. In the logical drive status table 450, correspondence between a plurality of logical drives and a plurality of statuses is managed. The control program 200 updates the logical drive status table 450 at any time based on a state (the normal state or the data migrating state) of the logical drives.

In this embodiment, as shown in FIG. 38, according to the life end processing S205, the storage unit 2 and the storage unit 3 are recognized as the logical drive 4 functioning as a singular logical drive. Read and write of data after the new storage unit 3 is connected until the logical drive 4 is built using the storage unit 3 take place at a degree equivalent to a data amount of the metadata 300 at most. Therefore, compared with time until the storage unit is replaced in the RAID storage array and mounted as the logical drive, mounting of the storage unit 3 is performed at extremely high speed.

Before the life end processing S205, the metadata 300 in the metadata area 6C of the main memory 6 and the journal of the metadata 300 is periodically backed up in the metadata area 2003 of the data migration source storage unit 2 by the OS 100. However, after the life end processing S205, the metadata 300 in the metadata area 6C of the main memory 6 and the journal of the metadata 300 are periodically backed up in the metadata area 3003 of the data migration destination storage unit 3 by the OS 100. Consequently, metadata close to the latest metadata is stored in the metadata area 3003. Old metadata before the life end processing S205 is stored in the metadata area 2003.

Figure 42:
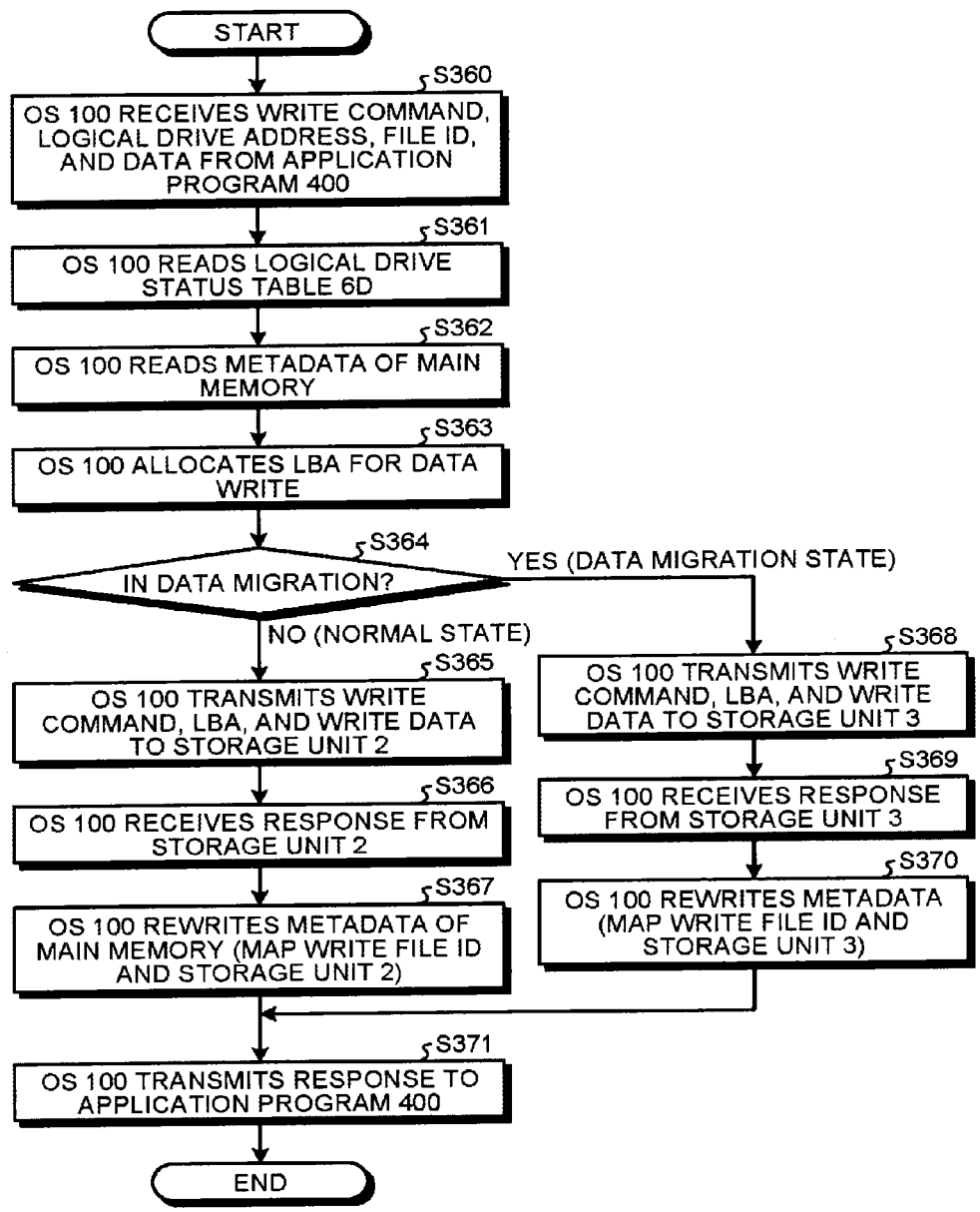
FIG. 42 is a flowchart for explaining a processing procedure of the OS performed when a write request is transmitted from the application program to the OS.

In the above explanation, the low reliability state of the storage status=2 is defined. However, when the control program 200 determines as a result of comparison of the reliability information and the threshold that the storage unit 2 has reached the life end, the control program 200 can immediately shift the storage state of the storage unit 2 to the data migration source state (the protected state) of the storage status=3 without shifting the storage status to the low reliability state of the storage status=2. That is, when the life end processing is started, at step S340 in FIG. 40, the control program 200 determine whether the storage status area 2006 of the Boot Loader area 2002 of the storage unit 2 is the storage status=3 (the data migration source state). When a result of the determination is negative, at step S341 in FIG. 40, the control program 200 rewrites the storage status area 2006 to the storage status=3 and shifts the procedure to step S342. The subsequent procedure is the same as the procedure shown in FIG. 40 except that step S347 is deleted. Write in the logical drive FIG. 42 shows a processing procedure of the OS 100 performed when a file data write request is transmitted from the application program 400 to the OS 100. The OS 100 receives a write request, a logical drive address, a file ID, and data from the application program 400 (step S360). The OS 100 reads the logical drive status table 450 from the main memory 6 (step S361), reads the metadata 300 from the main memory 6 (step S362), and allocates an LBA for data write referring to the metadata 300 (step S363).

The OS 100 determines whether a logical drive designated by a write command based on the logical drive status table 450 is in the normal state or the data migrating state (step S364). When the logical drive is in the normal state, the OS 100 transmits a write command, the LBA, and write data to the storage unit 2 (step S365). The OS 100 receives a response from the storage unit 2 (step S366). The OS 100 updates metadata on the main memory 6 and maps a write file ID to the storage unit 2, the LBA, and a sector count (step S367). The OS 100 transmits a response to the application program 400 (step S371).

When the logical drive is in the data migrating state, the OS 100 transmits a write command, the LBA, and write data to the data migration destination storage unit 3 (step S368). The OS 100 receives a response from the storage unit 3 (step S369). The OS 100 rewrites the metadata on the main memory 6 and maps a write file ID to the storage unit 3, the LBA, and a sector count (step S370). The OS 100 transmits a response to the application program 400 (step S371). That is, when the logical drive is in the data migrating state, according to write in the data migration destination storage unit 3, the OS 100 updates the metadata on the main memory 6 such that addresses of stored data of the storage unit 2 and the storage unit 3 are changed. Update processing for the metadata for an address of stored data involved in the write can be performed simultaneously and in parallel with the write processing in the storage unit 3, can be performed in the write processing in the storage unit 3, can be performed before the write processing in the storage unit 3 is performed, and can be performed after the write processing in the storage unit 3 is performed.

File Delete Request to the Logical Drive

Figure 43:
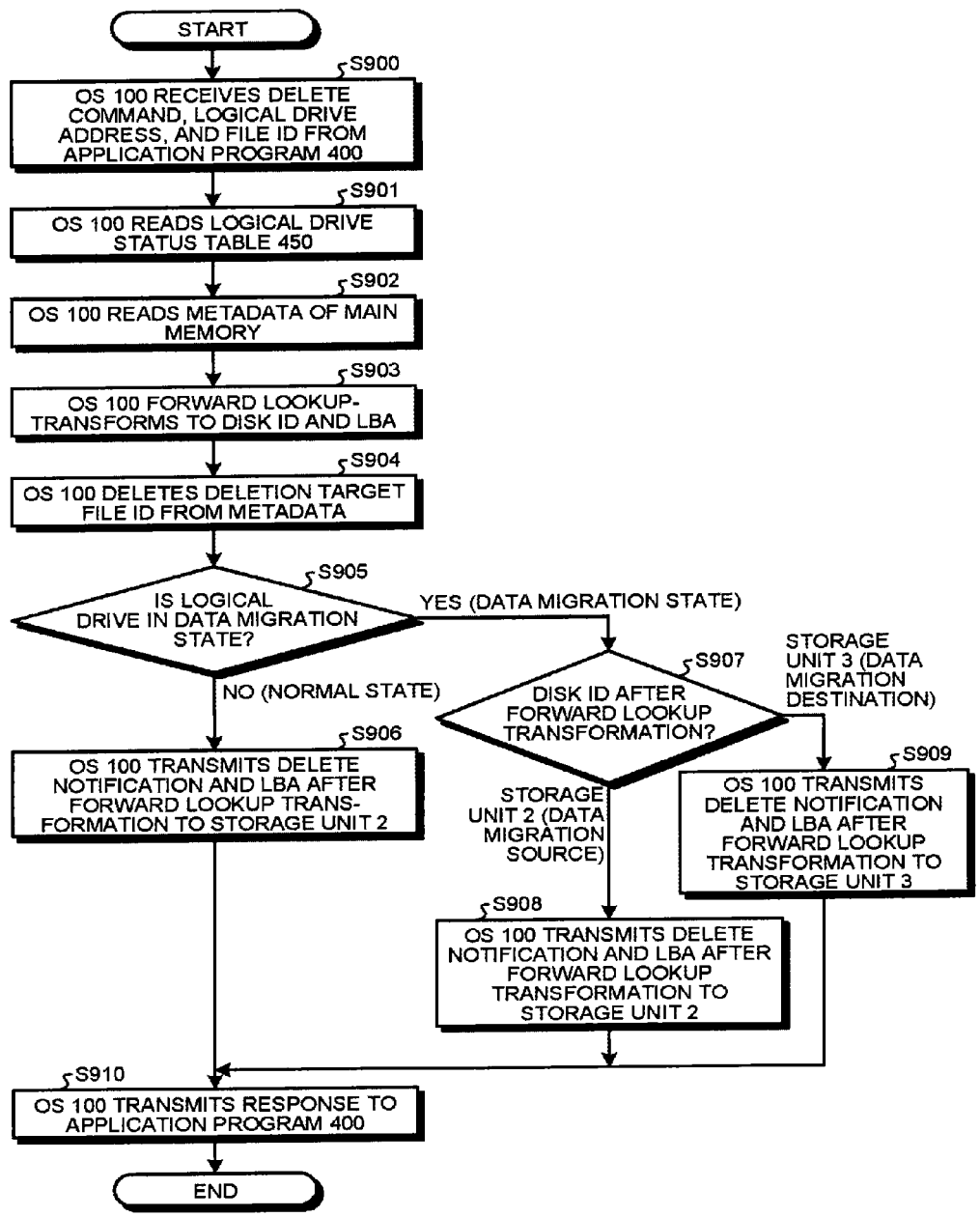
FIG. 43 is a flowchart for explaining a processing procedure of the OS performed when a delete request is transmitted from the application program to the OS.

FIG. 43 shows a processing procedure of the OS 100 performed when a file delete request is transmitted from the application program 400 to the OS 100. The OS 100 receives a delete command, a logical drive address, and a file ID from the application program 400 (step S900). The OS 100 reads the logical drive status table 450 from the main memory 6 (step S901), reads the metadata 300 from the main memory 6 (step S902), and forward lookup-transforms the logical drive address and the file ID into a storage unit identification name and an LBA referring to the metadata 300 (step S903). The OS 100 deletes a row in which a file ID of a delete target file is included from the metadata in the memory 6 or rewrites the file ID of the delete target file on the metadata in the main memory 6 with an invalid ID to delete the delete target file ID from the metadata 300 (step S904).

The OS 100 determines whether a logical drive designated by a delete command based on the logical drive status table 450 is in the normal state or the data migrating state (step S905). When the logical drive is in the normal state, the OS 100 transmits a delete notification and an LBA to the storage unit 2 (step S906). The OS 100 receives a response from the storage unit 2. The OS 100 transmits a response to the application program 400 (step S910).

When the logical drive is in the data migrating state, the OS 100 determines whether the storage unit identification name after the forward lookup transformation is the data migration source storage unit 2 or the data migration destination storage unit 3 (step S907). When the storage unit identification name after the forward lookup transformation is the storage unit 2, the OS 100 transmits a delete notification and an LBA to the storage unit 2 (step S908), receives a response from the storage unit 2, and transmits a response to the application program 400 (step S910). When the storage unit identification name after the forward lookup transformation is the storage unit 3, the OS 100 transmits a delete notification and an LBA to the storage unit 3 (step S909), receives a response from the storage unit 3, and transmits a response to the application program 400 (step S910).

Data Read from the Logical Drive

Figure 44:
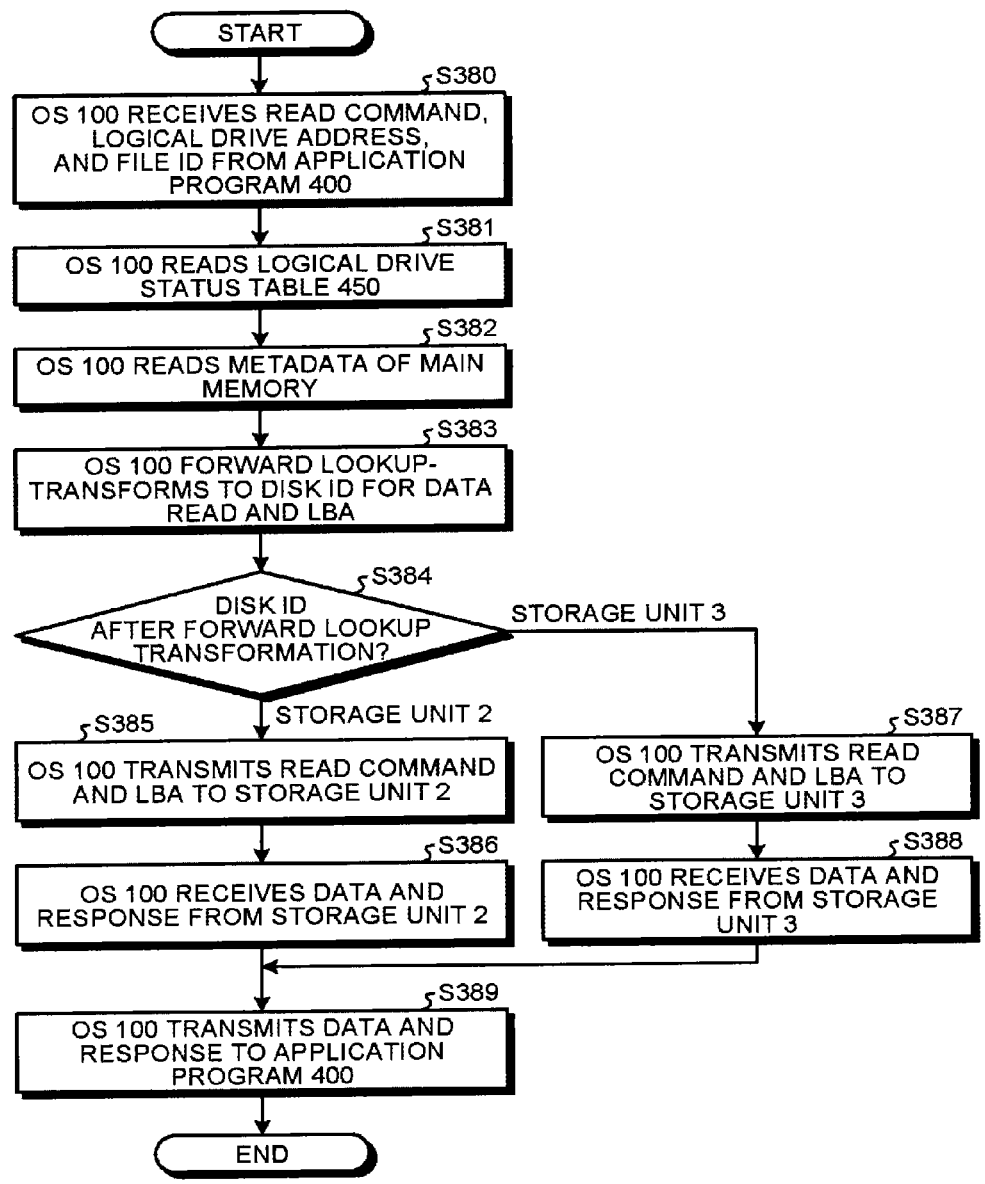
FIG. 44 is a flowchart for explaining a processing procedure of the OS performed when a read request is transmitted from the application program to the OS.

FIG. 44 shows a processing procedure of the OS 100 performed when a read request for file data is transmitted from the application program 400 to the OS 100. The OS 100 receives a read request, a logical drive address, and a file ID from the application program 400 (step S380). The OS 100 reads the logical drive status table 450 from the main memory 6 (step S381), reads the metadata 300 from the main memory 6 (step S382), and forward lookup-transforms the logical drive address and the file ID into a storage unit identification name, an LBA, and a sector count for data read referring to the metadata 300 (step S383).

When the storage unit identification name after the forward lookup transformation designates the storage unit 2 (step S384), the OS 100 transmits a read command, the LBA, and the sector count to the storage unit 2 (step S385). The OS 100 receives a response and read data from the storage unit 2 (step S386). The OS 100 transmits the read data and a response to the application program 400 (step S389).

When the storage unit identification name after the forward lookup transformation designates the storage unit 3 (step S384), the OS 100 transmits a read command, the LBA, and the sector count to the storage unit 3 (step S387). The OS 100 receives a response and read data from the storage unit 3 (step S388). The OS 100 transmits the read data and a response to the application program 400 (step S389). For example, when LBA=0 indicates a data migrated state and LBA=1 indicates a data un-migrated state, if read is performed with the LBA=0 and sector count=1, the read is performed from the storage unit 3 of the storage unit 2 and the storage unit 3, if read is performed with the LBA=1 and the sector count=1, the read is performed from the storage unit 2 of the storage unit 2 and the storage unit 3, and, if read is performed with the LBA=0 and sector count=2, the read is performed from both of the storage unit 2 and the storage unit 3.

In this way, write in the data migration source storage device is prohibited and data migration from the data migration source storage device to the data migration destination storage device is realized using write in the data migration destination storage unit 3. Therefore, backup work by the administrator, the operator, or the user of the information processing system 1 is unnecessary. In the data migration, copying of the user data 2004 is not performed. The data migration is performed using new write processing of the user data 2004. Therefore, write processing performance of the application program 400 is not deteriorated even during the data migration. After the life end processing S205, write processing that takes place in the storage unit 2 is limited to only write processing in the storage status area 2006 at most. Therefore, write processing in the storage unit 2 hardly takes place. In this way, even after the life end processing S205 for the storage unit 2, the logical drive 4 itself is recognized as a readable and writable drive for the application program 400. However, actually, for the information processing device 111, the storage unit 2 is treated as if the storage unit 2 is a read only device.

Write Back Backup

Figure 45:
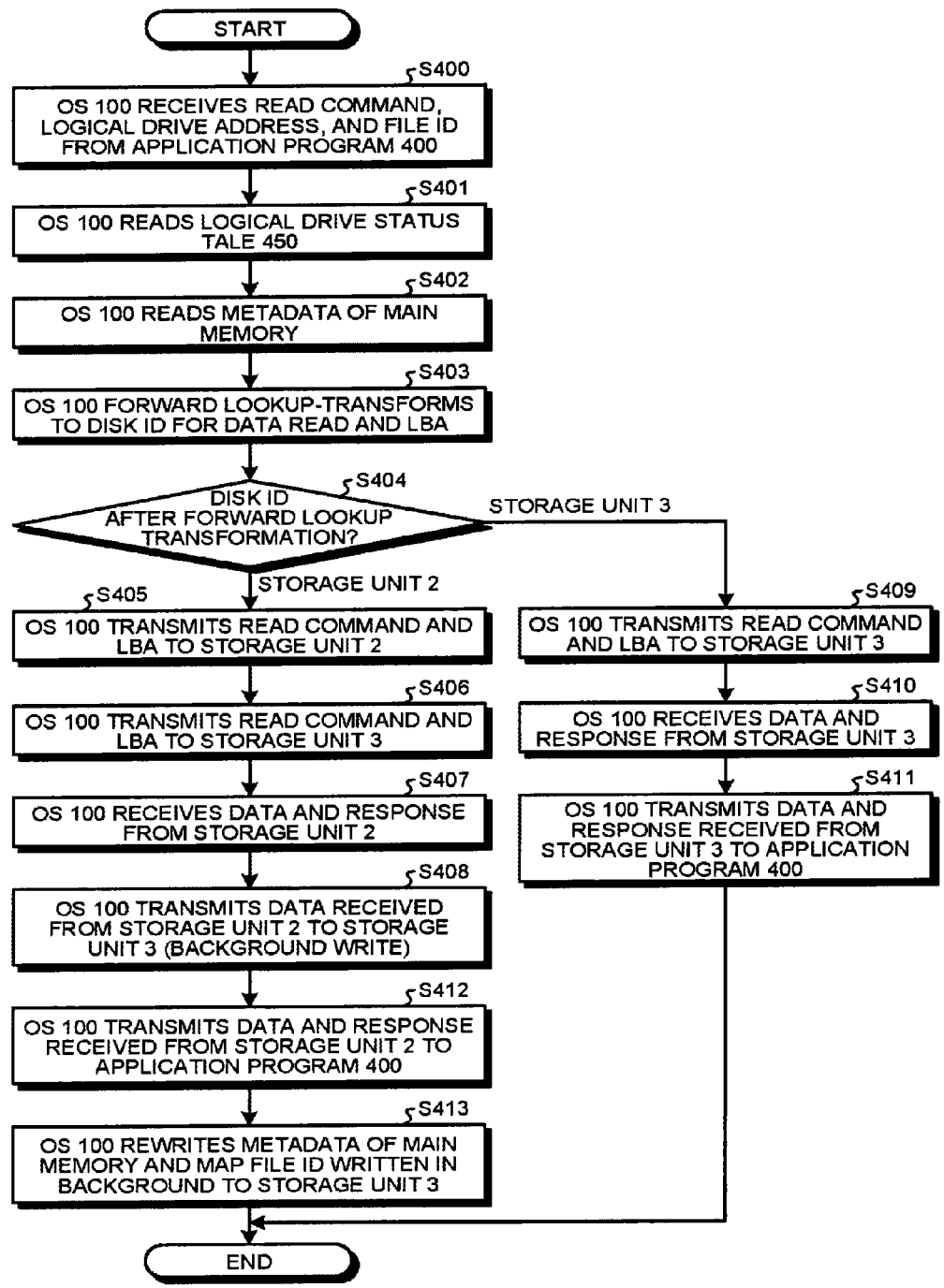
FIG. 45 is a flowchart for explaining a processing procedure of background backup.

When data in the data migration source storage unit 2 is read to the cache memory area in the main memory 6, the metadata 300 can be updated to write the data read to the cache memory area in the data migration destination storage unit 3 (write back) and map a file ID of the data to a write destination LBA. This is explained below with reference to FIG. 45.

The OS 100 receives a read request, a logical drive address, and a file ID from the application program 400 (step S400). The OS 100 reads the logical drive status table 450 from the main memory 6 (step S401), reads the metadata 300 from the main memory 6 (step S402), and forward lookup-transforms the logical drive address and the file ID into a storage unit identification name, an LBA, and a sector count for data read referring to the metadata 300 (step S403).

When the storage unit identification name after the forward lookup transformation designates the storage unit 3 (step S404), the OS 100 transmits a read command, the LBA, and the sector count to the storage unit 3 (step S409). The OS 100 receives a response and read data from the storage unit 3 (step S410). The OS 100 transmits the read data read from the storage unit 3 and a response to the application program 400 (step S411).

When the storage unit identification name after the forward lookup transformation designates the storage unit 2 (step S404), the OS 100 transmits a read command, the LBA, and the sector count to the storage unit 2 (step S405). The OS 100 transmits a write command, the LBA, and the sector count to the storage unit 3 (step S406). The OS 100 receives a response and read data from the storage unit 2 (step S407). The OS 100 transmits the data read from the storage unit 2 to the storage unit 3 to thereby perform background write for writing the date read from the storage unit 2 in the storage unit 3 (step S408). The OS 100 transmits the data received from the storage unit 2 and a response to the application program 400 (step S412). The OS 100 updates the metadata on the main memory 6 to map a write file ID to the storage unit 3, the LBA, and the sector count (step S413).

In this way, in the background of the data read from the logical drive 4 to the information processing device 111, data migration to the storage unit 3 can be performed. The size of an LBA area in which background backup explained should be performed is reduced. A period from the start to the completion of the data migrating state is further reduced. In particular, in the read operation of the logical drive 4, the data read from the storage unit 2 and the data write back to the storage unit 3 are performed in parallel, whereby data migration can be performed at higher speed.

Background Backup

The logical drive 4 is in the data migrating state in the logical drive status table 450, backup is performed in the background from the data migration source storage unit 2 to the data migration destination storage unit 3 (background backup) when an access from the application program 400 and the OS 100 to the logical drive 4 hardly takes place (during idling). The control program 200 reads the metadata 300 from the main memory 6 and searches for a file ID mapped to the storage unit 2. If a file mapped to the storage unit 2 is present, the control program 200 transmits a read command to the storage unit 2 to perform read from an LBA of the file and reads data. The control program 200 transmits a write command and the read data to the LBA of the storage unit 3, performs write, rewrites the metadata 300 on the main memory 6, and maps the file ID to the storage unit 3.

Data Migration Completion Time

Figure 46:
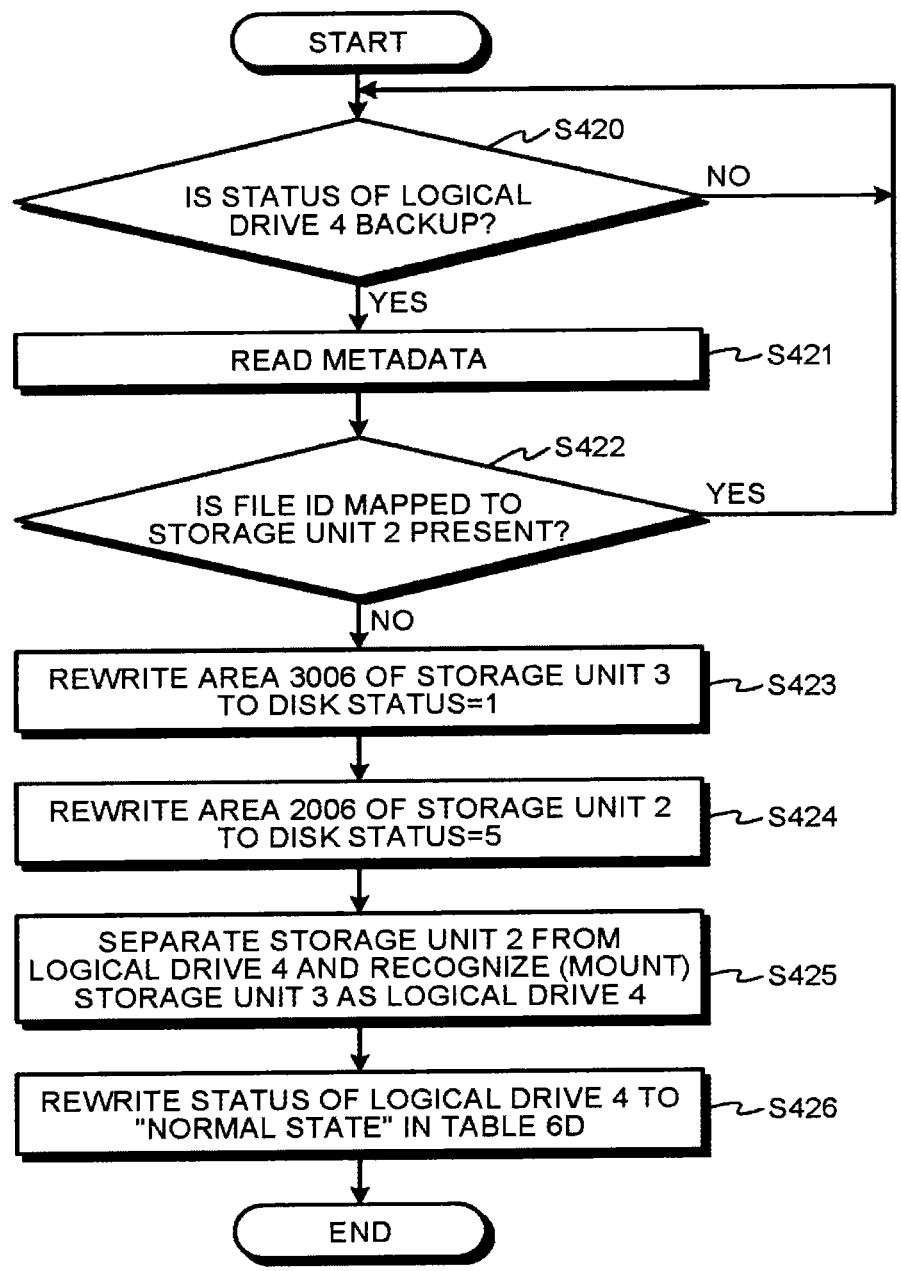
FIG. 46 is a flowchart for explaining an operation procedure of the control program performed when data migration is completed.

FIG. 46 shows an operation procedure of a control program at data migration completion time. When a status of the logical drive 4 is the "data migrating state" in the logical drive status table 450 (step S420), the control program 200 periodically reads the metadata 300 on the main memory 6 (step S421) and periodically checks whether a migration target file ID mapped to the storage unit 2 is present (step S422). For example, the control program 200 periodically checks whether a migration target file ID mapped to the storage unit 2 is present among file IDs of all files stored in the logical drive 4. When the migration target file ID is present, because data migration is not completed yet, the control program 200 continues the status of the data migrating state.

On the other hand, when the migration target file ID is absent, the control program 200 rewrites the storage status area 3006 of the data migration destination storage unit 3 to the storage status=1 (the normal state) (step S423) and rewrites the area 2006 of the data migration source storage unit 2 to the storage status=5 (the discard target state) (step S424). The control program 200 separates the storage unit 2 from the logical drive 4, recognizes (mounts) only the storage unit 3 of the storage unit 2 and the storage unit 3 as the logical drive 4 (step S425), and rewrites a status of the logical drive 4 from the "data migrating state" to the "normal state" in the logical drive status table 450 (step S426).

Consequently, the storage unit 2 can be physically (mechanically) detached and can be discarded at any time. The storage unit 3 plays the role of the storage unit 2 before the life end processing S205. Thereafter, the storage unit 3 can be regarded as the storage unit 2. The data configuration of the information processing device 111 returns to the state shown in FIG. 31, which is the data configuration before the life end processing S205.

To safely detach the storage unit 2 from the information processing device 111, after the storage unit 2 is separated from the logical drive 4, it is desirable to transmit the E0h Standby Immediate command and the like described in Information technology ATA/ATAPI Command Set-3 (ACS-3) to the storage unit 2 or change a register value of the storage unit 2 by, for example, setting Shutdown Notification (CC.SHN) described in NVM Express Revision 1.1 to 01b to transition the storage unit 2 to a state in which power supply interruption is possible.

To reduce the power consumption of the storage unit 2 that can be discarded, after the storage unit 2 is separated from the logical drive 4, state transition commands such as the E0h Standby Immediate command and the E6h SLEEP command described in Information technology ATA/ATAPI Command Set-3 (ACS-3) can be transmitted to the storage unit 2, the power supply to the storage unit 2 can be interrupted, the storage unit 2 can be transitioned to a Partial state and a Slumber state described in Serial ATA Revision 3.1 Gold Revision, a DEVSLP signal described in "Serial ATA Technical Proposal: SATA31_TPR_C108 Title: Device Sleep" can be activated to transition the storage unit 2 to a DevSleep state, or the storage unit 2 can be transitioned to a D1 state, a D2 state, or a D3 state described in PCI Express Base Specification Revision 3.0 or can be transitioned to an L1 state, an L2 state, or an L3 state described in PCI Express Base Specification Revision 3.0.

Figure 47:
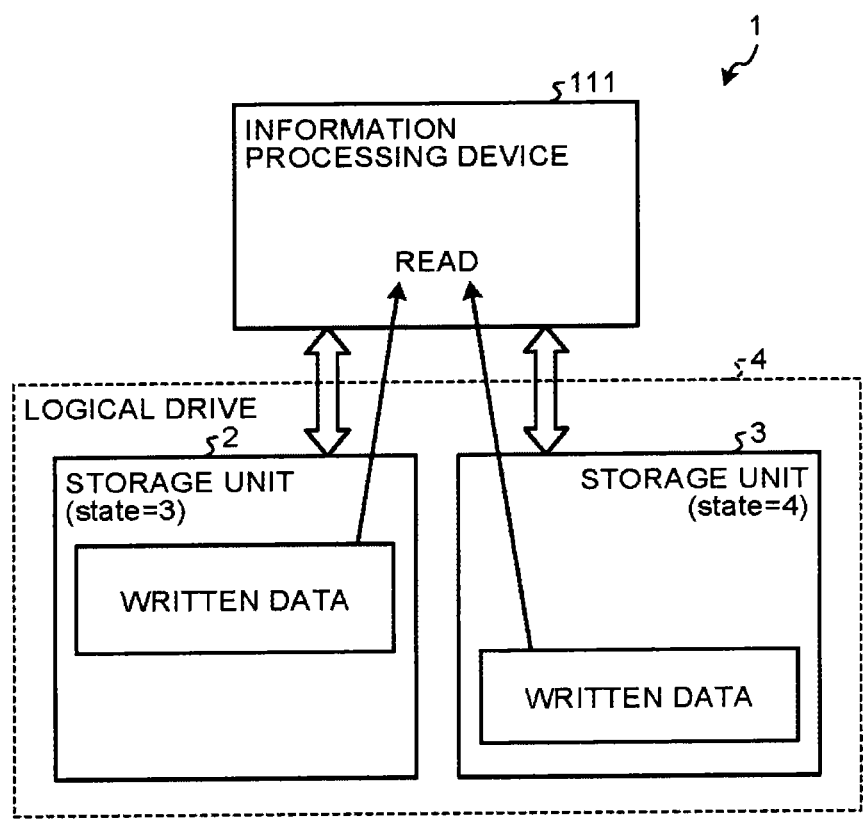
FIG. 47 is a conceptual diagram of read from a logical drive in a data migrating state.

FIG. 47 is a conceptual diagram of a read state from the logical drive 4 by the information processing device 111 in a state in which the storage unit 2 is in the storage status=3

(the protected state) and the storage unit 3 is in the storage status=4 (the data migration destination state). In the storages 2 and 3, LBAs at mapping sources do not overlap. In this state, data is read from at least one of the storage units 2 and 3.

Figure 48:
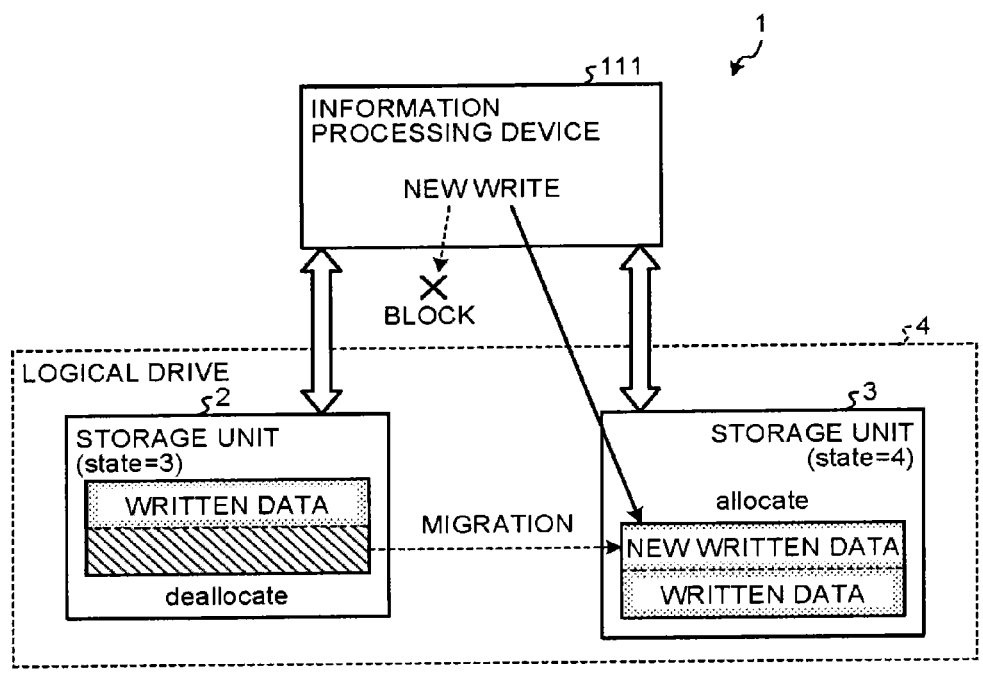
FIG. 48 is a conceptual diagram of write in the logical drive in the data migrating state.

FIG. 48 is a conceptual diagram of a write state in the logical drive 4 by the information processing device 111 in a state in which the storage unit 2 is in the storage status=3 (the protected state) and the storage unit 3 is in the storage status=4 (the data migration destination state). In this state, write is performed for only the storage unit 3 of the storage unit 2 and the storage unit 3. That is, the storage unit 2 functions as if the storage unit 2 is a read only device. When data is written in the storage unit 3, old mappings to the storage unit 2 are invalidated.

As explained above, when the storage unit 2 has reached the life end or is about to reach the life end according to this embodiment, only rewriting of the storage status area 2006 takes place as rewriting of the storage unit 2. Therefore, the rewrite processing is hardly performed and the storage unit 2 is treated as if the storage unit 2 is a read only device. On the other hand, the logical drive behaves as a readable and writable drive. Therefore, for the application program 400, the logical drive 4 behaves the same as before the life end. Data migration of data from the storage unit 2 to the storage unit 3 occurs when write in the logical drive 4 is requested from the application program 400 or the SS 100. The data migration is performed in a form of logical data transition by data write processing from the application program 400 or the OS 100 to the storage unit 3 and metadata rewriting rather than copying of entity data from the storage unit 2 to the storage unit 3. Consequently, the data migration of data from the storage unit 2 to the storage unit 3 can be executed in the background of normal data write from the application program 400 or the OS 100 to the storage unit 2. In the logical data transfer, compared with the copying of the entity data, a read processing amount and a write processing amount in the NAND flash memory 16 are markedly small and a band use ratio of the interface 19 is markedly small. As explained above, the data migration processing in this embodiment is performed at markedly high speed compared with the backup processing in a comparative example in which processing for reading data from the storage unit 2 and writing the data in the storage unit 3 is performed independently from an access from the application program 400 or the OS 100 to the logical drive 4. That is, a data migration time is substantially zero for an LBA in which write from the application program 400 or the OS 100 takes place.

For an LBA in which write from the application program 400 or the OS 100 does not take place, backup processing is separately necessary. However, unlike the backup processing and rebuilding of a RAID array in a comparative example in which data has to be copied before mounting of a new storage device, the backup processing can be performed in the background at idling time after the storage unit 2 and the storage unit 3 are mounted. Therefore, it is possible to suppress performance deterioration in the application program 400. Unlike the backup processing in the comparative example in which copying of user data is necessary before mounting of a new storage device and rebuilding of a logical drive by a RAID or the like in which rebuilding of user data and parity data is necessary before mounting of a new storage device, in the logical drive rebuilding involved in connection of a data migration destination storage device according to this embodiment, as shown in FIG. 40, only rewriting of the storage status area and the storage unit identification name area and copying of the metadata area are necessary. Therefore, it is possible to perform the logical drive rebuilding at extremely high speed.

Second Embodiment

In the example explained in the first embodiment, the metadata 300 stored in the main memory 6 is used as information for searching for data migrated to the storage unit 3. Consequently, for example, when the OS 100 is requested by the application program 400 to read data of the logical drive 4 with a file ID designated, by reading the metadata 300, the OS 100 can acquire information concerning from which of the storage unit 2 and the storage unit 3 data should be read and information concerning from which LBA data should be read. In an example explained in the second embodiment, a data migration log area 550 stored in the storage unit 3 is used as information for searching for data migrated to the storage unit 3. For example, when the OS 100 is commanded by the application program 400 to read data of the logical drive 4, by reading the data migration log area 550, the OS 100 can acquire information concerning from which of the storage unit 2 and the storage unit 3 data should be read. In this embodiment, the application program 400 transmits a read request and a write request to the OS 100 directly designating an LBA. The invention of this embodiment can also be applied when the application program 400 transmits a read command and a write command to the OS 100 designating a file ID as in the first embodiment. Then, the control program 200 or the OS 100 can transform the file ID into an LBA by reading the metadata 300. Read and write processing concerning the transformed LBA is performed in the same manner as this embodiment.

Figure 49:
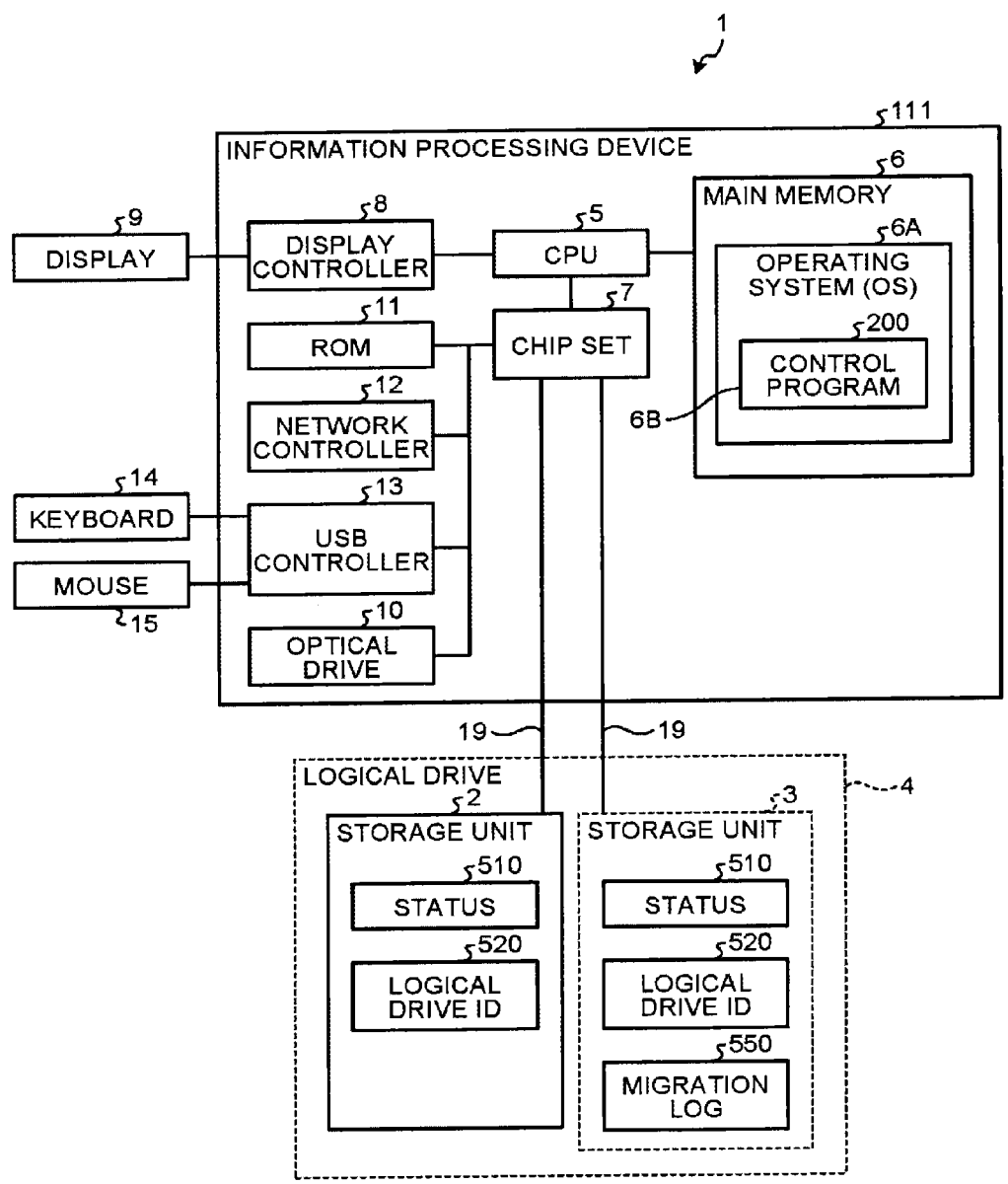
FIG. 49 is a block diagram of a functional configuration example of an information processing system in a second embodiment.

In FIG. 49, the configuration of the information processing system 1 in the second embodiment is shown. The basic configuration of the information processing system 1 is the same as that in the first embodiment. A logical drive is a logically built drive that the OS 100 can recognize. A logical drive ID (a drive name, a volume number, a logical unit number, etc.) is allocated to the logical drive. The OS 100 recognizes, as the logical drive, one or a plurality of storage units functioning as physical devices. The logical drive is divided into logical sectors (logical blocks). LBAs are allocated to the respective logical sectors. The logical drive is allocated to one or a plurality of physical drives, which are lower order layers, and an LBA area in a part of the physical drives by the OS 100 and the control program 200 shown in FIG. 7. The OS 100 transforms an LBA of the logical drive and an LEA of the physical drive each other. The application program 400, which is a higher order layer, virtually recognizes the logical drive as one drive. In this embodiment, in a state before the life end processing S205, the logical drive 4 is allocated to the storage unit 2 functioning as a singular physical storage unit. In this case, the LBA of the logical drive and the LBA of the physical drive have the same value. Even in the state before the life end processing S205, a storage array of Redundant Arrays of Inexpensive Disks (RAID), for example, a storage array of RAID0 or RAID5 can be configured using a plurality of physical storage devices and recognized as one logical drive 4. This embodiment can be applied even in such a case. The application program 400 can access a specific logical sector in a specific logical drive by giving a command including a logical drive ID and a logical address formed by an LBA to the OS 100. The logical drive ID can be allocated to a part of an LBA area of the storage unit rather than the entire LEA area. Consequently, the storage unit 2 and the storage unit 3 can be divided into a plurality of logical drives and managed. Separate logical drive IDs can be allocated to the respective logical drives.

In this embodiment, as an example, the SSD functioning as the storage unit 2 described in the first embodiment is used as the storage unit 2 and the SSD functioning as the storage unit 3 described in the first embodiment is used as the storage unit 3. To discard the storage unit 2 after reliability deterioration to reduce a setting space and reduce the power consumption of the entire system 1, it is desirable that the storage unit 2 can be physically detachably attachable to the information processing device 111.

It is desirable that a storage capacity of the data migration destination storage unit 3 is equal to or larger than a storage capacity of the data migration source storage unit 2. However, the present invention can be applied even when the storage capacity of the storage unit 3 is smaller than the storage capacity of the storage unit 2.

In this embodiment, the storage unit 3 is a storage unit connected to the information processing device 111 anew after it is determined that the storage unit 2 has reached the life end or is about to reach the life end. The present invention can also be applied when, after it is determined that the storage unit 2 has reached the life end or is about to reach the life end, the storage unit 3 in the normal state already connected to the information processing device 111 is used as a migration destination without new connection. To reduce a setting space before connection of the storage unit 3 and reduce the power consumption of the entire system 1 and to discard the storage unit 3 after reliability deterioration of the storage unit 3, reduce a setting space, and reduce the power consumption of the entire system 1, it is desirable that the storage unit 3 is physically detachably attachable to the information processing device 111.

The control program 200 stored in the main memory 6 performs control and management of statistical information of the storage unit 2 and the storage unit 3, status management areas 510, logical drive ID management areas 520, and a data migration log area 550 of the respective storage units and performs life end processing, data migration processing, and the like based on the statistical information.

The storage unit 2 and the storage unit 3 respectively include the status management areas 510 and the logical drive ID management areas 520. The storage unit 3 includes the data migration log area 550.

In this embodiment, data stored in the status management areas 510 can take values 0 to 5. The respective values indicate states of the storage units corresponding to the status management areas 510 as follows:

0: initial storage state
1: normal state
2: low reliability state
3: data migration source state (protected state)
4: data migration destination state
5: discard target state The information processing system 1 can be configured such that the status management areas 510, the logical drive ID management areas 520, and the data migration log area 550 are stored in the main memory 6 rather than being stored in the respective storage units. The same logical drive ID is stored in the logical drive ID management areas 520 of the data migration source storage unit 2 and the data migration destination storage unit 3.

Figure 50:
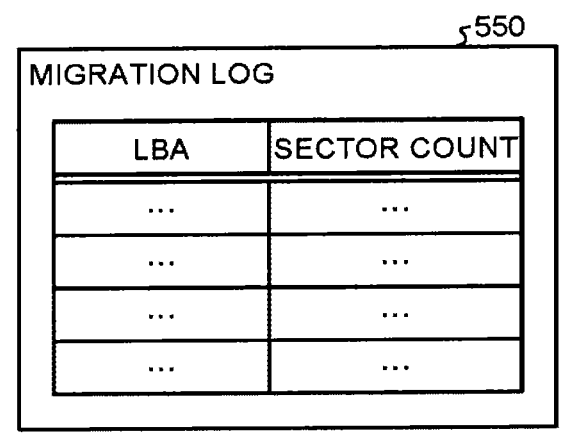

The data migration log area 550 is included in the data migration destination storage unit 3. When the information processing device 111 performs write in an LBA of the storage unit 3 or the information processing device 111 transmits a delete notification to the logical drive 4 to invalidate data in an LBA of the storage unit 2, the control program 200 stores a write target LBA and a write target sector size in the data migration log area 550 as shown in FIG. 50 as an update log (a data migration log) of the logical drive 4. The control program 200 performs garbage collection and optimization of the data migration log area 550 at any time during data write in the logical drive 4, during a delete notification, and during idling of the storage unit 3. For example, in storing an LBA area having a sector size X of LBA=cLBA~cLBA+X−1 (hereinafter described as (cLBA, X)) in the data migration log area 550, when an LBA overlapping (cLBA, X) is already stored in the data migration log area 550 or when an LBA area continuing to (cLBA, X) is already recorded in the data migration log area 550, it is desirable that the control program 200 records, as a new log, an LBA area obtained by combining (merging) the stored LEA area and the LBA(cLBA, X) in the data migration log area 550 and deletes logs of the combination source LBA areas. For example, when an LBA area A of A=(cLBA, X) is recorded in the data migration log area 550 anew and an LBA area B of B=(cLBA-a, a) is already stored in the data migration log area 550, the LBA area A and the LBA area B are continuous LBA areas. Then, the control program 200 can update the data migration log area 550 without increasing a log data amount of the data migration log area 550 by overwriting an area in which B=(cLBA-a, a) is stored in the data migration log area 550 with log data of (cLBA-a, a+X), which is an LBA area of A+B. When data migration explained below is completed, the control program 200 can delete or deallocate the data migration log area 550 and allocate the data migration data area 550 to other uses such as user data storage.

Figure 51:
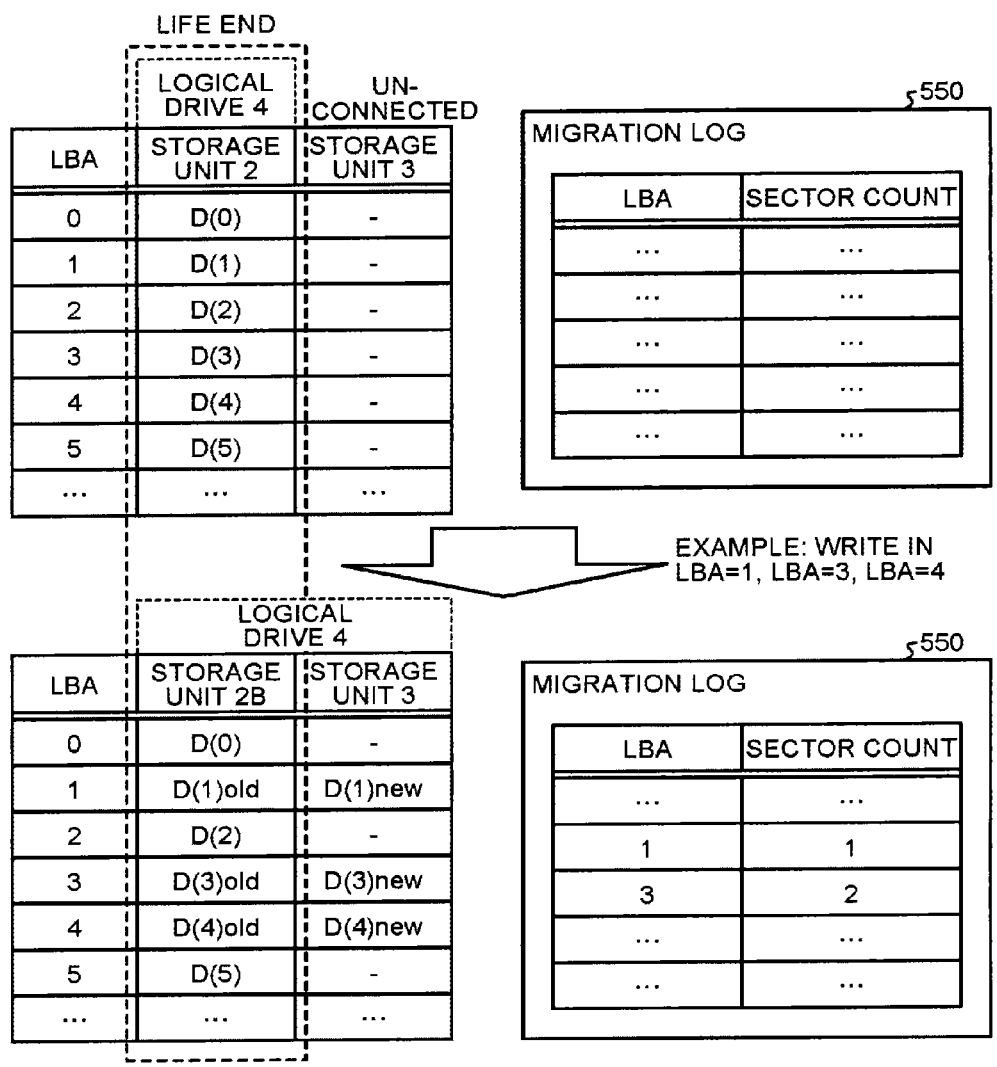
FIG. 51 is a diagram of a write example of a log in the data migration log.

FIG. 51 is an example of write of a log in the data migration log area 550. Data D (cLBA) in LBA=cLBA of the logical drive 4 before the life end is stored in the LBA=cLBA of the storage unit 2. When the storage unit 2 has reached the life end, for example, if write of the data D (cLBA) having one sector size in the LBA=cLBA of the logical drive 4 is performed, the control program 200 controls the OS 100 to perform write in the LBA=cLBA of the storage unit 3. The control program 200 stores the LBA=LEA and the sector count=1 in the data migration log area 550 as log data. After the storage unit 2 has reached the life end, when the OS 100 writes data D(cLBA), D(cLBA+1), . . . , and D(cLBA+X−1) of a sector size=X in the LBA=cLBA in the logical drive 4, the control program 200 controls the OS 100 to write the data in LBA=cLBA, cLBA+1, . . . , and cLBR+X−1. The control program 200 stores the LBA=cLBA and the sector count=X in the data migration log area 550 as log data.

In FIG. 51, write in LBA=1, LBA=3, and LBA=4 is performed in LBA=1, LBA=3, and LBA=4 of the storage unit 3. Logs of the LBA=1 and the sector count=1 are recorded as data migration logs. Logs of the LBA=3 and the sector count=1 and the LBA=4 and the sector count=1 are integrated with logs of the LBA=3 and the sector count=2 and recorded.

The control program 200 can allocate an LBA area as the status management areas 510, the logical drive ID management areas 520, and the data migration log area 550. Alternatively, the control program 200 can allocate a logical address area (e.g., a log page address area), which is not an LEA area, as the status management areas 510, the logical drive ID management areas 520, and the data migration log area 550. When the log page address area is allocated, for example, read of the log page area is performed according to 2Fh Read Log Ext described in ACS-3 of Non-Patent Literature 1 and write in the log page address area is performed according to 3Fh Write Log Ext described in ACS-3 of Non-Patent Literature 1.

In the same manner as shown in FIGS. 24 and 29 in the first embodiment, the control program 200 determines whether the respective storage units connected to the CPU 5 have reached the life end, are about to reach the life end, or are about to fail. When the storage units have reached the life end, are about to reach the life end, or are about to fail, the control program 200 performs the life end processing of the storage units. As in the first embodiment, the life end determination is performed at every fixed time, at each fixed number of kinds of processing, or at each fixed data transmission and reception shown in FIG. 24 or when a command response received from the storage unit is an error response as shown in FIGS. 29 and 30.

Life End Processing

Figure 52:
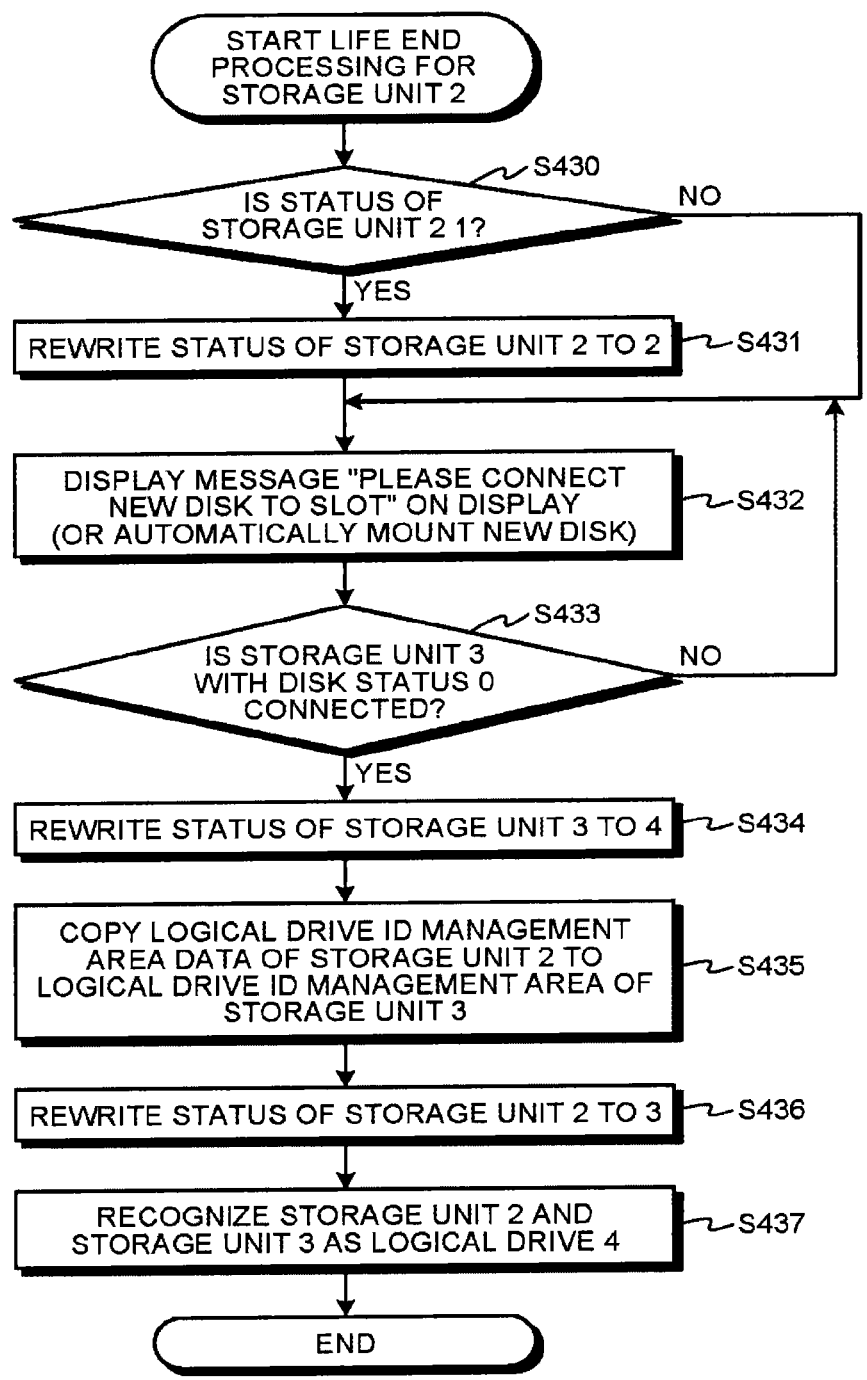
FIG. 52 is a flowchart for explaining life end processing.

FIG. 52 shows the life end processing of the storage unit 2 in this embodiment performed when the control program 200 determines that the storage unit 2 has reached the life end. When the control program 200 determines that the storage unit 2 has reached the life end (step S430), the control program 200 rewrites a status of the storage unit 2 from the normal state of 1 to the low reliability state of 2 (step S431). It is desirable that the control program 200 notifies an administrator, an operator, or a user of the information processing system through a display device or an LED or the like set near a port to connect the storage unit 3, which is a new storage unit, to a free port of the interface 19 (step S432). Alternatively, when a mechanical apparatus that automatically performs physical attachment and detachment of the storage unit 2 or the storage unit 3 to and from the interface 19 is mounted on the information processing system 1 as a storage load/unload apparatus (not shown in the figure), the control program can control the storage load/unload apparatus to connect the storage unit 3, which is a new storage unit, to the interface 19.

When the storage unit 3 is connected as a new storage unit (step S433), the control program 200 rewrites the status 510 of the storage unit 3 to the data migration destination state of 4 (step S434) and copies data of the logical drive ID management area 520 of the storage unit 2 to the logical drive ID management area 520 of the storage unit 3 to match logical drive IDs of the storage units 2 and 3 (step S435). In the present example, because the storage unit 2 is allocated as the logical drive 4 as shown in FIG. 49, an ID of the logical drive 4 is written in the logical drive ID management area 520 of the storage unit 3. The control program 200 rewrites the status 510 of the storage unit 2 to the data protected state (the data migration source state) (step S436) and causes the OS 100 to recognize the storage unit 2 and the storage unit 3 as the logical drive 4, which is the same logical drive (step S437). After the life end processing, the status of the storage unit 2 is 3 and the status of the storage unit 3 is 4. The logical drive 4, the storage unit 2, and the storage unit 3 transition to the data migrating state.

Figure 53A:
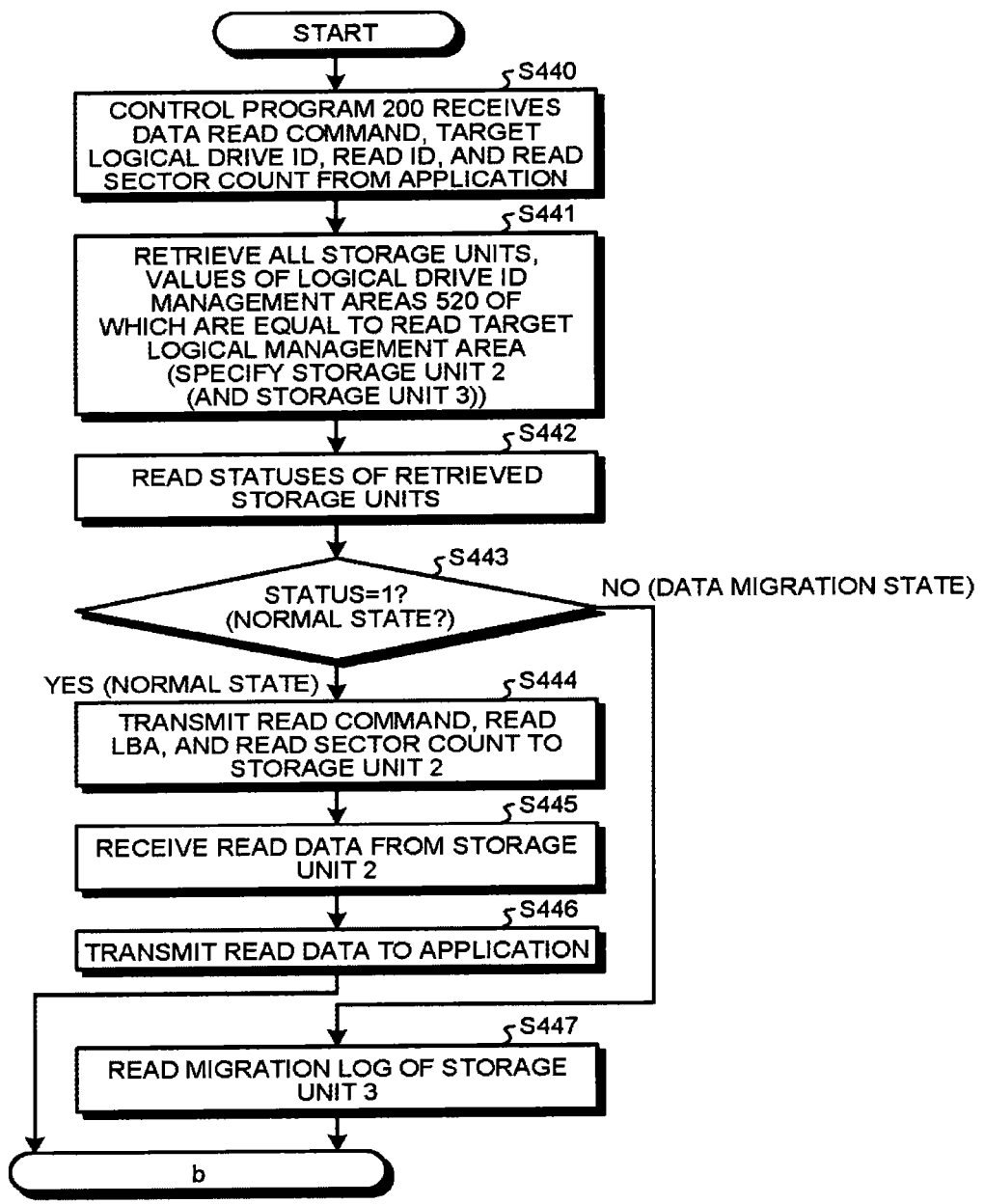
FIG. 53A and FIG. 53B are flowchart for explaining an operation procedure of read from a logical drive.
Figure 53B:
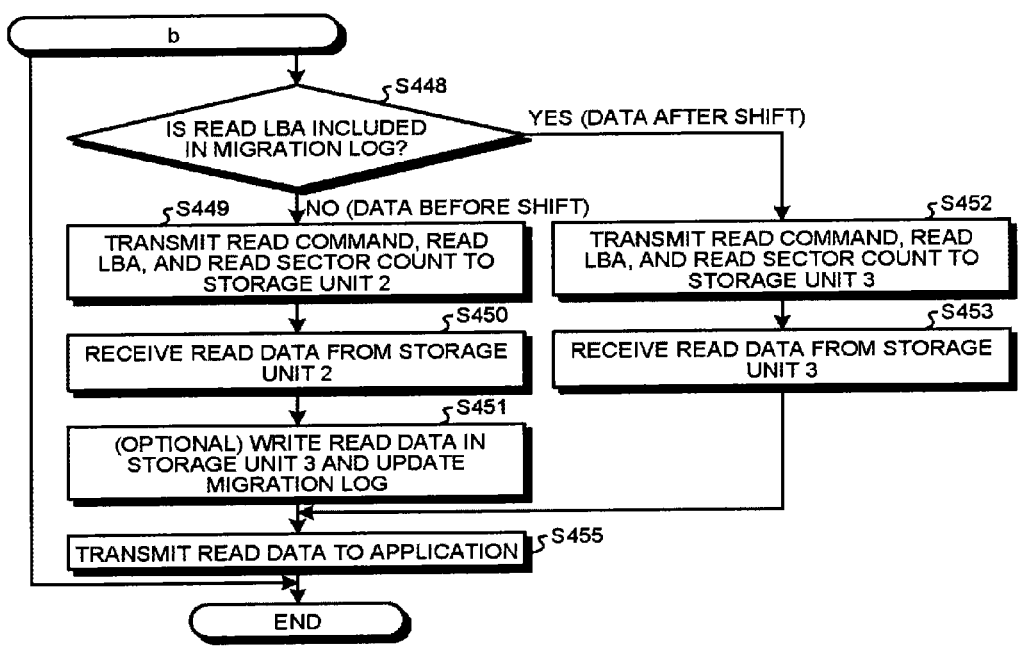

In this embodiment, the statuses of the respective storage units are stored in the status management areas 510 of the storage units in a nonvolatile manner. As shown in FIG. 35, the control program 200 recognizes the statuses of the storage units by reading the status management areas 510 every time the OS 100 starts. The control program 200 recognizes whether the logical drive 4 is in the data migrating state by recognizing the statuses of the storage units and reading the logical drive IDs of the storage units from the logical drive ID management areas 520. Read from the logical drive The control program 200 reads data as shown in FIGS. 53A and 53B in response to a read request from the application program 400. The control program 200 receives a read request, a read target logical drive ID, a read target LBA, and a sector count from the application program 400 (step S440). The control program 200 retrieves all storage units in which data of the logical drive ID management areas 520 is equal to the read target logical drive ID and specifies the storage unit 2 and the storage unit 3 (step S441). The control program 200 reads values of the status management areas 510 of the retrieved storage units and determines statuses of the storage units to specify which of the storage unit 2 and the storage unit 3 each of the retrieved storage units is (step S442). To suppress performance deterioration of the information processing system 1 involved in the read processing of the status management areas 510, it is desirable that the control program 200 loads, during the start of the information processing device 111, data of the status management areas 510 of the storage unit 2 and the storage unit 3 on the main memory 6 as cache data and thereafter reads data of the status management areas 510 from the main memory 6.

When a status of the storage unit belonging to the target logical drive is 1, a status of the logical drive is the normal state (Yes at step S443). The control program 200 controls the OS 100 to transmit a read command, the read target LBA, and the sector count to the storage unit 2 (step S444). The control program 200 receives a response and read data from the storage unit 2 (step S445). The control program 200 transmits the read data and a response to the application program 400 (step S446).

When the status of the storage unit belonging to the target logical drive is not 1, the status of the logical drive is the data migrating state (No at step S443). The control program 200 reads the data migration log area 550 of the storage unit 3 (step S447) and determines whether the read target LBA is included in the data migration log (step S448). When the read target LBA is included in the data migration log (Yes at step S448), the control program 200 transmits a read command, the read target LBA, and the sector count to the storage unit 3 (step S452). The control program 200 receives a response and read data from the storage unit 3 (step S453). The control program 200 transmits the read data and a response to the application program 400 (step S455).

When the read target LEA is not included in the data migration log (No at step S448), the control program 200 transmits a read command, the read target LEA, and the sector count to the storage unit 2 (step S449). The control program 200 receives a response and read data from the storage unit 2 (step S450). The control program 200 transmits the read data and a response to the application program 400 (step S455).

When an LBA area included in the data migration log and an LEA area not included in the data migration log are mixed in the read target LBA area, the control program 200 divides the read target LEA area into the LBA area included in the data migration log and the LBA area not included in the data migration log and performs the processing explained above for the respective areas.

Write Back Backup

For example, in FIGS. 53A and 53B, write back backup at step S451 can be performed or does not have to be performed. At step S451, when data of the data migration source storage unit 2 under data migration is read to the cache memory area in the main memory 6, the data read to the cache memory area is written in the data migration destination storage unit 3 under the data migration and a write destination LBA and a sector count are written in the data migration log area 550. Consequently, it is possible to perform data transition to the storage unit 3 in the background of the data read from the logical drive 4 to the information processing device 111. The size of an LEA area that should be backed up in the background is reduced and a period from the start to the completion of the data migrating state is further reduced. In particular, in a read operation to the logical drive 4, data read from the storage unit 2 and data write back in the storage unit 3 are performed in parallel, whereby data migration can be performed at high speed.

Data Delete Request to the Logical Drive

Figure 54:
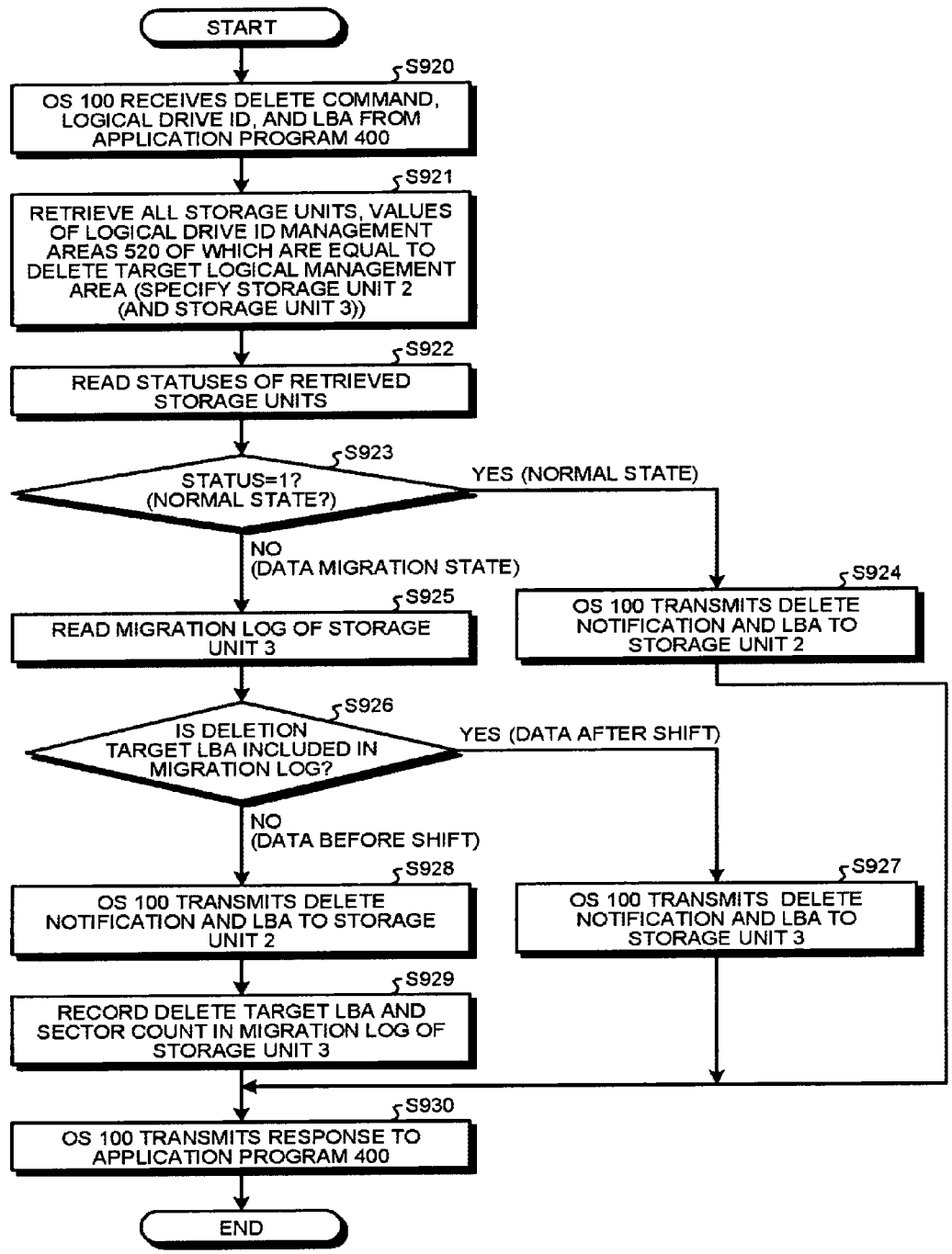
FIG. 54 is a flowchart for explaining a processing procedure of an OS performed when an LBA data delete request is transmitted from an application program to the OS.

FIG. 54 shows a processing procedure of the OS 100 performed when an LBA data delete request is transmitted from the application program 400 to the OS 100. The OS 100 receives a data delete request, a logical drive address, and a delete target LBA from the application program 400 (step S920). The control program 200 retrieves all storage units in which data of the logical drive ID management areas 520 is equal to a logical drive ID of an LBA data delete target and specifies the storage unit 2 and the storage unit 3 (step S921). The control program 200 reads values of the status management areas 510 of the retrieved storage units (step S922) and determines statutes to specify which of the storage unit 2 and the storage unit 3 each of the retrieve storage units is.

When a status of the storage unit belonging to the target logical drive is 1 (Yes at step S923), a status of the logical drive is the normal state. The OS 100 transmits a delete notification and an LBA to the storage unit 2 (step S924). The OS 100 receives a response from the storage unit 2. The OS 100 transmits a response to the application program 400 (step S930).

When the status of the storage unit belonging to the target logical drive is not 1 (No at step S923), the status of the logical drive is the data migrating state. The control program 200 reads the data migration log area 550 of the storage unit 3 (step S925) and determines whether the data delete target LBA is included in the data migration log (step S926). When the delete target LBA is included in the data migration log, delete target data is stored in the storage unit 3. The control program 200 transmits a delete notification and the LBA to the storage unit 3 (step S927). The storage unit 3 invalidates data of the delete notification target LBA, receives a response from the storage unit 3, and transmits a response to the application program 400 (step S930).

When the delete target LEA is not included in the data migration log (step S926), the delete target data is stored in the storage unit 2. The control program 200 transmits a delete notification and the LEA to the storage unit 2 (step S928) and receives a response from the storage unit 2. The control program 200 does not have to transmit the delete notification to the storage unit 2. An LEA set as a target of a delete command from the application program 400 is data unnecessary to be read in future for the application program 400 and the OS 100 and is data unnecessary to be migrated to the storage unit 3. Therefore, the control program 200 records the delete target LBA and the sector count in the data migration log area 550 to thereby invalidate mapping from the delete target LBA to the storage unit 2 (step S929). The control program 200 transmits a response to the application program 400 (step S930).

When an LBA area included in the data migration log and an LBA area not included in the data migration log are mixed in the delete target LBA area, the control program 200 divides the delete target LBA area into the LBA area included in the data migration log and the LBA area not included in the data migration log and performs the processing explained above for the respective areas.

In this way, in the processing of the data delete request, the control program 200 updates the data migration log area 550. Therefore, data is logically migrated from the storage unit 2 to the storage unit 3. Data deletion is used as a data migrating operation as well.

Write in the Logical Drive

Figure 55:
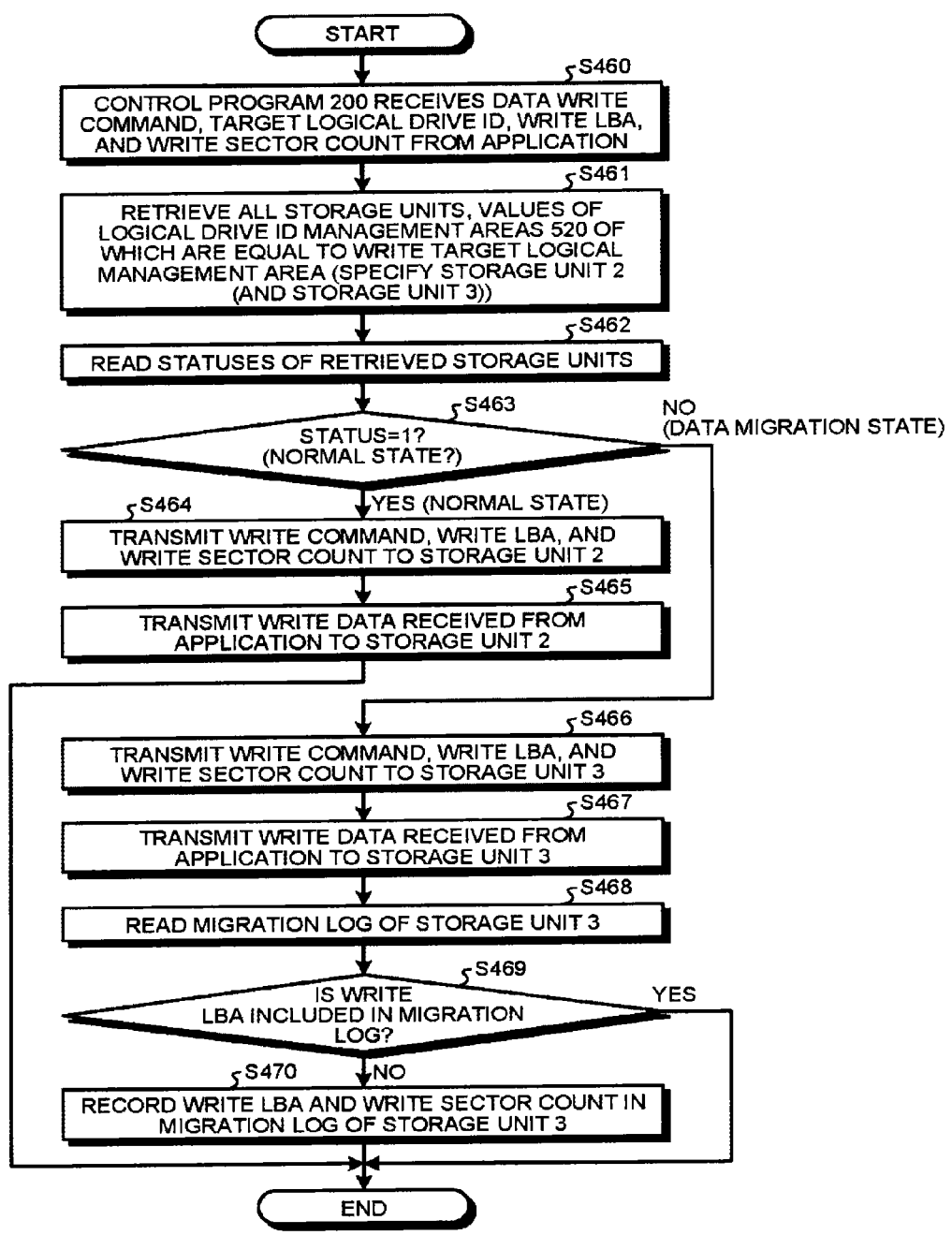
FIG. 55 is a flowchart for explaining an operation procedure of write in the logical drive.

The control program 200 writes data as shown in FIG. 55 in response to a write command from the application program 400. The control program 200 receives a write request, a write target logical drive ID, a write target LBA, and a sector count from the application program 400 (step S460). The control program 200 retrieves all storage units in which data of the logical drive ID management areas 520 is equal to the write target logical drive ID and specifies the storage unit 2 and the storage unit 3 (step S461). The control program 200 reads values of the status management areas 510 of the retrieved storage units and determines statuses of the storage units to specify which of the storage unit 2 and the storage unit 3 each of the retrieved storage units is (step S462).

When a status of the storage unit belonging to a target logical drive is the normal state, a status of the logical drive is the normal state (Yes at step S463). The control program 200 transmits a write command, the write target LBA, and the sector count to the storage unit 2 (step S464). The control program 200 transmits write data received from an application to the storage unit 2 (step S465).

When the status of the storage unit belonging to the target logical drive is the data migrating state, the status of the logical drive is the data migrating state (No at step S463). The control program 200 transmits a write command, the write target LBA, and the sector count to the data migration destination storage unit 3 (step S466). The control program 200 transmits the write data received from the application to the storage unit 3 (step S467). The control program 200 reads the data migration log area 550 of the storage unit 3 (step S468) and determines whether the write target LBA is included in the data migration log (step S469). When the write target LBA is included in the data migration log, the write target LBA is already subjected to data migration. Therefore, the control program 200 does not update the data migration log area 550. When the write target LBA is not included in the data migration log, the write target LBA is an LBA for which migration is completed anew. Therefore, the control program 200 records the write target LBA and the sector count in the data migration log area 550 (step S470). The storage unit 3 writes write data in the write target LBA.

In this way, during the data migration, the OS 100 is controlled not to transmit a write request to the data migration source storage unit 2 and to transmit a write request to the data migration destination storage unit 3. The data migration log is recorded in the data migration log area 550 of the storage unit 3. Every time the logical drive 4 receives a write request from the application program 400, valid data stored in the storage unit 2 is gradually migrated to the storage unit 3. New data write is used as a data migrating operation as well.

If it is assumed that a data write request from the application program 400 is transmitted to all LBAs of the storage unit 2 at a uniform probability distribution, when a sufficiently large amount of data is written in total, nearly all valid data of the storage unit 2 is transferred to the storage unit 3. The valid data is hardly left in the storage unit 2. A total number of logical sectors, which is a storage capacity, of the storage unit 2 is defined as C2, a total number of logical sectors of the storage unit 3 is defined as C3, and, for example, C2=C3=C. If it is assumed that a write distribution for all the LBAs is a uniform probability distribution as a model case, a probability that a LBA=cLBA is written by a certain write request is 1/C. When an n write requests are processed, a probability that the LBA=cLBA is not written at all is $(1-(1/C)^n)$. $^n$ is n-th power. Therefore, an expected value of the number of logical sectors for which write is completed after the write requests are processed n times is $C-C\times(1-(1/C)^n)$.

If write of one logical sector is performed according to one write request, when data having a volume N times as large as the storage capacity of the storage unit 2 and the storage unit. 3 is written, because the number of processed write commands is n=NC, an expected value E of the number of logical sectors in which write is not performed is $E=C\times(1-(1/C)^{(NC)})$. For example, when a storage capacity G of the storage unit 2 in a Gbyte unit is G=512 GB (=476.9 GiByte) based on the IDEMA (International Disk Drive Equipment and Materials Association) standard, because C=97,696,368+1,953,504×(G=512−50)=1,000,215,216 and, in general, C is a sufficiently large integer, the expected value E can be approximated as $E=C\times e^{(-N)}$ (e is a base of a natural logarithm). Therefore, the expected value E exponentially decreases with respect to an increase in N. For example, when data write of 476.9 GiByte equivalent to one round of the logical drive 4 takes place with respect to the logical drive 4 having a capacity of G=512 GByte (=476.9 GiByte), write in LBAs of about 63.2% of the logical drive 4 is completed. It can be considered that transfer of half or more data of the logical drive 4 from the storage unit 2 to the storage unit 3 is completed. For example, when data write of 13 TiByte equivalent to 4.6 rounds of the logical drive 4 takes place with respect to the logical drive 4 having a capacity of G=512 GByte (=476.9 GiByte), write in LBAs of about 99% of the logical drive 4 is completed. It can be considered that transfer of substantially all data of the logical drive 4 from the storage unit 2 to the storage unit 3 is completed. Ki=1024, Mi=1024×Ki, Gi=1024×Mi, and Ti=1024×Gi.

Monitoring of a Data Migration State

Figure 56:
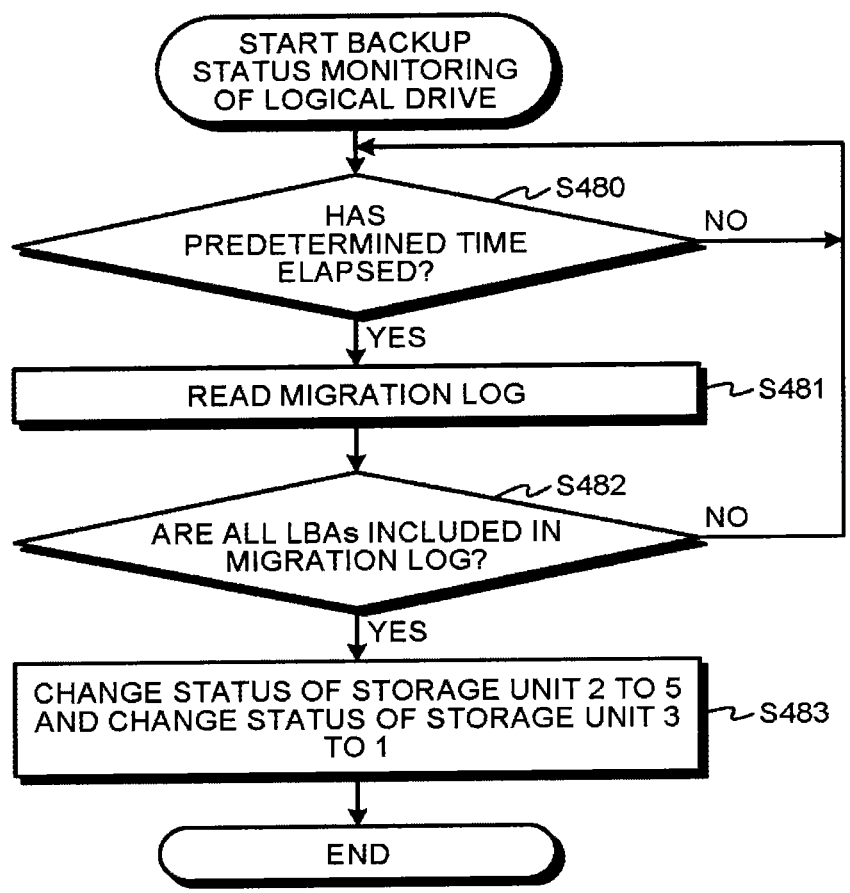
FIG. 56 is a flowchart for explaining a monitoring procedure of a data migrating state performed using the data migration log.

The control program 200 reads the data migration log area 550 to monitor a data migration state of the logical drive 4 in the data migrating state. FIG. 56 shows a monitoring procedure for monitoring a data migration state using a data migration log. For example, the control program 200 reads the data migration log area 550 every time a predetermined time elapses to monitor a data migration state (steps S480 and S481). When all migration target LBAs are included in the data migration log area 550, the control program 200 determines that data migration is completed. For example, all the LBAs of the data migration source storage unit 2 are included in the data migration log area 550, the control program 200 determines that data migration is completed (step S482). Alternatively, as determination of the completion of the data migration, for example, the control program 200 can determine whether all the LBAs of the storage unit 3 are included in the data migration log area 550.

When the control program 200 determines that the data migration is completed, the control program 200 changes a status of the data migration source storage unit 2 to the discard target state of 5 and changes a status of the data migration destination storage unit 3 to the normal state of 1 (step S483) to end the data migrating state of the logical drive 4 and ends the data migration state monitoring for the logical drive 4. To reduce the power consumption of the storage unit 2, it is desirable that the control program 200 transmits a transition request to a low power consumption mode to the storage unit 2. After the end of the data migrating state, it is desirable that the control program 200 notifies, through the display 9 or the LED set near the port, the administrator, the operator, or the user of the information processing system to detach the storage unit 2 from the interface 19 or controls the storage load/unload apparatus to detach the storage unit 2 from the interface 19.

Transition of an Overall Status

FIG. 57 shows transition of a status of the logical drive 4 performed when the storage unit 2 has reached the life end. When the storage unit 2 is in the normal state, a status of the storage unit 2 is one and the storage unit 3 is unconnected to the CPU 5 (step 1). When the control program 200 determines that the storage unit 2 has reached the life end, the control program 200 changes the status of the storage unit 2 to 2 (step 2). The storage unit 3 is connected to the interface 19 as a new storage unit based on the notification or the control by the control program 200 (step 3). When the storage unit 3 is connected, the control program 200 changes the status of the storage unit 2 to 3 and changes a status of the storage unit 3 to 4 to complete the transition to the data migrating state (step 4). When the control program 200 determines based on information of the data migration log area 550 that all valid data of the storage unit 2 is migrated to the storage unit 3, the control program 200 changes the status of the storage unit 2 to 5 and changes the status of the storage unit 3 to 1. Thereafter, the storage unit 3 behaves as if the storage unit 3 is the original storage unit 2 (the processing returns to step 1). Thereafter, when it is further determined that the storage unit 3, i.e., the new storage unit has reached the life end, the same steps 2 to 5 are repeated. In this way, even when any one of the storage units of the information processing device 111 has reached the life end, is about to reach the life end, or is about to fail, it is possible to easily migrate the data of the storage unit 2 to a new storage unit according to this embodiment.

Background Backup

For example, during idling when the OS 100 does not receive a request from the application program 400 for a fixed time or more, when the OS 100 receives a standby mode transition request from the application program 400, or the information processing device 111 and the OS 100 are shut down, it is desirable that the control program 200 performs background backup for performing a backup operation for automatically reading data from the storage unit 2 and automatically writing data in the storage unit 3 for an LEA in which data migration to the storage unit 3 is not completed. For example, a background backup operation is performed by the control program 200 reading the data migration log area 550 of the storage unit 3, performing data read from the storage unit 2 for a cLBA not included in the data migration log area 550, and storing the cLBA and a sector size of the write data in the data migration log area 550 as log data. In storage of the cLBA in the data migration log area 550, when continuous LBA areas are present or when overlapping LEA areas are present, it is desirable that an LEA area obtained by merging the LBA areas is stored in the data migration log area 550 and the LEA areas before the merging is deleted from the data migration log area 550.

To reduce the data size of the data migration log area 550 and to perform data migration end determination explained below at high speed, it is desirable that the background backup is preferentially performed for the un-migrated fragmented cLBA areas among cLBA areas other than the cLBA area registered in the data migration log area 550. The control program 200 preferentially backs up the un-migrated fragmented LBA area and subjects the un-migrated fragmented LBA area to data migration to thereby store a newly migrated LBA area in the data migration log area 550 as an LEA area formed by merging the newly migrated LBA area with migrated LBA areas continuously located before and after the newly migrated LBA area. For example, when data of the area LBA=0 ((LEA=0, sector size=1)) and the area LBA=2 ((LBA=2, sector size=1)) is already backed up and registered in the data migration log, the control program 200 can change the LBA areas (LBA=0, sector size=3) of the continuous LBA0 to LBA2 to a migration completed state. Consequently, an data amount of the data migration log area 550 is reduced.

For example, as explained above, when the application program 400 writes data of 476.9 GiByte in total in a SSD of 512 GByte (=476.9 GiByte), the control program 200 performs the background backup operation for an area of 175.5 GiB, which is a capacity of 36.8% of the storage capacity, whereby data migration for all LBA areas of the storage unit 2 is completed. Typical read speed and typical write speed of the storage unit 2, which is a SSD, and the storage unit 3, which is a SSD, are, for example, about 400 MiB/second. Read from the storage unit 2 in the LEA areas of 476.9 GiB is completed in about 449 seconds and write in the storage unit 3 is completed in about 449 seconds. Therefore, under such a situation, the background backup is completed in about 15 minutes at most. When the read from the storage unit 2 and the write in the storage unit 3 are performed in parallel, the read and the write are completed in about 8 minutes.

Further, for example, as explained above, when the application program 400 writes data of 13 TiByte in total in a SSD of 512 GByte (=476.9 GiByte), the control program 200 performs the background backup operation for an area of 4.8 GiB, which is a capacity of 1% of the storage capacity, whereby the data migration is completed for all the LEA areas of the storage unit 2. Typical read speed and typical write speed of the storage unit 2, which is a SSD, and the storage unit 3, which is a SSD, are, for example, about 400 MiB/second. Read from the storage unit 2 in the LEA areas of 4.8 GiB is completed in about 12 seconds and write in the storage unit 3 is completed in about 12 seconds. Therefore, under such a situation, the background backup is completed in about 24 minutes at most. When the read from the storage unit 2 and the write in the storage unit 3 are performed in parallel, the read and the write are completed in about 12 minutes.

On the other hand, time of 20 minutes to 41 minutes is required for data backup of a comparative example for backing up data by reading all the data from the storage unit 2 having a capacity of 512 GB and writing the data in the storage unit 3 without applying this embodiment. That is, compared with the comparative example, according to the application of this embodiment, the time require for substantial backup decreases by 63% after data write equivalent to storage capacity×1 and by 99% after data write equivalent to storage capacity×4.6.

In this way, according to the application of this embodiment, data backup work by the user is unnecessary and a load of processing on the information processing device 111 according to the background backup is substantially reduced. The application program 400 can use the logical drive 4 while hardly being affected by the data backup from the storage unit 2 in the storage unit 3. Most of data migration processing in this embodiment is logical data transfer. Compared with copying of entity data, a read processing amount and a write processing amount in the NAND flash memory 16 is markedly small and a band use ratio of the interface 19 is markedly small. Only rewriting of an amount equivalent to the size of the status management areas 510 takes place in the storage unit 2 deteriorated in reliability and it is possible to reduce the failure rate of the storage unit 2 due to further data write in the storage unit 2. When new data is written in the logical drive 4, data is written in the storage unit 3 having high reliability rather than the storage unit 2. Therefore, it is possible to prevent a loss of write data. Even when the storage unit 2 has reached the life end and further data write is prevented, the logical drive 4, which is the upper layer of the storage units, behaves as a drive that can perform both of read and write. Therefore, an upper software layer such as an application program can treat the logical drive 4 equivalently irrespective of whether the logical drive 4 is in a life end mode or in the normal state. Therefore, an application program modification for introducing this embodiment is not needed and a shift to a system adopting this embodiment is easy.

Third Embodiment

Figure 58:
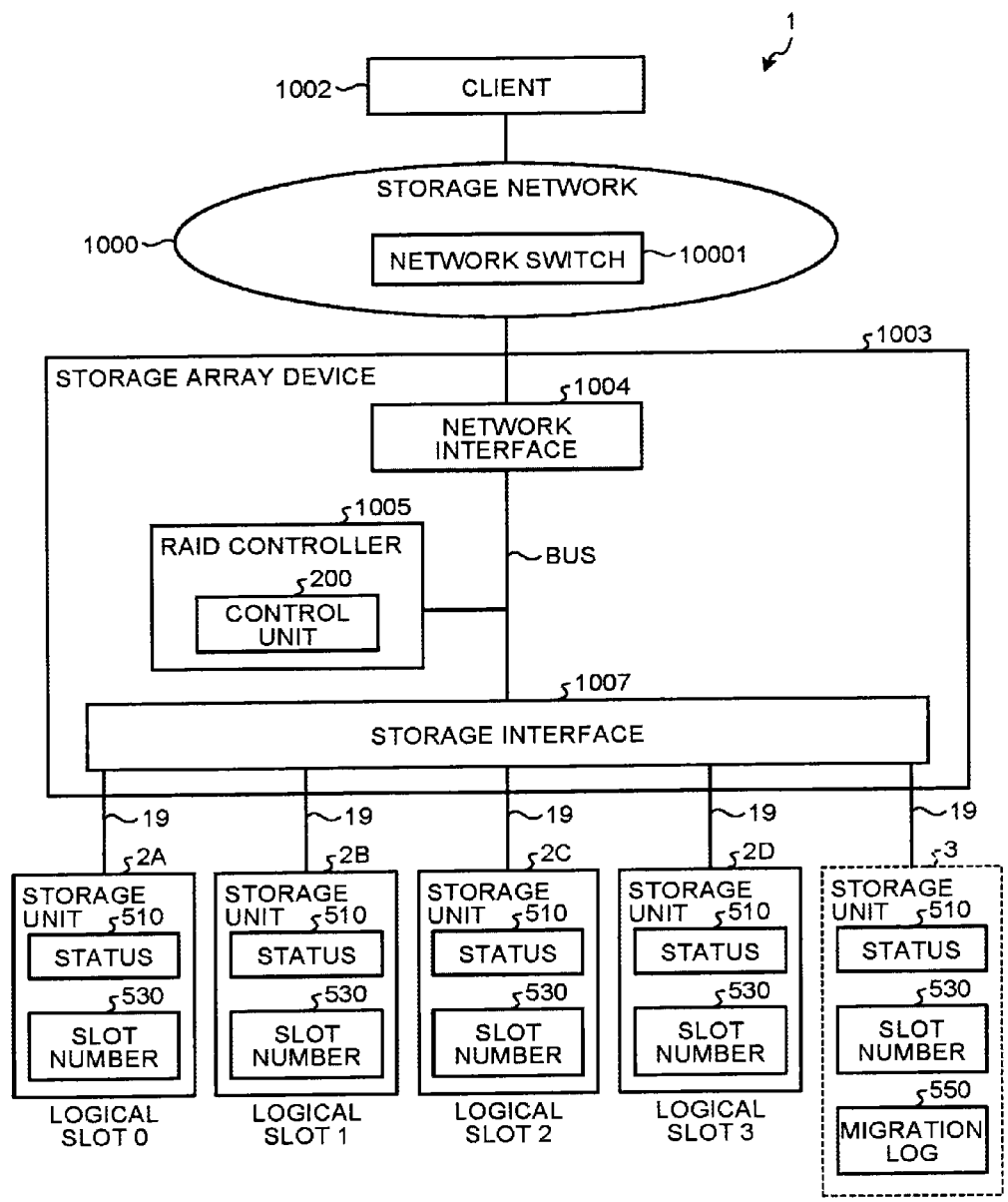
FIG. 58 is a block diagram of a functional configuration example of an information processing system in a third embodiment.

In an example explained in a third embodiment, the present invention is applied to the information processing system 1 including a storage array. FIG. 58 shows the information processing system 1 according to the third embodiment. The information processing system 1 includes a storage array device 1003, storage units 2A to 2D, the storage unit 3, the interface 19 configured to connect the storage array device 1003, the storage units 2A to 2D, and the storage unit 3, a client 1002, and a storage network 1000 configured to connect the client 1002 and the storage array device 1003. In the information processing system 1, the storage units 2A to 2D are connected to the storage array device 1003 and are respectively recognized as logical slots functioning as logical units. A RAID (Redundant Arrays of Inexpensive Disks) array is built using the logical slots. The storage unit 3 functioning as a data migration destination can be further connected to the storage array device 1003. In this embodiment, four storage units configure the RAID array before life end processing. However, the RAID array can be built using arbitrary two to a plurality of storage units. In this embodiment, the RAID5 is used as the RAID array. However, this embodiment can also be applied when a storage array is built using other RAID techniques such as RAID0, RAID2, RAID3, RAID4, RAID6, and RAID Z and other storage array implementation forms.

The network 1000 is a storage network for storage access. For example, a Fibre Channel or an Ethernet (registered trademark) is used. In particular, as the storage network 1000, for example, a SAN (Storage Area Network) or a NAS (Network Attached Storage) is used. As the SAN, for example, an FC-SAN (Fibre Channel Storage Area Network) or an IP-SAN (Internet Protocol Area Network) is used. As an upper layer protocol of the SAN, for example, a SCSI (Small Computer System Interface) is used. In an example explained in this embodiment, the IP-SAN is adopted as the storage network 1000. As an upper layer protocol of the IP-SAN, an iSCSI (Internet Small Computer System Interface) is used. The storage network 1000 includes a network switch 10001 and a hub (not shown in the figure).

The client 1002 is a computer connected to the storage network 1000 and configured to carry out desired processing. Typically, the client 1002 includes hardware resources such as a processor, a main memory, a communication interface and a local input/output device. The client 1002 includes software resources such as a device driver, an operating system (OS), and an application program (not shown in the figure). Consequently, the client 1002 executes various programs under the control by the processor and realizes processing in cooperation with the hardware resources. For example, the client 1002 executes a business application program under the control by the processor to thereby I/O-access the storage array device 1003 through the storage network 1000 and realize a desired business system. The client 1002 can be a database server (DB server) in which a database management system (DBMS) is operating. Then, upon receiving a data read request from a client (not shown in the figure) connected to the DB server through the storage network 1000 or another network (not shown in the figure), the client 1002 reads data from the storage array device 1003 and transmits the read data to the client. Upon receiving a data write request from the client, the client 1002 receives write data from the client and writes the data in the storage array device 1003.

The storage array device 1003 uses logical slots 0 to 3 as configuration units of RAID. The logical slots correspond to the logical devices in the second embodiment. In a normal state before any one of the storage units 2A to 2D has reached the life end, the storage units 2A to 2D are connected to the storage array device 1003 through the interface 19. The storage unit 2A is allocated to the logical slot 0, the storage unit 2B is allocated to the logical slot 1, the storage unit 2C is allocated to the logical slot 2, and the storage unit 2D is allocated to the logical slot 3. Consequently, the storage array device 1003 notifies the client 1002 of the four logical slots corresponding to the four storage units 2A to 2D as virtual one logical device using the RAID5. The client 1002 transmits an LBA for accessing the storage array device (hereinafter referred to as "array LBA" or "ALBA"). A control unit 200 in a RAID controller 1005 transforms the array LBA into logical slot numbers and LBAs for accessing the storage units 2A to 2D (hereinafter referred to as "storage unit LBAs" or "SLBAs"). The control unit 200 transmits an access command to the SLBA of at least one storage unit among the storage units 2A to 2D specified by the logical slot numbers.

The storage array device 1003 alone can provide the cline 1002 with data-storage service. Alternatively, one virtual storage device virtually configured by the storage array device 1003 and not-shown another storage array device can provide the client 1002 with the data-storage service. In the storage array device 1003, one or more logical devices (LDEVs) to be provided to the client 1002 are formed in the storage array device 1003.

The logical device is a logical storage device that can be recognized by the client 1002. A logical unit (LU) is allocated to the logical device. The client 1002 recognizes the logical device formed on a physical device as the logical unit. Logical unit numbers (LUNs) are given to the logical units. The logical unit is divided into logical sectors (logical blocks). Array LBAs are allocated to the logical sectors. The client 1002 can access a specific logical sector in a specific logical unit by giving a command including a logical address formed by a logical unit number and the array LBA to the storage array device 1003. In this embodiment in which the iSCSI is used, the client 1002 and the storage array device 1003 respectively function as an initiator and a target, which are iSCSI nodes allocated with iSCSI names. Therefore, the client 1002 and the storage array device 1003 transmit and receive an iSCSI PDU via a network portal specified by a combination of an IP address and a TCP port number. Therefore, the client 1002 designates an iSCSI name, an IP address, and a TCP port number to thereby recognize the storage array device 1003 on the network 1000 and accesses a logical sector in the logical unit of the storage array device 1003.

The storage units 2A to 2D are storage units connected to the storage array device 1003 through the interface 19. As the storage units 2A to 2D, for example, storage units equivalent to the storage unit 2 explained in the first embodiment can be respectively used. In this embodiment, as an example, as the storage units 2A to 2D, the SSD explained in the first embodiment is used. In terms of discarding the storage units 2A to 2D after reliability deterioration, reduce a setting space, and reduce the power consumption of the entire information processing system 1, it is desirable that the storage units 2A to 2D are physically detachably attachable to the storage array device 1003.

The storage unit 3 is a storage unit connected to the storage array device 1003 anew after it is determined that any one of the storage units 2A to 2D has reached the life end or is about to reach the life end. For example, the storage units equivalent to the storage unit 3 described in the first embodiment can be used. In this embodiment, as the storage unit 3, the SSD described in the first embodiment is used. To reduce a setting space before connection of the storage unit 3, to reduce the power consumption of the entire information processing system 1, and to discard the storage unit 3 after reliability deterioration of the storage unit 3 to reduce a setting space and reduce the power consumption of the entire information processing system 1, it is desirable that the storage unit 3 is physically detachably attachable to the storage array device 1003.

The RAID controller 1005 controls building and management of a RAID array of a storage unit connected to a storage interface 1007 and includes the control unit 200. The control unit 200 takes various implementation forms such as firmware and software stored in a memory in the RAID controller 1005 or hardware in the RAID controller 1005. Upon receiving a command from the client 1002, a network switch 6009, or the like through a network interface 1004, the control unit 200 transmits a read command, a write command, other commands, and data to the storage units through the storage interface 1007, receives responses and data from the storage units, and transmits a response and the data to the client 1002 through the network interface 1004. The control unit 200 performs control and management of statistical information, the status management areas 510, the slot number management areas 530, and the data migration log area 550 of the storage units 2A to 2D and the storage unit 3 and performs life end processing, data migration processing, and the like based on the statistical information. The status management areas 510, the slot number management areas 530, and the data migration log area 550 can be stored in a storage area in the information processing system 1 such as a memory area (not shown in the figure) in the RAID controller 1005 rather than being stored in the storage units. In this embodiment, data stored in the status management areas 510 can take values 0 to 5. The respective values indicate states of a storage unit corresponding thereto as follows:

0: initial storage state
1: normal state
2: low reliability state

3: data migration source state (protected state)
4: data migration destination state
5: discard target state In FIG. 59, a transformation method for an array LBA (ALBA) and a storage unit LBA (SLBA) in the normal state in this embodiment is shown. The control unit 200 adopting the RAID5 generates, using three continuous logical sectors ALBA=3q, 3q+1, and 3q+2 (q is an arbitrary integer equal to or larger than 0) as a set, parity data P(3q, 3q+2) equivalent to one logical sector with respect to array data D(ALBA=3q), D(ALBA=3q+1), and D(ALBA=3q+2), which are data of the respective logical sectors.

The parity data P(3q, 3q+2) is calculated by exclusive ORing respective bits having the same offset in logical sectors in D(ALBA=3q), D(ALBA=3q+1), and D(ALBA=3q+2) in such a manner as P(3q, 3q+2)=(D(ALBA=3q) XOR D(ALBA=3q+1) XOR DALBA-3q+2). For example, parity data P(0,2) is calculated by the control unit 200 from D(0), which is data of ALBA=0, D(1), which is data of ALBA=1, and D(2), which is data of ALBA=2. In the normal state, array data D(ALBA=3q), D(ALBA=3q+1), and D(ALBA=3q+2) and parity data P(3q, 3q+2) are distributedly managed in the storage units 2A to 2D as shown in FIG. 59. For example, in the case of the ALBA=1, data D(1) corresponding thereto is stored in LBA=SLBA=0 of the storage unit 2B allocated to the logical slot 1. Upon receiving the ALBA=1 from the client 1002, the control unit 200 specifies a logical slot number=1 and SLBA=0.

For example, upon receiving a read command for the ALBA=1 from the client 1002, the control unit 200 specifies the logical slot number=1 and the SLBA=0, which are storage destination of D(1), transmits a read command for the SLBA=0 to the storage unit 2B connected to the logical slot number=1, receives read data, and transmits the received read data to the client 1002. When a response is not received from the storage unit 25 or when an error response is received from the storage unit 2B, the control unit 200 transmits a read command for the SLBA=0 to the storage unit 2A, the storage unit 2C, and the storage unit 2D connected to the logical slot 0 and the logical slots 2 and 3 other than the logical slot 1, restores D(1) from received data D(0), D(2), and P(0,2) through exclusive OR, and transmits the restored D(1) to the client 1002. Data read for D(0), D(2), and P(0,2) can be performed in parallel during the read of D(1).

For example, upon receiving a write command and write data for the ALBA=1 from the client 1002, the control unit 200 specifies the logical slot number=1 and the SLBA=0, which are storage destination of D(1), transmits a write command for the SLBA=0 to the storage unit 2B having the logical slot number=1, writes data to be written, reads the data D(0) and D(2) from the SLBA=1 of the storage unit 2A and the storage unit 2C, which are the storage units connected to the slots other than the logical slot number 1 and not having parity data stored in the SLBA=0, calculates the parity data P(0,2) from D(0), D(1), and D(2), and writes the parity data P(0,2) in the SLBA=0 of the storage unit 2D.

In FIG. 60, a transformation method for the array LBA and the storage unit LBA immediately after migration state transition of the logical slot 1 is shown. Immediately after the migration state transition, the transformation method for the array LBA and the storage unit LBA is the same as that in the normal state shown in FIG. 59.

As shown in FIG. 58, the storage units 2A to 2D and the storage unit 3 respectively include the status management areas 510 and the logical slot number management areas 530. The storage unit 3 includes the data migration log area 550. When data migration explained below is completed, the control unit 200 can delete or deallocate the data migration log area 550 and allocate the data migration log area 550 to another use such as user data storage. The control unit 200 can allocate the LBA area to the status management areas 510, the logical slot number management areas 530, and the data migration log area 550. Alternatively, the control unit 200 can allocate an area that is not an LBA area (e.g., a log area allocated with a log page address) to the status management areas 510, the logical slot number management areas 530, and the data migration log area 550. In the area that is not an LBA area, for example, read is performed according to 2Fh Read Log Ext described in ACS-3 of Non-Patent Literature 1 and write is performed according to 3Fh Write Log Ext described in ACS-3 of Non-Patent Literature 1. A log of a data migrating state explained below is stored in the data migration log area 550.

As log data recorded in the data migration log area 550, in this embodiment, table data shown in FIG. 61 is used. When data of a sector count X is written in the LBA (=SLBA) of the storage unit 3 in the data migrating state, the control unit 200 additionally writes (SLBA, X) in the data migration log area 550. When LBAs overlapping or continuous to an area of LBA=SLBA~SLBA+X−1 are already recorded in the data migration log area 550, it is desirable to record a log obtained by combining the LEAs in the data migration log area 550 and delete the combined log from the data migration log area 550. For example, when an LBA area A of (SLBA, X) is written in the data migration log area 550 anew and when an LBA area B of (SLBA-a, a) is already recorded in the data migration log area 550, because the LBA area A and the LBA area B are continuous, it is possible to update the data migration log area 550 without increasing a log data amount by overwriting a log of (SLBA-a, a) with data of (SLBA-a, a+X) indicating a region of A+B.

In the same manner as shown in FIGS. 24 and 29 in the first embodiment, the control unit 200 determines whether the respective storage units connected to the storage interface 1007 have reached the life end, are about to reach the life end, or are about to fail. When the storage units have reached the life end, are about to reach the life end, or are about to fail, the control unit 200 performs the life end processing. As in the first embodiment, the life end determination is performed at every fixed time, at each fixed number of kinds of processing, or at each fixed data transmission and reception shown in FIG. 24 or when a command response received from the storage unit is an error response as shown in FIGS. 29 and 30.

Figure 62:
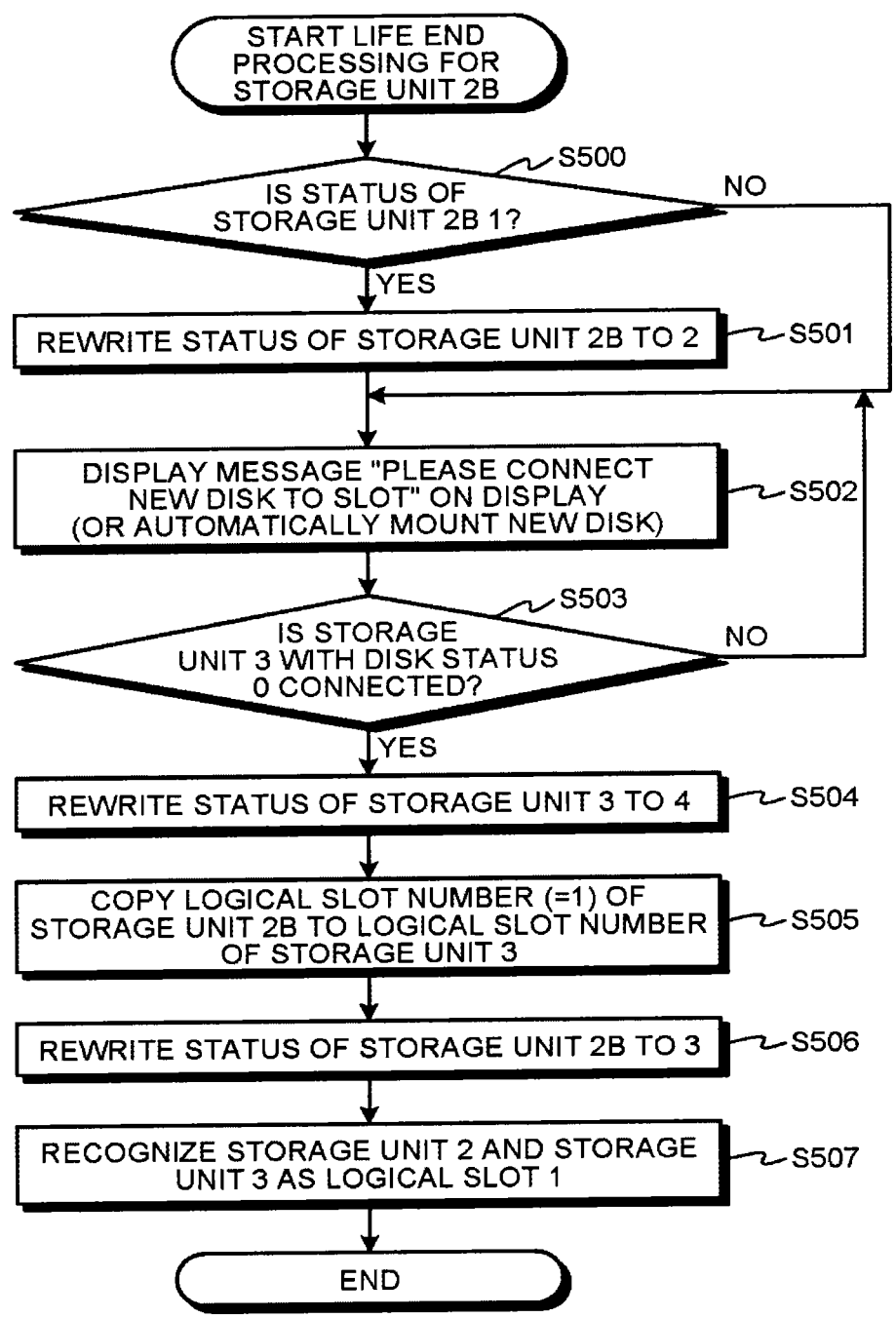
FIG. 62 is a flowchart for explaining life end processing.

FIG. 62 shows the life end processing of the storage unit 2B performed, for example, when the control unit 200 determines that the storage unit 2B has reached the life end. When the control unit 200 determines that the storage unit 2B has reached the life end (step S500), the control unit 200 rewrites a status of the storage unit 2B from 1 to 2 (step S501). It is desirable that the control unit 200 notifies a network administrator through a display device, an LED, or the like to connect a new storage unit to a free slot of the storage interface 1007 (step S502). Alternatively, when a mechanical apparatus that automatically performs physical attachment and detachment of the storage units 2A to 2D or the storage unit 3 to and from the storage interface 1007 is mounted on the information processing system 1 as a storage load/unload apparatus (not shown in the figure), the control unit 200 can control the storage load/unload apparatus to connect a new storage unit to the storage interface 1007 (step S502).

When the storage unit 3 is connected as a new storage unit (step S503), the control program 200 rewrites the status 510 of the storage unit 3 to 4 (step S504) and copies data of the logical slot number management areas 530 of the storage unit 2B to the logical slot number management areas 530 of the storage unit 3 (step S505). In the present example, because the storage unit 2B is allocated as the logical slot 1 as shown in FIG. 57, 1 is written in the logical slot number management areas 530 of the storage unit 3. The control program 200 rewrites the status 510 of the storage unit 2B to 3 (step S506) and causes the RAID controller 1005 to recognize the storage unit 2B and the storage unit 3 as the logical slot 1, which is the same logical slot (step S507). After the life end processing, a status of the storage unit 2B is 3 and a status of the storage unit 3 is 4. The logical slot 1 transitions to the data migrating state.

Figure 63:
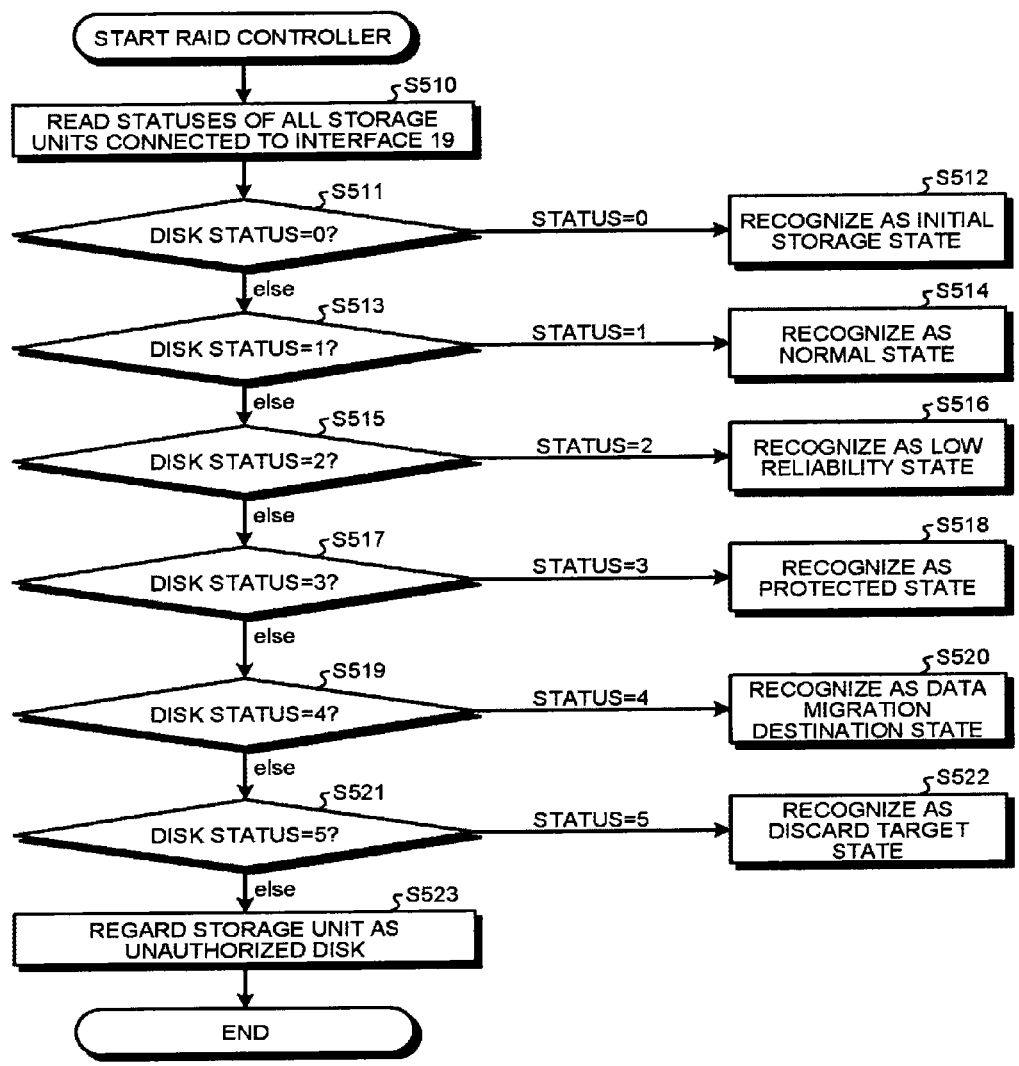
FIG. 63 is a flowchart for explaining a processing procedure of a control unit performed when, for example, a RAID controller starts.

In this embodiment, the statuses of the respective storage units are stored in the status management areas 510 of the storage units in a nonvolatile manner. FIG. 63 shows a processing procedure of the control unit 200 performed when the RAID controller 1005 starts and when the storage units are connected to the storage interface 1007. Every time the RAID controller 1005 starts, the control unit 200 reads the status management areas 510 to recognize statuses of the storage units. The control unit 200 recognizes the statuses of the storage units and reads logical slot numbers of the storage units from the logical slot number management areas 530 to determine whether each of the logical slots 0 to 3 is in the data migrating state.

That is, when the storage status=0 (step S511), the control unit 200 recognizes the storage units as being in the initial storage state (step S512). When the storage status=1 (step S513), the control unit 200 recognizes the storage units as being in the normal state (step S514). When the storage status=2 (step S515), the control unit 200 recognizes the storage unit as being in the low reliability state (step S516). When the storage status=3 (step S517), the control unit 200 recognizes the storage units as being in the data migration source state (the protected state) during the data migration work (step S518). When the storage status=4 (step S519), the control unit 200 recognizes the storage units as being in the data migration destination state during the data migration work (step S520). When the storage status=5 (step S521), the control unit 200 recognizes the storage units as being in the discard target state (step S522). When the storage status is other than 0 to 5, the control unit 200 regards the storage units as unauthorized storage units (step S523). Read from the logical drive (1)

Figure 64:
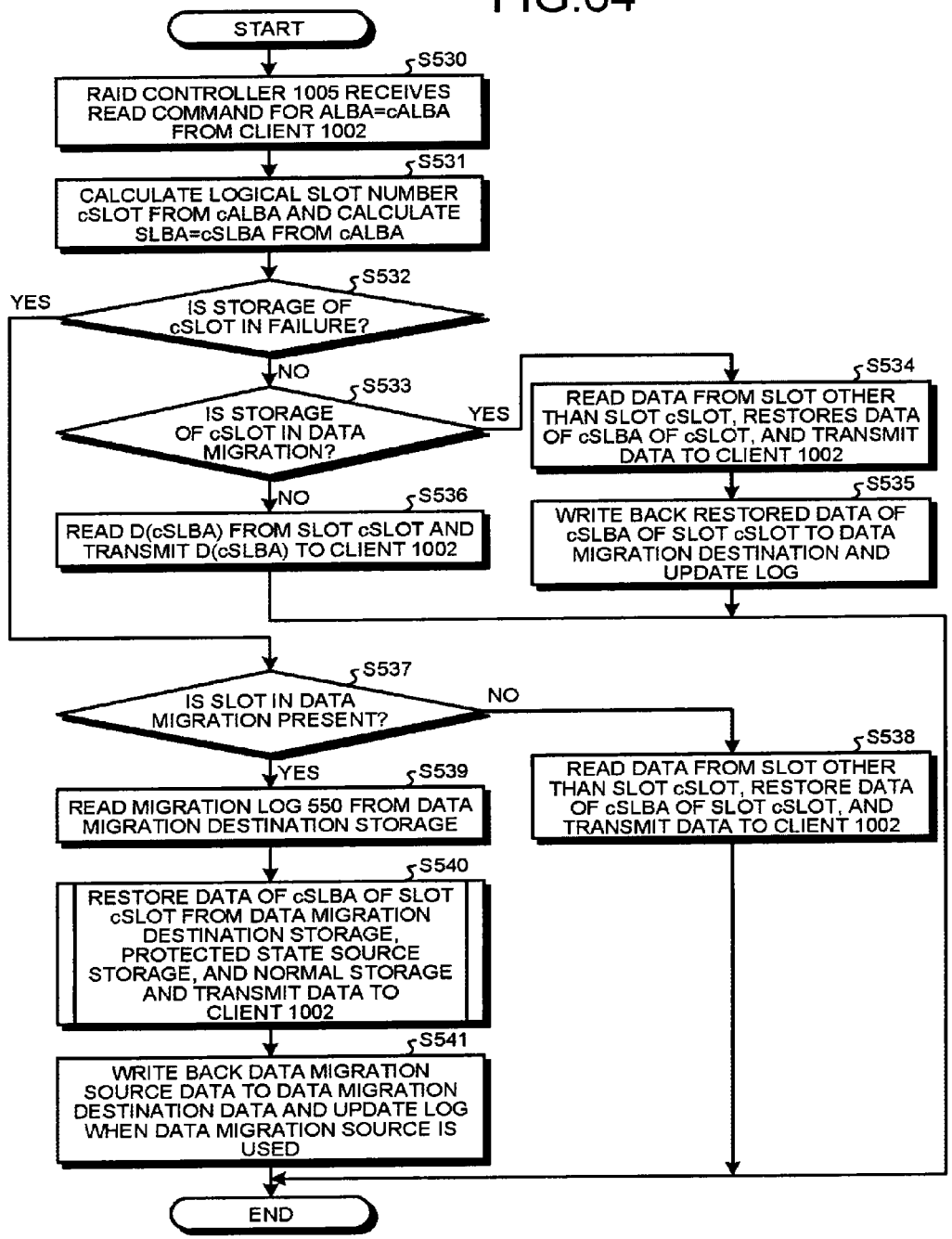
FIG. 64 is a flowchart for explaining a processing procedure of the RAID controller in executing a read request.

FIG. 64 shows a processing procedure of the control unit 200 performed when a read request is transmitted from the client 1002 to the storage array device 1003. The control unit 200 receives a read command for ALBA=cALBA, which is a read target array LBA, from the client 1002 (step S530). The control unit 200 calculates a logical slot number cSLOT and SLBA=cSLBA, which is a read target storage unit LBA, from cALBA (step S531). The control unit 200 determines whether a storage unit of a logical unit of cSLOT is in failure (step S532). When the storage unit of the logical slot of the cSLOT is not in failure, subsequently, the control unit 200 determines whether the storage unit of the logical slot of the cSLOT is in the data migrating state (step S533).

When the storage unit of the logical slot of the cSLOT is in the data migrating state (step S533), the control unit 200 reads data including parity from a slot other than the slots of the cSLOT, restores data of the cSLBA of the cSLOT using the data, and transmits the restored data to the client 1002 (step S534). The control unit 200 writes back the restored data of the cSLBA of the cSLOT to the data migration destination storage unit 3 and records a data migration log in the data migration log area 550 (step S535). When the storage unit of the logical slot of the cSLOT is not performing data migration (step S533), the control unit 200 reads data D (cSLBA) from the storage unit of the cSLOT and transmits the read data to the client 1002. In this way, when the read target logical slot is in the data migrating state, the read target data is restored from a slot other than the read target. Consequently, even if data of the storage unit in the data migrating state is lost, it is possible to remedy the loss. Further, read from the storage unit in the data migrating state is reduced to suppress read disturb (a phenomenon in which an error occurs in stored data because very small charges are stored in a floating gate of an unselected memory cell included in the same block as a memory cell from which the data is read).

When the storage unit of the logical slot of the cSLOT is in failure, the control unit 200 determines whether a slot in the data migrating state is present (step S537). When a slot in the data migrating state is absent, the control unit 200 reads data from a slot other than the slot of the cSLOT, restores data of the cSLBA of the cSLOT using the data, and transmits the restored data to the client 1002 (step S538). When the read target slot is in failure and a slot in the data migrating state is absent in other slots in this way, the control unit 200 restores the read target data from a slot other than the read target.

When the storage unit of the logical slot of the cSLOT is in failure and a slot in the data migrating state is present (step S537), the control unit 200 reads the data migration log area 550 and determines in which of the data migration source and the data migration destination the data of the read target SLBA is present (step S539). The control unit 200 restores the data of the cSLBA of the cSLOT from data read from a data migration destination storage unit, a data migration source storage unit, and a normal-state storage unit and transmits the restored data to the client 1002 (step S540). When data of the data migration source is used, the control unit 200 writes back the used data migration source data to the data migration destination storage unit 3 and records a data migration log in the data migration destination data migration log area 550 (step S541).

Read from the Logical Drive (2)

Figure 65:
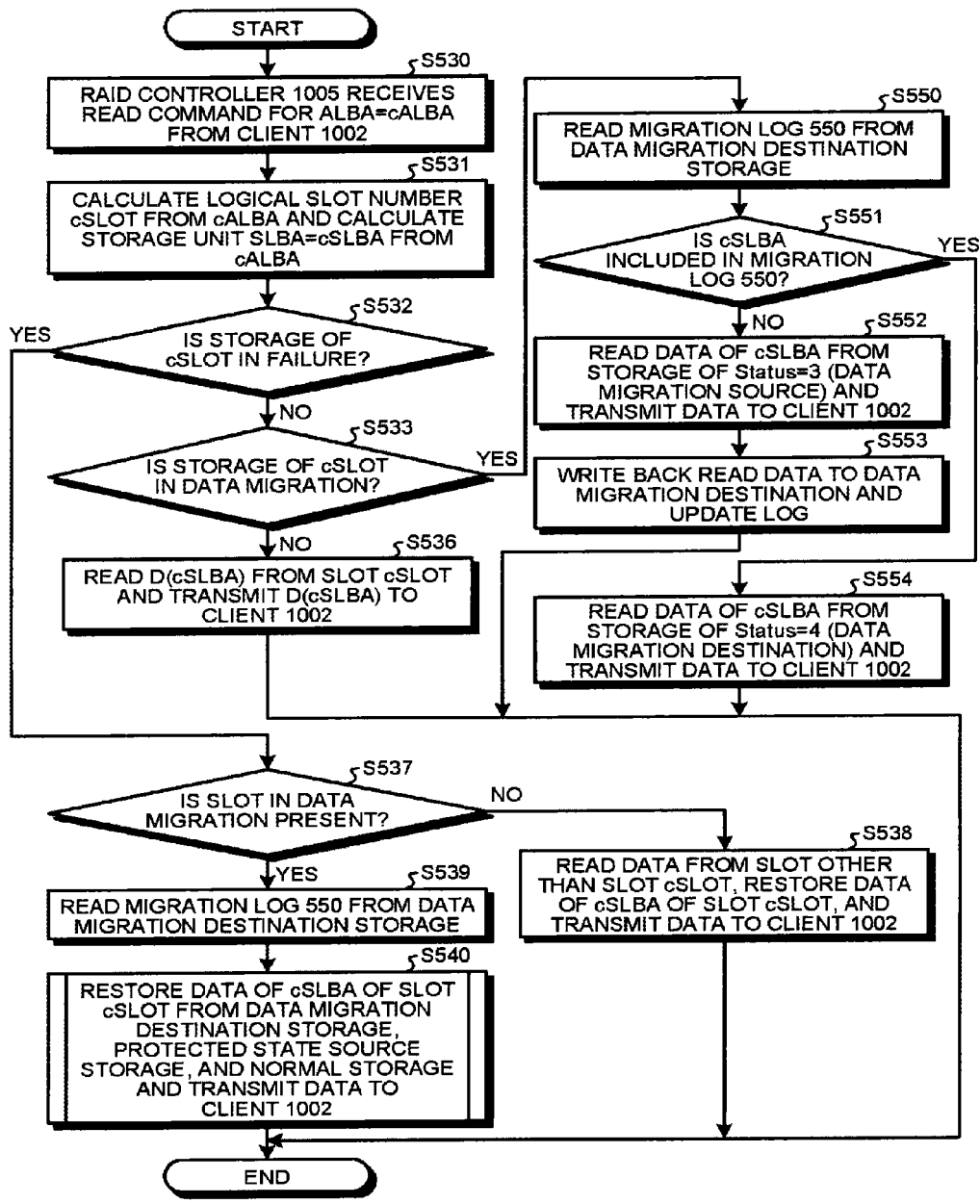
FIG. 65 is a flowchart for explaining another processing procedure of the RAID controller in executing the read request.

FIG. 65 shows another processing procedure of the control unit 200 performed when a read request is transmitted from the client 1002 to the storage array device 1003. In the processing procedure shown in FIG. 65, processing performed when the determination at step S533 in FIG. 64 is affirmative is changed from steps S534 and S535 to steps S550 to S554. In FIG. 65, the processing at step S541 in FIG. 64 is deleted. When the storage unit of the logical slot of the cSLOT is in the data migrating state (step S533), the control unit 200 reads the data migration log from the data migration destination storage unit 3 and determines whether the data of the cSLBA is included in the data migration log (step S551). When the data of the cSLBA is included in the data migration log, the control unit 200 reads the data of the cSLBA from the data migration destination storage unit 3 and transmits the read data to the client 1002 (step S554). When the data of the cSLBA is not included in the data migration log, the control unit 200 reads the data of the cSLBA from the data migration source storage unit and transmits the read data to the client 1002 (step S552). The control unit 200 writes back the data read from the data migration source to the data migration destination storage unit 3 and updates the log 550 of the data migration destination storage unit 3 (step S553).

Write in the Logical Drive

Figure 66:
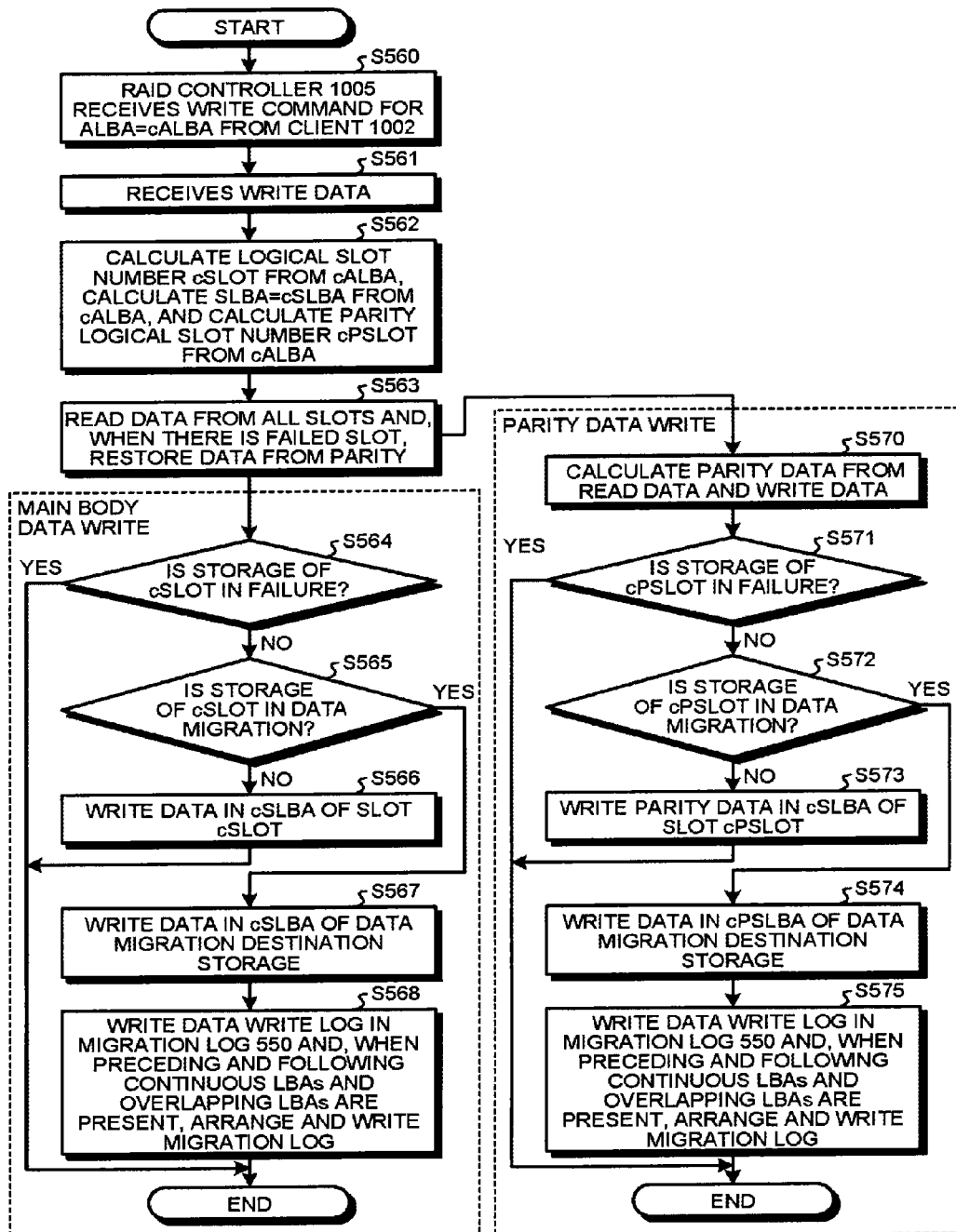
FIG. 66 is a flowchart for explaining a processing procedure of the RAID controller in executing a write request.

FIG. 66 is a flowchart for explaining processing for a write command from the client 1002 in this embodiment. Upon receiving a write command including the cLBA, which is the array LBA, and a sector length from the client 1002 (step S560), the control unit 200 receives write data from the client 1002 (step S561). The control unit 200 calculates a logical slot number cSLOT, in which data should be written, from the cALBA, retrieves the cSLBA, which is the storage unit LBA in which data should be written, from the cALBA, and calculates a logical slot number cPSLOT of a parity data storage destination of the cSLBA from the cALBA (step S562). The control unit 200 reads data of the cSLBA of all the slots in parallel. When there is a failed slot, the control unit 200 reads data from a slot other than the failed slot and restores data of the failed slot (step S563). Thereafter, the control unit 200 processes a main body data write task and a parity data write task in parallel.

The main body data write task is executed as explained below. The control unit 200 determines whether the cSLOT is in failure (step S564). When the cSLOT is in failure, the control unit 200 ends the task without write data. When the cSLOT is not in failure, the control unit 200 determines whether the cSLOT is in the data migrating state (step S565). When the cSLOT is not in the data migrating state, the control unit 200 writes reception data from the client 1002 in the cSLBA of the slot cSLOT (step S566). When the cSLOT is in the data migrating state, the control unit 200 writes the reception data in the cSLBA of a data migration destination storing unit of a data migration source storage unit and the data migration destination storage unit allocated to the slot cSLOT (step S567). The control unit 200 records the cSLBA and a sector size in the data migration log area 550 of the data migration destination storage unit as a data migration log (step S568). When data migration logs of continuous LBAs before and after the cSLBA and overlapping LBAs are present in the data migration log area 550, the control unit 200 writes a data migration log obtained by combining the logs in the data migration log 550 and deletes (invalidates) the combination source data migration logs (step S568).

The deletion of the data migration log from the data migration log 550 only has to be logical deletion. The data migration log does not have to be physically erased by block erasing of the NAND memory 16. For example, a flag for invalidating a log is written in the data migration log 550 or the data migration log 550 after update is stored in an area different from the data migration log 550 before the update and a pointer indicating a storage position of the data migration log 550 is updated, whereby the data migration log is logically deleted from the data migration log 550.

The parity data write task is executed as explained below. The control unit 200 overwrites data read from all the logical slots to the memory in the RAID controller 1005 with the write data received from the client 1002 and recalculates parity data (step S570). The control unit 200 determines whether the cPSLOT is in failure (step S571). When the cPSLOT is in failure, the control unit 200 ends the task without writing the parity data. When the cPSLOT is not in failure, the control unit 200 determines whether the cPSLOT is in the data migrating state (step S572). When the cPSLOT is not in the data migrating state, the control unit 200 writes the parity data in the cSLBA of the slot cPSLOT (step S573). When the cPSLOT is in the data migrating state, the control unit 200 writes the parity data in the cSLBA of the data migration destination storage unit of the data migration source storing unit and the data migration destination source unit allocated to the slot cPSLOT (step S574). The control unit 200 records the cSLBA and a sector size in the data migration log area 550 of the data migration destination storage unit as a data migration log. When data migration logs of continuous LBAs before and after the cSLBA and overlapping LBA are present in the data migration log 550, the control unit 200 writes a data migration log obtained by combining the data migration logs in the data migration log area 550 and deletes the combination source data migration logs from the data migration log 550 (step S575).

In this way, the control unit 200 transmits, in response to a write request from the client, the write command of the SLBA to the storage units 2A, 2C, and 2D allocated to the logical slots 0, 2, and 3 not in the data migrating state. On the other hand, for the logical slot 1 under the data migration, the control unit 200 does not transmit a write command to the data migration source storage unit 2B, transmits a write command to the data migration destination storage unit 3, and records a data migration log in the data migration log area 550 of the storage unit 3.

Figure 67:
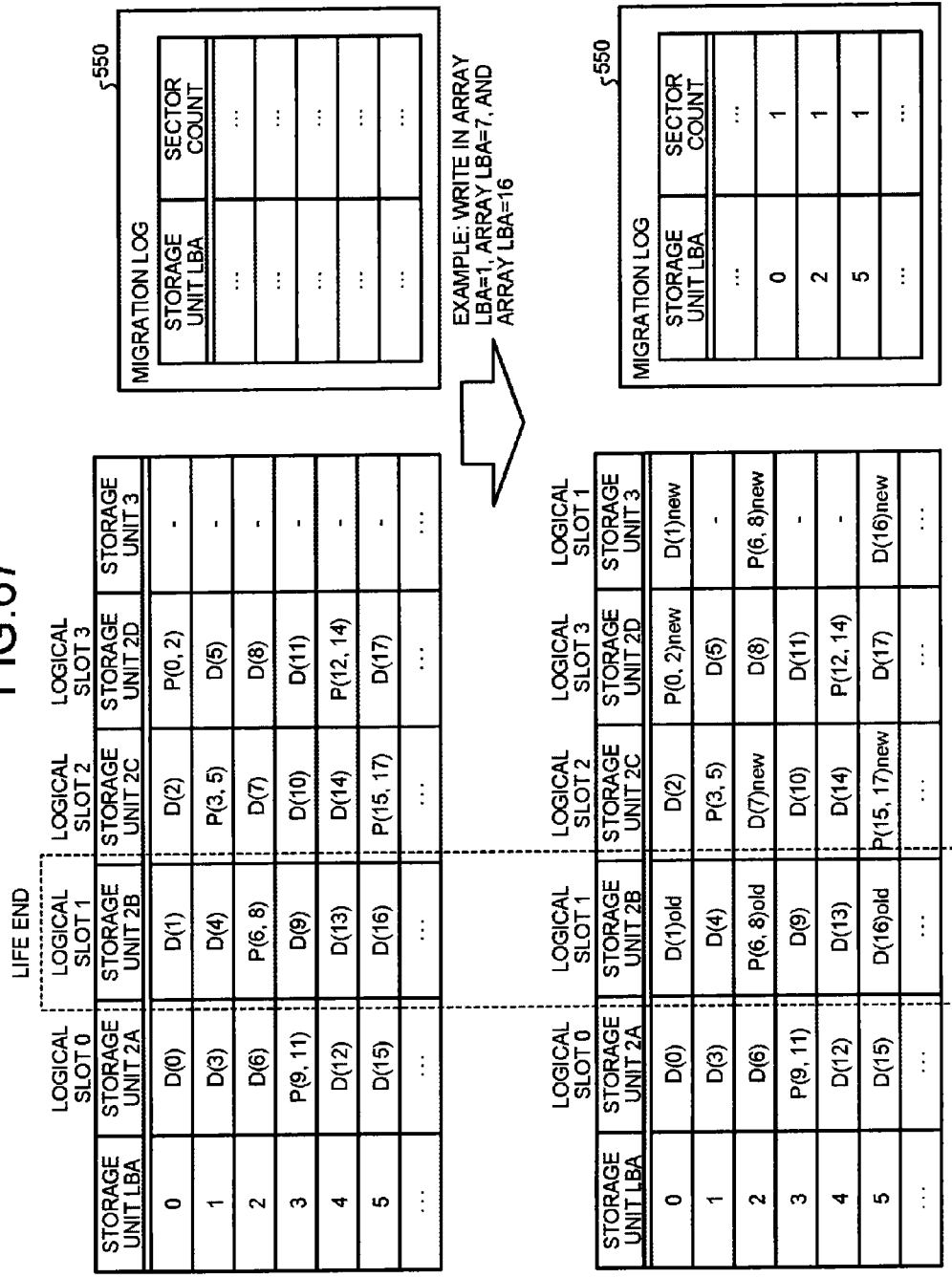
FIG. 67 is a diagram of a specific example of write processing.

A more detailed example is shown in FIG. 67. In an example shown in FIG. 67, when the logical slot 1 is in the data migrating state, the storage unit 2B is allocated as the data migration source, the storage unit 3 is allocated as the data migration destination, and the logical slots 0, 2, and 3 are in the normal state, a request for writing D(1) in the ALBA=1, writing D(7) in ALBA=7, and writing D(16) in the ALBA=16 of the storage array device 1003 is transmitted from the client 1002.

Example 1

Upon receiving a write command for data D(1)new in the ALBA=1 from the client 1002, the control unit 200 specifies SLBA=0 and the logical slot 1 from the ALBA=1. When the logical slot 1 is not in the data migrating state, D(1)new is written in the SLBA=0 of the storage unit 2B. However, in the present example, the logical slot 1 is in the data migrating state. Therefore, the control unit 200 writes D(1)new in the storage unit 3. The control unit 200 reads D(0) from the storage unit 2A of the logical slot 0 and reads D(2) from the storage unit 2C of the logical slot 2 based on the read operation explained above, calculates new parity data P(0, 2)new from D(0), D(1)new, and D(2) through exclusive OR, and stores P(0,2)new in the SLBA=0 of the storage unit 2D of the logical slot 3. For improvement of processing speed, it is desirable that the write command for D(1)new to the storage unit 3, the read command for D(0) to the storage unit 2A, and the read command for D(2) to the storage unit 2C are transmitted from the control unit 200 in parallel. Further, it is desirable to, at a point when the read of D(0) and D(2) is completed, calculate P(0<2)new and transmit the write command to the storage unit 2D without waiting for the completion of the write of D(1). The control unit 200 records, in the data migration log area 550 of the storage unit 3, (SLBA, sector count), which indicates an SLBA and a sector count in which write is performed in the storage unit 3. For example, in this example, write is performed in an SLBA area of one sector from the SLBA=0 of the storage unit 3. Therefore, (0, 1) is additionally written in the data migration log area 550. As explained above, when continuous LBA areas and overlapping LEA areas are already recorded in the data migration log area 550, an SLBA area obtained by merging the LBA areas is recorded in the data migration log area 550. When write is performed in a logical slot not in the data migrating state, update of the data migration log 550 is not performed.

Example 2

Upon receiving a write command for new data D(7)new for the ALBA=7 from the client 1002, the control unit 200 specifies the SLBA=2 and the logical slot 2 from the ALBA=7. Because the logical slot 2 is not in the data migrating state, D(7)new is written in the SLBA=0 of the storage unit 2B. The control unit 200 performs read of D(6) and D(8) from the logical slot 0 and the logical slot 3 based on the read operation, calculates parity data P(6, 8)new, and stores the parity data P(6, 8)new in the logical slot 1. Because the logical slot 1 is in the data migrating state, the control unit 200 writes P(6, 8)new in the storage unit 3 rather than the storage unit 2B and records (SLBA, sector count) =(2, 1), which indicates an SLBA and a sector count in which write is performed in the storage unit 3, in the data migration log area 550 of the storage unit 3.

Example 3

Upon receiving a write command for new data D(16)new for the ALBA=16 from the client 1002, the control unit 200 specifies the SLBA=5 and the logical slot 1 from the ALBA=16. In the present example, because the logical slot 1 is in the data migrating state, the control unit 200 writes D(16)new in the storage unit 3. The control unit 200 reads D(15) from the storage unit 2A of the logical slot 0 and reads D(17) from the storage unit 2D of the logical slot 2 based on the read operation, calculates new parity data P(15, 17)new from D(15), D(16)new, and D(17) through exclusive OR, and stores P(15, 17)new in the SLBA=5 of the storage unit 2C of the logical slot 2. The control unit 200 records, in the data migration log area 550 of the storage unit 3, (SLBA, sector count), which indicates an SLBA and a sector count in which write is performed in the storage unit 3. For example, in this example, write is performed in an LBA area of one sector from the SLBA=5 of the storage unit 3. Therefore, (5, 1) is additionally written in the data migration log area 550. As explained above, when continuous SLBA areas and overlapping SLBA areas are already recorded in the data migration log area 550, an SLBA area obtained by merging the SLBA areas is recorded in the data migration log area 550. When write is performed in a slot not in the data migrating state, update of the data migration log 550 is not performed. In this way, as in the second embodiment, every time a write request is received from the client 1002, data of an SLBA corresponding to the write request is written in the data migration destination storage unit 3 rather than the data migration source storage unit 2B and a data migration log is recorded. Consequently, it is possible to simultaneously perform new data write and data migrating operations.

Background Backup

During idling when, for example, a command is not received from the client 1002 for a fixed time or more or when a standby mode transition request is received from the client 1002, the control unit 200 performs background backup from the storage unit 2 to the storage unit 3. The control unit 200 reads the data migration log area 550 of the storage unit 3, performs read from the storage unit 2B to an SLBA not recorded in the data migration log area 550, writes the data in the storage unit 3, and stores the SLBA and a sector size of write data in the data migration log area 550 of the storage unit 3 to perform the background backup. In the storage of the SLBA in the data migration log 550, when continuous SLBA areas are present or when overlapping SLBA areas are present, it is desirable that an SLBA area obtained by merging the SLBA areas is stored in the data migration log 550 and the SLBA areas before the merging are deleted from the data migration log area 550.

To reduce a data size of a data migration log stored in the data migration log area 550 and to perform data migration end determination explained below at high speed, it is desirable that the background backup is preferentially performed for un-migrated fragmented SLBA areas among SLBA areas other than the SLBA area registered in the data migration log 550. The control program 200 backs up the un-migrated fragmented SLBA area and subjects the un-migrated fragmented LBA area to data migration to thereby store a newly migrated SLBA area in the data migration log 550 as an SLBA area formed by merging the newly migrated SLBA area with a migrated SLBA area continuously located before and after the newly migrated SLBA area.

Monitoring of a Data Migration State

Figure 68:
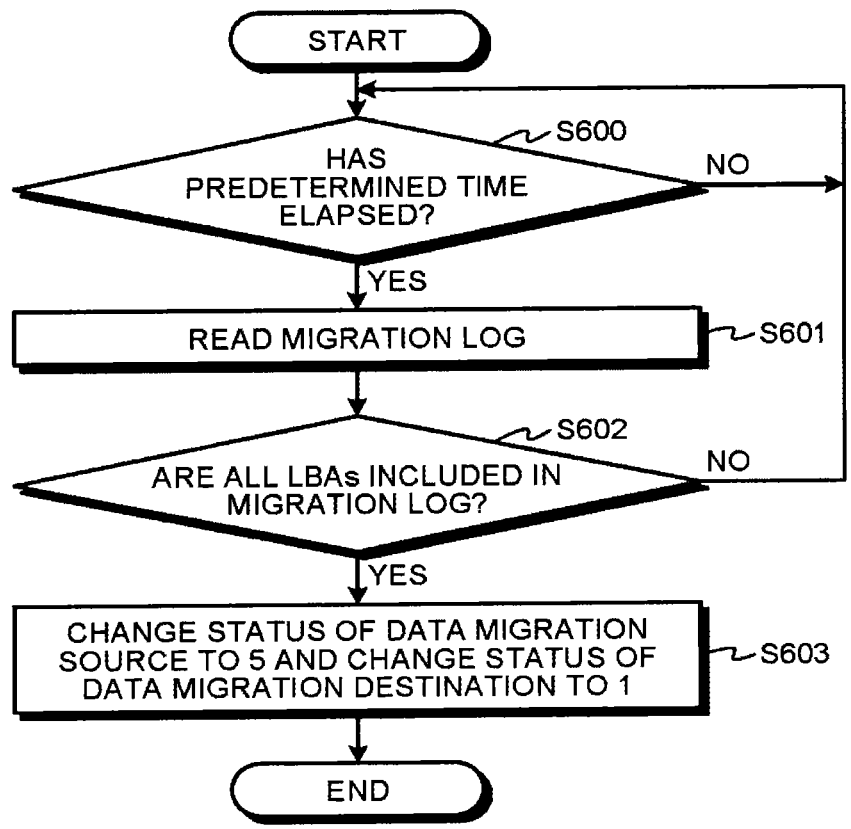
FIG. 68 is a flowchart for explaining a monitoring procedure for a data migrating state performed using the data migration log.

The control unit 200 reads the data migration log area 550 to monitor a data migration state of a logical slot under data migration. FIG. 68 shows a monitoring procedure for monitoring a data migration state using a data migration log. For example, the control unit 200 reads a data migration log from the data migration log area 550 every time a predetermined time elapses (steps S600 and S601). When all migration target SLBAs are included in the data migration log 550, the control unit 200 determines that the data migration is completed. For example, when all SLBAs of the data migration source storage unit 2B are included in the data migration log 550, the control unit 200 determines that the data migration is completed (step S602). As the determination of the completion of the data migration, for example, the control unit 200 can determine whether all SLBAs of the data migration destination storage unit 3 are included in the data migration log 550.

When the control unit 200 determines that the data migration is completed, the control unit 200 changes a status of the data migration source storage unit 2 to the discard target state of 5 and changes a status of the data migration destination storage unit 3 to the normal state of 1 (step S603) to end a data migration state of the logical slot 1 and end the data migration state monitoring for the logical slot 1. In terms of reducing the power consumption of the storage unit 2B, it is desirable that the control unit 200 transmits a transition request to the low power consumption mode to the storage unit 2. After the end of the data migrating state, it is desirable that the control unit 200 notifies, through the display 9 or the LED set near the port, the user or the administrator to detach the storage unit 2B from the interface 19 or controls the storage load/unload apparatus to detach the storage unit 2B from the interface 19.

Transition of Entire Statuses

FIG. 69 shows transition of statuses of the storage units that occurs when the storage unit 2B has reached the life end. When all the storage units 2A to 2D are in the normal state, statuses of all the storage units 2A to 2D are 1 and the storage unit 3 is unconnected to the storage interface 1007 (step 1). When the control unit 200 determines that the storage unit 2B has reached the life end, the control unit 200 changes a status of the storage unit 2B to 2 (step 2). The storage unit 3, which is a new storage unit, is connected to the storage interface 1007 based on a notification or a command from the control unit 200 (step 3). When the storage unit 3 is connected, the control unit 200 changes the status of the data migration source storage unit 2B to 3 and changes a status of the data migration destination storage unit 3 to 4 to shift a state of the logical slot 1 to the data migrating state (step 4). When the control unit 200 determines based on information read from the data migration log area 550 that all valid data of the storage unit 2B is migrated to the storage unit 3, the control unit 200 changes the status of the storage unit 2B to 5 and changes the status of the storage unit 3 to 1. Thereafter, the storage unit 2A, the storage unit 3, the storage unit 2C, and the storage unit 2D behave as if the storage unit 2A, the storage unit 3, the storage unit 2C, and the storage unit 2D are the original storage unit 2A, the original storage unit 2B, the original storage unit 2C, and the original storage unit 2D (the processing returns to step 1). Thereafter, when it is further determined that any one of the storage unit 2A, the storage unit 3, the storage unit 2C, and the storage unit 2D has reached the life end, the same steps 2 to 5 are repeated. In this way, even when any one of the storage units of the storage array device 1003 has reached the life end, is about to reach the life end, or is about to fail, it is possible to easily migrate data of the storage unit to a new storage unit according to this embodiment. In this embodiment, because the data migrating operation is performed in the background, it is possible to suppress performance deterioration due to the backup operation. A data migrating state of one storage unit and a failure of another storage unit simultaneously occur In an example shown in FIG. 70, a data migrating state of one storage unit and a failure of another storage unit simultaneously occur. In an example shown in FIG. 70, when the logical slot 1 is in the data migrating state, the storage unit 2B is allocated as the data migration source, the storage unit 3 is allocated as the data migration destination, and the logical slots 0, 2, and 3 are in the normal state, a failure occurs in the storage unit 2D of the logical slot 3.

In the case of read from the SLBA=0, data restoration is unnecessary for read of D(0) of the logical slot 0 and D(2) of the logical slot 2. Read of D(1) of the logical slot 1 can be realized by reading D(1)new, which is the latest data, from the data migration destination storage unit 3. In the case of read from the SLBA=2, data restoration is unnecessary for read of D(6) of the logical slot 0 and D(7) of the logical slot 2. Read of D(8) of the logical slot 3 can be realized by restoring data by exclusive ORing D(6) and D(7) and P(6, 8)new from the data migration destination storage unit 3. In the case of read from the SLBA=5, data restoration is unnecessary for read of D(15) of the logical slot 0. Read of D(16) of the logical slot 1 can be realized by reading D(16)new, which is the latest data, from the data migration destination storage unit 3. Read of D(17) of the logical slot 3 can be realized by restoring data by exclusive ORing D(15), D(16) new of the data migration destination storage unit 3, and P(15, 17)new of the logical slot 2.

Data Migrating States of Two Storage Units and a Failure of One Storage Unit Simultaneously Occur In an example shown in FIG. 71, data migrating states of two storage units and a failure of another storage unit simultaneously occur. In an example shown in FIG. 71, when the logical slot 1 and the logical slot 2 are in the data migrating state, the storage units 2B and 2C are allocated as data migration sources, storage units 3B and 3C are allocated as data migration destinations, and the logical slots 0 and 3 are in the normal state, a failure occurs in the storage unit 2D of the logical slot 3.

In the case of read from the SLBA=0, data restoration is unnecessary for read of D(0) of the logical slot 0 and D(2) of the logical slot 2, read of D(1) of the logical slot 1 can be realized by reading D(1)new from the data migration destination storage unit 32. In the case of read from the SLBA=2, data restoration is unnecessary for read of D(6) of the logical slot 0. Read of D(7) of the logical slot 2 can be realized by reading D(7)new, which is the latest data, from the data migration destination storage unit 3C. Read of D(8) of the logical slot 3 can be realized by restoring data by exclusive ORing D(6), D(7)new, and P(6, 8)new. In the case of read from the SLBA=5, data restoration is unnecessary for read of D(15) of the logical slot 0. Read of D(16) of the logical slot 1 can be realized by reading D(16)new, which is the latest data, from the data migration destination storage unit 3B. Read of D(17) of the logical slot 3 can be realized by restoring data by exclusive ORing D(15), D(16)new of the data migration destination storage unit 3B, and P(15, 17)new of the data migration destination storage unit 3C of the logical slot 2.

A Data Migrating State of One Storage Unit and a Data Read Inability Error Simultaneously Occur In an example shown in FIG. 72, a read error such as an uncorrectable ECC error (UECC error) occurs in one storage unit during data migration.

Example 1

Upon receiving a read command for data D(2) for the ALBA=2, the control unit 200 specifies the SLBA=0 and the logical unit 2 from the ALBA=2. When a UECC error occurs in read of the data D(2) from the storage unit 2C of the logical slot 2, D(2) can be restored by exclusive ORing D(1)new of the data migration destination storage unit 3 and P(0, 2)new of the logical slot 3.

Example 2

Upon receiving a read command for new data D(8) for ALBA=8 from the client 1002, the control unit 200 specifies the SLBA=2 and the logical slot 3 from the ALBA=8. When an UECC error occurs in read of the data D(8) from the storage unit 2D of the logical slot 3, D(8) can be restored by exclusive ORing D(6), D(7)new, and P(6, 8)new of the storage unit 3.

Example 3

Upon receiving a read command for new data D(9) for ALBA-9 from the client 1002, the control unit 200 specifies the SLBA=3 and the logical slot 1 from the ALBA=9. When a UECC error occurs in read of the data D(9) from the storage unit 2B of the logical slot 1, D(9) can be restored by exclusive ORing D(10), D(11), and P(9, 10).

Fourth Embodiment

Figure 73:
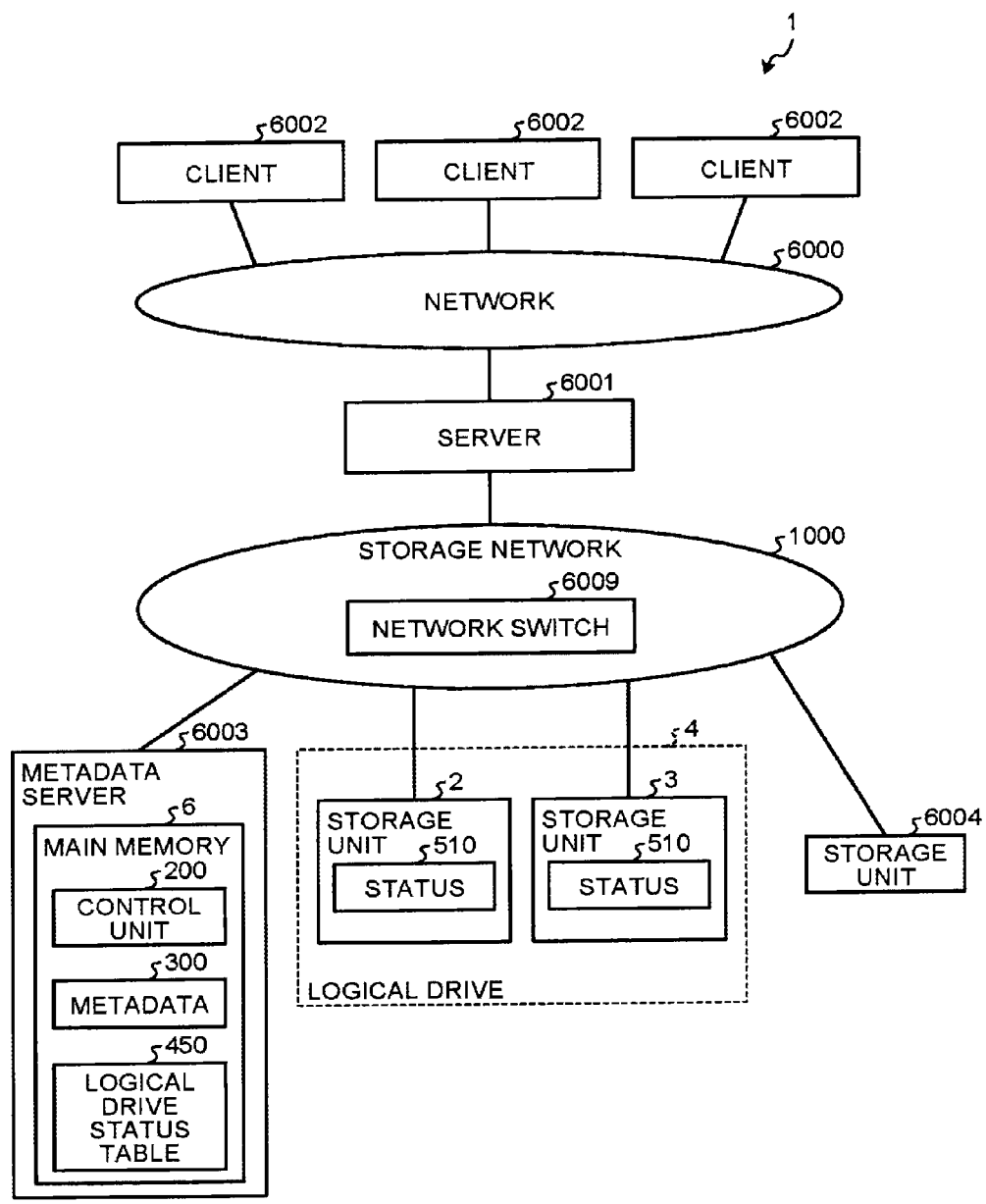
FIG. 73 is a block diagram of a functional configuration example of an information processing system in a fourth embodiment.
Figure 74:
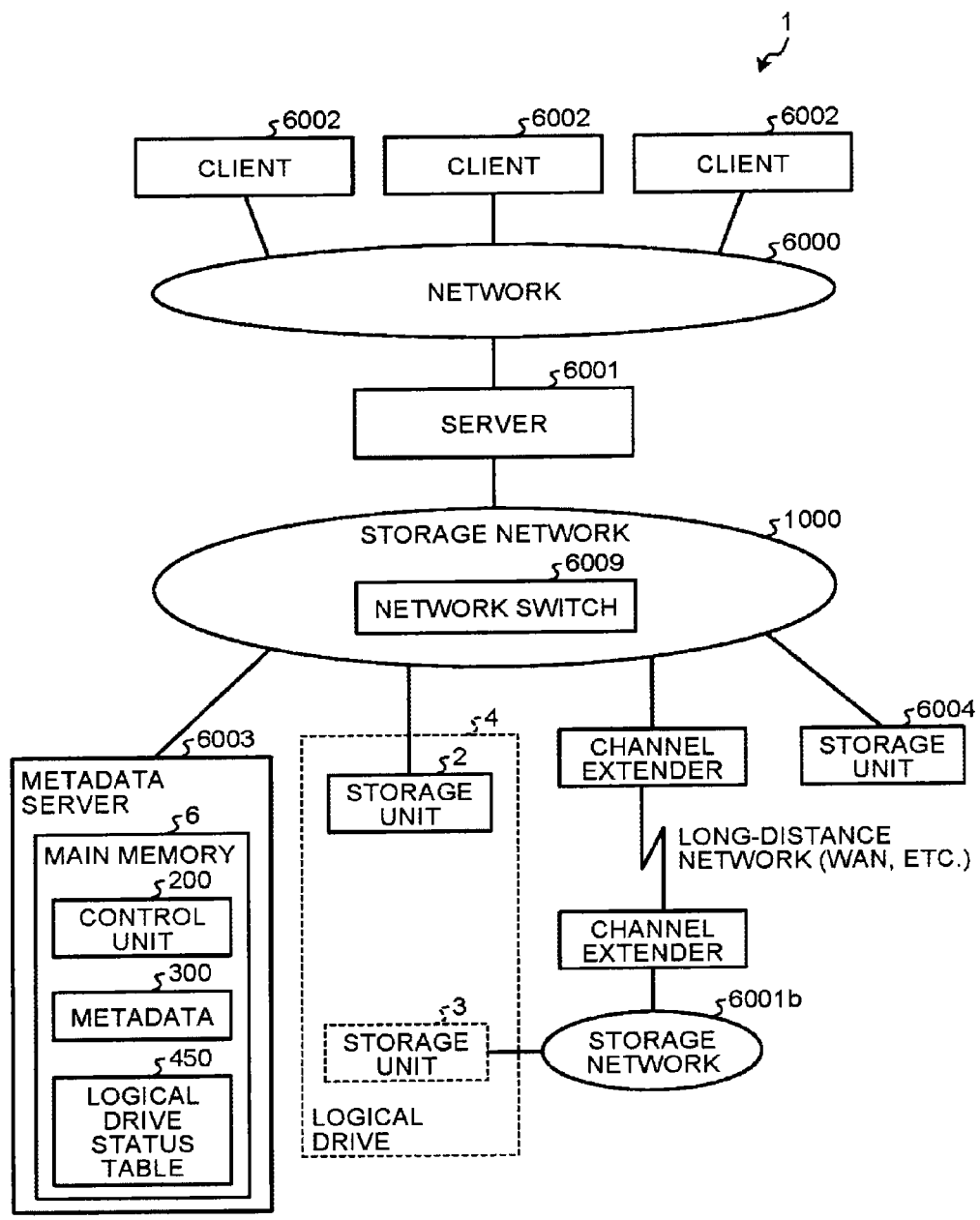
FIG. 74 is a block diagram of another functional configuration example of the information processing system in the fourth embodiment.

In a fourth embodiment, the present invention is applied to the information processing system 1 including a storage network. In this embodiment, the information processing system 1 is configured as shown in FIG. 73. The information processing system 1 can be configured as shown in FIG. 74. As shown in FIG. 73, the information processing system 1 in this embodiment includes the storage unit 2, the storage unit 3, one or a plurality of other storage units 6004, one or a plurality of metadata servers 6003, a server 6001, a storage network 1000 configured to connect the storage unit 2, the storage unit 3, the storage unit 6004, the metadata server 6003, and the server 6001 one another, one or a plurality of clients 6002, and a network 6000 configured to connect the server 6001 and the client 6002 each other. In the case of FIG. 74, the storage network 1000 is connected to a storage network 6001*b* via a channel extender and a long-distance network such as a WAN. The storage unit 3 is connected to the storage network 6001*b*.

The storage units 2 and 3 include the status management areas 510. The storage units 2 and 3 can include the data migration target management areas 2007 and 3007 (see FIG. 32) same as those in the first embodiment or can include the logical drive ID management areas 520 same as those in the second embodiment. As explained above, the status management areas 510 respectively indicate that the storage units corresponding thereto are in the following states:
0: initial storage state
1: normal state
2: low reliability state
3: data migration source state (protected state)
4: data migration destination state
5: discard target state The metadata server 6003 includes the main memory 6 configured to stores the OS 100, the control unit 200, the metadata 300, and the logical drive status table 450 same as those in the first embodiment and the CPU 5, which is an arithmetic unit configured to execute the OS 100 and the control unit 200. The metadata server 6003 plays functions equivalent to the OS 100 and the control unit 200 of the information processing device 111 in the first embodiment. The metadata 300 stored in the main memory 6 of the metadata server 6003 has, for example, a structure shown in FIG. 33. Metadata on the main memory 6 and a journal of the metadata are backed up in a nonvolatile storage unit in the metadata server 6003, a nonvolatile storage unit in the storage network 1000, the storage unit 2, the storage unit 3, and the like. The logical drive status table 450 has, for example, a structure shown in FIG. 40. The logical drive status table 450 indicates that the logical drive is in the normal state or the data migrating state. For example, upon receiving a file ID from the server 6001, the metadata server 6003 retrieves the file ID from the metadata area 300 and specifies a logical drive address, a storage unit identification name, which is a storage unit address, an LBA, a sector count, and the like. As the storage unit identification name, which is the storage unit address, for example, an IP (Internet Protocol) address, a MAC (Media Access Control) address, or a WWN (World Wide Name) can be used. The status tables 510 store statuses of the storage units 2 and 3 connected to the storage network 1000.

The logical drive status table 450 can be structured as shown in FIG. 41. A status table 650 shown in FIG. 75 can be stored in the main memory 6 of the metadata server 6003. The logical drive status table 450 does not have to be stored in the main memory 6. In the status table 650, a logical drive address, a storage unit identification name, a logical drive status, and a storage status are managed. The status table 650 is used instead of the logical drive status table 450 and the status management areas 510. Then, the status management areas 510 in the storage units 2 and 3 are unnecessary. In FIG. 75, a logical drive address B includes two storage units, storage unit identification names of which are b1 and b2. The storage units are in the data migrating state. The storage unit having the storage unit identification name b1 is a data migration source. The storage unit having the storage unit identification name b2 is a data migration destination.

The storage network 1000 is a network for a storage access. For example, a Fibre Channel or an Ethernet (registered trademark) is used. In particular, as the storage network 1000, for example, a SAN (Storage Area Network) or a NAS (Network Attached Storage) is used. As the SAN, for example, an FC-SAN (Fibre Channel Storage Area Network) or an IP-SAN (Internet Protocol Storage Area Network) is used. As an upper layer protocol of the SAN, for example, a SCSI (Small Computer System Interface) is used. In an example explained in this embodiment, an iSCSI is used as the upper layer protocol. The storage network 1000 includes the network switch 6009 and a hub (not shown in the figure).

The network 6000 is a network for allowing a client to access the server 6001 and use various services. For example, a Fibre Channel or an Ethernet (registered trademark) is used as the network 6000. For example, there are a WAN, a LAN, and the like as the network 6000. The network 6000 includes a network switch (not shown in the figure) and a hub (not shown in the figure).

The client 1002 is a computer connected to the network 6000 and configured to carry out desired processing. The client 1002 typically includes hardware resources such as a processor, a main memory, a communication interface, and a local input/output device. Further, the client 1002 includes software resources such as a device driver, an operating system (OS), and the application program 400 (not shown in the figure). Consequently, the client 1002 executes various programs under the control by the processor and realizes processing in cooperation with the hardware resources. For example, the client 1002 executes a business application program under the control by the processor to thereby I/O-access the server 6001 through the network 6000 and realize a desired business system.

The server 6001 is a computer connected to the storage network 1000 and the network 6000 and configured to carry out desired processing according to a request from the client 1002. The server 6001 typically includes hardware resources such as a processor, a main memory, a communication interface, and a local input/output device. Further, the server 6001 includes software resources such as a device driver, an operating system (OS), and an application program (not shown in the figure). Consequently, the server 6001 executes various programs under the control by the processor and realizes processing in cooperation with the hardware resources. For example, the server 6001 executes an application service program under the control by the processor in response to a request from the client 1002 to thereby I/O-access the storage unit 2, the storage unit 3, or the storage unit 6004 through the storage network 6000 and realize a desired application service program.

For example, upon receiving a file data read request and a file ID from the client 6002, the server 6001 transmits the file ID to the metadata server 6003, receives a storage unit address such as an IP address, a MAC address, or a WWN and an LBA of a storage unit in which a file from the metadata server 6003 is stored, transmits a packet designating the storage unit address to the storage network 1000 to transmit a read command to the storage unit, receives read data from the storage unit, and transmits the read data to the client 1002. For example, upon receiving a file data write request and a file ID from the client 1002, the server 6001 transmits the file ID to the metadata server 6003, receives a storage unit address and an LBA of a storage unit in which a file from the metadata server 6003 should be stored, receives write data from the client 6002, and transmits the data to the storage unit to write the data. The server 6001 can be a database server (DB server), which is a server on which a database management system (DBMS) is operating.

Processing for Determining Life End

When started, the control unit 200 monitors reliability information such as the statistical information 65 concerning the storage unit 2. For example, as shown in FIG. 24, the control unit 200 acquires the statistical information 65 from the storage unit 2 at every fixed time (e.g., every one minute) or in each fixed number of times of processing. As in the first embodiment, the control unit 200 determines, based on the acquired reliability information, whether the storage unit 2 has reached the life end. When the control unit 200 determines that the storage unit 2 has reached the life end, the control unit 200 executes life end processing explained below.

Life End Processing

When the connected storage unit 2 has reached the life end or is about to reach the life end and the life end processing is started, after changing the status 510 of the storage unit 2 to the storage status=2 (the low reliability state), the control unit 200 displays a message for urging connection of a new storage unit on the display 9 and the like of the metadata server 6003, the server 6001, and the client 6002. When the new storage unit 3 is connected, the control unit 200 rewrites the status 510 of the storage unit 3 of the status table 450 to the storage status=4 (the data migration destination state) and further rewrites the status 510 of the storage unit 2 to the storage status=3 (the protected state). The control unit 200 causes the OS 100 to recognize the storage unit 2 and the storage unit 3 as one logical drive 4. The control unit 200 rewrites a status of the logical drive 4 stored in the logical drive status table 450 or the status table 650 on the main memory 6 from the "normal state" to the "data migrating state". Read from the logical drive in the data migrating state Upon receiving a read request and a file ID from the client 6002, the server 6001 transmits the file ID to the metadata server 6003. The metadata server 6003 specifies the logical drive 4 corresponding to the file ID from the metadata 300, reads the logical drive status table 450 and the status table 650 from the main memory 6, and recognizes that a status of the specified logical drive 4 is the data migrating state. The metadata server 6003 acquires, from the metadata 300, a storage unit address and an LEA of the storage unit 2 or 3 in which a file designated by the file ID is stored and transmits the acquired storage unit address and the acquired LEA to the server 6001. The server 6001 transmits a packet designating the received storage unit address and the received LEA to the storage network 1000 to transmit a read command to the storage unit 2 or 3, receives read data from the storage unit, and transmits the read data to the client 1002.

Write in the Logical Drive

For example, upon receiving a file data write request and a file ID from the client 1002, the server 6001 transmits the file ID to the metadata server 6003. The metadata server 6003 determines a status of the logical drive 4 from the logical drive status table 450 or the status table 650 and recognizes the logical drive 4 as being in the normal state. Then, the metadata server 6003 reads the metadata 300 from the main memory 6 and allocates an LBA for data write referring to the metadata 300. The metadata server 6003 transmits the LEA and a storage unit address and an LBA of the storage unit 2 to the server 6001. The server 6001 transmits a packet designating the received storage unit address and the received LBA to the storage network 1000 to transmit a write command to the storage unit 2 and stores write data in the storage unit 2. The control unit 200 rewrites the metadata 300 and maps an LBA and a sector count of the write data to the storage unit 2 and a write file ID.

When the control unit 200 recognizes the logical drive 4 as being in the data migrating state, the control unit 200 reads the metadata 300 from the main memory 6 and allocates an LBA for data write referring to the metadata 300. The metadata server 6003 transmits the LBA and a storage unit address and an LEA of the storage unit 3 to the server 6001. The server 6001 transmits a write request packet designating the received storage unit address and the received LBA of the storage unit 3 to the storage network 1000 to transmit a write command to the storage unit 3 and stores write data in the storage unit 3. The control unit 200 updates the metadata 300, invalidates the mappings from the file ID to the storage unit 2, and maps the file ID to the storage unit 3, the written LBA and a sector count to realize data migration from the storage unit 2 to the storage unit 3 using write in the storage unit 3.

Background Backup

When the logical drive 4 is in a status of the data migrating state in the logical drive status table 450, the control unit 200 can perform background backup from the data migration source storage unit 2 to the data migration destination storage unit 3 when an access to the logical drive 4 by the client 6002 hardly takes place (during idling). The control unit 200 reads the metadata 300 from the main memory 6 and searches for a file ID mapped to the storage unit 2. If a file mapped to the storage unit 2 is present, the control unit 200 transmits a read command to the storage unit 2 via the server 6001 to perform read from an LBA of the file and receives read data. The control unit 200 transmits a write command and the read data to the LEA of the storage unit 3, performs write, rewrites the metadata 300 on the main memory 6, invalidates mappings from the file ID to the storage unit 2, and maps the file ID to the storage unit 3.

Server-free backup (server-less backup) can be adopted as a background backup operation of the control unit 200. In that case, for example, an extended copy command can be used. As the extended copy command, for example, a 83h EXTENDED COPY command described in SCSI Primary Commands-4 (SPC-4), INCITS T10/1731-D, Revision 36e (http://www.t10.org/) can be used. The control unit 200 transmits an extended copy command including a backup target LBA and an address of the storage unit 3 to the storage unit 2. Then, the storage unit 2 reads data from the LBA and transmits the read data to the storage unit 3. The storage unit 3 writes reception data in the LBA.

Data Migration Completion Time

In the logical drive status table 450, when a status of the logical drive 4 is the "data migrating state", the control unit 200 periodically reads the metadata 300 on the main memory 6 and periodically checks whether a migration target file ID mapped to the storage unit 2 is present. For example, the control unit 200 periodically checks whether a migration target file ID mapped to the storage unit 2 is present among file IDs of all files stored in the logical drive 4. When the migration target file ID is absent, the control unit 200 rewrites the status 510 of the data migration destination storage unit 3 to the storage status=1 (the normal state) and rewrites the status 510 of the data migration source storage unit 2 to the storage status=5 (the discard target state). The control unit 200 separates the storage unit 2 from the logical drive 4, recognizes the storage unit 3 as the logical drive 4, and rewrites a status of the logical drive 4 in the logical drive status table 450 or the status table 650 from the "data migrating state" to the "normal state".

As explained above, in the data migrating state, in data write in the logical drive 4, a write command is not transmitted to the data migration source storage unit 2 and is transmitted to the data migration destination storage unit 3. Data read from the logical drive 4 is executed from the storage unit 2 or 3. In the logical drive 4, every time a write request is received from the client 6002, valid data stored in the storage unit 2 is gradually migrated to the storage unit 3. A new data write operation also serves as a data migrating operation.

Fifth Embodiment

Figure 76:
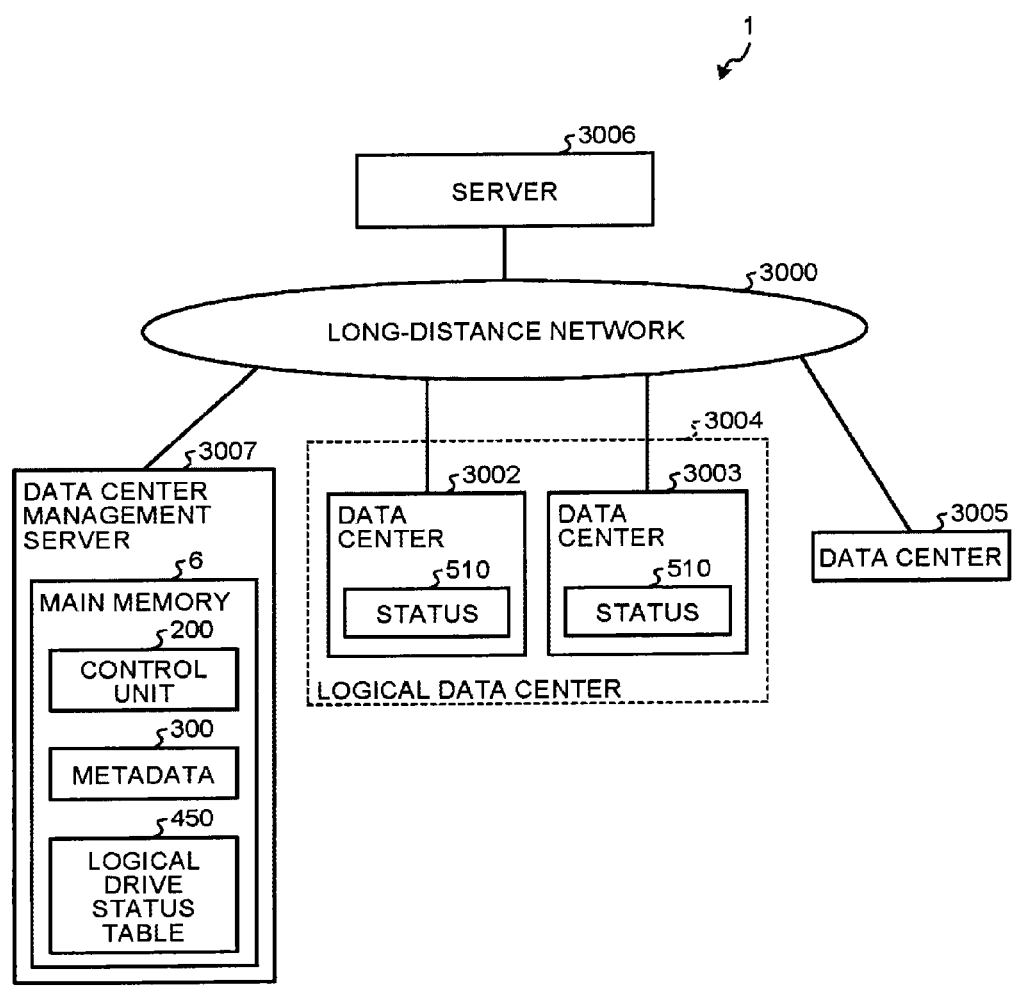
FIG. 76 is a block diagram of a functional configuration example of an information processing system in a fifth embodiment.

In a fifth embodiment, the present invention is applied to the information processing system 1 including a plurality of data centers (DCs) and a long-distance network configured to connect the data centers (DCs). In this embodiment, the information processing system 1 is configured as shown in FIG. 76. In this embodiment, the information processing system 1 includes a data migration source data center 3002 (storage unit 3002), a data migration destination data center 3003 (storage unit 3003), a data center 3005, which is another data center, a server 3006, a data center management server 3007, and a long-distance network 3000 configured to connect the devices. In this embodiment, the data center management server 3007 recognizes the data center 3002 as a logical data center 3004 functioning as a logical unit. When the data center 3002 is deteriorated in reliability, the data center management server 3007 recognizes the data center 3002 and the data center 3003 as the logical data center 3004.

The data centers 3002 and 3003 include the status management areas 510. The storage units 3002 and 3003 can include the data migration target management areas 2007 and 3007 corresponding to the data migration target management areas 2007 and 3007 (see FIG. 32) in the first embodiment. The storage units 3002 and 3003 can include the logical data center ID management areas 520 corresponding to the logical drive ID management areas 520 in the second embodiment. As explained above, the status management areas 510 indicate that storage units corresponding thereto are in the following states:

0: initial storage state
1: normal state
2: low reliability state
3: data migration source state (protected state)
4: data migration destination state
5: discard target state The data center management server 3007 includes the main memory 6 that stores the OS 100, the control unit 200, the metadata 300, and a logical data center status table 450 same as those in the first embodiment and the CPU 5, which is an arithmetic unit configured to execute the OS 100 and the control unit 200. The data center management server 3007 plays functions equivalent to the OS 100 and the control unit 200 of the information processing device 111 in the first embodiment. The metadata 300 stored in the main memory 6 of the data center management server 3007 has, for example, a structure shown in FIG. 33. Metadata on the main memory 6 and a journal of the metadata are backed up in a nonvolatile storage unit in the data center management server 3007 and the data centers 3002, 3003, and 3005 in the long-distance network 3000. The logical data center status table 450 has, for example, a structure shown in FIG. 41. The logical data center status table 450 indicates that the logical data center 3004 is in the normal state or the data migrating state. For example, upon receiving a file ID from the server 3006, the data center management server 3007 retrieves the file ID from the metadata area 300 and specifies a logical data center ID, a data center ID, an LBA, a sector count, and the like corresponding to the file ID. The status tables 510 store statuses of the data centers 3002 and 3003.

Besides configuring the logical data center status table 450 in the structure shown in FIG. 41, the status table 650 shown in FIG. 75 can be adopted as the data center management server 3007. In the status table 650, a logical data center ID, a data center ID, a logical data center status, and a data center status are managed. In this case, the status management areas 510 in the storage units 2 and 3 are unnecessary. The control unit 200 can manage migration of data from the data center 3002 to the data center 3003 using, instead of the metadata area 300, a data migration log storage area as in the second embodiment.

Processing for Determining Life End

When started, the control unit 200 monitors the reliability information concerning the data center 3002. For example, as shown in FIG. 24, the control unit 200 acquires the statistical information 65 from the data center 3002 at every fixed time (e.g., every one minute) or in each fixed number of times of processing. As in the first embodiment, the control unit 200 determines, based on the acquired statistical information 65, whether the data center 3002 has reached the life end. When the control unit 200 determines that the data center 3002 has reached the life end, the control unit 200 executes life end processing explained below.

Life End Processing

When the connected data center 3002 has reached the life end or is about to reach the life end and the life end processing is started, after changing the status 510 of the data center 3002 to the data center status=2 (the low reliability state), the control unit 200 displays a message for urging connection of a new data center on a display of the data center management server 3007 and the like. When the new data center 3003 is connected, the control unit 200 rewrites the status 510 of the data center 3003 of the status table 450 to the data center status=4 (the data migration destination state) and further rewrites the status 510 of the data center 3002 to the data center status=3 (the protected state). The control unit 200 causes the OS 100 to recognize the data center 3002 and the data center 3003 as one logical data center 3004. The control unit 200 rewrites a status of the logical data center status table 450 on the main memory 6 from the "normal state" to the "data migrating state".

(Read from the Logical Data Center in the Data Migrating State)

Upon receiving a read request and a file ID from the server 3006, the data center management server 3007 specifies the logical data center 3004 corresponding to the file ID from the metadata 300, reads the logical data center status table 450 from the main memory 6, and recognizes that a status of the specified logical data center 3004 is the data migrating state. The data center management server 3007 acquires, from the metadata 300, a data center address and an LBA of the data center 3002 or 3003 in which a file designated by the file ID is stored and transmits the acquired data center address and the acquired LBA to the server 3006. The server 3001 transmits a packet designating the received data center address and the received LBA to the network 3000 to transmit a read command to the data center 3002 or 3003, and receives read data from the data center 3002 or 3003.

Write in the Logical Data Center

Upon receiving a write request and a file ID from the server 3006, the data center management server 3007 determines a status of the logical data center 3004 from the logical data center status table 450 and recognizes the logical data center 3004 as being in the normal state. Then, the data center management server 3007 reads the metadata 300 from the main memory 6 and allocates an LBA for data write referring to the metadata 300. The data center management server 3007 transmits the LBA and a data center ID and an LBA of the data center 3002 to the server 3006. The server 3006 transmits a packet designating the received data center ID and the received LBA to the network 3000 to transmit a write command to the data center 3002 and stores write data in the data center 3002.

When the data center management server 3007 recognizes the logical data center 3004 as being in the data migrating state, the data center management server 3007 reads the metadata 300 from the main memory 6 and allocates an LBA for data write referring to the metadata 300. The data center management server 3007 transmits the LBA and a data center ID and an LBA of the data center 3003 to the server 3006. The server 3006 transmits a packet designating the received data center ID and the received LBA of the data center 3003 to the network 3000 to transmit a write command to the data center 3003 and stores write data in the data center 3003.

Background Backup

When the logical data center 3004 is in a status of the data migrating state in the logical drive status table 450, the control unit 200 can perform background backup from the data migration source data center 3002 to the data migration destination data center 3003 when an access to the logical data center 3004 by the server 3006 hardly takes place (during idling). The control unit 200 reads the metadata 300 from the main memory 6 and searches for a file ID mapped to the data center 3002. If a file mapped to the data center 3002 is present, the control unit 200 transmits a read command to the data center 3002 via the server 3006 to perform read from an LBA of the file and receives read data from the data center 3002. The control unit 200 transmits a write command and the read data to the LBA of the data center 3003, performs write, rewrites the metadata 300 on the main memory 6, and maps the file ID to the data center 3003.

Server-free backup can be adopted as a background backup operation of the control unit 200. In that case, for example, an extended copy command can be used. As the extended copy command, for example, a 83h EXTENDED COPY command described in SCSI Primary Commands-4 (SPC-4), INCITE T10/1731-D, Revision 36e (http://www.t10.org/) can be used. The control unit 200 transmits an extended copy command including a backup target LBA and an ID of the data center 3003 to the data center 3002. Then, the data center 3002 reads data from the LBA and transmits the read data to the data center 3003. The data center 3003 writes reception data in the LBA.

Data Migration Completion Time

In the logical drive status table 450, when a status of the logical data center 3004 is the "data migrating state", the control unit 200 periodically reads the metadata 300 on the main memory 6 and periodically checks whether a migration target file ID mapped to the data center 3002 is present. For example, the control unit 200 periodically checks whether a migration target file ID mapped to the data center 3002 is present among file IDs of all files stored in the logical data center 3004. When the migration target file ID is absent, the control unit 200 rewrites the status 510 of the data migration destination data center 3003 to the data center status=1 (the normal state) and rewrites the status 510 of the data migration source data center 3002 to the data center status=5 (the discard target state). The control unit 200 separates the data center 3002 from the logical data center 3004, recognizes the data center 3003 as the logical data center 3004, and rewrites a status of the logical data center 3004 from the "data migrating state" to the "normal state" in the logical drive status table 450.

As explained above, during the data migration, in data write in the logical data center 3004, a write command is not transmitted to the data migration source data center 3002 and is transmitted to the data migration destination data center 3003. Data read from the logical data center 3004 is executed from the data center 3002 or 3003. In the logical data center 3004, every time a write request is received from the server 3006, valid data stored in the data center 3002 is gradually migrated to the data center 3003. A new data write operation also serves as a data migrating operation.

Sixth Embodiment

Relay Unit

In the first and second embodiments, when the control unit 200 determines that the storage unit 2 has reached the life end, is about to reach the life end, or is about to fail or determines that the storage unit 2 is deteriorated in reliability, the control unit 200 processes a write request to prevent write in the storage unit 2. Consequently, it is possible to suppress further deterioration in the reliability of the storage unit 2 and prevent a loss of new write data. To safely limit data write in the storage unit 2, it is desirable to prevent the information processing device, the client, and the server from spontaneously performing write in the storage unit. In this embodiment, the information processing system includes a relay unit 5000. The control unit 200 in the relay unit 5000 monitors reliability information such as statistical information of the storage unit 2. When the relay unit 5000 determines that the storage unit 2 has reached the life end, is about to reach the life end, or is about to fail or the storage unit 2 is deteriorated in the reliability, the control unit 200 notifies the information processing device 111, the client, and the server of information indicating that the storage unit 2 is a read only device to thereby prevent the information processing device 111, the client, and the server from spontaneously perform write in the storage unit 2. This embodiment can be carried out independently. On the other hand, when this embodiment is combined with the first embodiment, the second embodiment, or the like, it is possible to more robustly suppress write in the storage unit 2 deteriorated in the reliability. For example, when this embodiment is combined with the first embodiment, the second embodiment, or the like, the relay unit 5000 transmits storage unit information indicating that the storage unit 2 is a storage unit that supports only read of read and write. The CPU 5 and the control unit 200 stored in the main memory 6 recognize the storage unit 2 as a read only storage unit and recognize the storage unit 2 as being in the protected state (the data migration source state).

Figure 77:
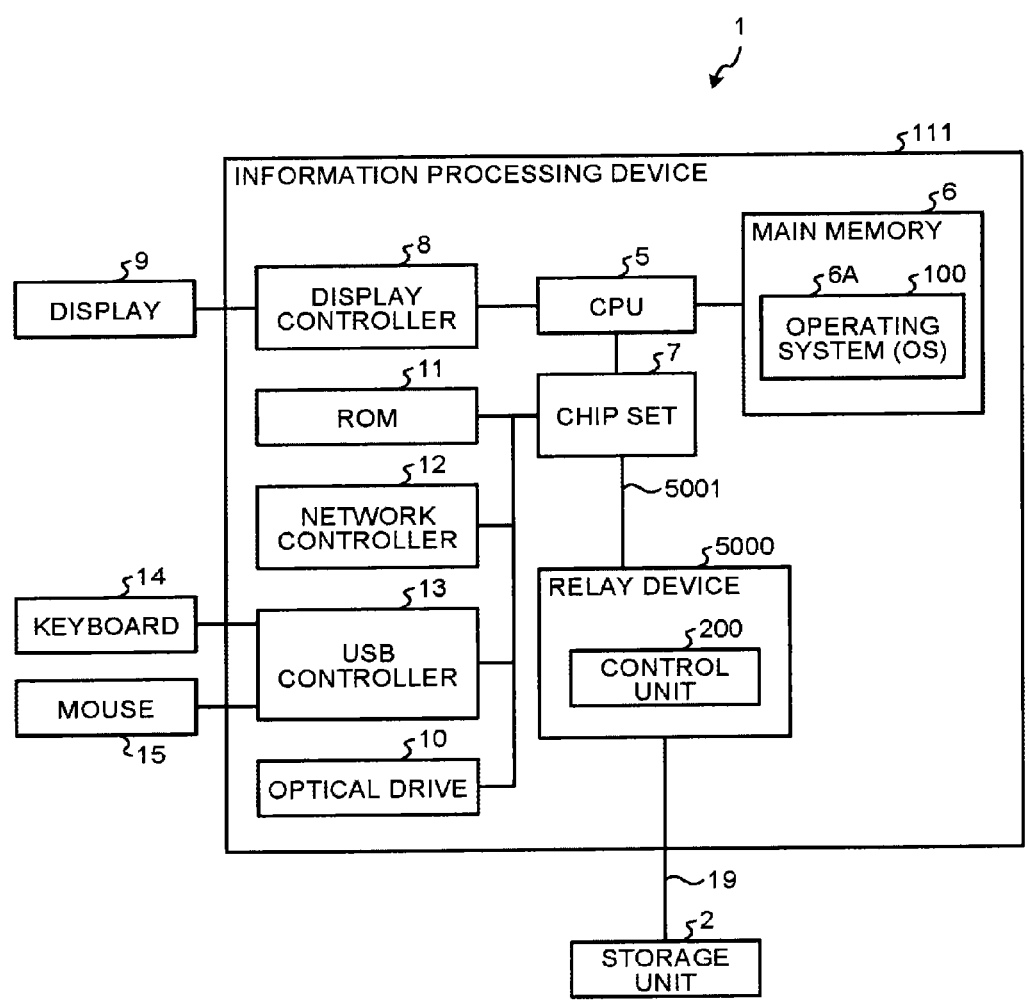
FIG. 77 is a block diagram of a functional configuration example of an information processing system in a sixth embodiment.

FIG. 77 is an example in which the relay unit 5000 is mounted on the information processing system 1 such as a desktop personal computer or a notebook personal computer. The relay unit 5000 can be mounted inside the information processing device 111 or can be mounted outside the information processing device 111. The relay unit 5000 is connected to the storage unit 2 via the interface 19 and connected to the CPU 5 via an interface 5001 and the chip set 7. The relay unit 5000 can be directly connected to the CPU 5 not via the chip set 7. The relay unit 5000 can be embedded in the chip set 7.

Figure 78:
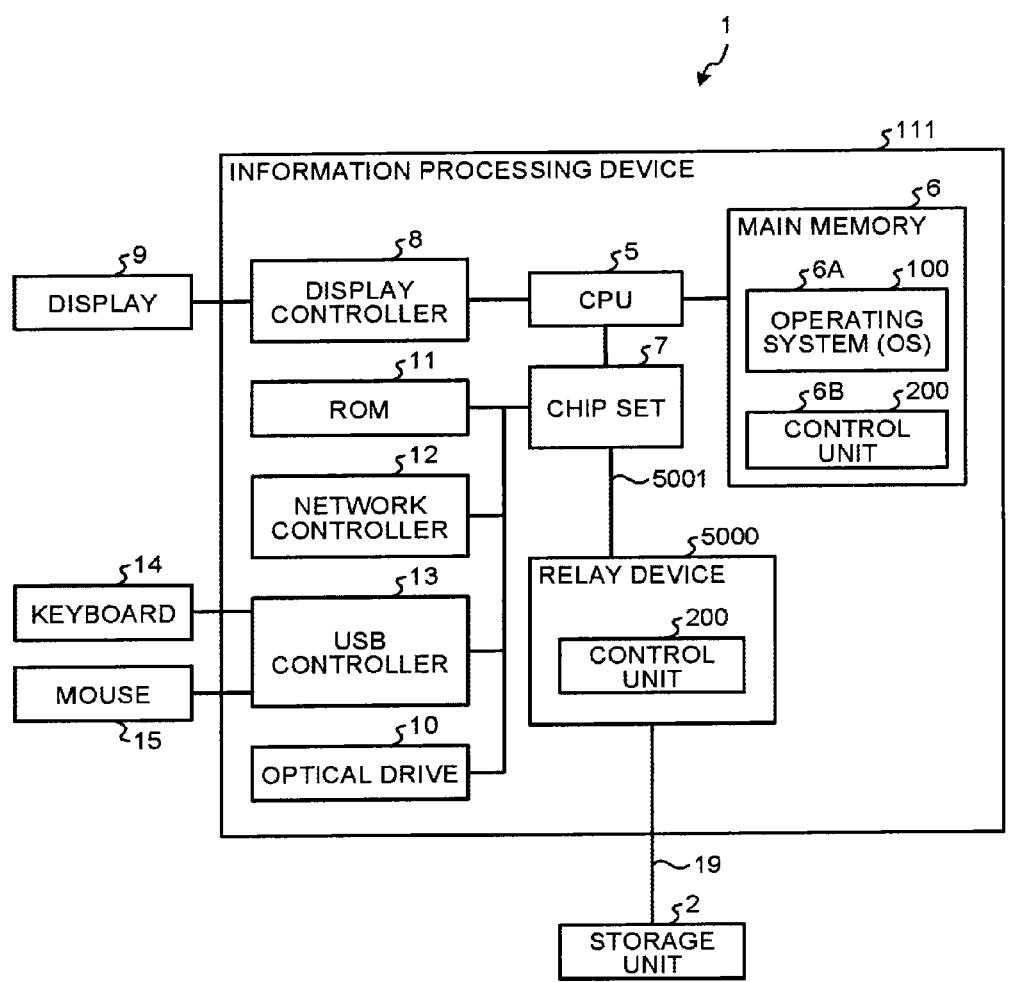
FIG. 78 is a block diagram of another functional configuration example of the information processing system in the sixth embodiment.

The relay unit 5000 includes the control unit 200. As shown in FIG. 77, the entire control unit 200 is included in the relay unit 5000. As shown in FIG. 78, a part of the control unit 200 can be included in the relay unit 5000 and a part of the control unit 200 can be included in the main memory 6. A part of the control unit 200 can be included in the relay unit 5000 and a part of the control unit 200 can be included in another memory section in the information processing device 111 such as the ROM 11. The control unit 200 can be implemented in a form of a firmware or software or can be implemented in a form of hardware.

As the interface 19 and the interface 5001, for example, a SATA (Serial Advanced Technology Attachment), a PCI Express (Peripheral Component Interconnect Express, PCIe), a USB (Universal Serial Bus), a SAS (Serial Attached SCSI), a Thunderbolt (registered trademark), an Ethernet (registered trademark), and a Fibre Channel can be used. The interface 19 and the interface 5001 can be interfaces of the same standard or can be interfaces of different standards. In this embodiment, the interface 19 and the interface 5000 are SATA interfaces.

Figure 79:
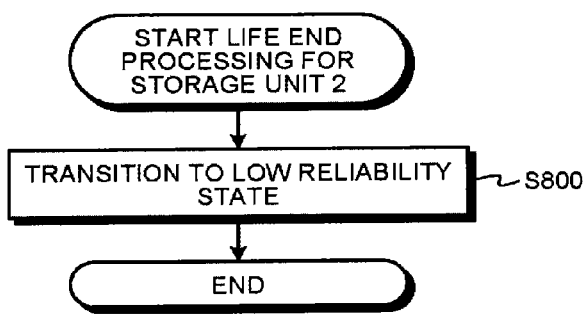
FIG. 79 is a flowchart for explaining transition operation of a control unit from a normal state to a low reliability state.

In the same manner as shown in FIGS. 24 and 29 in the first embodiment, the control unit 200 determines whether the storage unit 2 has reached the life end, is about to reach the life end, or is about to fail. When the control unit 200 determines that the storage unit 2 has reached the life end, is about to reach the life end, or is about to fail, as shown in FIG. 79, the control unit 200 transitions from the normal state to the low reliability state to perform the life end processing (step S800). The normal state and the low reliability state are modes of the control unit 200. When the storage unit 2 is normal, the control unit 200 operates in the normal state. When the control unit 200 determines whether the storage unit 2 has reached the life end, is about to reach the life end, or is about to fail or the storage unit 2 is deteriorated in the reliability, the control unit 200 operates in the low reliability state. As in the first embodiment, the life end determination is carried out at every fixed time, in each fixed number of times of processing, or every transmission and reception of fixed data as shown in FIG. 24 or when a command response received from the storage unit 2 is an error response as shown in FIGS. 29 and 30.

The control unit 200 transmits a command and data received from the CPU 5 via the interface 5001 to the storage unit 2 through the interface 19. The control unit 200 transmits a response and data received from the storage unit 2 through the interface 19 to the CPU 5 through the interface 5001. When protocols of the interface 5001 and the interface 19 are different, after performing protocol transformation, the control unit 200 transmits the command, the response, and the data after the transformation to the CPU 5 and the storage unit 2. When transmitting storage unit information of the storage unit 2 to the CPU 5, the control unit 200 switches the storage unit information according to whether the control unit 200 is in the normal state or the low reliability state. That is, in the normal state, the control unit 200 transmits storage unit information indicating that the storage unit 2 is a readable and writable storage unit to the CPU 5. In the low reliability state, the control unit 200 transmits storage unit information indicating that the storage unit 2 is a readable only storage unit to the CPU 5.

Upon receiving a storage unit information request for the storage unit 2 from the CPU 5, in the normal state, the control unit 200 transmits, as a response to the storage unit information request, storage unit information indicating that the storage unit 2 is a readable and writable storage unit to the CPU 5. In the low reliability state, the control unit 200 transmits storage unit information indicating that the storage unit 2 is a readable only storage unit to the CPU 5. As an example of the storage unit information request, an ECh IDENTIFY DEVICE command described in ACS-3, an A3h REPORT IDENTIFYING INFORMATION command described in SCSI Primary Commands-4 (SPC-4), a 46h GET CONFIGURATION command described in INFORMATION TECHNOLOGY Multi-Media Commands-6 (MMC-6) (http://www.t10.org/), and a 06h Identify command described in NVM Express Revision 1.1 are used.

Figure 80:
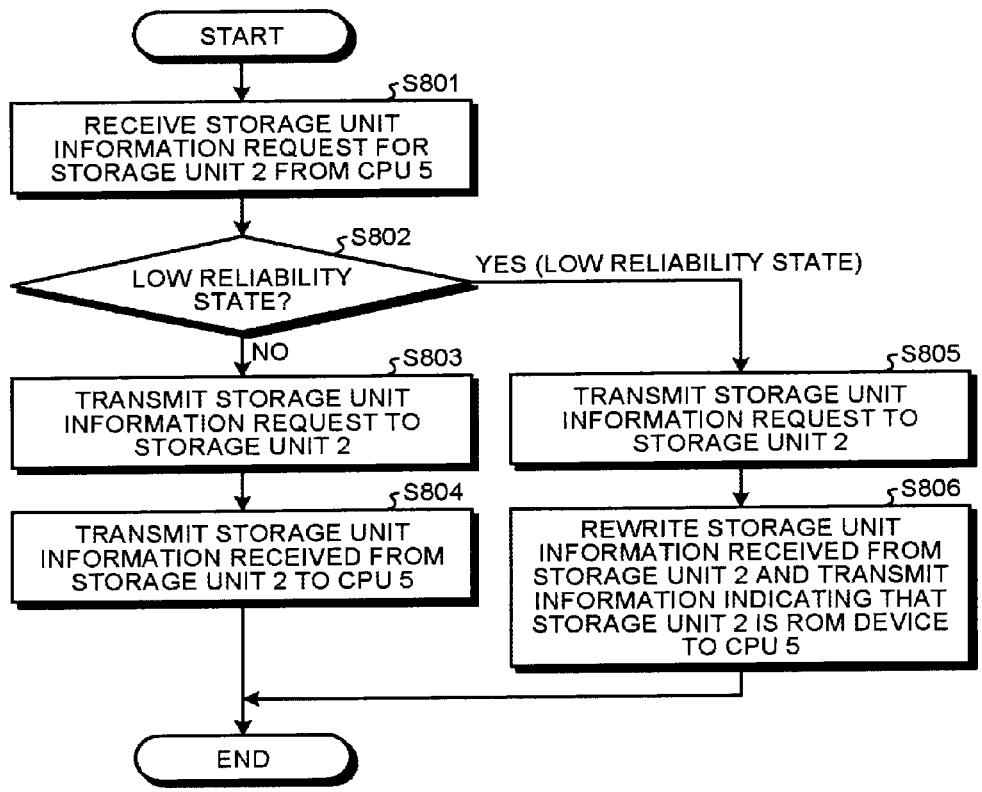
FIG. 80 is a flowchart for explaining an example of a processing procedure performed when the control unit receives a storage unit information request for a storage unit from a CPU.

FIG. 80 shows an example of a processing procedure performed when the control unit 200 receives a storage unit information request for the storage unit 2 from the CPU 5. When the control unit 200 receives a storage unit information request for the storage unit 2 from the CPU 5 (step S801), the control unit 200 determines, based on whether the control unit 200 is in the normal state or the low reliability state, whether the storage unit 2 is in the low reliability state (step S802). When the storage unit 2 is in the normal state, the control unit 200 transmits the storage unit information request to the storage unit 2 (step S803), receives storage unit information from the storage unit 2, and transmits the received storage unit information to the CPU 5 (step S804). When the storage unit 2 is in the low reliability state, the control unit 200 transmits the storage unit information request to the storage unit 2 (step S805), receives storage unit information from the storage unit 2, rewrites reception data to change the storage unit information to indicate as if the storage unit 2 is a ROM device, and transmits the changed storage unit information to the CPU 5 (step S806). The control unit 200 can spontaneously carry out the processing at S802 to S806 without receiving the storage unit information request from the CPU 5 at step S801. The control unit 200 can transmit the storage unit information request to the storage unit 2 between step S801 and step S802 and does not have to transmit the storage unit information request to the storage unit 2 at steps S803 and S805.

Figure 81:
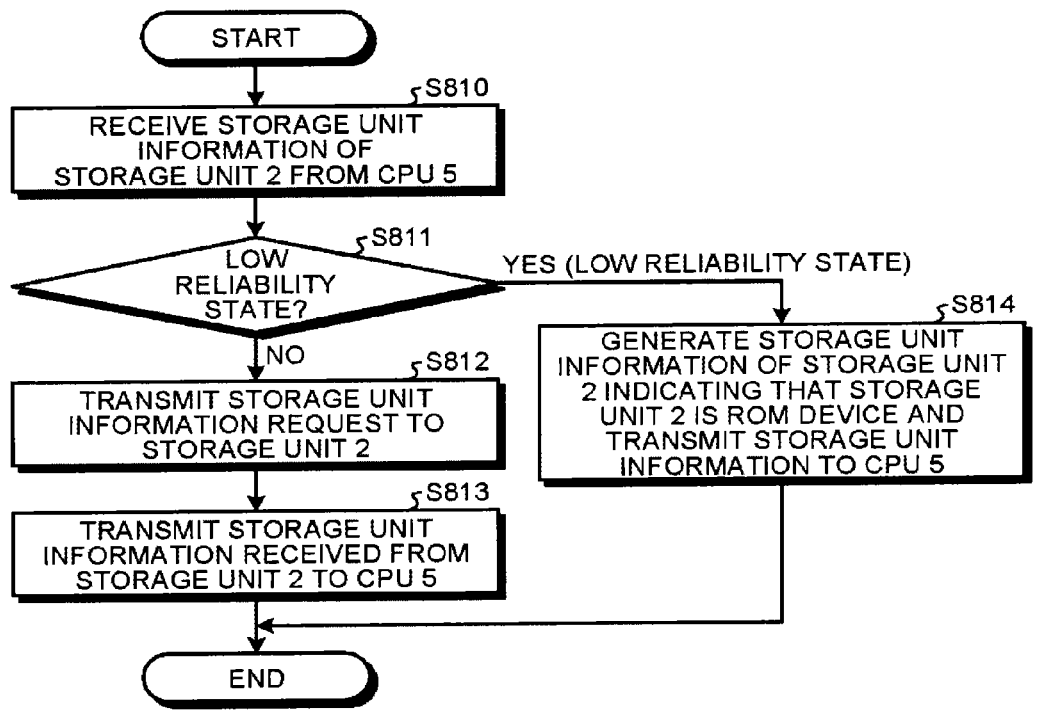
FIG. 81 is a flowchart for explaining an example of another processing procedure performed when the control unit receives the storage unit information request for the storage unit from the CPU.

As shown in FIG. 81, in the low reliability state, the control unit 200 can generate storage unit information indicating as if the storage unit 2 is a ROM device and transmits the storage unit information to the CPU 5 without transmitting a storage unit information request to the storage unit 2. That is, upon receiving a storage unit information request for the storage unit 2 from the CPU 5 (step S810), the control unit 200 determines, based on whether the control unit 200 is in the normal state or the low reliability state, whether the storage unit 2 is in the low reliability state (step S811). When the control unit 200 is in the normal state, the control unit 200 transmits the storage unit information request to the storage unit 2 (step S812) and transmits received storage unit information to the CPU 5 (step S813). When the control unit 200 is in the low reliability state, the control unit 200 generates storage unit information for indicating to the CPU 5 as if the storage unit 2 is a ROM device and transmits the generated storage unit information to the CPU 5 (step S814) without transmitting the storage unit information request to the storage unit 2.

When operating in the normal state, as the storage unit information indicating that the storage unit 2 is a readable and writable storage unit, it is desirable that, for example, the control unit 200 explicitly notifies that CPU 5 that the storage unit 2 is an ATA device. For example, it is possible to notify the CPU 5 that the storage unit 2 is an ATA device by substituting 01h in LBA(7:0), substituting 00h in LBA (15:8), and substituting 00h in LBA(23:16) in Device Signature described in ATA/ATAPI Command Set-3 (ACS-3) and outputting the LEA (7:0), the LEA (15:8), and the LBA (23:16) to the CPU 5.

When operating in the low reliability state, as the storage unit information indicating that the storage unit 2 is a readable only storage unit, for example, the control unit 200 explicitly notifies the CPU 5 that the storage unit 2 is an ATAPI device. For example, it is possible to notify the CPU 5 that the storage unit 2 is an ATAPI device by substituting 01h in LBA(7:0), substituting 14h in LBA(15:8), and substituting EBh in LBA(23:16) in Device Signature described in ACS-3 and outputting the LBA (7:0), the LBA(15:8), and the LBA (23)16) to the CPU 5. Further, when operating in the low reliability state, for example, upon receiving a 46h GET CONFIGURATION command described in INCITS Multi-Media Commands-6 (MMC-6) from the CPU 5 as storage unit information indicating that the storage unit 2 is a readable only storage unit, the control unit 200 informs the CPU 5 that all write functions are not supported in Features such as Random Writable (Feature Number=0020h), Incremental Streaming Writable (Feature Number=0021h), and Write Once (Feature Number=0025h). Consequently, even when the OS 100 is Windows (registered trademark) or the like, it is possible to cause the OS 100 to recognize the storage unit 2 as a readable device. For the OS 100 and the application program 400 in a layer higher than the OS 100, the storage unit 2 is seen as if the storage unit 2 is a read only device. Therefore, it is possible to prevent the OS 100 and the application program 400 from transmitting a write command to the storage unit 2 by mistake.

Alternatively, when operating in the low reliability state, as storage unit information indicating that the storage unit 2 is a readable only storage unit, for example, the control unit 200 can explicitly notify the CPU 5 that the storage unit 2 is an ATA device. Upon receiving an ECh IDENTIFY DEVICE command described in ACS-3 from the CPU 5, the control unit 200 can notify the CPU 5 of information indicating that all write functions are not supported.

Figure 82:
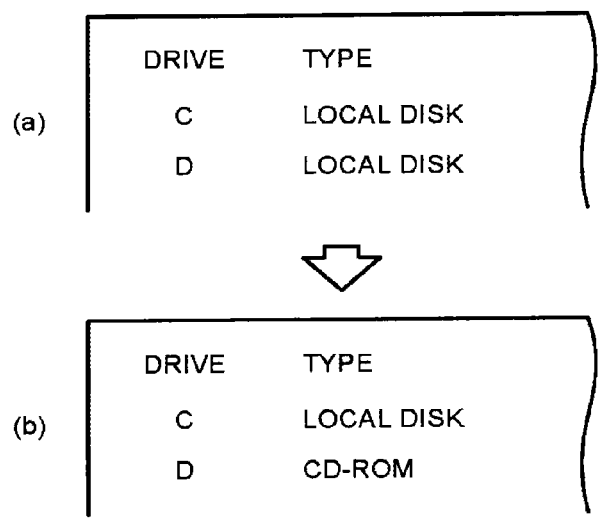
FIG. 82 is a diagram of a drive display screen example in an information processing device.
Figure 83:
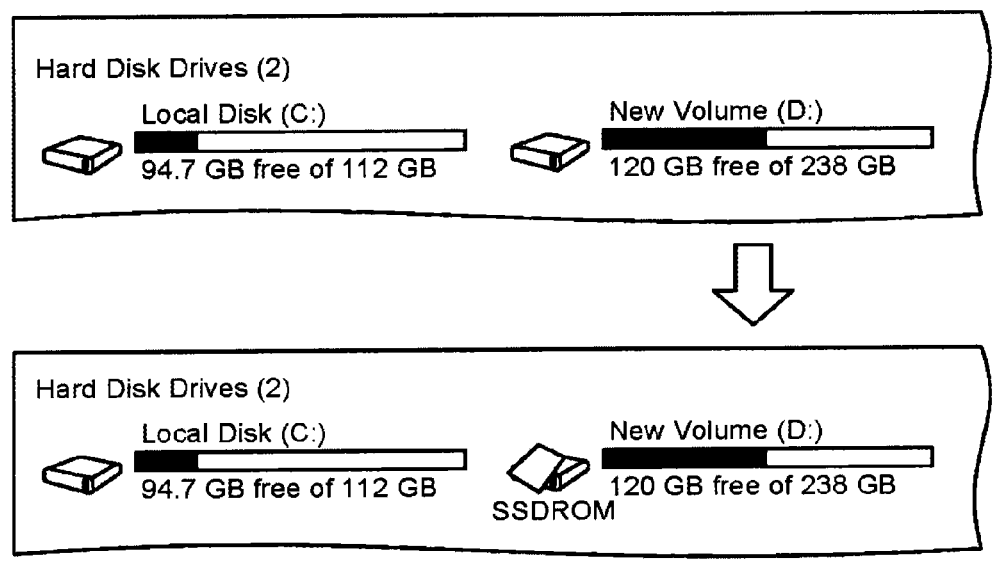
FIG. 83 is a diagram of another drive display screen example in the information processing device.
Figure 84:
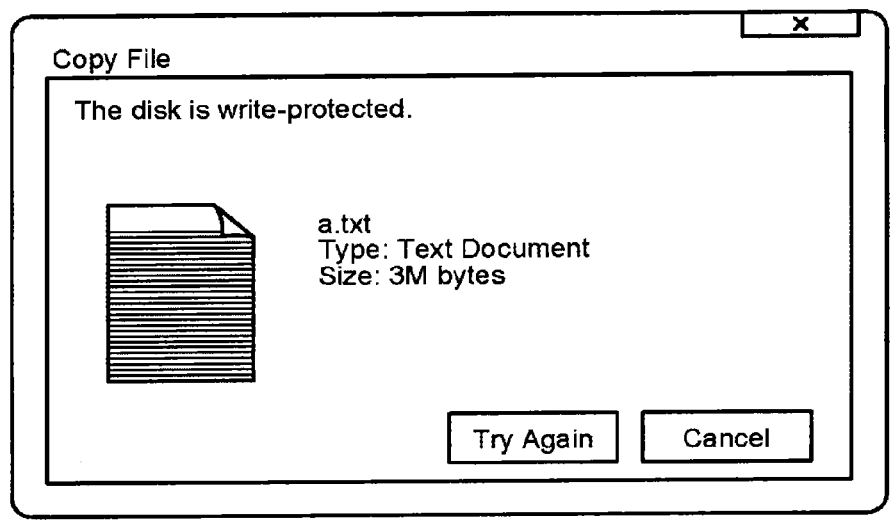
FIG. 84 is a diagram of another display screen example in the information processing device.

A method of notifying whether the storage unit 2 is a readable only storage unit can take various forms besides the forms explained above. When the CPU 5 receives information indicating that the storage unit 2 is a readable only storage unit, the OS 100 applies a driver for a read only storage unit, for example, an ATAPI read only storage unit as driver software applied to the storage unit 2. On the OS 100, the storage unit 2 is recognized as a read only storage unit such as a CD-ROM, a DVD-ROM, or a BD-ROM. For example, as shown in FIGS. 82 and 83, it is desirable that the OS 100 explicitly notifies, with icon graphics or the like, through the display device 9, an administrator, an operator, and a user of the information processing device 111 that the storage unit 2 is a read only device such as a CD-ROM, a DVD-ROM, or a BD-ROM. When the user attempts to write a file or the like in the storage unit 2, as shown in FIG. 84, it is more desirable that the OS 100 notifies through the display device 9 that the storage unit 2 is write-protected.

Even when the CPU 5 and the OS 100 recognize the storage unit 2 as a readable only storage unit, for example, when the OS 100 applies the driver for a read only storage unit to the storage unit 2, the CPU 5 can transmit a read command to the storage unit 2. When the CPU 5 transmits the read command to the storage unit 2, the control unit 200 transmits the read command to the storage unit 2, the control unit 200 receives read data from the storage unit 2, and the control unit 200 transmits the read data to the CPU 5. In this way, the CPU 5 can read data from the storage unit 2 irrespective of whether the control unit 200 is in the normal state or the low reliability state.

In terms of preventing a user data loss due to data breakage or a failure of the storage unit 2, it is desirable that the control unit 200 in the low reliability state is configured not to transmit a write command to the storage unit 2 at all. However, for example, when it is necessary to write a part of data such as system information of the OS 100 in the storage unit 2, as an exception, the control unit 200 can permit write of the data in the storage unit 2. However, it is desirable that a data amount of the write data is sufficiently small compared with the capacity of the storage unit 2. To prevent the user from transmitting a write command by mistake and writing data in the storage unit 2, it is more desirable that, even if a normal write command to the storage unit 2 is received from the CPU 5, the control unit 200 does not transmit the write command to the storage unit 2. As an exception, only when it is necessary to write data in the storage unit 2, for example, only when a write command by a special command is received from the CPU 5, the control unit 200 transmits the write command to storage unit 2. For example, when a write command such as 35h WRITE DMA EXT or 61h WRITE FPDMA QUEUED described in ACS-3 is used as the normal write command to the storage unit 2 of the CPU 5, upon receiving a 35h WRITE DMA EXT command or a 61h WRITE FPDMA QUEUED command from the CPU 5 as the normal write command, the control unit 200 in the normal state transfers the command to the storage unit 2. Upon receiving the 35h WRITE DMA EXT command or the 61h WRITE FPDMA QUEUED command from the CPU 5 as the normal write command, the control unit 200 in the low reliability state does not transmit the write command to the storage unit 2. On the other hand, upon receiving a 30h Write Sectors command, a 3Fh Write Log Ext command, or SCT Command Transport, described in INCITS ACS-3, other vendor unique commands, or the like from the CPU 5 as a special write command, the control unit 200 in the low reliability state transfers the command to the storage unit 2.

Figure 85:
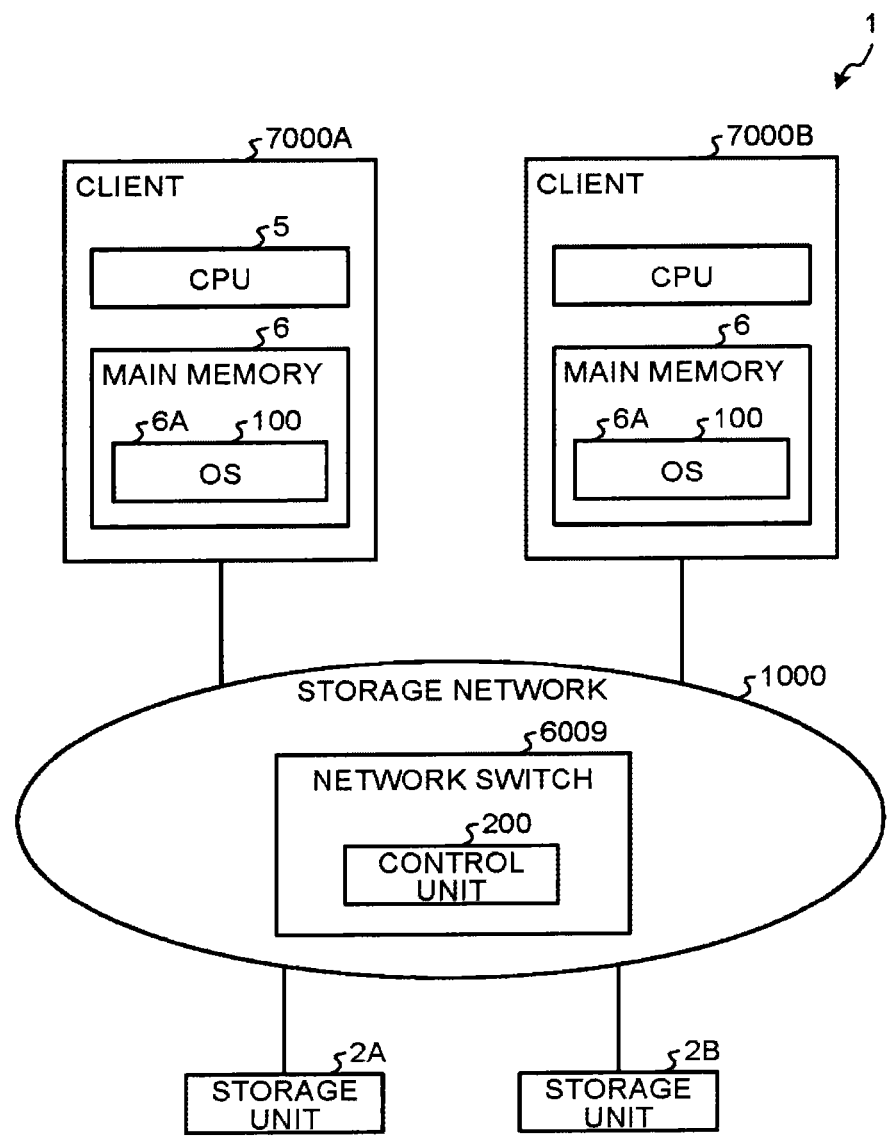
FIG. 85 is a block diagram of another functional configuration example of the information processing system in the sixth embodiment.

In the above explanation, the information processing system 1 is the computer system such as a desktop personal computer or a notebook personal computer. However, the information processing system 1 can be, for example, an information processing system including a storage network shown in FIG. 85. In FIG. 85, the storage network 1000 is used as the interface 19 and the interface 5001 and the network switch 6009 is used as the relay unit 5000.

For example, a SAN (Storage Area Network) or a NAS (Network Attached Storage) is used as the storage network 1000. As the SAN, for example, an FC-SAN (Fibre Channel Storage Area Network) or an IP-SAN (Internet Protocol Storage Area Network) is used. As an upper layer protocol of the SAN, for example, a SCSI (Small Computer System Interface) is used. For example, the IP-SAN can be adopted as the storage network 1000. An iSCSI (Internet Small Computer System Interface) can be adopted as an upper layer protocol of the IP-SAN.

The network switch 6009 is a network device configured to connect a plurality of network apparatuses such as clients, servers, and storage units on the storage network 1000. Upon receiving a packet from a network apparatus, the network switch 6009 transmits a reception packet to the network apparatus at a destination based on a destination address of the reception packet.

The network switch 6009 includes the control unit 200. The control unit 200 can be entirely included in the network switch 6009 as shown in FIG. 85. Alternatively, a part of the control unit 200 can be included in the network switch 6009 and another part of the control unit 200 can be included in the main memory 6 of a client 7000A or a part of the control unit 200 can be included in the network switch 6009 and another part of the control unit 200 can be included in another section in the system 1 such as a ROM of the client 7000A. The control unit 200 can be implemented in a form of firmware or software or can be implemented in a form of hardware.

In the same manner as shown in FIGS. 24 and 29 in the first embodiment, the control unit 200 determines whether one or a plurality of storage units connected to the storage network 1000 have reached the life end, are about to reach the life end, or are about to fail. When the storage units have reached the life end, are about to reach the life end, or are about to fail, the control unit 200 transitions from the normal state to the low reliability state targeting only a storage unit to be subjected to life end processing. The normal state and the low reliability state are modes of the control unit 200 present to correspond to each of one or a plurality of storage units connected to the storage network 1000. For example, when the storage unit 2A is normal, the control unit 200 operates in the normal state, i.e., a mode for the storage unit 2A. For example, when the control unit 200 determines that the storage unit 2A has reached the life end, is about to reach the life end, or is about to fail or determines that the storage unit 2A is deteriorated in reliability, the control unit 200 operates in the low reliability state, i.e., a mode for the storage unit 2A. Even when the control unit 200 transitions from the normal state to the low reliability state targeting a storage unit to be subjected to the life end processing, the control unit 200 operates in the normal state for a storage unit not to be subjected to the life end processing. As in the first embodiment, the life end determination is performed at every fixed time, at each fixed number of kinds of processing, or at each fixed data transmission and reception shown in FIG. 24 or when a command response received from the storage unit is an error response as shown in FIGS. 29 and 30.

In this embodiment, as an example, two clients 7000A and 7000B and two storage units 2A and 2B are connected to the storage network 1000. However, other arbitrary configuration can be adopted as the configuration of the network apparatuses of the system 1. A server 7000A can be used instead of the client 7000A. A server 7000B can be used instead of the client 7000B. Addresses are respectively allocated to the client 7000A, the client 7000B, the storage unit 2A, and the storage unit 2B on a storage network. As the addresses, for example, IP addresses or MAC addresses can be used. For example, when the CPU 5 of the client 7000A transmits a command and data designating only the address of the storage unit 2A to the storage network 1000, the network switch 6009 specifies the storage unit 2A from the address in a packet configuring the command and the data. The network switch 6009 transmits the packet to only the storage unit 2A. For example, when the storage unit 2A transmits a response and data designating only the address of the client 7000A to the storage network 1000, the network switch 6009 specifies the client 7000A from the address in a packet configuring the response and the data. The network switch 6009 transmits the packet to only the client 7000A. In the address designation, not only a single network apparatus but also a plurality of network apparatuses can be designated.

When transmitting, for example, storage unit information of the storage unit 2A to, for example, the client 7000A, the control unit 200 switches the storage unit information of the storage unit 2A transmitted to the client 7000A according to whether the mode for the storage unit 2A of the control unit 200 is the normal state or the low reliability state. That is, when the mode for the storage unit 2A of the control unit 200 is the normal state, the control unit 200 transmits storage unit information indicating that storage unit 2A is a readable and writable storage unit to the client 7000A. When the mode for the storage unit 2A of the control unit 200 is the low reliability state, the control unit 200 transmits storage unit information indicating that the storage unit 2A is a readable only storage unit to the client 7000A. The storage unit information of the storage unit 2A is transmitted to the client 7000B as well in the same manner. Storage unit information of the storage unit 2B is also transmitted to the client 7000A and the client 7000B in the same manner.

As explained above, in this embodiment, when the control unit 200 determines that the storage unit 2 has reached the life end, is about to reach the life end, or is about to fail or determines that the storage unit 2 is deteriorated in reliability, the control unit 200 processes or generates storage unit information of the storage unit 2 transmitted to the CPU 5 to thereby cause the CPU 5 and the OS 100 to recognize that the storage unit is a readably only storage unit. Consequently, it is possible to prevent data write in the storage unit 2. Processing for recognizing that the storage unit 2 is a readable only storage unit is performed in a lower software layer such as the OS 100. Therefore, an upper software layer such as the application program 400 and the user does not need to perform special control of the storage unit 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An information processing system comprising:
a first storage unit including a readable and writable first memory;
a second storage unit including a readable and writable second memory;
an information processing device connectable to the first storage unit and the second storage unit; and
a data migration log area, wherein
the information processing device includes a control unit configured to execute:
first processing for determining a storage status of the first storage unit based on reliability information acquired from the first storage unit;
second processing for, when the storage status of the first storage unit is recognized as a protected state by the first processing, executing write on only the second storage unit of the first and second storage units, when a read target address is recorded in the data migration log area, executing read data from the second storage unit and, when the read target address is not recorded in the data migration log area, executing read data from the first storage unit;
third processing for recording an address of data written in the second storage unit in the data migration log area according to the write by the second processing; and fourth processing for, when the storage status of the first storage unit is not recognized as the protected state by the first processing, executing read data from the first storage unit without reading from the data migration log area.

2. The information processing system according to claim 1, wherein the control unit performs comparison of the reliability information and a threshold in the first processing and, when determining based on the comparison that a life end condition of the first storage unit is met, determines that the storage status of the first storage unit is the protected state.

3. The information processing system according to claim 1, wherein the control unit executes fourth processing for, when the storage status of the first storage unit is recognized as a low reliability state by the first processing, recognizing that the second storage unit is in a data migration destination state of data stored in the first storage unit and changing the storage status of the first storage unit to the protected state.

4. The information processing system according to claim 3, wherein, in the first processing, the control unit performs the comparison of the reliability information and the threshold and, when determining based on the comparison that a life end condition of the first storage unit is met, determines that the storage status of the first storage unit is the low reliability state.

5. The information processing system according to claim 1, wherein the control unit manages, in the third processing, the addresses of the stored data in the first and second storage units such that data of a same address is present in one of the first and second storage units.

6. The information processing system according to claim 5, wherein, when the storage status of the first storage unit is recognized as the protected state, the control unit recognizes, in the third processing, the first storage unit and the second storage unit as a same logical unit.

7. The information processing system according to claim 6, further comprising one or a plurality of third storage units connectable to the information processing device and including readable and writable third memories, wherein
the control unit executes fifth processing for controlling the one or plurality of third storage units and the first storage unit to configure a RAID and controls, in the fifth processing, when the storage status of the first storage unit is recognized as the protected state, the one or plurality of third storage units and the logical unit to configure the RAID.

8. The information processing system according to claim 1, wherein, in the second processing, the control unit executes processing for writing data read from the first storage unit in the second storage unit in parallel to the read processing.

9. The information processing system according to claim 1, further comprising a metadata storing unit configured to store metadata, wherein
in the third processing, the control unit records, when it is determined by the first processing that the storage status of the first storage unit is not the protected state, in the metadata, a mapping from an address of data written in the first storage unit to the first storage unit and records, when it is determined by the first processing that the storage status of the first storage unit is the protected state, in the metadata, a mapping from an address of data written in the second storage unit to the second storage unit, and
in the second processing, in read processing, the control unit reads the data from the first storage unit when a mapping from a read target address to the first storage unit is recorded in the metadata and reads the data from the second storage unit when a mapping from the read target address to the second storage unit is recorded in the metadata.

10. The information processing system according to claim 9, wherein, when the mapping to the first storage unit is absent in the metadata, the control unit determines that the storage status of the first storage unit is a state other than the protected state.

11. The information processing system according to claim 9, wherein the control unit executes seventh processing for, after it is determined by the first processing that the storage status of the first storage unit is the protected state, when a deletion processing command for data stored in the first storage unit is received, changing the metadata to invalidate a mapping from an address of the deletion target data to the first storage unit.

12. The information processing system according to claim 1, wherein
the control unit executes sixth processing for, when it is determined by the first processing that the storage status of the first storage unit is the protected state, storing first metadata stored in the first storage unit in the second storage unit as second metadata and managing the addresses of the stored data in the first and second storage units using the second metadata, and
in the third processing, the control unit records, when it is determined by the first processing that the storage status of the first storage unit is not the protected state, in the first metadata, a mapping from an address of data written in the first storage unit to the first storage unit and records, when it is determined by the first processing that the storage status of the first storage unit is the protected state, in the second metadata, a mapping from an address of data written in the second storage unit to the second storage unit.

13. The information processing system according to claim 1, wherein the control unit executes eighth processing for, after it is determined by the first processing that the storage status of the first storage unit is the protected state, when a deletion processing command for data stored in the first storage unit is received, recording an address of a deletion target data by the deletion processing command in the data migration log area.

14. The information processing system according to claim 1, wherein the control unit executes ninth processing for selecting data to be migrated to the second storage unit among data written in the first storage unit and, when all addresses corresponding to the data to be migrated are stored in the data migration log area, ending the protected state of the first storage unit.

15. The information processing system according to claim 1, wherein the data migration log area is stored in the second storage unit.

16. The information processing system according to claim 1, wherein, in the third processing, in recording a first address in the data migration log area, when a second address overlapping the first address or continuous to the first address is already stored in the data migration log area, the control unit records a third address obtained by combining the first address and the second address in the data migration log area and invalidates the second address.

17. The information processing system according to claim 1, wherein the control unit executes tenth processing for, when the storage status of the first storage unit is not recognized as the protected state by the first processing, erasing the data migration log area.

18. The information processing system according to claim 1, further comprising a relay unit configured to perform communication with the first storage unit and the information processing device, wherein
the relay unit determines a state of the first storage unit based on reliability information acquired from the first storage unit and, when determining that the state of the storage unit is the protected state, transmits, to the information processing device, storage unit information indicating that the first storage unit is a storage unit that supports only a read operation of read and write operations, and
upon receiving the storage unit information, the control unit determines in the first processing that the state of the first storage unit is the protected state.

19. An information processing system comprising:
a first storage unit including a readable and writable first memory;
a second storage unit including a readable and writable second memory;
an information processing device connectable to the first storage unit and the second storage unit; and
a data migration log area, wherein
the information processing device includes a control unit configured to execute:
first processing for determining a storage status of the first storage unit based on reliability information acquired from the first storage unit;
second processing for, when the storage status of the first storage unit is recognized as a protected state by the first processing, executing write on only the second storage unit of the first and second storage units and executing read on at least one of the first and second storage units; and
third processing for updating addresses of stored data in the first and second storage units according to the write by the second processing, wherein
the control unit is configured to
in the third processing, when the storage status of the first storage unit is recognized as the protected state by the first processing, record an address of data written in the second storage unit in the data migration log area, and
in the second processing, when a read target address is recorded in the data migration log area, read data from the second storage unit in the read processing and, when the read target address is not recorded in the data migration log area, read data from the first storage unit in the read processing.

20. The information processing system according to claim 19, wherein the control unit executes fourth processing for selecting data to be migrated to the second storage unit among data written in the first storage unit and, when all addresses corresponding to the data to be migrated are stored in the data migration log area, ending the protected state of the first storage unit.

* * * * *